US012670233B2

(12) United States Patent
Katz et al.

(10) Patent No.: US 12,670,233 B2
(45) Date of Patent: Jun. 30, 2026

(54) CLUSTER INTRALAYER SAFETY MECHANISM IN AN ARTIFICIAL NEURAL NETWORK PROCESSOR

(71) Applicant: Hailo Technologies Ltd., Tel Aviv (IL)

(72) Inventors: Ori Katz, Tel-Aviv (IL); Roi Seznayov, Raanana (IL); Daniel Chibotero, Kirat Ono (IL); Avi Baum, Givat Shmuel (IL); Guy Kaminitz, Kfar Saba (IL); Amir Shmul, Tel-Aviv (IL); Nir Engelberg, Tel-Aviv (IL); Yuval Adelstein, Tel-Aviv (IL); Or Danon, Kirat Ono (IL)

(73) Assignee: Hailo Technologies Ltd. (IL)

( * ) Notice: Subject to any disclaimer, the term of this patent is extended or adjusted under 35 U.S.C. 154(b) by 826 days.

(21) Appl. No.: 17/035,809

(22) Filed: Sep. 29, 2020

(65) Prior Publication Data

US 2022/0101043 A1      Mar. 31, 2022

(51) Int. Cl.
*H03M 13/15* (2006.01)
*G06F 18/22* (2023.01)
(Continued)

(52) U.S. Cl.
CPC ............ *G06F 18/231* (2023.01); *G06F 18/22* (2023.01); *G06N 3/063* (2013.01); *G06N 3/08* (2013.01);
(Continued)

(58) Field of Classification Search
CPC ....... G06F 18/231; G06F 18/22; G06N 3/063; H03M 13/096; H03M 13/15
See application file for complete search history.

(56) References Cited

U.S. PATENT DOCUMENTS

| | | | |
|---|---|---|---|
| 4,450,533 | A | 5/1984 | Petit |
| 4,943,931 | A | 7/1990 | Allen |

(Continued)

FOREIGN PATENT DOCUMENTS

| | | |
|---|---|---|
| CA | 2019099 | 12/1990 |
| CN | 101493677 | 7/2009 |

(Continued)

OTHER PUBLICATIONS

ISR/WO dated Jun. 24, 2018; issued in connection with PCT/IL2018/050392.

(Continued)

*Primary Examiner* — Nhat Huy T Nguyen
(74) *Attorney, Agent, or Firm* — Zaretsky Group PC; Howard Zaretsky

(57) ABSTRACT

Novel and useful system and methods of functional safety mechanisms for use in an artificial neural network (ANN) processor. The mechanisms can be deployed individually or in combination to provide a desired level of safety in neural networks. Multiple strategies are applied involving redundancy by design, redundancy through spatial mapping as well as self-tuning procedures that modify static (weights) and monitor dynamic (activations) behavior. The NN processor incorporates several functional safety concepts which reduce its risk of failure that occurs during operation from going unnoticed. The mechanisms function to detect and promptly flag and report the occurrence of an error with some mechanisms capable of correction as well. The safety mechanisms cover data stream fault detection, software defined redundant allocation, cluster interlayer safety, cluster intralayer safety, layer control unit (LCU) instruction addressing, weights storage safety, and neural network intermediate results storage safety.

13 Claims, 66 Drawing Sheets

(51) Int. Cl.

| | |
|---|---|
| *G06F 18/231* | (2023.01) |
| *G06N 3/063* | (2023.01) |
| *G06N 3/08* | (2023.01) |
| *G06N 5/046* | (2023.01) |
| *G06V 10/82* | (2022.01) |
| *H03M 13/09* | (2006.01) |

(52) U.S. Cl.
CPC .......... *G06N 5/046* (2013.01); *H03M 13/096* (2013.01); *H03M 13/15* (2013.01)

(56) References Cited

U.S. PATENT DOCUMENTS

| | | | |
|---|---|---|---|
| 4,979,124 A | 12/1990 | Sachse et al. | |
| 4,994,982 A | 2/1991 | Duranton et al. | |
| 5,003,490 A | 3/1991 | Castelaz et al. | |
| 5,008,833 A | 4/1991 | Agranat et al. | |
| 5,014,235 A | 5/1991 | Morton | |
| 5,056,037 A | 10/1991 | Eberhardt | |
| 5,080,464 A | 1/1992 | Toyoda | |
| 5,091,864 A | 2/1992 | Baji et al. | |
| 5,148,515 A | 9/1992 | Vassiliadis et al. | |
| 5,195,169 A | 3/1993 | Kamiya et al. | |
| 5,195,170 A | 3/1993 | Eberhardt | |
| 5,257,358 A | 10/1993 | Cohen | |
| 5,274,743 A | 12/1993 | Imondi et al. | |
| 5,278,945 A | 1/1994 | Basehore et al. | |
| 5,293,456 A | 3/1994 | Guez et al. | |
| 5,293,459 A | 3/1994 | Duranton et al. | |
| 5,297,232 A | 3/1994 | Murphy | |
| 5,365,460 A | 11/1994 | Chung | |
| 5,367,612 A | 11/1994 | Bozich et al. | |
| 5,408,645 A | 4/1995 | Ikeda et al. | |
| 5,423,001 A | 6/1995 | Ueda | |
| 5,430,830 A | 7/1995 | Frank et al. | |
| 5,444,822 A | 8/1995 | Shinohara | |
| 5,448,681 A | 9/1995 | Khan | |
| 5,450,315 A | 9/1995 | Stefanski | |
| 5,465,204 A | 11/1995 | Sekine et al. | |
| 5,479,579 A | 12/1995 | Duong et al. | |
| 5,485,545 A | 1/1996 | Kojima et al. | |
| 5,486,996 A | 1/1996 | Samad et al. | |
| 5,493,631 A | 2/1996 | Huang et al. | |
| 5,504,839 A | 4/1996 | Mobus | |
| 5,519,811 A | 5/1996 | Yoneda et al. | |
| 5,521,985 A | 5/1996 | Camp, Jr. et al. | |
| 5,533,383 A | 7/1996 | Gtreene et al. | |
| 5,537,513 A | 7/1996 | DeVille | |
| 5,583,771 A | 12/1996 | Lynch et al. | |
| 5,615,305 A | 3/1997 | Nunally | |
| 5,627,943 A | 5/1997 | Yoneda et al. | |
| 5,689,622 A | 11/1997 | Higashino et al. | |
| 5,704,016 A | 12/1997 | Shigematsu et al. | |
| 5,705,956 A | 1/1998 | Neely | |
| 5,717,832 A | 2/1998 | Steimle et al. | |
| 5,740,325 A | 4/1998 | Wang | |
| 5,745,652 A | 4/1998 | Bigus | |
| 5,748,849 A | 5/1998 | Gobert | |
| 5,796,925 A | 8/1998 | Deville | |
| 5,944,841 A | 8/1999 | Christie | |
| 5,956,703 A | 9/1999 | Turner et al. | |
| 5,978,782 A | 11/1999 | Neely | |
| 6,267,298 B1 | 7/2001 | Campbell | |
| 6,317,658 B1 | 11/2001 | Vian | |
| 6,326,912 B1 | 12/2001 | Fujimori | |
| 6,366,236 B1 | 4/2002 | Farmer et al. | |
| 6,421,359 B1 | 7/2002 | Bennett et al. | |
| 6,434,541 B1 | 8/2002 | Tawel et al. | |
| 6,446,238 B1 | 9/2002 | Canestaro et al. | |
| 6,493,689 B2 | 12/2002 | Kotoulas et al. | |
| 6,523,018 B1 | 2/2003 | Louis et al. | |
| 6,529,614 B1 | 3/2003 | Chao et al. | |
| 6,539,368 B1 | 3/2003 | Chernikov et al. | |
| 6,542,985 B1 | 4/2003 | Johnson et al. | |
| 6,567,953 B1 | 5/2003 | Pomerantz | |
| 6,578,020 B1 | 6/2003 | Nguyen | |
| 6,622,125 B1 | 9/2003 | Cragun et al. | |
| 6,629,089 B1 | 9/2003 | Supino | |
| 6,665,813 B1 | 12/2003 | Forsman et al. | |
| 6,671,832 B1 | 12/2003 | Apisdorf | |
| 6,751,529 B1 | 6/2004 | Fouche | |
| 6,836,767 B2 | 12/2004 | McBride | |
| 6,882,992 B1 | 4/2005 | Werbos | |
| 7,039,233 B2 | 5/2006 | Mori | |
| 7,069,256 B1 | 6/2006 | Campos | |
| 7,082,419 B1 | 7/2006 | Lightowler | |
| 7,113,970 B2 | 9/2006 | Chiueh | |
| 7,117,045 B2 | 10/2006 | Hittle et al. | |
| 7,174,325 B1 | 2/2007 | Ascoli | |
| 7,302,619 B1 | 11/2007 | Tompkins et al. | |
| 7,308,322 B1 | 12/2007 | Discenzo et al. | |
| 7,647,284 B2 | 1/2010 | Prokhorov | |
| 8,081,816 B1 | 12/2011 | Irick et al. | |
| 8,126,828 B2 | 2/2012 | Snook et al. | |
| 8,131,659 B2 | 3/2012 | Xu et al. | |
| 8,145,983 B1 | 3/2012 | Chaichanavong | |
| 8,321,769 B1 | 11/2012 | Yeo | |
| 8,326,782 B2 | 12/2012 | Snook et al. | |
| 8,391,306 B2 | 3/2013 | Ito et al. | |
| 8,745,466 B2 | 6/2014 | Kaynak | |
| 8,892,485 B2 | 11/2014 | Aparin et al. | |
| 8,909,576 B2 | 12/2014 | Akopyan | |
| 8,996,350 B1 | 3/2015 | Dub | |
| 8,996,967 B2 | 3/2015 | Kaynak | |
| 9,014,181 B2 | 4/2015 | Lakshman et al. | |
| 9,077,491 B2 | 7/2015 | Mar et al. | |
| 9,129,220 B2 | 9/2015 | Aparin et al. | |
| 9,129,222 B2 | 9/2015 | Aparin | |
| 9,153,230 B2 | 10/2015 | Maaninen | |
| 9,159,020 B2 | 10/2015 | Alcarez-Icaza Rivera et al. | |
| 9,195,656 B2 | 11/2015 | Fructuso et al. | |
| 9,306,965 B1 | 4/2016 | Grossman et al. | |
| 9,361,104 B2 | 6/2016 | Morrison | |
| 9,400,954 B2 | 7/2016 | Modha | |
| 9,466,022 B2 | 10/2016 | Alvarez-Icaza Rivera et al. | |
| 9,477,925 B2 | 10/2016 | Seide et al. | |
| 9,530,092 B2 | 12/2016 | Chatterjee et al. | |
| 9,542,642 B2 | 1/2017 | Wood | |
| 9,542,643 B2 | 1/2017 | Levin et al. | |
| 9,558,444 B2 | 1/2017 | Palmer et al. | |
| 9,607,217 B2 | 3/2017 | Cetintas et al. | |
| 10,019,470 B2 | 7/2018 | Birdwell et al. | |
| 10,073,816 B1 | 9/2018 | Lu et al. | |
| 10,339,041 B2 | 7/2019 | Rangan et al. | |
| 10,417,089 B2 | 9/2019 | Oboukhov | |
| 10,430,706 B2 | 10/2019 | Henry et al. | |
| 10,699,189 B2 | 6/2020 | Lie et al. | |
| 10,789,734 B2 | 9/2020 | Pan et al. | |
| 10,936,569 B1 | 3/2021 | Baskaran et al. | |
| 11,232,016 B1 | 1/2022 | Huynh | |
| 11,392,829 B1 | 7/2022 | Pool | |
| 11,487,811 B2 * | 11/2022 | Das | G06V 40/103 |
| 2002/0112204 A1 | 8/2002 | Biskup et al. | |
| 2002/0161813 A1 | 10/2002 | Chiueh | |
| 2002/0184556 A1 | 12/2002 | Hashemi | |
| 2003/0069516 A1 | 4/2003 | Becker et al. | |
| 2003/0115537 A1 | 6/2003 | Boyer et al. | |
| 2004/0015748 A1 * | 1/2004 | Dwyer | G06F 8/437 714/E11.04 |
| 2004/0167418 A1 | 8/2004 | Nguyen et al. | |
| 2005/0193357 A1 | 9/2005 | Honary et al. | |
| 2005/0256420 A1 | 11/2005 | Noman et al. | |
| 2006/0015703 A1 | 1/2006 | Ramchandran | |
| 2006/0085558 A1 | 4/2006 | Solomon | |
| 2006/0167784 A1 | 7/2006 | Hoffberg | |
| 2007/0266277 A1 | 11/2007 | Oyamada | |
| 2008/0117220 A1 | 5/2008 | Gorchetchnikov et al. | |
| 2009/0276666 A1 | 11/2009 | Haley et al. | |
| 2010/0100514 A1 | 4/2010 | Raymond et al. | |
| 2010/0205399 A1 | 8/2010 | Bean et al. | |
| 2010/0235686 A1 | 9/2010 | Sato | |
| 2010/0313104 A1 | 12/2010 | Bommena et al. | |
| 2010/0317420 A1 | 12/2010 | Hoffberg | |
| 2011/0041013 A1 | 2/2011 | Ingimundarson | |

(56) References Cited

U.S. PATENT DOCUMENTS

| | | |
|---|---|---|
| 2012/0179898 A1 | 7/2012 | Betouin et al. |
| 2013/0079842 A1 | 3/2013 | Mokelke et al. |
| 2013/0254892 A1 | 9/2013 | Kaufman |
| 2014/0032457 A1 | 1/2014 | Palmer et al. |
| 2014/0156576 A1 | 6/2014 | Nugent |
| 2014/0344203 A1 | 11/2014 | Ahn |
| 2015/0026104 A1 | 1/2015 | Tambos |
| 2015/0081753 A1 | 3/2015 | Iyer et al. |
| 2015/0106311 A1 | 4/2015 | Birdwell et al. |
| 2015/0106317 A1 | 4/2015 | Rangan et al. |
| 2015/0134580 A1 | 5/2015 | Wilson |
| 2015/0170021 A1 | 6/2015 | Lupon et al. |
| 2015/0212861 A1 | 7/2015 | Canoy et al. |
| 2015/0269480 A1 | 9/2015 | Levin et al. |
| 2015/0324690 A1 | 11/2015 | Chilimbi et al. |
| 2015/0324691 A1 | 11/2015 | Dropps et al. |
| 2015/0324692 A1 | 11/2015 | Ritchey et al. |
| 2016/0086077 A1 | 3/2016 | Akopyan et al. |
| 2016/0179434 A1 | 6/2016 | Herrero Abellanas et al. |
| 2016/0210550 A1 | 7/2016 | Merrill |
| 2016/0232442 A1 | 8/2016 | Fan et al. |
| 2016/0275398 A1 | 9/2016 | Corvinelli et al. |
| 2016/0321537 A1 | 11/2016 | Akopyan et al. |
| 2016/0328646 A1 | 11/2016 | Lin |
| 2016/0335119 A1 | 11/2016 | Merrill et al. |
| 2016/0335534 A1 | 11/2016 | Nere et al. |
| 2017/0011288 A1 | 1/2017 | Brothers et al. |
| 2017/0017876 A1 | 1/2017 | Modha |
| 2017/0024644 A1 | 1/2017 | Van Der Made et al. |
| 2017/0083469 A1 | 3/2017 | Catthoor |
| 2017/0090929 A1 | 3/2017 | Muttik et al. |
| 2017/0091614 A1 | 3/2017 | Amir et al. |
| 2017/0093526 A1 | 3/2017 | Mula et al. |
| 2017/0103313 A1 | 4/2017 | Ross et al. |
| 2017/0110093 A1 | 4/2017 | Stein et al. |
| 2017/0147301 A1 | 5/2017 | Rong |
| 2017/0206437 A1 | 7/2017 | Hachiya et al. |
| 2017/0228638 A1 | 8/2017 | Danihelka |
| 2017/0277658 A1 | 9/2017 | Pratas |
| 2017/0330509 A1 | 11/2017 | Cok et al. |
| 2017/0345181 A1 | 11/2017 | Yu et al. |
| 2018/0018558 A1 | 1/2018 | Lee et al. |
| 2018/0046894 A1 | 2/2018 | Yao |
| 2018/0189231 A1 | 7/2018 | Fleming |
| 2018/0189631 A1 | 7/2018 | Sumbul |
| 2018/0232617 A1 | 8/2018 | Rozen et al. |
| 2018/0260220 A1 | 9/2018 | Lacy et al. |
| 2018/0322382 A1 | 11/2018 | Mellempudi et al. |
| 2018/0336462 A1 | 11/2018 | Brothers |
| 2018/0375729 A1 | 12/2018 | Tzoreff et al. |
| 2019/0004800 A1 | 1/2019 | Ong |
| 2019/0079729 A1 | 3/2019 | Aimone |
| 2019/0158223 A1 | 5/2019 | Carlough et al. |
| 2019/0197350 A1 | 6/2019 | Park |
| 2019/0265701 A1* | 8/2019 | Troia ........... G06F 11/1012 |
| 2019/0373588 A1 | 12/2019 | Bae |
| 2019/0392296 A1 | 12/2019 | Brady |
| 2020/0012900 A1* | 1/2020 | Walters ........... G06F 16/2237 |
| 2020/0024496 A1 | 1/2020 | Murakami et al. |
| 2020/0026992 A1 | 1/2020 | Zhang |
| 2020/0104717 A1 | 4/2020 | Alistarh |
| 2020/0134446 A1* | 4/2020 | Soni ........... G06N 3/047 |
| 2020/0136943 A1 | 4/2020 | Banyai |
| 2020/0154482 A1 | 5/2020 | Ahn |
| 2020/0174829 A1 | 6/2020 | Shao |
| 2020/0193297 A1 | 6/2020 | Verhoef |
| 2020/0202198 A1 | 6/2020 | Lee et al. |
| 2020/0250312 A1* | 8/2020 | Kumar Addepalli ... G06F 21/57 |
| 2020/0285949 A1 | 9/2020 | Baum |
| 2020/0285950 A1 | 9/2020 | Baum et al. |
| 2020/0285997 A1 | 9/2020 | Bhattacharyya |
| 2020/0322135 A1 | 10/2020 | Kupwade Patil |
| 2020/0379740 A1 | 12/2020 | Paek |
| 2020/0379841 A1 | 12/2020 | Cassidy et al. |
| 2020/0380369 A1 | 12/2020 | Case |
| 2021/0053574 A1 | 2/2021 | Bielby et al. |
| 2021/0073127 A1 | 3/2021 | Bielby et al. |
| 2021/0132678 A1 | 5/2021 | An |
| 2021/0158169 A1 | 5/2021 | Kim |
| 2021/0256384 A1 | 8/2021 | Wang |
| 2021/0279055 A1 | 9/2021 | Saxena |
| 2021/0357923 A1* | 11/2021 | Walters ........... G06Q 20/389 |
| 2022/0108157 A1 | 4/2022 | Hunter |

FOREIGN PATENT DOCUMENTS

| | | |
|---|---|---|
| CN | 101809597 | 8/2010 |
| CN | 201927073 | 8/2011 |
| CN | 101882238 | 2/2012 |
| CN | 103778468 | 5/2014 |
| CN | 104107507 | 10/2014 |
| CN | 104899641 | 9/2015 |
| CN | 105311750 | 2/2016 |
| CN | 105676649 | 6/2016 |
| CN | 105678379 | 6/2016 |
| CN | 105930902 | 9/2016 |
| CN | 106355246 | 1/2017 |
| CN | 106447034 | 2/2017 |
| CN | 106503796 | 3/2017 |
| CN | 106529670 | 3/2017 |
| EP | 568146 B1 | 11/1993 |
| EP | 575716 A1 | 12/1993 |
| EP | 2825974 | 1/2015 |
| EP | 3035249 | 6/2016 |
| EP | 3276540 | 1/2018 |
| FR | 2780919 | 1/2000 |
| JP | H02267660 | 11/1990 |
| JP | 3100857 | 4/1991 |
| JP | H04113481 | 4/1992 |
| JP | H04336370 | 11/1992 |
| JP | H04344970 | 12/1992 |
| JP | H0520294 A | 1/1993 |
| JP | H0581227 | 4/1993 |
| JP | H05165800 | 7/1993 |
| JP | H05197701 | 8/1993 |
| JP | H05-233586 A | 9/1993 |
| JP | H05334278 | 12/1993 |
| JP | H0619868 | 1/1994 |
| JP | H06-348906 A | 12/1994 |
| JP | H07191951 | 7/1995 |
| JP | H07302292 | 11/1995 |
| JP | H10-55346 A | 2/1998 |
| JP | 2001034735 | 2/2001 |
| JP | 3177996 | 6/2001 |
| JP | 3183484 B2 | 7/2001 |
| JP | 2006154992 | 6/2006 |
| JP | 2009288908 | 12/2009 |
| JP | 2015195011 | 11/2015 |
| JP | 2016219011 | 12/2016 |
| KR | 367715 B1 | 1/2003 |
| KR | 919572 B1 | 10/2009 |
| RU | 2057363 | 3/1996 |
| RU | 2473126 | 1/2013 |
| WO | 2015/053889 A2 | 4/2015 |
| WO | WO 2018/126270 A1 | 7/2018 |

OTHER PUBLICATIONS

ISR/WO dated Jul. 10, 2018; issued in connection with PCT/IL2018/050393.
ISR/WO dated Jul. 12, 2018; issued in connection with PCT/IL2018/050394.
ISR/WO dated Jul. 11, 2018; issued in connection with PCT/IL2018/050395.
ISR/WO dated Jul. 15, 2018; issued in connection with PCT/IL2018/050396.
Shuchang Zhou et al., "Balanced Quantization: An Effective and Efficient Approach to Quantized Neural Networks", arXiv, Jun. 2017.
Lin, "Fixed Point Quantization of Deep Convolutional Networks", Proceedings of the 33rd International Conference on Machine Learning, New York, NY, JMLR: W&CP vol. 48, arXiv, Jun. 2016.

(56)　　　　　References Cited

OTHER PUBLICATIONS

Amir et al., "Cognitive Computing Programming Paradigm: A Corelet Language for Composing Networks ofNeurosynaptic Cores", Aug. 4-9, 2013, The 2013 International Joint Conference on Neural Networks (IJCNN), IEEE.

George et al.,MicroPython 1.14 [Online], Aug. 2015, URL: http://docs.micropython.org/en/latest/pyboard/tutorial/assembler.html.

Pattnaik et al., "Scheduling Techniques for GPU Architectures with Processing-In_Memory Capabilities", Sep. 11-15, 2016, IEEE, p. 31-44.

Kuzmin et al., Taxonomy and Evaluation of Structured Compression of Convolutional Neural Networks, Review of Structured CNN Compression, pp. 1-33, Dec. 20, 2019.

Principe et al., "An Analysis of the Gamma Memory in Dynamic Neural Networks", IEEE Transactions on Neural Networks, vol. 5, No. 2, pp. 331-337, Mar. 1994.

Kumpati S. Narendra et al., "Identification and Control of Dynamical Systems Using Neural Networks", IEEE Transactions on Neural Networks, vol. 1, No. 1, pp. 4-27, Mar. 1990.

Campolucci et al., "On-Line Learning Algorithms for Locally Recurrent Neural Networks", IEEE Transactions on Neural Networks, vol. 1 , No. 2, pp. 253-271, Mar. 1999.

M'zah et al., "Deterministic Microcode Machine Generation", 2017 IEEE Conference on Dependable and Secure Computing, 2017, pp. 370-376, doi: 10.1109/DESEC.2017.8073858. (Year: 2017).

V.T. Lee, A. Alaghi, J. P. Hayes, V. Sathe and L. Ceze, "Energy-efficient hybrid stochastic-binary neural networks for near-sensor computing," *Design, Automation & Test in Europe Conference & Exhibition (DATE)*, 2017, 2017, pp. 13-18, doi: 10.23919/DATE. 2017.7926951.

Makato Yamada, Sparse Network Lasso for Local High-dimensional Regression, Mar. 23, 2016, p. 1-12 (Year: 2016).

Sze, Vivienne et al. "Efficient Processing of Deep Neural Networks: A Tutorial and Survey." Proceedings of the IEEE 105 (2017): 2295-2329.

Wei Wen, Learning Structured Sparsity in Deep Neural Networks, Dec. 5, 2016, NIPS'16: Proceedings of the 30th International Conference on Neural Information Processing Systems, p. 1-8. (Year: 2016).

Majid, Mohammad Wadood, Golrokh Mirzaei, and Mohsin M. Jamali. "Evolutionary Neural Network parallelization with multicore systems on chip." 2012 IEEE International Conference on Electro/ Information Technology. IEEE, 2012. (Year: 2012).

Vinu Joseph, et al., "A Programmable Approach To Model Compression", arXiv:1911.02497v1 [cs.LG] ,Nov. 6, 2019.

Yuxuan Cai, et al., "YOLObile: Real-Time Object Detection on Mobile Devices via Compression-Compilation Co-Design", arXiv:2009. 05697v1 [cs:CV], Sep. 12, 2020.

S. Carrillo, et al., "Hierarchical Network-on-Chip and Traffic Compression for Spiking Neural Network Implementtions", 2012 Sixth IEEE/ACM International Symposium on Networks-on-Chip, IEEE Computer Society, 2012.

M.M. Khan, et al., "SpiNNaker: Mapping Neural Networks onto a Massively-Parallel Chip Multiprocessor", 2008 International Joint Conference on Neural Networks (IJCNN 2008), pp. 2849-2856, 2008.

Yihua Liao: Neural Networks in Hardware: A Survey (undated).

* cited by examiner

| | | |
|---|---|---|
| 6 | APPLICATION | 422 |
| 5 | INTERFACE | 420 |
| 4 | MANAGEMENT | 418 |
| 3 | INTERCONNECT | 416 |
| 2 | UNIT | 414 |
| 1 | PHYSICAL | 412 |

410

MEMORY ELEMENTS

MEMORY ELEMENTS

910

| COL<br>ROW | 1 *912* | 2 | 3 | 4 |
|---|---|---|---|---|
| 1 | ADDR=0<br>$D_{11}$ | ADDR=3<br>$D_{21}$ | ADDR=6<br>$D_{31}$ | ADDR=9<br>$D_{41}$ |
| 2 | ADDR=1<br>$D_{12}$ | ADDR=4<br>$D_{22}$ | ADDR=7<br>$D_{32}$ | ADDR=10<br>$D_{42}$ |
| 3 | ADDR=2<br>$D_{13}$ | ADDR=5<br>$D_{23}$ | ADDR=8<br>$D_{33}$ | ADDR=11<br>$D_{43}$ |

CRC GENERATED OVER ALL FEATURES

PIXELS 0..7 FEATURE F

PIXELS 0..7 FEATURE 1

CLUSTER INTRALAYER SAFETY MECHANISM IN AN ARTIFICIAL NEURAL NETWORK PROCESSOR

FIELD OF THE DISCLOSURE

The subject matter disclosed herein relates to the field of artificial neural networks (ANNs) and more particularly relates to systems and methods of functional safety mechanisms incorporated into an ANN processor for use in neural networks.

BACKGROUND OF THE INVENTION

Artificial neural networks (ANNs) are computing systems inspired by the biological neural networks that constitute animal brains. Such systems learn, i.e. progressively improve performance, to do tasks by considering examples, generally without task-specific programming by extracting the critical features of those tasks and generalizing from large numbers of examples. For example, in image recognition, they might learn to identify images that contain cats by analyzing example images that have been manually labeled as "cat" or "not cat" and using the analytic results to identify cats in other images. They have found most use in applications difficult to express in a traditional computer algorithm using rule-based programming.

An ANN is based on a collection of connected units called artificial neurons, analogous to neurons in a biological brain. Each connection or synapse between neurons can transmit a signal to another neuron. The receiving or postsynaptic neuron is connected to another one or several neurons and can process the signals and then signal downstream neurons connected to it through a synapse also referred to as an axon. Neurons may have a state, generally represented by real numbers, typically between 0 and 1. Neurons and synapses may also have a weight that varies as learning proceeds, which can increase or decrease the strength of the signal that it sends downstream. Further, they may have a threshold such that only if the aggregate signal is below or above that level is the downstream signal sent.

Typically, neurons are organized in layers. Different layers may perform different kinds of transformations on their inputs. Signals travel from the first, i.e. input, to the last, i.e. output, layer, possibly after traversing the layers multiple times.

The original goal of the neural network approach was to solve problems in the same way that a human brain would. Over time, attention focused on matching specific mental abilities, leading to deviations from biology such as backpropagation, or passing information in the reverse direction and adjusting the network to reflect that information.

The components of an artificial neural network include (1) neurons having an activation threshold; (2) connections and weights for transferring the output of a neuron; (3) a propagation function to compute the input to a neuron from the output of predecessor neurons; and (4) a learning rule which is an algorithm that modifies the parameters of the neural network in order for a given input to produce a desired outcome which typically amounts to modifying the weights and thresholds.

Given a specific task to solve, and a class of functions F, learning entails using a set of observations to find the function that which solves the task in some optimal sense. A cost function C is defined such that, for the optimal solution no other solution has a cost less than the cost of the optimal solution.

The cost function C is a measure of how far away a particular solution is from an optimal solution to the problem to be solved. Learning algorithms search through the solution space to find a function that has the smallest possible cost.

A neural network can be trained using backpropagation which is a method to calculate the gradient of the loss function with respect to the weights in an ANN. The weight updates of backpropagation can be done via well-known stochastic gradient descent techniques. Note that the choice of the cost function depends on factors such as the learning type (e.g., supervised, unsupervised, reinforcement) and the activation function.

There are three major learning paradigms and each corresponds to a particular learning task: supervised learning, unsupervised learning, and reinforcement learning. Supervised learning uses a set of example pairs and the goal is to find a function in the allowed class of functions that matches the examples. A commonly used cost is the mean-squared error, which tries to minimize the average squared error between the network's output and the target value over all example pairs. Minimizing this cost using gradient descent for the class of neural networks called multilayer perceptrons (MLP), produces the backpropagation algorithm for training neural networks. Examples of supervised learning include pattern recognition, i.e. classification, and regression, i.e. function approximation.

In unsupervised learning, some data is given and the cost function to be minimized, that can be any function of the data and the network's output. The cost function is dependent on the task (i.e. the model domain) and any a priori assumptions (i.e. the implicit properties of the model, its parameters, and the observed variables). Tasks that fall within the paradigm of unsupervised learning are in general estimation problems; the applications include clustering, the estimation of statistical distributions, compression, and filtering.

In reinforcement learning, data is usually not provided, but generated by an agent's interactions with the environment. At each point in time, the agent performs an action and the environment generates an observation and an instantaneous cost according to some typically unknown dynamics. The aim is to discover a policy for selecting actions that minimizes some measure of a long-term cost, e.g., the expected cumulative cost. The environment's dynamics and the long-term cost for each policy are usually unknown but can be estimated.

Today, a common application for neural networks is in the analysis of video streams, i.e. machine vision. Examples include industrial factories where machine vision is used on the assembly line in the manufacture of goods, autonomous vehicles where machine vision is used to detect objects in the path of and surrounding the vehicle, etc.

An Artificial Neural Network (ANN) has an inherent structure that greatly relies on a set of parameters that are attributed to the so-called 'network model'. These parameters are often called 'weights' of the network due to their tendency to operate as a scaling factor for other intermediate values as they propagate along the network. The process for determining the values of the weights is called training as described supra. Once training is complete, the network settles into a steady state and can now be used with new (i.e. unknown) data to extract information. This stage is referred to as the 'inference' stage.

During inference, one can observe the resultant set of parameters, namely the weights, and manipulate them to yield better performance (i.e. representation). Methods for pruning and quantizing weights are known. These methods, however, are applied only on the trained model before moving to the inference stage. This approach does yield better execution performance. It does not, however, fully explore and exploit the potential of modifying the weights. In addition, existing solutions apply quantization of weights only after training once the weights of the ANN have converged to a satisfactory level.

Further, modern ANNs are complex computational graphs that are prone to random errors and directed deception using adversarial strategies. This is especially acute when ANNs are used in critical roles such as autonomous vehicles, robots, etc. Thus, there is a need for mechanisms that attempts to provide a level of safety to improve system immunity.

SUMMARY OF THE INVENTION

This disclosure describes a novel invention for several safety mechanisms for use in an artificial neural network (ANN) processor. The mechanisms described herein can be deployed individually or in combination to provide a desired level of safety in the processor and the neural network it is used to implement. The invention applies multiple strategies involving redundancy by design, redundancy through spatial mapping as well as self-tuning procedures that modify static (weights) and monitor dynamic (activations) behavior. The various mechanisms of the present invention address ANN system level safety in situ, as a system level strategy that is tightly coupled with the processor architecture.

In one embodiment, the NN processor incorporates several functional safety concepts which reduce its risk of failure that occurs during operation from going unnoticed. The safety mechanisms disclosed herein function to detect and promptly flag (i.e. report) the occurrence of an error and with some of the safety mechanisms correction of the error is also possible. These features are highly desired or even mandatory in certain applications such as use in autonomous vehicles as dictated by the ISO 26262 standard.

The NN processor is realized as a programmable SoC and as described herein is suitable for use in implementing deep neural networks. The processor includes hardware elements, software elements, and hardware/software interfaces, in addition to one or more software tools (e.g., SDK) which are provided to the customer.

The scope of the safety concept related to the NN processor is described infra. Note that the SDK can be excluded from the safety context except for functions that are directly involved in content deployed to the device. Note further that this does not exclude the embedded firmware that runs on the on chip MCU subsystem.

In particular, the safety mechanisms disclosed herein include (1) data stream fault detection mechanism; (2) software defined redundant allocation safety mechanism; (3) cluster interlayer safety mechanism; (4) cluster intralayer safety mechanism; (5) layer control unit (LCU) instruction addressing safety mechanism; (6) weights safety mechanism; and (7) neural network intermediate results safety mechanism.

The invention is applicable to neural network (NN) processing engines adapted to implement artificial neural networks (ANNs). The granular nature of the NN processing engine or processor, also referred to as a neurocomputer or neurochip, enables the underpinnings of a neural network to be easily identified and a wide range of neural network models to be implemented in a very efficient manner. The NN processor provides some flexibility in selecting a balance between (1) over-generalizing the architecture regarding the computational aspect, and (2) aggregating computations in dedicated computationally capable units. The present invention provides an improved balance specific for neural networks and attempts to meet needed capabilities with appropriate capacity. The resulting architecture is thus more efficient and provides substantially higher computational unit density along with much lower power consumption per unit.

Several key features of the architecture of the NN processor of the present invention include the following: (1) computational units are self-contained and configured to be at full utilization to implement their target task; (2) a hierarchical architecture provides homogeneity and self-similarity thereby enabling simpler management and control of similar computational units, aggregated in multiple levels of hierarchy; (3) computational units are designed with minimal overhead as possible, where additional features and capabilities are placed at higher levels in the hierarchy (i.e. aggregation); (4) on-chip memory provides storage for content inherently required for basic operation at a particular hierarchy is coupled with the computational resources in an optimal ratio; (5) lean control provides just enough control to manage only the operations required at a particular hierarchical level; and (6) dynamic resource assignment agility can be adjusted as required depending on availability and capacity.

This, additional, and/or other aspects and/or advantages of the embodiments of the present invention are set forth in the detailed description which follows; possibly inferable from the detailed description; and/or learnable by practice of the embodiments of the present invention.

There is thus provided in accordance with the invention, a method of cluster intralayer neural network tensor data flow path failure detection for use in a neural network processor, the method comprising providing a computational logic circuit for processing a stream of tensors, providing the stream of tensors for input to and processing by the computational logic circuit, injecting tensor test data into the computational logic circuit and calculating a test output therefrom, and comparing the calculated test output with a precalculated expected test output and generating an error if a mismatch is detected.

There is also provided in accordance with the invention, an apparatus for cluster intralayer neural network tensor data flow path failure detection for use in a neural network processor, comprising a computational logic circuit for processing a stream of tensors and generating an output therefrom, a first circuit element operative to provide the stream tensors for input to the computational logic circuit, a second circuit element operative to inject one or more test tensors into the computational logic circuit to generate test output thereby, a third circuit element operative to compare the test output with expected test output calculated a priori and to generate an error if a mismatch is detected.

There is further provided in accordance with the invention, a method of cluster intralayer tensor data flow path failure detection for use in a neural network processor, the method comprising providing a cluster level logic circuit for processing a stream of tensors, ceasing processing of the stream of tensors, injecting one or more test tensors into the cluster level logic circuit to generate a test output therefrom, and comparing the calculated test output with an expected test output calculated a priori and generating an error if a mismatch is detected.

BRIEF DESCRIPTION OF THE DRAWINGS

The present invention is explained in further detail in the following exemplary embodiments and with reference to the figures, where identical or similar elements may be partly indicated by the same or similar reference numerals, and the features of various exemplary embodiments being combinable. The invention is herein described, by way of example only, with reference to the accompanying drawings, wherein.

DETAILED DESCRIPTION

Figure 1:
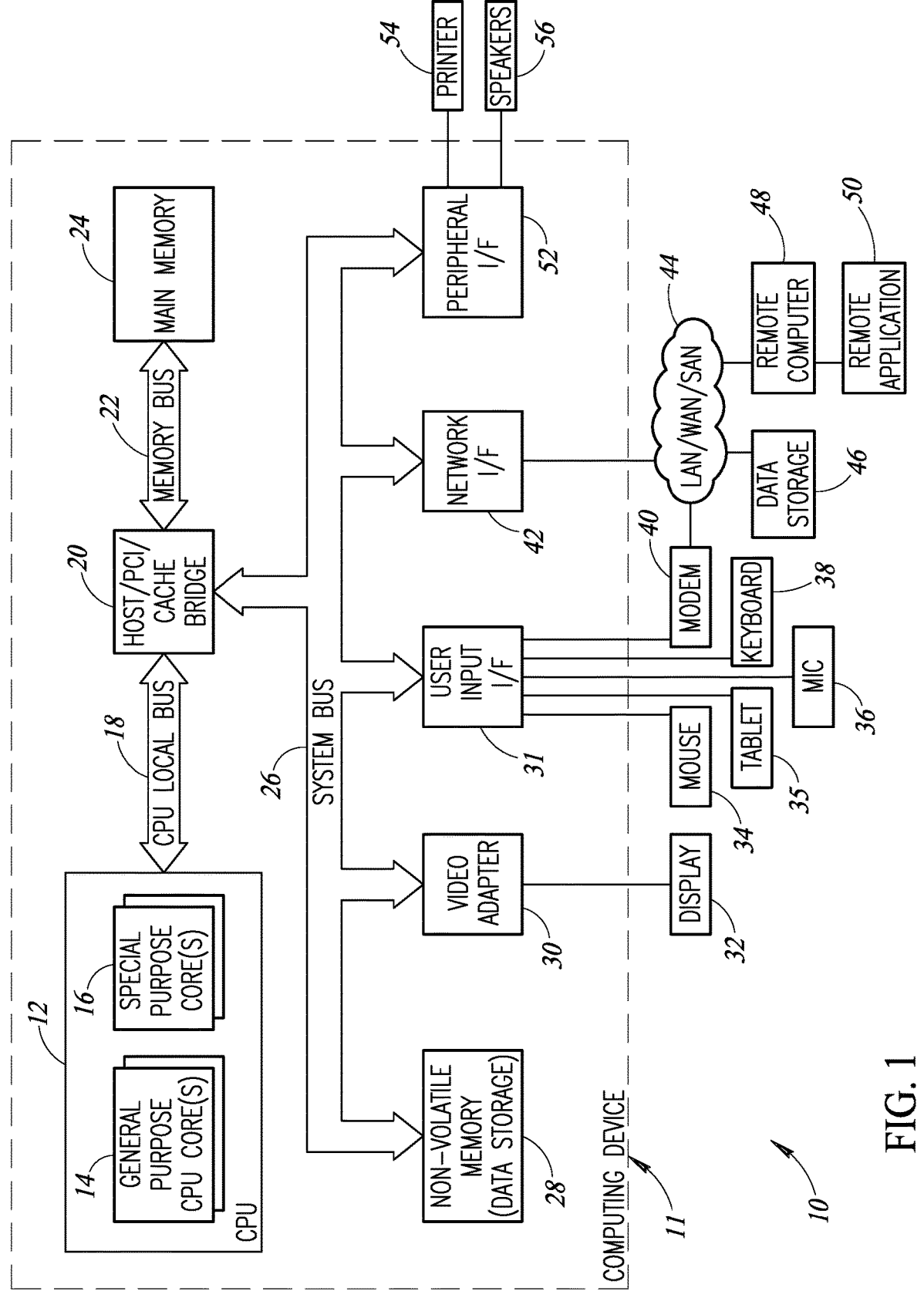
FIG. 1 is a block diagram illustrating an example computer processing system adapted to implement one or more portions of the present invention.

In the following detailed description, numerous specific details are set forth in order to provide a thorough understanding of the invention. It will be understood by those skilled in the art, however, that the present invention may be practiced without these specific details. In other instances, well-known methods, procedures, and components have not been described in detail so as not to obscure the present invention.

Among those benefits and improvements that have been disclosed, other objects and advantages of this invention will become apparent from the following description taken in conjunction with the accompanying figures. Detailed embodiments of the present invention are disclosed herein; however, it is to be understood that the disclosed embodiments are merely illustrative of the invention that may be embodied in various forms. In addition, each of the examples given in connection with the various embodiments of the invention which are intended to be illustrative, and not restrictive.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

The figures constitute a part of this specification and include illustrative embodiments of the present invention and illustrate various objects and features thereof. Further, the figures are not necessarily to scale, some features may be exaggerated to show details of particular components. In addition, any measurements, specifications and the like shown in the figures are intended to be illustrative, and not restrictive. Therefore, specific structural and functional details disclosed herein are not to be interpreted as limiting, but merely as a representative basis for teaching one skilled in the art to variously employ the present invention. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary, for the understanding and appreciation of the underlying concepts of the present invention and in order not to obfuscate or distract from the teachings of the present invention.

Any reference in the specification to a method should be applied mutatis mutandis to a system capable of executing the method. Any reference in the specification to a system should be applied mutatis mutandis to a method that may be executed by the system.

Throughout the specification and claims, the following terms take the meanings explicitly associated herein, unless the context clearly dictates otherwise. The phrases "in one embodiment," "in an example embodiment," and "in some embodiments" as used herein do not necessarily refer to the same embodiment(s), though it may. Furthermore, the phrases "in another embodiment," "in an alternative embodiment," and "in some other embodiments" as used herein do not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

As will be appreciated by one skilled in the art, the present invention may be embodied as a system, method, computer program product or any combination thereof. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

The invention may be described in the general context of computer-executable instructions, such as program modules, being executed by a computer. Generally, program modules include routines, programs, objects, components, data structures, etc. that perform particular tasks or implement particular abstract data types. The invention may also be practiced in distributed computing environments where tasks are performed by remote processing devices that are linked through a communications network. In a distributed computing environment, program modules may be located in both local and remote computer storage media including memory storage devices.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain or store the program for use by or in connection with the instruction execution system, apparatus, or device.

Computer program code for carrying out operations of the present invention may be written in any combination of one or more programming languages, including an object-oriented programming language such as Java, Smalltalk, C++, C# or the like, conventional procedural programming languages, such as the "C" programming language, and functional programming languages such as Prolog and Lisp, machine code, assembler or any other suitable programming languages. The program code may execute entirely on the user's computer, partly on the user's computer, as a standalone software package, partly on the user's computer and partly on a remote computer or entirely on the remote computer or server. In the latter scenario, the remote computer may be connected to the user's computer through any type of network using any type of network protocol, including for example a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented or supported by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The invention is operational with numerous general purpose or special purpose computing system environments or configurations. Examples of well-known computing systems, environments, and/or configurations that may be suitable for use with the invention include, but are not limited to, personal computers, server computers, cloud computing, hand-held or laptop devices, multiprocessor systems, microprocessor, microcontroller or microcomputer based systems, set top boxes, programmable consumer electronics, ASIC or FPGA core, DSP core, network PCs, minicomputers, mainframe computers, distributed computing environments that include any of the above systems or devices, and the like.

In addition, the invention is operational in systems incorporating video and still cameras, sensors, etc. such as found in automated factories, autonomous vehicles, in mobile devices such as tablets and smartphones, smart meters installed in the power grid and control systems for robot networks. In general, any computation device that can host an agent can be used to implement the present invention.

A block diagram illustrating an example computer processing system adapted to implement one or more portions of the present invention is shown in FIG. 1. The exemplary computer processing system, generally referenced 10, for implementing the invention comprises a general-purpose computing device 11. Computing device 11 comprises central processing unit (CPU) 12, host/PCI/cache bridge 20 and main memory 24.

The CPU 12 comprises one or more general purpose CPU cores 14 and optionally one or more special purpose cores 16 (e.g., DSP core, floating point, GPU, and neural network optimized core). The one or more general purpose cores execute general purpose opcodes while the special purpose cores execute functions specific to their purpose. The CPU 12 is coupled through the CPU local bus 18 to a host/PCI/ cache bridge or chipset 20. A second level (i.e. L2) cache memory (not shown) may be coupled to a cache controller in the chipset. For some processors, the external cache may comprise an L1 or first level cache. The bridge or chipset 20 couples to main memory 24 via memory bus 22. The main memory comprises dynamic random access memory (DRAM) or extended data out (EDO) memory, or other types of memory such as ROM, static RAM, flash, and non-volatile static random access memory (NVSRAM), bubble memory, etc.

The computing device 11 also comprises various system components coupled to the CPU via system bus 26 (e.g., PCI). The host/PCI/cache bridge or chipset 20 interfaces to the system bus 26, such as peripheral component interconnect (PCI) bus. The system bus 26 may comprise any of several types of well-known bus structures using any of a variety of bus architectures. Example architectures include Industry Standard Architecture (ISA) bus, Micro Channel Architecture (MCA) bus, Enhanced ISA (EISA) bus, Video Electronics Standards Associate (VESA) local bus, Peripheral Component Interconnect (PCI) also known as Mezzanine bus, and PCI Express bus.

Various components connected to the system bus include, but are not limited to, non-volatile memory (e.g., disk based data storage) 28, video/graphics adapter 30 connected to display 32, user input interface (I/F) controller 31 connected to one or more input devices such mouse 34, tablet 35, microphone 36, keyboard 38 and modem 40, network interface controller 42, peripheral interface controller 52 connected to one or more external peripherals such as printer 54 and speakers 56. The network interface controller 42 is coupled to one or more devices, such as data storage 46, remote computer 48 running one or more remote applications 50, via a network 44 which may comprise the Internet cloud, a local area network (LAN), wide area network (WAN), storage area network (SAN), etc. A small computer systems interface (SCSI) adapter (not shown) may also be coupled to the system bus. The SCSI adapter can couple to various SCSI devices such as a CD-ROM drive, tape drive, etc.

The non-volatile memory 28 may include various removable/non-removable, volatile/nonvolatile computer storage media, such as hard disk drives that reads from or writes to non-removable, nonvolatile magnetic media, a magnetic disk drive that reads from or writes to a removable, nonvolatile magnetic disk, an optical disk drive that reads from or writes to a removable, nonvolatile optical disk such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like.

A user may enter commands and information into the computer through input devices connected to the user input interface 31. Examples of input devices include a keyboard and pointing device, mouse, trackball or touch pad. Other input devices may include a microphone, joystick, game pad, satellite dish, scanner, etc.

The computing device 11 may operate in a networked environment via connections to one or more remote computers, such as a remote computer 48. The remote computer may comprise a personal computer (PC), server, router, network PC, peer device or other common network node, and typically includes many or all of the elements described supra. Such networking environments are commonplace in offices, enterprise-wide computer networks, intranets and the Internet.

When used in a LAN networking environment, the computing device 11 is connected to the LAN 44 via network interface 42. When used in a WAN networking environment, the computing device 11 includes a modem 40 or other means for establishing communications over the WAN, such as the Internet. The modem 40, which may be internal or external, is connected to the system bus 26 via user input interface 31, or other appropriate mechanism. In some embodiments, the Internet network interface may comprise 3G, 4G or 5G cellular network circuitry. In some embodiments, the network interface may comprise Wi-Fi 6. In some embodiments, the Internet network interface may comprise a UBS Wi-Fi hotspot.

The computing system environment, generally referenced 10, is an example of a suitable computing environment and is not intended to suggest any limitation as to the scope of use or functionality of the invention. Neither should the computing environment be interpreted as having any dependency or requirement relating to any one or combination of components illustrated in the exemplary operating environment.

In one embodiment, the software adapted to implement the system and methods of the present invention can also reside in the cloud. Cloud computing provides computation, software, data access and storage services that do not require end-user knowledge of the physical location and configuration of the system that delivers the services. Cloud computing encompasses any subscription-based or pay-per-use service and typically involves provisioning of dynamically scalable and often virtualized resources. Cloud computing providers deliver applications via the Internet, which can be accessed from a web browser, while the business software and data are stored on servers at a remote location.

In another embodiment, software adapted to implement the system and methods of the present invention is adapted to reside on a computer readable medium. Computer readable media can be any available media that can be accessed by the computer and capable of storing for later reading by a computer a computer program implementing the method of this invention. Computer readable media includes both volatile and nonvolatile media, removable and non-removable media. By way of example, and not limitation, computer readable media may comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computer. Communication media typically embodies computer readable instructions, data structures, program modules or other data such as a magnetic disk within a disk drive unit. The software adapted to implement the system and methods of the present invention may also reside, in whole or in part, in the static or dynamic main memories or in firmware within the processor of the computer system (i.e. within microcontroller, microprocessor or microcomputer internal memory).

Other digital computer system configurations can also be employed to implement the system and methods of the present invention, and to the extent that a particular system configuration is capable of implementing the system and methods of this invention, it is equivalent to the representative digital computer system of FIG. 1 and within the spirit and scope of this invention.

Once they are programmed to perform particular functions pursuant to instructions from program software that implements the system and methods of this invention, such digital computer systems in effect become special purpose computers particular to the method of this invention. The techniques necessary for this are well-known to those skilled in the art of computer systems.

It is noted that computer programs implementing the system and methods of this invention will commonly be distributed to users on a distribution medium such as floppy disk, CDROM, DVD, flash memory, portable hard disk drive, etc. or via download through the Internet or other network. From there, they will often be copied to a hard disk or a similar intermediate storage medium. When the programs are to be run, they will be loaded either from their distribution medium or their intermediate storage medium into the execution memory of the computer, configuring the computer to act in accordance with the method of this invention. All these operations are well-known to those skilled in the art of computer systems.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or by combinations of special purpose hardware and computer instructions.

Neural Network (NN) Processing Core

At a very high-level, an ANN is essentially a function with a large number of parameters, mapping between an input space to an output space. Thus, an ANN can be viewed as a sequence of computations. ANNs, however, have a certain internal structure and a set of properties. Considering this unique structure, the neural network (NN) processor comprises a plurality of basic computation units doing the same or similar mathematical manipulations, which, when combined together make up the neural network.

Figure 2:
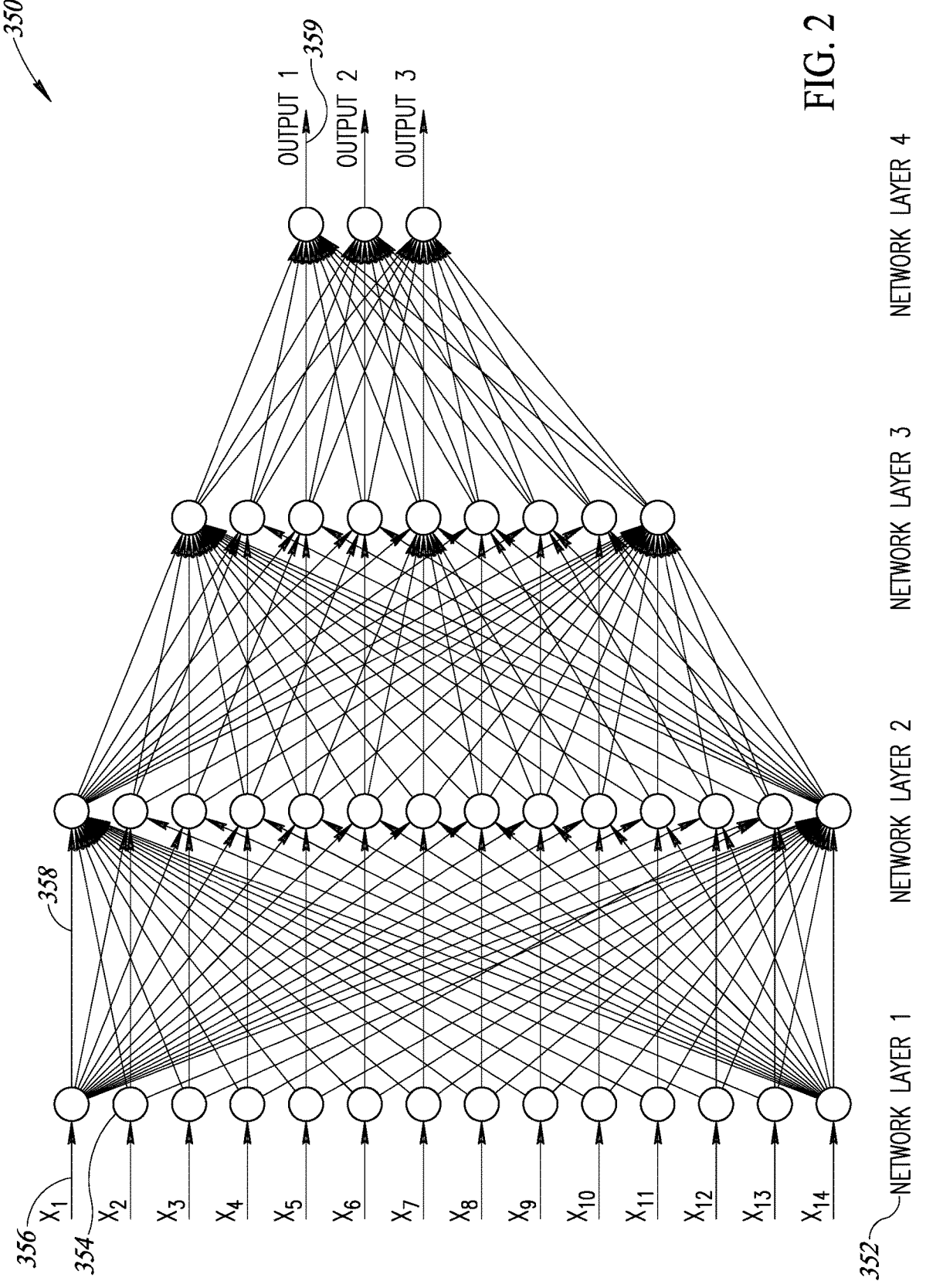
FIG. 2 is a diagram illustrating a first example artificial neural network.

The following set of notations is used herein to uniquely describe the network:

$$ANN \propto \{X^{<S>}, Y^{<T>}, M^{<W>}\} \tag{1}$$

where:
   $X^{<S>}$ represents the input dataset, characterized by a certain structure S;
   $Y^{<T>}$ represents the output dataset with a format denoted by T;
   $M^{<W>}$ represents the ANN model, which, given a set of parameters or weights (W) is a function that maps input to output;

A diagram illustrating an example artificial neural network is shown in FIG. 2. The example ANN, generally referenced 350, comprises four network layers 352, including network layers 1 through 4. Each network layer comprises a plurality of neurons 354. Inputs $X_1$ to $X_{14}$ 356 are input to network layer 1. Weights 358 are applied to the inputs of each neuron in a network layer. The outputs of one network layer forming the input to the next network layer until the final outputs 359, outputs 1 through 3, are generated.

In one embodiment, the architecture of the present invention comprises a multi-layer architecture (i.e. not referred to ANN layers) that addresses the computational needs of an artificial neural network to its full capacity. The term multi-layer refers to an approach similar to that of the well-known ISO OSI-layer model for networking which describes the overall solution at varying levels of abstraction.

Figures 3, 4:
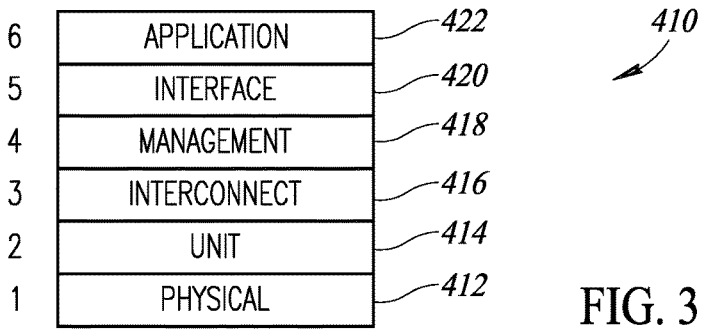
FIG. 3 is a diagram illustrating an example multi-layer abstraction for a neural network processing system.
FIG. 4 is a high-level block diagram illustrating an example SoC based NN processing system comprising one or more NN processing cores.

A diagram illustrating an example multi-layer abstraction for a neural network processing system is shown in FIG. 3. The equivalent model for neural network processing, generally referenced 410, comprises six layers, including: Layer 1 (Physical 412) comprising the physical primitives making up the various units; Layer 2 (Unit 414) comprising the basic computational unit that underlies the neural network; Layer 3 (Interconnect 416) comprising the interconnect fabric that provides the network connectivity; Layer 4 (Management 418) providing network level flow control, monitoring and diagnostics; Layer 5 (Interface 420) providing the application layer interface and mapping to architecture primitives; and Layer 6 (Application 422) comprising the neural network based application.

A high-level block diagram illustrating an example system on chip (SoC) NN processing system comprising one or more NN processing cores is shown in FIG. 4. The SoC NN processing system, generally referenced 100, comprises at least one NN processor integrated circuit (or core) 102 optionally coupled to one or more additional internal or external NN processors 104 via one or more suitable chip to chip interfaces, a bus fabric 106 adapted to couple the NN processor to various system on chip elements 108, microcontroller unit (MCU) subsystem 118, and one or more interfaces 126.

In one embodiment, the SoC 108 includes bootstrap circuit block 110, debug circuit block 112, power circuit block 114, and clock circuit block 116. The MCU subsystem 118 includes a controller circuit block 120, instruction memory 122, and data memory 124. Interfaces 126 comprise a pin multiplexer 139, and one or more well-known interfaces including camera serial interface (CSI) 128, display serial interface (DSI) 130, Ethernet 132, universal serial bus (USB) 134, inter-integrated circuit (I²C) interface 136, serial peripheral interface (SPI) 137, and controller area network (CAN) interface 138. Note that these interfaces are shown as an example, as any combination of different interfaces may be implemented.

Figure 5:
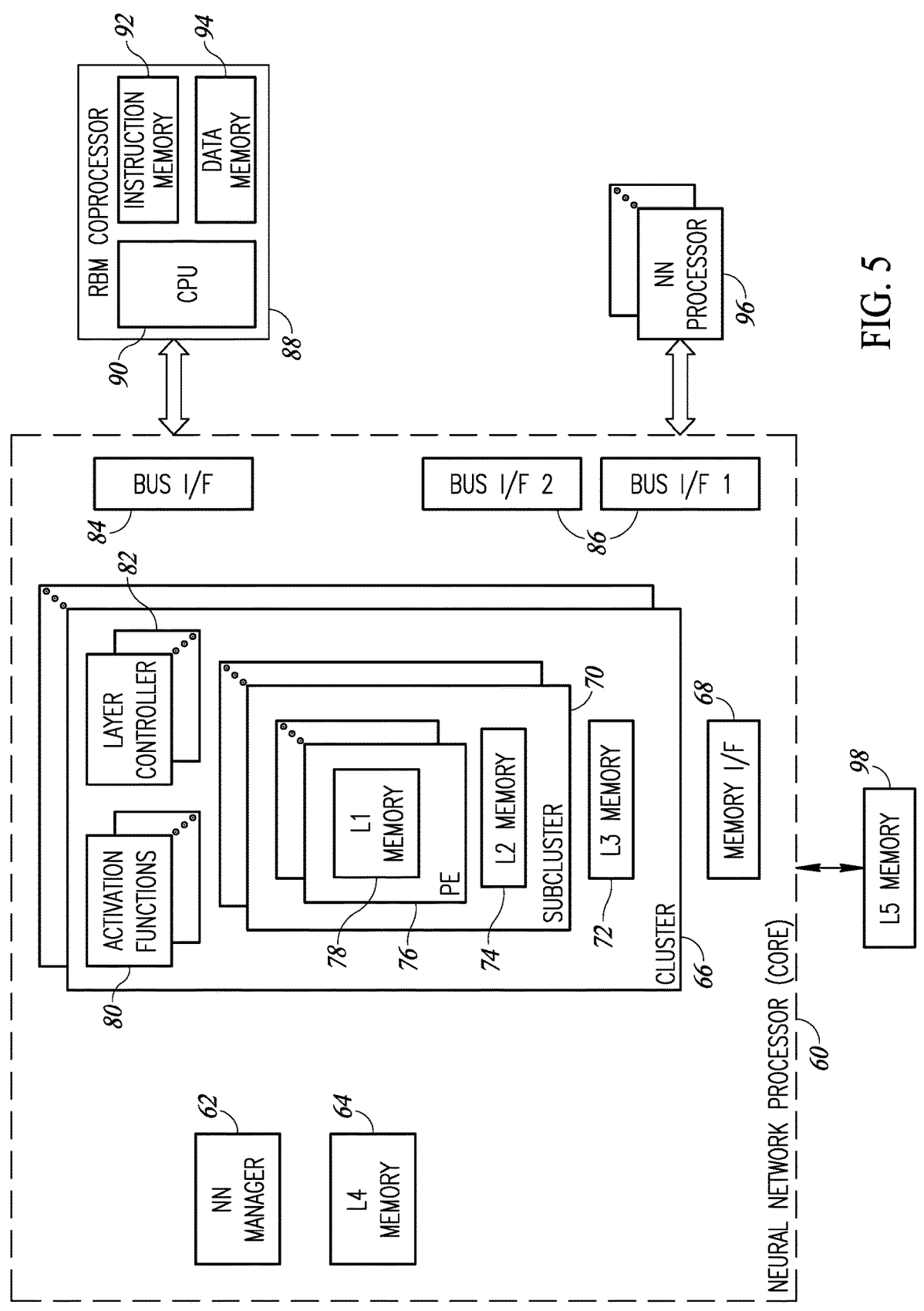
FIG. 5 is a high-level block diagram illustrating an example NN processing core in more detail.

A high-level block diagram illustrating an example NN processing core in more detail is shown in FIG. 5. The NN processing engine or core 60 comprises several hierarchical computation units. The lowest hierarchical level is the processing element (PE) 76 with its own dedicated internal Layer 1 or L1 memory 78 in which individual neurons are implemented. A plurality of N PEs 76 along with dedicated Layer 2 or L2 memory 74 make up the next hierarchical level termed a subcluster 70. A plurality of M subclusters 70 along with dedicated Layer 3 or L3 memory 72, a plurality of activation function circuits 80, and a plurality of layer controller (LC) circuits 82 make up a cluster 66. A plurality of L clusters along with dedicated Layer 4 or L4 memory 64 are in the NN processor core 60 which also comprises NN manager circuit 62, and memory interface 68 to off-chip Layer 5 or L5 memory 98. A plurality of bus interfaces 86 (i.e. chip-to-chip interfaces) couple the NN processor to other off-chip NN processor chips for additional network capacity. Bus interface 84 (i.e. chip-to-chip interface) couples the NN processor to a conventional rule based machine (RBM) co-processor 88 comprising a CPU 90, instruction memory 92 and data memory 94. In an alternative embodiment, the RBM co-processor is optionally coupled to the NN device 60 via a suitable interface, e.g., GPUs, I²C, etc.

Note that in an example NN processor embodiment, a PE comprises P=16 neurons, a subcluster comprises N=64 PEs, a cluster comprises M=64 subclusters, and the NN core comprises L=8 clusters. It is appreciated that the NN processor can be implemented having any desired number of hierarchical levels as well as any number of computation units within each level and is not limited to the examples described herein which are provided for illustration purposes only. In addition, any number of activation functions 80 and layer controllers 82 may be implemented in the cluster level or in any other level depending on the design goals and particular implementation of the NN processor.

In one embodiment, the NN manager 62 is a specialized processor that controls two data pipes: one parallel and one serial along with functions to drive the network fabric. This processor carries out special purpose operations that are native to the control plane of the neural network. Example operations include, but are not limited to, Infer, Train, Load weights, and Update weights. Load balancing and resource allocation are handled by an external software tool chain, which includes a set of tools including a compiler, mapper, and allocator, that address these tasks.

In one embodiment, the NN processor includes shared memory for the storage of weights and dedicated memory elements are for storing contexts thereby enabling relatively high data processing bandwidth. In addition, the NN processor includes data and control planes that are strictly separate from each other and that provide out of band control to the computation elements. Moreover, the NN processor includes a configurable interconnect between aggregation levels to yield a dynamic and programmable data pipeline.

In another embodiment, the NN processor is capable of implementing multiple ANNs in parallel, where each ANN has one or more network layers. The NN processor is adapted to simultaneously process one or more input data streams associated with the ANNs. Since the architecture of the NN device resembles the structure of an ANN, multiple ANNs can be viewed as a single wide ANN. Note that when deploying multiple ANNs, given enough resources, the mapper in the external tool chain is operative to map available resources while the NN manager governs event triggers. In this case, due to the enormous parallelism of the device, each set of resources grouped within a 'layer' of the ANN is independent from each other.

In addition, the computation elements of the NN processor are operative to function at any desired granularity of a subset of the input data stream thereby trading off memory element usage versus latency, as described in more detail infra.

The NN processor of the present invention uses several design principles in its implementation including: (1) just in time usage of system resources; (2) dynamic allocation of system resources per need; (3) leveraging both the time-domain and the space-domain to optimize utilization and efficiency; and (4) balanced load over available system resources.

Note that the present invention is well suited to implement ANNs. Typically, ANNs are implemented in three stages: modeling, training, and inference, all three of which are addressed to some extent by the NN processor of the present invention.

Regarding modeling, the NN processor is capable of altering the model representation statically and dynamically thus reflecting its flexible nature. The 'processor' notation is used as opposed to an 'accelerator' since the latter is typically adapted a priori to exercise a predefined set of operations. Regarding training, the NN processor supports on-the-fly and complementary training operations that allows implementation of the training procedure. This includes: (1) running back and forth through the network (i.e. backpropagation); (2) dynamically applying dropout; and (3) on-the-fly evaluation of layer performance and ill behavior detection. During the inference mode, the ANN is executed optimally and efficiently and is applied to new inputs.

The NN processor of the present invention combines several features that combine together to provide extremely high computation rate, small chip footprint, low power consumption, scalability, programmability, and flexibility to handle many types of neural networks.

A first feature comprises the compute fabric (or compute capability) provided by the computation units that are organized into various aggregation levels or hierarchical levels, such as PEs, subclusters, clusters, NN cores as described in the example system disclosed herein. The compute fabric comprises the basic compute elements that are configured to address the special nature of the computational needs of ANNs. Several features of the compute fabric include: (1) a lean circuit architecture thereby allowing a relatively large number of physical entities to be implemented; (2) a large number of multiply and accumulate operations at once, where additions are performed as accumulations; (3) flexibility of number representation, including integer and floating point as well as different bit widths; (4) quad-multiplier support allowing for higher resolution computations; and (5) N-way ALU support to provide the capability of optimizing memory bandwidth, i.e. instead of performing a single operation per cycle such as $y \leftarrow y + w^* x$, a more complex operation such as $y \leftarrow y + w_1 * x_1 + w_2 * x_2$ can be implemented which reflects a trade-off between an increase in silicon complexity and reduced memory access required.

A second feature is the control plane and the strict separation of the control fabric from the data fabric which enables aggregation of control as well as very 'lean' or 'slim' control of the entire data fabric (i.e. data plane). The control plane is separate from the data plane and thus it can be aggregated in the sense that a large number of compute units are controlled using relatively few control lines, e.g., by a single control line in some cases. For example, considering the multiply circuits in the PEs, a single control signal initiates the multiply operation in thousands of PEs at the same time. Further, the programmability of the control plane is separate from the programmability of the data plane. The massive parallelism of the data fabric of the NN core is matched by the lean structure of the control plane.

This is in contrast to the typical prior art approach of in-band control where control signals are applied in close proximity to the data which require the replication of the control signals by the number of compute elements. Furthermore, out-of-band control is in contrast to traditional microcontroller based techniques as it is not a Von-Neuman machine based technique.

Another advantage of the separation of control and data fabric is that the control remains programmable. The non-rigid implementation of the control fabric and the general nature of the computation units (i.e. PEs, subclusters, clusters, etc.) allows the NN core to handle numerous types of ANNs, such as convolutional NNs (CNNs), recurrent NNs (RNNs), deep NNs (DNNs), MLPs, etc., as well as more intricate implementations of the above and subtle combinations and properties of each, e.g., stride, padding, etc. implemented in convolutional modes.

A third feature is the structure of the memory fabric including memory windowing. In addition to the localization and hierarchical structure of the memory, high bandwidth access to the memory is provided in parallel to a large number of computation units. This is achieved by narrowing access for a particular computation unit to only a small portion of the memory. Thus, full random access to the entire memory is not provided. Rather, access to only a relatively small window of memory is provided. This allows simultaneous access across thousands of computation units, thus representing a tradeoff between bandwidth and random accessibility. Since a single compute unit memory access pattern is structured and well-defined by the ANN and does not require full random access to the entire memory, access can be 'windowed' to only those few memory blocks required for that particular compute unit. Thus, extremely high memory bandwidth is achieved whereby thousands of compute units can access memory simultaneously in parallel with the tradeoff being access only to memory that is 'local' to the compute unit.

In one embodiment, the architecture of the NN processor comprises a control plane and a data plane (or control fabric and data fabric). The control plane is responsible for configuring and controlling all the data computation units in the NN processor. It comprises a dataflow machine or processor incorporating, in one embodiment, microcode tailored for neural network operations. In the example NN processor described herein, the control plane governs the cluster entities 66 which functions as an aggregator for the next layer of aggregation, i.e. the subcluster 70. The subcluster, in turn, comprises the most basic units, namely the processing elements (PEs) 76 which are composed of a multiply and accumulate (MAC) circuit and local memory. It is the PE hierarchical level that contains a set of neuron entities found in a typical neural network.

An important aspect of implementing an ANN in the NN processor is the control and interconnect of all the compute elements. The very large number of compute elements in an ANN is leveraged by the present invention. One feature of the device control fabric is that it is relatively very lean since it is shared among a large set of compute resources. In one embodiment, the NN processor features (1) strict separation between data and control, where the control signaling is performed out of band and does not include any data driven memory access; (2) dynamic mapping between control and attached compute resources; and (3) flexibility and programmability of the control fabric (i.e. at compile time). In addition, the NN processor includes layer controllers incorporating microcode machines that allow full accessibility to the control signaling of the computational elements, memory etc.

Note that data driven memory access denotes access that involves observation of the data that flows through the data pipeline. The NN processor does not require this. Note that data driven memory access is common in rule based machines since the nature of the rules is data dependent and thus control must be intertwined with data. For example, consider the statement: if (x>some_value) then do A. This implies the need to observe every input 'x'. In contrast, consider a machine that compares many inputs with a threshold. The microcode in this case only needs to trigger an operation that applies a massive set of comparators. Such an approach, however, cannot be taken in an RBM because it implies a huge number of operations that must be hard-wired which negates the possibility of programing the machine.

The NN processor, in contrast, operates on data using a very limited set of operations. The nature of the processing flow does not involve the value of the data. Thus, it is possible aggregate control and drive an enormous set of compute elements with relatively few control signals. For example, in the NN device, a control bus of 64 control signals is needed to control thousands of compute units.

In one embodiment the NN processor is implemented such that functionality is provided at several points of aggregation where it is needed, as described in more detail infra. In addition, the NN processor is configured to be substantially balanced in terms of compute and memory resources to ensure the system achieves maximal utilization.

In the event that the capacity of the NN processor is insufficient for a particular neural network, bus interfaces 86 provide for interconnecting additional NN processors 96 to extend beyond the limitations of a single processor.

In one embodiment, an RBM coprocessor subsystem 88 is configured to support one or more primitives that are not supported by the NN processor. In addition, the coprocessor functions to exchange tasks extracted from the ANN and assigned to the RBM.

The NN processor essentially operates as a dataflow machine meaning that the calculations are executed based solely upon the availability of data. The data flow is divided between layers, which are analogous to the layers in the ANN. The computation units inside a layer act synchronously, starting when data is ready at the layer's input and ending when they need new data and/or need to pass results to the next layer, at which point the layer's state machine synchronizes with the previous and/or next layer's state machine.

As an example, an MLP network with two dense layers can be mapped as (1) one layer which receives input from outside the core, (2) two layers which represent the neural network layers, and (3) one layer which sends the result outside the core.

In one embodiment, the input layer waits until it receives all the inputs (e.g., 784 inputs for the well-known MNIST data set), and then signals layer 1 that its input is ready. Layer 1 then performs all the required multiply and accumulate (MAC) operations, the activation function, and finally signals to layer 2, which in turn repeats the same steps. When layer 2 is finished, it signals to the output layer to send the results outside the NN core.

In another embodiment, considering the same network, the NN core starts the MACs in layer 1 on a smaller portion of input data, thus reducing the buffering required between the input layer and layer 1, at the expense of complexity of the state machine in layer 1 and possibly loss of compute efficiency during signaling.

Figure 11:
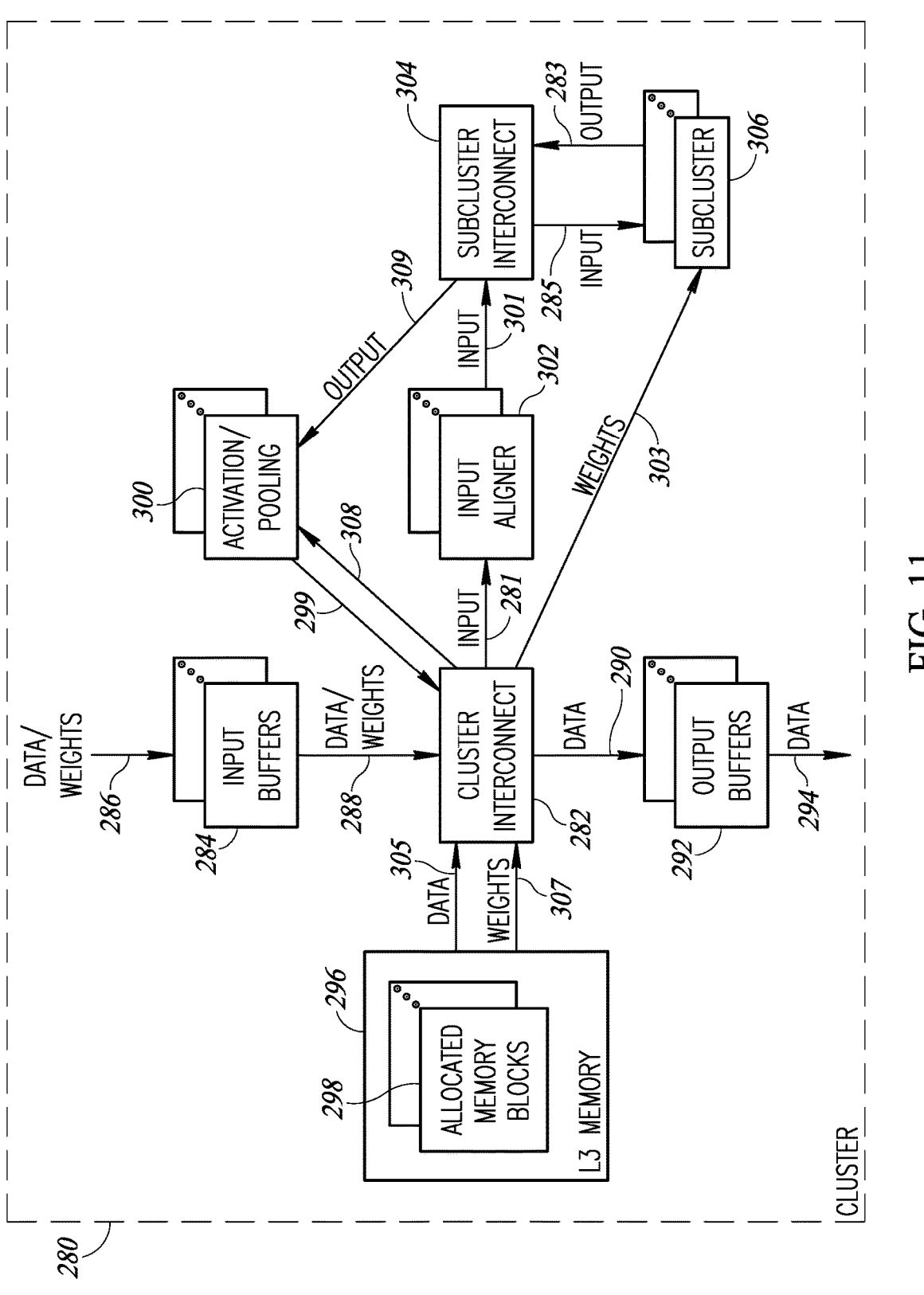
FIG. 11 is a high-level block diagram illustrating a second example cluster in more detail.

Inside the clusters 66 in the NN core, data is passed through shared L3 memory 72, while the signaling is performed through a dedicated interconnect 282 (FIG. 11). In one embodiment, the AXI4-Stream protocol is used between clusters, which handles both data and control planes. To prevent stalls, the interconnect between the layers provides a dual buffer mechanism, so that one layer writes its output to one buffer as the second layer reads the previous output as its input from the second buffer.

In one embodiment, the use of the dataflow architecture together with a relatively limited set of basic operations in neural networks enables a significant reduction in the requirements of control distribution.

Firstly, much of the information regarding the computation being performed is statically known once the network model is defined and can therefore be loaded via a narrowband interface a priori, thus reducing the number of control lines required during computation. The result is that the code for the 'kernels' which implement layers is divided between quasi-static configuration that are constant per network model and dynamic instructions which change throughout the computation.

Secondly, each dynamic 'instruction' actually comprises multiple instructions instructing all the compute elements in a layer what to do in each cycle. As each compute element has relatively simple functionality, the basic instructions themselves are relatively simple. Repetitions (i.e. loops) and jump instructions are provided out of band, to avoid wasting cycles.

Thirdly, the static order of computations combined with an appropriate arrangement of parameters in memory enables sequential access to memory. Therefore, only address increment instructions to access memory are required rather than full addressing.

Fourthly, since the microcode is very compact, it can reside in on-chip SRAM without the need for prefetch, branch prediction, etc.

Fifthly, although a layer comprises many processing elements (PEs), only one central state machine is needed to control the steps of the computation for the entire layer along with smaller slave state machines which store only a substate, with each of them controlling multiple PEs. In one embodiment, a global enable bit starts execution of all the state machines, and a global synchronous reset signal returns them to an initial state. Note that reset has no effect on the configuration memory and the data memory as the control plane ensures that no invalid data is used.

Note that the term 'model' is used to describe a quasi-static configuration which defines the dynamic behavior of all the compute units in the NN core. A model is typically analogous to an ANN model, but there may be other types of models, such as a model loaded for debug purposes or for loading weights into memory.

The configuration space is exposed in a memory-like interface, where modules are addressed using a hierarchical address space. Weights loading is normally performed before the configuration of the model and is achieved by configuring control signaling which copies the weights into the relevant memory blocks and sets the enable bit. The inference model is then loaded while the cluster is disabled, the control is reset and finally the cluster is enabled.

Memory Hierarchy

In one embodiment, the memory fabric of the NN processor is designed to address the inherent nature of ANNs. Thus, the memory is structured in a hierarchical manner in order to address the needs of the various memory consumers. These consumers include: (1) inter-layer data (i.e. cross layer input/output); (2) intra-layer information (i.e. contexts or intermediate results); and (3) weights. The various memory layers (e.g., five in the example embodiment disclosed herein), go from smaller, efficient, more localized memory to larger, less efficient, global memory.

In one embodiment, the memory fabric is organized and constructed utilizing the following: (1) localization of memory where computing elements require access to local data which permits accessibility of any given computing element to a predefined and limited memory entity; (2) structured organization whereby memory content is organized a priori in a given consistent matter; (3) limited recall nature (i.e. read once) where most of the data is volatile by nature and once processed, is fully consumed with limited or no need for further access to it; and (4) pipelined operation there where the output data of one compute element serves as the input data to another compute element.

As described supra, each hierarchical level contains its own local memory. PEs comprise L1 memory, subclusters comprise L2 memory, clusters comprise L3 memory, NN cores comprise L4 memory, and L5 memory is located externally off-SoC. An example memory hierarchy is presented below in Table 1.

TABLE 1

| Memory Hierarchy | | | | | | |
|---|---|---|---|---|---|---|
| | | | | Usage | | |
| Memory Level | Location | Size [Bytes] | Bandwidth [Bytes/Transaction] | Contexts | Weights | Input Data |
| L1 | PE | Baseline (B) | L*M*N*2 | X | | |
| L2 | Subcluster | B*512 | L*M*16 | X | | X |

TABLE 1-continued

| | | | Memory Hierarchy | | | |
| | | | | | Usage | |
| Memory Level | Location | Size [Bytes] | Bandwidth [Bytes/Transaction] | Contexts | Weights | Input Data |
| --- | --- | --- | --- | --- | --- | --- |
| L3 | Cluster | B*1024*128 | L*128 | | X | X |
| L4 | NN Core | B*512*128 | 128 | | X | X |
| L5 | External to SoC | B*1024*2048 | 0.5 | | (X) | (X) |

Where N represents the number of processing elements in a subcluster, M is the number of subclusters in a cluster, and L is the number of clusters in the NN processor device. Note that the size indicated for each memory level L1 through L5 are for illustration purposes only. It is appreciated that any desired memory size for the various memory layers may be implemented without departing from the scope of the invention.

Note that the lower memory layers, e.g., L1 in the PE, are smaller sized but carry the larger bandwidths. The upper memory layers, e.g., L4 in the NN core, are much larger sized by carry far less traffic.

In accordance with the invention, as much memory as possible is kept as close as possible to where it is needed while utilizing the localized nature of memory usage in ANNs to avoid providing full mesh access between the entire memory and the compute elements. To overcome the restrictions imposed by the above strategy, the allocation of memory to consumers is done in a 'gradual' way, such that each level of memory having a specific role is complemented by a higher level as it requires more resources, where the higher level memory is used for 'resource load balancing' between multiple layers in the ANN which have different requirements.

Note that in one embodiment this 'spillover' is a quasi-static feature, as the resource requirements are already known once the model is selected, and thus does not require complex arbitration. This feature allows the static allocation of a significantly lower amount of memory resources in each layer since they are allocated according to the nominal case rather than the worst case.

In addition, the 'gradual' allocation of memory also features a sliding window mechanism, described briefly supra, which is used in L3 memory and described in more detail infra.

Processing Element (PE)

Figure 6:
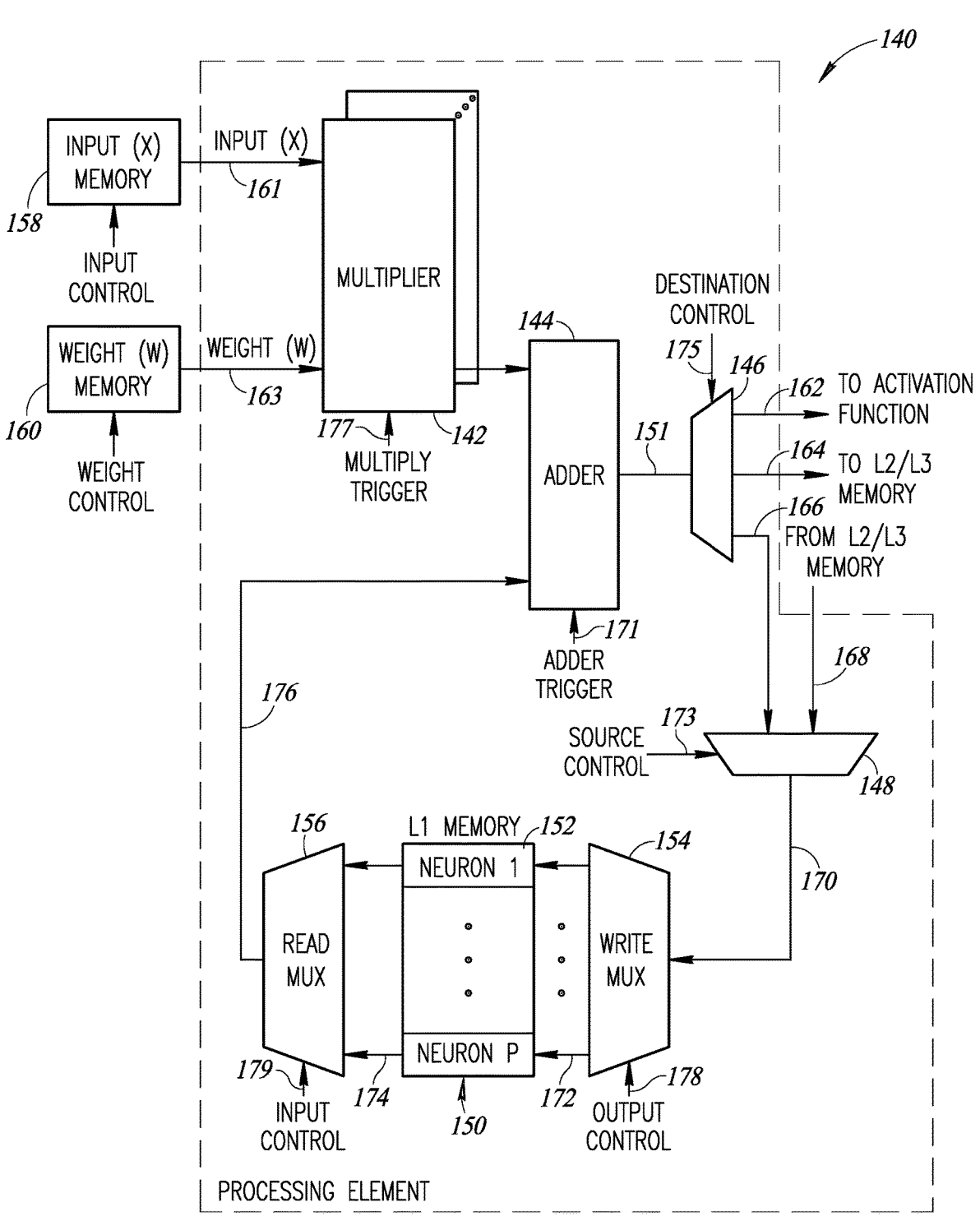
FIG. 6 is a block diagram illustrating a first example low-level processing element (PE) in more detail.

In one embodiment, the basic compute unit is the processing element (PE). A block diagram illustrating an example low-level processing element (PE) in more detail is shown in FIG. 6. The PE, generally referenced 140, comprises one or more multipliers 142 controlled by multiply trigger 177, an adder 144 controlled by adder trigger 171, L1 memory 150 comprising a plurality of registers 152, destination multiplexer 146 controlled by destination control 175, source multiplexer 148 controlled by source control 173, write multiplexer 154 controlled by output shuffle control 178, and read multiplexer 156 controlled by input shuffle control 179.

Input (x) data 161 from input memory 158 and weights (w) 163 from weight memory 160 are provided to the multiplier(s) 142 in accordance with an input control and weight control, respectively.

The most basic mathematical operation of a neuron in a neural network is defined by the following:

$$y_j = \sigma\left(\sum_{i=0}^{N-1} w_{i,j} \cdot x_i\right) \tag{2}$$

where:

denotes the input dataset, organized into a 1D vector;

denotes the weight representing $i^{th}$ input contribution to output j;

$\sigma$ denotes the activation function, typically a nonlinear scalar function;

The basic compute unit is a PE and comprises a multiply/accumulate entity that reflects the intrinsic operation of a neuron. The intermediate result or outcome is stored in L1 memory 150 which is local to the PE. The L1 memory has a certain depth and width, e.g., number of neurons P=16, each of which is 16 bits wide, in the example described herein. It is appreciated that L1 memory having any desired depth and width may be used. The depth P of L1 memory reflects the number of simultaneous 'neurons' or 'contexts' a PE can handle. Note that more than P neurons (i.e. contexts) can be handled by storing intermediate results for additional neurons in L2/L3 memory. Latency is impacted in that additional time is required to process the additional neurons. Providing P neurons leverages both the spatial domain by limiting the computational construct to the bare minimum, while also leveraging the time domain by storing multiple contexts.

The capability of handling internal context provides for a number of capabilities such as: (1) the ability to assign multiple logical neurons to a single physical neuron (each context stores the output of one neuron); (2) storing multiple intermediate results for the same input resulting in simultaneous operations, and hypothesis testing for different versions of weights (e.g., backpropagation results, correction values based on gradients, etc.); (3) multithreaded inference of the same inputs for the purpose of applying common methodology of a network committee and a majority vote extraction; (4) running multiple networks if resources are available; and (5) load balancing based on overall network capacity as governed by an NN manager.

Figure 20:
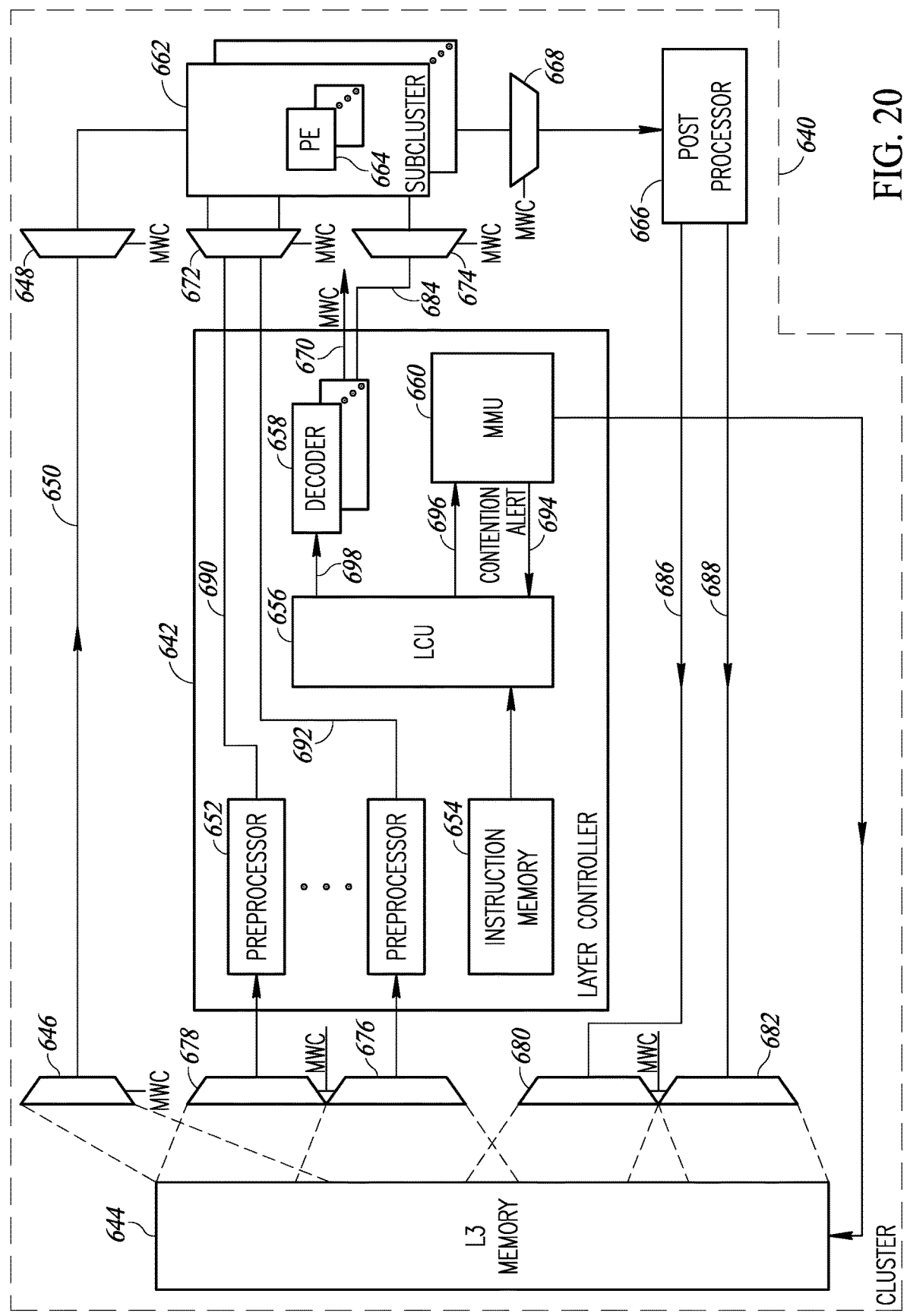
FIG. 20 is a high-level block diagram illustrating the layer controller interface to L3 memory and subclusters in more detail.

In operation, Equation 2 above reflecting neuron functionality is spread over multiple time instances and implemented as provided below in Listing 1. Note that this is an example implementation only as other sequences may be used by loading different microcode to the layer controllers (LCs) 642 (FIG. 20).

Listing 1: Neuron functionality

```
@ time t = 0:
  Set default value based on subcluster control signal as follows:
    • Ctrl = load_zero:   y ← 0
    • Ctrl = load_bias:   y ← L2/L3 [@bias_address]
    • Ctrl = load_same:   y ← L1 [@same_address_index]
    • Ctrl = load_cont:   y ← L2 [@next_address_index]
    • Ctrl = load_other:  y ← L3 [previous_layer_neuron_index]
@ t = 1...P–1:
  Apply calculation according to configured representation, based
  on subcluster ctrl.
  Target is stored in place unless otherwise indicated by control signals.
          y ← y + w * x
    • '*' is implemented as a multiplier with control signals for
    representation type
      • '+' is implemented as an adder with control signals for
      representation type
  Update weight according to the control scheme:
        w ← (ctrl = weight_update) & read_next (base, offset)
  Update input according to the control scheme:
        x ← (ctrl = input_update) & read_next (base, offset)
@ t = P:
  Apply activation function unless bypassed; activation type determined
  through control
  Destination is pre-configured and auto-determined by activation
        z ← (ctrl = bypass_activation) & activation_func ( y, type )
```

With reference to FIG. 6, the PE comprises separately controlled counting elements for the weights (w) and inputs (x) as well as separate control over the representation format for the adder and multiplier. It also comprises separately controlled ingress/egress L1 entry index, allowing the order of calculations to be manipulated. The intermediate results of the accumulation function are stored locally in the L1 memory registers 152. In addition, pre-processing during initialization enables L1 memory to be pre-loaded with default values (e.g. prior intermediate results, bias values, etc.). The PE also includes intermediate memory aggregation control, i.e. allocation step size. In addition, activation functions are aggregated to minimize area overhead and not implemented at the PE or subcluster level but rather at the cluster level. The PE also supports activation bypass to permit concatenation.

Pre-synthesis configurability allows for: (1) N-way multiply and accumulate (i.e. $Y=Y+A_1*B_1+ \ldots +A_N*B_N$); (2) representation format span (e.g., support for $k_0 \ldots k_N$ bits per entry with m-bit mantissa and e-bit exponent, where k=m+e); and (3) selection of local storage depth P.

In operation, the data flow within the PE is fairly flexible. The output 151 of the adder 144 can be steered via destination mux 146 using destination control 175 to either (1) the activation function via path 162; (2) to L2 or L3 memory via path 164; or (3) to the source mux 148 via path 166. The source mux 148 selects via source control 173 either (1) the output from the adder; or (2) an intermediate result from L2 or L3 memory 168. The write mux selects via output shuffle select 178 one of the neuron registers 152 to write the output of the source mux to via one of P paths 172. The data written to the L1 memory typically comprises intermediate results generated as a result of the multiply and accumulate operations performed over many cycles.

Data is read out of the L1 memory via one of P paths 174 connecting the neuron registers to the read mux 156 and selected via input shuffle control select 179. The output 176 of the read mux forms one of the two inputs to the adder 144. The other input to the adder being the output of the multiplier 142. Note that in the event multiple multipliers 142 are implemented, a pre-adder (not shown) functions to add the outputs of the multipliers to generate a single sum that is then input to the adder 144.

Figure 7A:
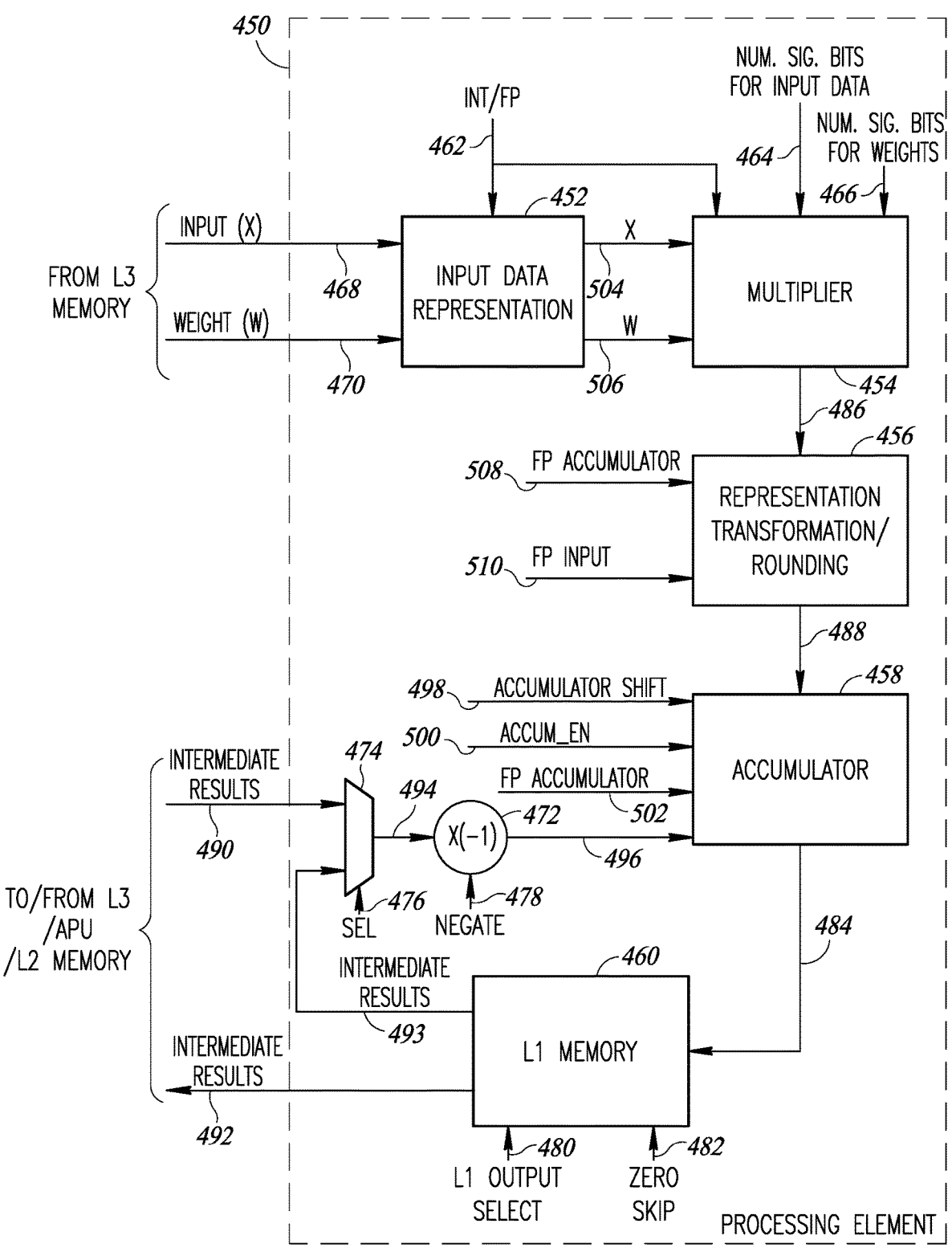
FIG. 7A is a block diagram illustrating a second example low-level processing element (PE) in more detail.

A block diagram illustrating a second example low-level processing element (PE) in more detail is shown in FIG. 7A. As described supra, the PE is the most basic compute element of the NN processor. The neurons of the ANN are implemented in the PE, essentially in the L1 memory. The processing element, generally referenced 450, comprises an input data representation circuit 452, multiplier circuit 454, representation transformation/rounding circuit 456, accumulator (i.e. adder) 458, L1 memory 460, negate circuit 472, and multiplexer 474.

In operation, input data (X) 468 and weights (W) 470 are input from L3 memory to the input data representation circuit 452. This circuit is operative to transform the representation of the input data and/or weights from integer to floating point (FP) format and vice versa in accordance with an INT/FP signal 462 which is also input to the multiplier. The resulting X 504 and W 506 are input to the multiplier 454. Note that either of the two PE embodiments shown in FIGS. 6 and 7A may be used in the NN device of the present invention.

In one embodiment, the multiplier comprises several multipliers that operate in parallel. The multiplier is capable of multiplying both integer and floating point numbers. The number of significant bits for the input data and weights can also vary as set by the control inputs 464, 466, respectively. The product output of the multiplier 486 is input to the representation transformation/rounding circuit 456. FP accumulator and FP input control inputs 508, 510, respectively, signal circuit 456 whether the product is integer or FP format. In addition, the circuit 456 functions to perform rounding of the product before input to the accumulator.

The output 488 of circuit 456 is input to the accumulator (adder) 458. The second input to the accumulator 496 comprises either a context (i.e. intermediate result) 490 from L2 or L3 memory or the output of local L1 memory 460. Multiplexer 474 selects between the two in accordance with SEL 476. The output 494 is input to a negate circuit 472 where, in accordance with a Negate control 478, the output 496 is negated before being input to the accumulator.

Additional configuration controls to the accumulator include an accumulator shift signal (accumulator shift) 498, accumulator enable (accum_en) 500, and FP accumulator 502. The output 484 of the accumulator is written to the L1 memory. The L1 memory also includes L1 output select 480 and zero skip 482. Intermediate results (i.e. contexts) output from the L1 memory are either input to the accumulator via path 493 or written to L2 or L3 memory via path 492. In one embodiment, accumulated (i.e. intermediate) results are written to and read from L1 memory sequentially, i.e. there is no random access to the neuron registers in L1 memory. Note that L1 memory may be accessed using any suitable predefined pattern other than randomly, e.g., sequential (one by one), skip one, skip two, etc. This greatly simplifies the addressing required to access the neuron registers. In addition, access to and from L2 and L3 memory layers is provided in the event not enough local L1 memory is available for a particular ANN. In this case, intermediate results are stored in higher memory layers to accommodate the particular ANN. The tradeoff, however, is increased latency in accessing the higher memory layers.

Figure 7B:
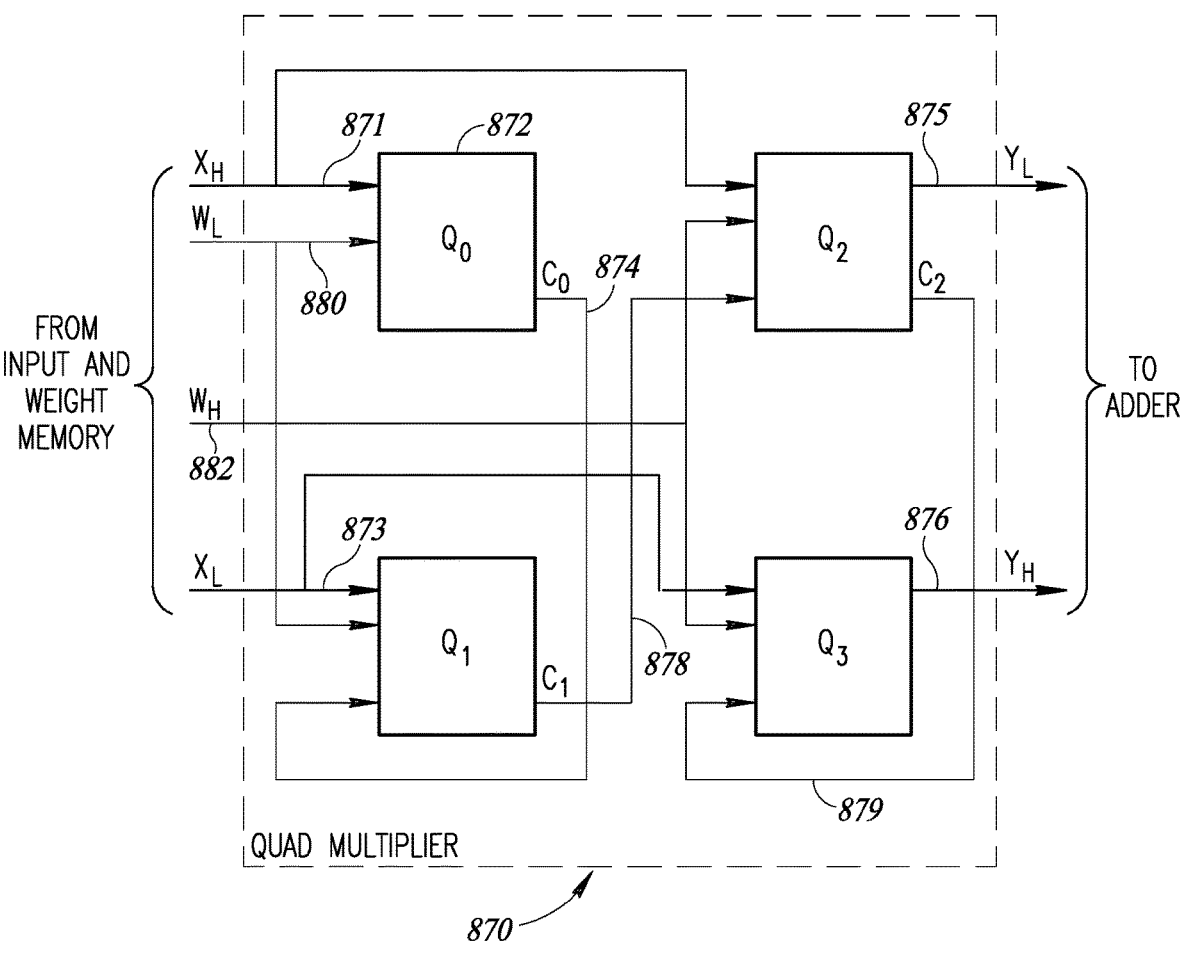
FIG. 7B is a block diagram illustrating the quad multiplier of the PE in more detail.

In an alternative embodiment, a higher precision multiplication (e.g., 16-bit) is performed by combining four low precision (e.g., 8-bit) multipliers to generate a high (or double) precision (e.g., 16-bit) product. A block diagram illustrating the quad multiplier of the PE in more detail is shown in FIG. 7B. The quad multiplier, generally referenced 870, comprises four lower precision (e.g., 8-bit) multipliers 872, $Q_0$, $Q_1$, $Q_2$, and $Q_3$. The input to the quad multiplier is a double precision input X made up of two low precision (e.g., 8-bit) values, namely $X_L$ 873 and $X_H$ 871, and a double precision weight W also comprising two low precision (e.g., 8-bit) values, namely WL 880 and $X_H$ 882.

In operation, each basic unit Q' receives a low precision (e.g., 8-bit) W and X value and based thereon, the quad multiplier circuit generates the result Considering double precision X and W values, we denote the upper and lower parts of weights, input data and output as $W_H$ 882, $X_H$ 871, $Y_H$ 876 and WL 880, $X_L$ 873, $Y_L$ 875, respectively. Three carries $C_0$ 874, $C_1$ 878, and $C_2$ 879 are generated as well.

Expanding into $$(Y_H \ll 16 + Y_L) \leftarrow (W_H \ll 8 + W_L) * (X_H \ll 8 + X_L) \qquad (3)$$

yields the following $$Y_L \leftarrow W_L * X_L + [(W_L * X_H + W_H * X_L) \ll 8]_L + C_0 \ll 9 \qquad (4)$$

and $$Y_H \leftarrow W_H * X_H + [(W_L * X_H + W_H * X_L) \ll 8]_H + C_1 \ll 9 + C_2 \ll 9 \qquad (5)$$

Note that each output $Y_L$ and $Y_H$ represents a 16-bit number to yield a 32-bit multiplication product Y. It is appreciated that results of greater precision can be obtained using additional multipliers and suitable combination of input, weight and carry components.

Subcluster

Figure 8:
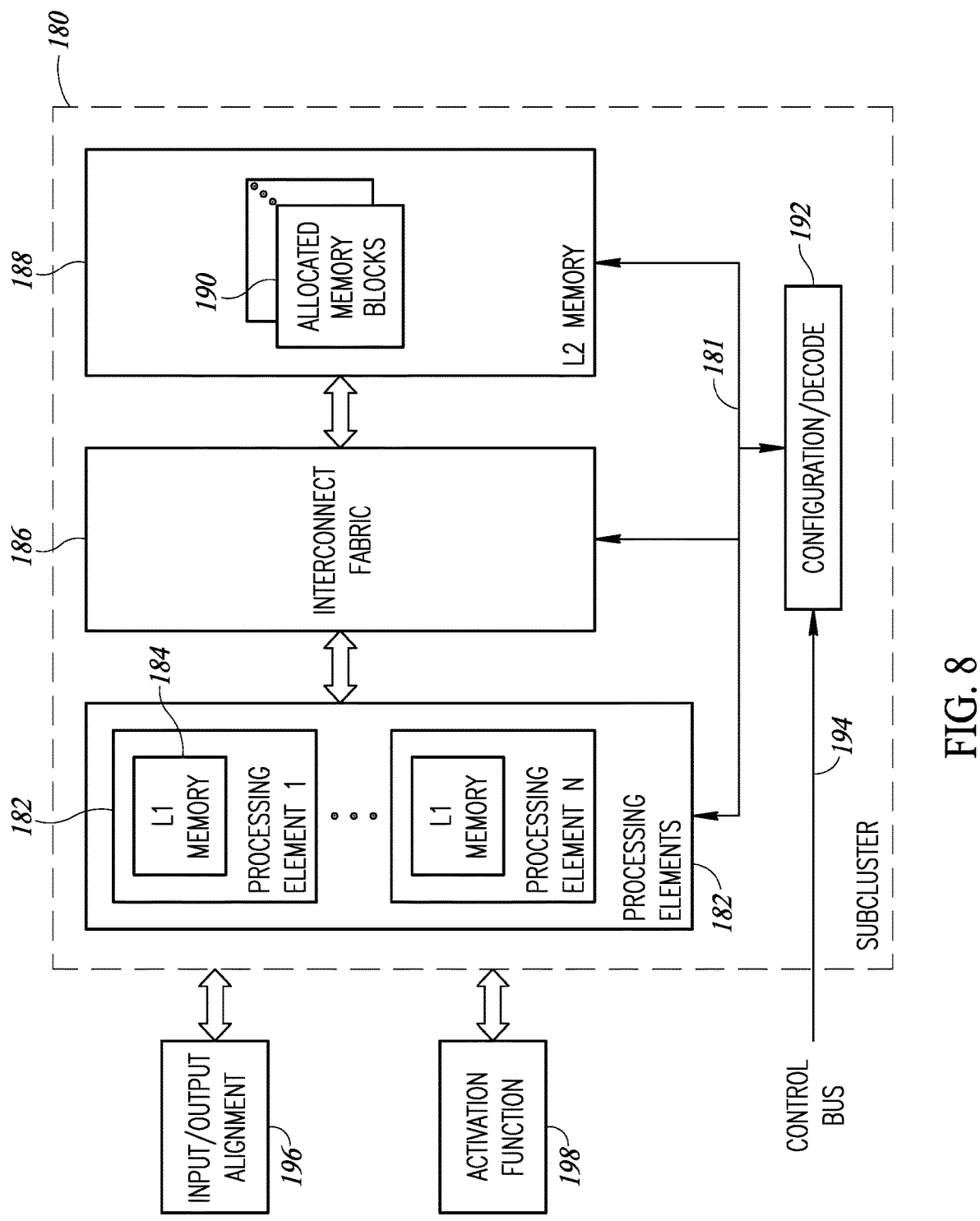
FIG. 8 is a high-level block diagram illustrating a first example subcluster in more detail.

A high-level block diagram illustrating a first example subcluster in more detail is shown in FIG. 8. The subcluster, generally referenced 180, comprises a plurality of N PEs 182, each individual PE 182 including local L1 memory 184, interconnect fabric 186, dedicated local L2 memory 188 portioned into a plurality of allocated memory blocks 190, configuration and decode block 192, and control/data signals 181. The configuration/decode circuit 192 receives instructions from an external control bus 194. Each subcluster 180 also communicates with input/output alignment circuit 196 and activation circuit 198 which in the example embodiment presented herein are located in the cluster hierarchy level, as described in more detail infra.

In one embodiment, the function of the subcluster is to aggregate a plurality of N PEs, e.g., N=64. All PEs in a subcluster belong to the same layer of a neural network which greatly simplifies the control logic required. For example, apart from a static configuration a priori, control of cycle-by-cycle operation is not needed.

In addition, the subcluster encapsulates the next level of memory hierarchy, i.e. the L2 memory layer that stores interlayer and intermediate results. In one embodiment, it also includes the activation function circuits (i.e. represented by in Equation 2 supra). For efficiency, however, the example NN core moves the activation function to the cluster level. The activation function, regardless of its location receives the outputs of the neurons and is triggered once per N multiply and accumulate operations. Note that the number and location of the activation function circuits are selected to reflect optimal utilization of hardware.

Several features of the subcluster include: (1) a distributed control scheme to manage memory access; (2) dynamic allocation of L2 memory for weights and intermediate results; (3) inherent intermediate results shuffling support to seamlessly augment L1 memory; (4) layer-centric information and diagnostics storage; (5) layer-centric pre-processing; (6) layer-centric post-processing; and (7) in-layer split support (e.g., for quantization segmentation).

Figure 9:
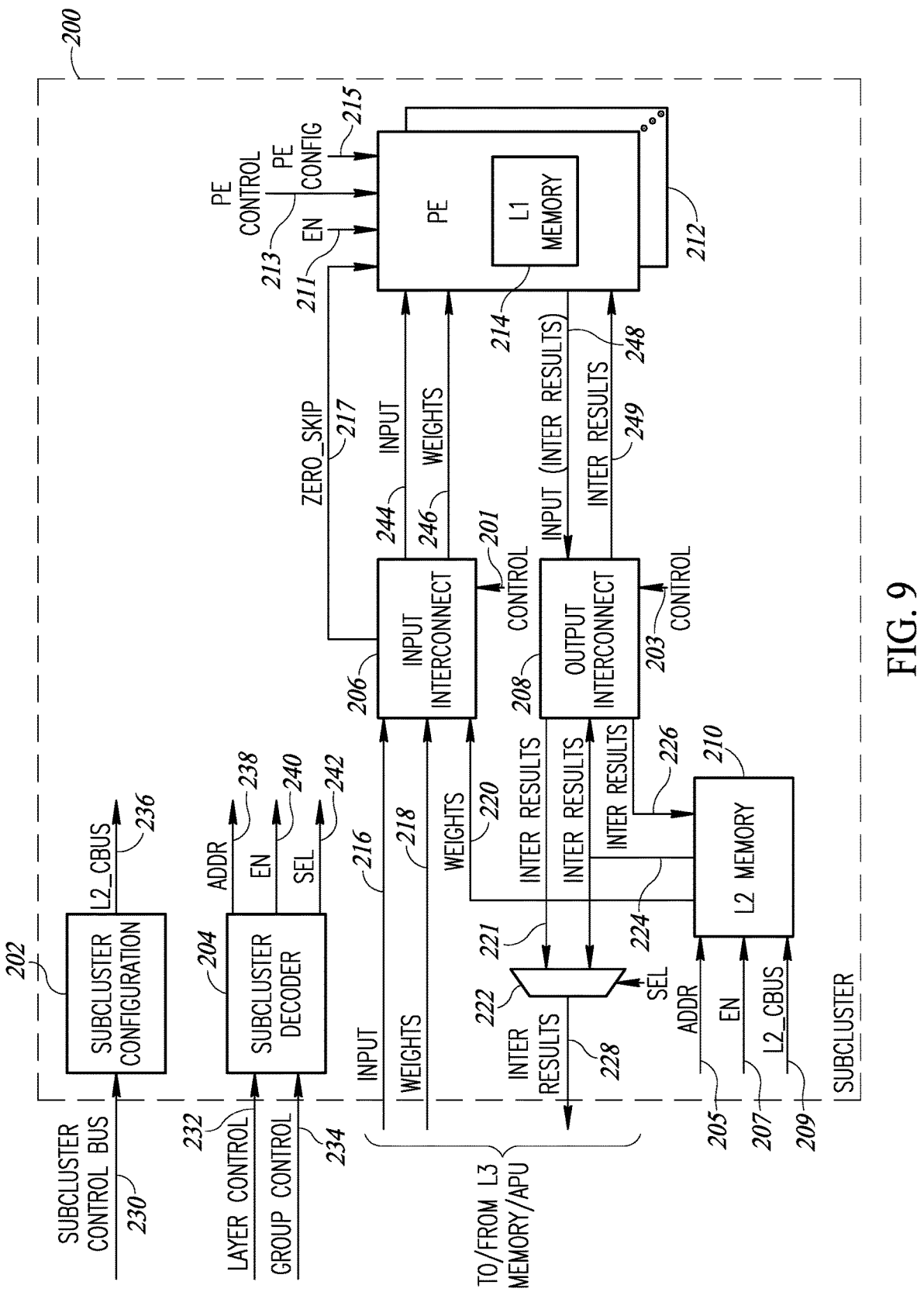
FIG. 9 is a high-level block diagram illustrating a second example subcluster in more detail.

A high-level block diagram illustrating a second example subcluster in more detail is shown in FIG. 9. While FIG. 8 reflects a mostly logical view of the subcluster, FIG. 9 reflects a more physical view. The subcluster, generally referenced 200, comprises dedicated local L2 memory 210, a plurality of N PEs 212, each with its own L1 memory 214 and receiving enable EN 211, PE control signal 213, and PE configuration signal 215, input interconnect 206, output interconnect 208, subcluster configuration 202 which receives instructions from the subcluster control bus 230 and outputs L2_cbus 236, and subcluster decoder 204 which receives layer control 232 and group control 234 and outputs address ADDR 238, enable EN 240, and select SEL 242.

In operation, input data 216 and weights 218 are provided from the L3 memory at the cluster level to the input interconnect 206 in accordance with control signal 201. The input interconnect feed input data 244 and weights 246 to the PEs 212. A zero_skip signal 217 notifies the PEs that either the input data or weights have zero values and thus a multiply and add operation are not needed. Note that weights 220 may also come from local L2 memory 210, which receives address ADDR 205, enable EN 207, and control L2_cbus 209.

Once the neurons in the PEs have accumulated the required calculations for a particular layer, the contents of the neurons, now representing intermediate results 248, are read out and output to the output interconnect 208 via control signal 203. Intermediate results can then be written to local L2 memory via path 226 or written to L3 memory via path 221, multiplexer 222, and path 228. In addition, intermediate results 224 can be read from L2 memory and either transferred to L3 memory via multiplexer 222 or to the output interconnect which then forwards it to the PEs via path 249.

Thus, each subcluster comprises flexible and programmable pathways for feeding input data and weights to the neurons in the PEs as well as steering intermediate results from the neurons to and from either L2 or L3 memory.

In one embodiment, a subcluster is dedicated to the execution of a single ANN layer or a portion of it. Its function is to receive external inputs from L3 memory, perform multiply and adds with weights from either local L2 or external L3 memory, store intermediate results (also referred to as 'contexts') in PE L1 memory (or in local L2 memory when L1 memory is not sufficient), and finally send the results to the external activation function for normalization and activation.

The subcluster decoder 204 functions to combine static input from the subcluster configuration 202 with dynamic input, both the common layer control and the timing group control. The state it stores, includes counters which hold the following addressing: (1) weights read/write address; (2) contexts read address; (3) contexts write address; (4) activation source address (which PEs output for reading).

The input interconnect is operative to (1) select between external weights (i.e. L3 memory) or local weights (i.e. from L2 memory); (2) select the width of the weights memory, i.e. the number of weights selected and the depth of the memory where the maximum width allows all PEs to receive a different weight from L2 memory, or from L3 external memory; (3) select the weights to pass to the PEs from the selected weights source (using the MSBs of the address); select the width of the input bus; and (4) select the inputs to pass to the PEs from the selected input source (using the MSBs of the address).

Note that the L2 memory 210 is used to store both weights and contexts in the same block. The weights addresses start from zero and count upwards while the contexts addresses start from the end of the memory. It is the responsibility of the control plane to prevent overflows.

Cluster

Figure 10:
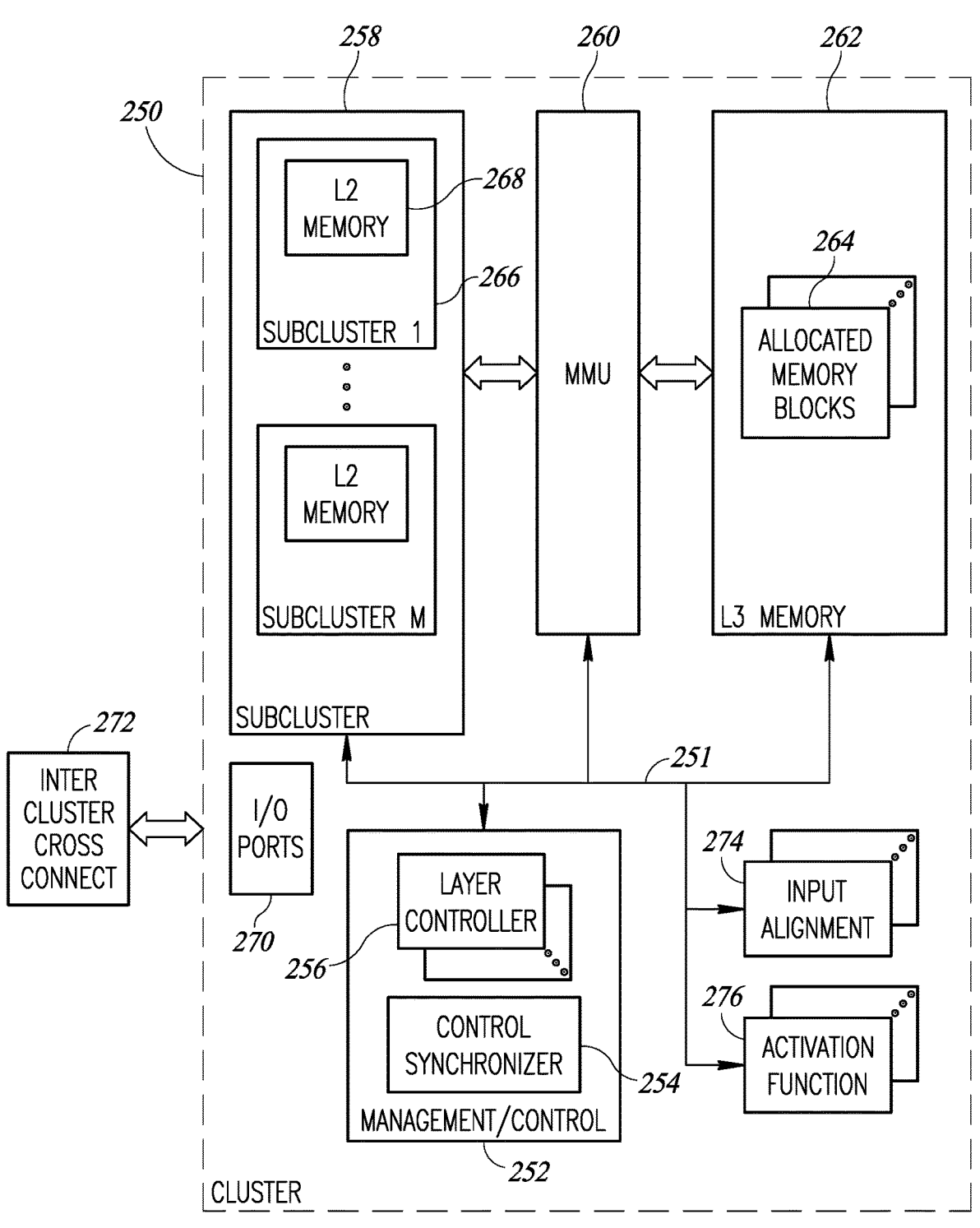
FIG. 10 is a high-level block diagram illustrating a first example cluster in more detail.

A high-level block diagram illustrating a first example cluster in more detail is shown in FIG. 10. The cluster, generally referenced 250, comprises a plurality of M subclusters, each subcluster 266 having its own L2 memory 268, dedicated local L3 memory 262 portioned into a plurality of allocated memory blocks 264, memory management unit (MMU) 260 adapted to interface L3 memory to the subclusters, management and control block 252 including control synchronizer 254 and a plurality of layer control circuits 256, a plurality of input aligners 274, and a plurality of activation function circuits 276. Input/output (I/O) ports 270 interface each cluster to an inter-cluster cross connect switch 272.

In one embodiment, the cluster is the next level of aggregation typically representing more than one neural network layer. It contains both the subclusters which contain the PE basic computational entities as well as the interconnect fabric amongst subclusters. This provides the NN core with the flexibility to represent different neural network models by controlling the connectivity between subclusters. The L3 memory 262 functions to store interlayer results in one or more allocated memory blocks 264.

Several features of the cluster include: (1) a distributed control scheme to manage memory access; (2) flexible configurable routing matrix to support representation of the total M subclusters into multiple layers; (3) dynamic allocation of L3 memory for weights and intermediate results (relatively infrequent); and (4) interlayer control to allow data flow throttling and load balancing.

Additional features include: (1) weight/input data balancing; (2) pre and post-processing blocks; (3) dynamic bus width and memory bit cell; (4) input data and weights interchangeability in the MMU; (5) the capability to provide event-driven behavior and pipelining; (6) control is decoupled from the data plane; (7) optional zero pipeline capability; and (8) balanced capability of runtime configuration modification.

A high-level block diagram illustrating a second example cluster in more detail is shown in FIG. 11. The cluster, generally referenced 280, comprises a cluster interconnect circuit 282, input buffers 284, output buffers 292, plurality of M subclusters 306, subcluster interconnect 304, a plurality of activation function/pooling circuits 300, a plurality of input aligner circuits 302, and L3 memory 296 including a plurality of allocated memory blocks 298.

Input data and weights 286 are stored in the input buffers 284. From the input buffers the input data and weights 288 are input to the cluster interconnect 282. Input data 305 and weights 307 can also be written to and read from L3 memory 296. Input data 281 from the cluster interconnect is input to the aligner circuit 302 before being input to the subcluster interconnect 304. Input data 285 is fed to the subclusters 306 from the subcluster interconnect while output 283 from the subclusters is sent to the subcluster interconnect. The output 309 is input to the activation functions/pooling circuits 300 where the resulting output 308 is input to the cluster interconnect 282. Output data 290 is written to the output buffers 292. Data output 294 is then sent to other clusters or off-chip.

In one embodiment, the NN core supports multiple neural networks in parallel. Each cluster is operative to expose a control interface (e.g., clock, reset, enable, etc.), a configuration interface (memory like) and data interfaces (e.g., Advanced Extensible Interface (AXI)). Each cluster is adapted to implement one or more ANN layers, possibly from more than one ANN. The AXI interconnect exposes a control interface, and is used to connect the clusters, the DMA engine of an ARM controller in the NN core, and external ports. The ARM exposes an AXI interface through a DMA engine, control and configuration interfaces to the clusters and the interconnect, and external standard interfaces.

In one embodiment, clusters comprise: (1) configuration circuit; (2) memory management unit (MMU); (3) control interconnect; (4) trigger interconnect; (5) multiple subclusters; (6) multiple layer controllers (LCs); (7) multiple special purpose units; (8) multiple input units; (9) multiple output units; and (10) multiple memory blocks (i.e. L3 memory).

In one embodiment, the cluster supports multiple ANN layers in parallel, possibly from multiple ANNs. Note that a network layer can be implemented as a layer controller (LC) with one or more subclusters connected through the control interconnect, or one of the special units (special purpose, input or output) which contains the control within. Layers communicate data through the allocated memory blocks 298 in L3 memory 296, using signaling for flow control over the trigger interconnect, all defined by the configuration. The allocated memory blocks are also used as weight memory for the subclusters. All the control signals from the various layers to the L3 memory are translated by the MMU 260 from virtual to physical addresses using the configuration.

The MMU uses a sliding overlapping window mechanism between two communicating port groups, such as the read ports of the L3 memory and the input ports to the subcluster. Each subcluster can choose its input from a group of memory ports around its relative place in the list of subclusters. The window mechanism is described more detail infra.

In order to be able to utilize the pipeline in the NN core efficiently, the allocation of subclusters for each ANN layer is preferably proportional to the number of computations required in the ANN layer per feed. The allocation is determined by the control interconnect, which maps the subclusters to the LCs. The mapping is performed in two levels: (1) each subcluster is assigned to an LC through a sliding overlapping window mechanism (i.e. similar to that used in the MMU); and (2) the subcluster is assigned to a timing group inside the ANN layer. The timing groups spreads over time the actions requiring common resources, such as the write port to L3 used after activation. An ANN layer may comprise one or more timing groups, each containing one or more subclusters. The controls, which are common among all timing groups, are not passed through the second selection level, reducing multiplexing complexity of the circuit.

In one embodiment, the signaling mechanism between ANN layers is based on two bidirectional wires, which negotiate on the state of the dual buffer between them. Therefore, two bidirectional lines are required to connect two consecutive layers, i.e. each layer uses four bidirectional lines, two for the previous layer and two for the next layer. The two backward signals indicate whether the buffer ready for receiving new data for each one of the two buffers between the layers, and the two forward signals indicate whether the data in the buffer is valid for both buffers. To simplify the interface, the controller can flip the meaning of the two buffers (i.e. active and passive) in both directions, using a dedicated instruction.

Figure 12:
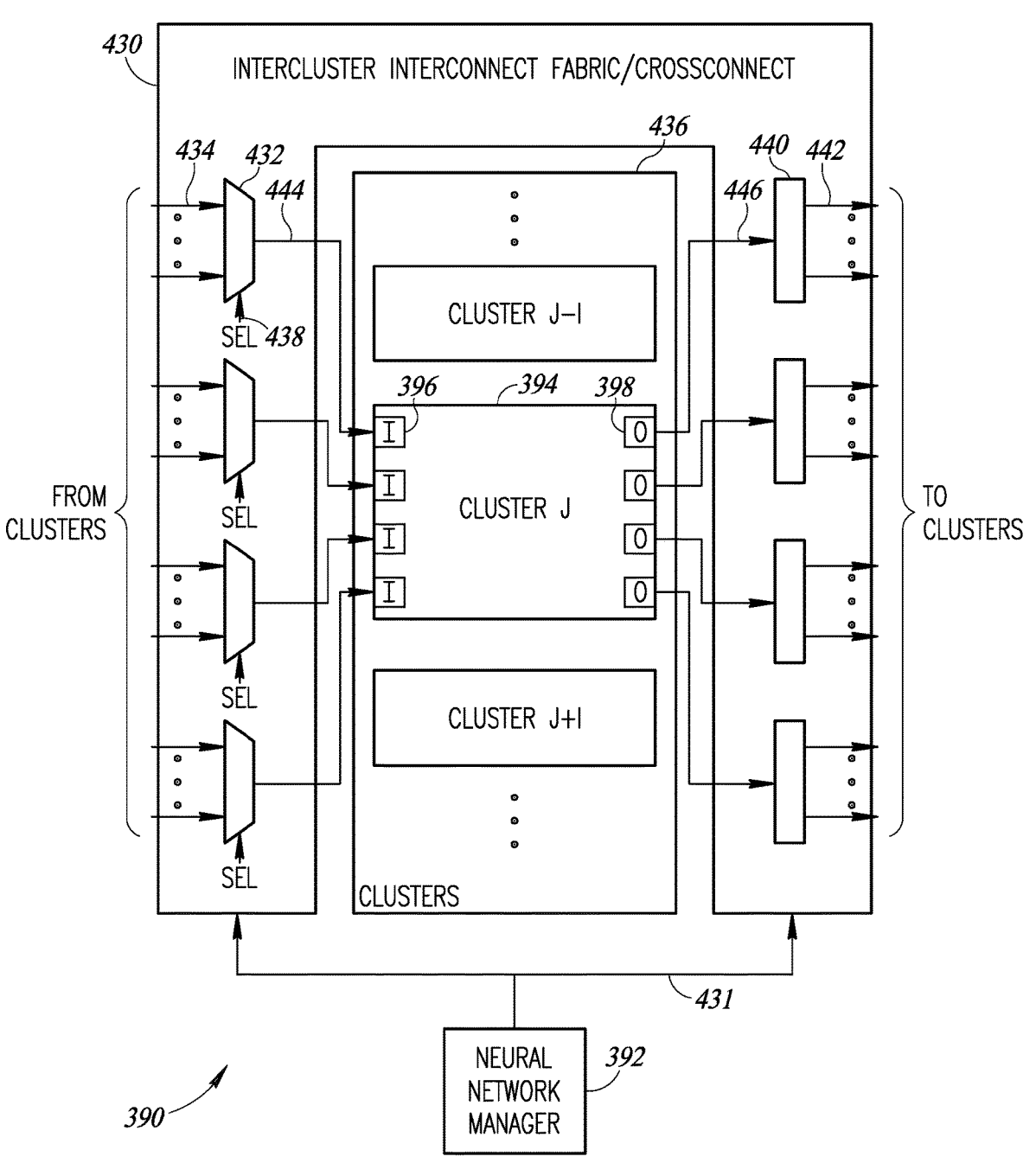
FIG. 12 is a high-level block diagram illustrating the inter-cluster cross connect in more detail.

A high-level block diagram illustrating the inter-cluster cross connect in more detail is shown in FIG. 12. The inter-cluster interconnect fabric/cross connect, generally referenced 430, comprises a plurality of multiplexers 432 and splitters 440 that enable communications between clusters 436. In one embodiment, each cluster J comprises a plurality of ports, including input ports 396 and output ports 398. Four input and output ports are shown in the example but any number can be implemented.

Multiplexers 432 on the input side are controlled by SEL lines 438. The inputs 434 to each multiplexer comprise output lines from neighboring clusters, e.g., clusters J–2, J–1, J, J+1. The output 444 from each multiplexer is input to a separate input port 396 in a cluster. Similarly, splitters 440 on the output side generate outputs 442 that are fed to input lines of neighboring clusters, e.g., clusters J–1, J, J+1, J+2. The output 446 from each output port 398 of a cluster is input to a separate multiplexer 440. The NN manager 392 functions to control the configuration of the cross connect 430. In one embodiment, the possible connections from one cluster to another is intentionally limited to reduce addressing and control routing and to improve bandwidth. For example, connections to cluster J via inputs 434 are limited to clusters J–2, J–1, J, and J+1, i.e. neighboring clusters (and itself) only. Similarly, connections from cluster J at the outputs 442 are limited to clusters J–2, J–1, J, and J+1. Note that although direct connections to other clusters are limited, any cluster is still able to communicate with any other cluster indirectly by traversing one or more intermediary clusters.

Note that the cross connect occurs at all levels, starting at the cluster level, going through the top level of the NN processor core as well as device to device. The L clusters in the NN processor are connected using a cyclic interconnect fabric that enables output ports from one cluster to be mapped to neighboring clusters. The cross connect is also capable of routing outputs of a cluster to itself (i.e. self-routing). Note that the extent of access in the cross connect is configurable and permits a tradeoff between design complexity and accessibility. Note also that a 'scatter/gather' mechanism allows the outputs to be split (i.e. via splitters) into multiple replicas such that the same output feeds multiple inputs in parallel. Control of the cross connect is provided by NN manager 392 via control lines 431.

Sliding Overlapping Memory Windowing

Figure 13:
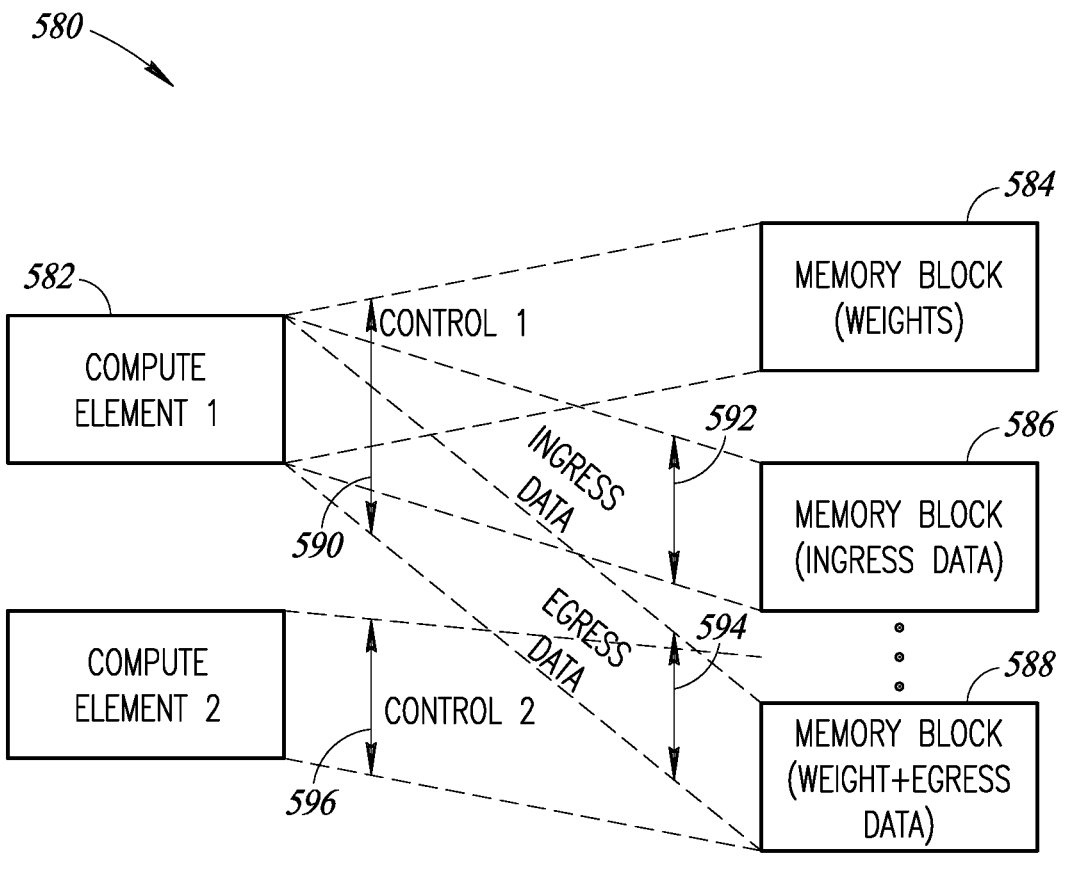
FIG. 13 is a diagram illustrating a first example memory windowing scheme.

A diagram illustrating a first example memory windowing scheme is shown in FIG. 13. To maintain flexibility, each consumer of memory in the processor has the ability to access different memory segments for the exchange of data. The term memory windowing refers to a scheme whereby a computing element or entity is given access only to a certain subset of available memory resources rather than a much wider range of memory resources. Limiting access to memory by the compute elements using a memory windowing scheme significantly improves the available bandwidth while greatly reducing the required address and control routing. Note that the memory fabric can dynamically rearrange the memory windowing scheme whereby the memory resources accessible by compute elements is programmable and configurable (e.g., at compile time, runtime, etc.). The windowing scheme is based on a scatter/gather technique described in more detail infra.

In the example shown, generally referenced 580, two compute elements 582 access memory resources 584, 586, 588. None of the compute elements have access to the entire memory, but rather only to a finite window. This is because the compute elements never require access to the entire memory fabric at once. Note that the windowing can be different for control, ingress data, egress data, and weights. In addition, the windows typically overlap to enable sharing and pipelining. Also, the memory resources themselves is multipurposed where it can be used to store more than one type of information.

In the illustrative example, control for compute element 1 spans memory blocks 584, 586, and 588, denoted by Control 1 arrow 590. Compute element 1 includes an ingress data window to memory block 586, denoted by Ingress Data arrow 592. Similarly, compute element 1 includes an egress data window to memory block 588, denoted by Egress Data arrow 594. The weights are stored in memory block 584 as well as in memory block 588 which also functions to store egress data. In similar fashion, the other compute elements include control, ingress, egress, and weight windows as well. For example, compute element 2 includes a control window 596 spanning memory block 588 as well as one or more other memory blocks (not shown).

Figure 14:
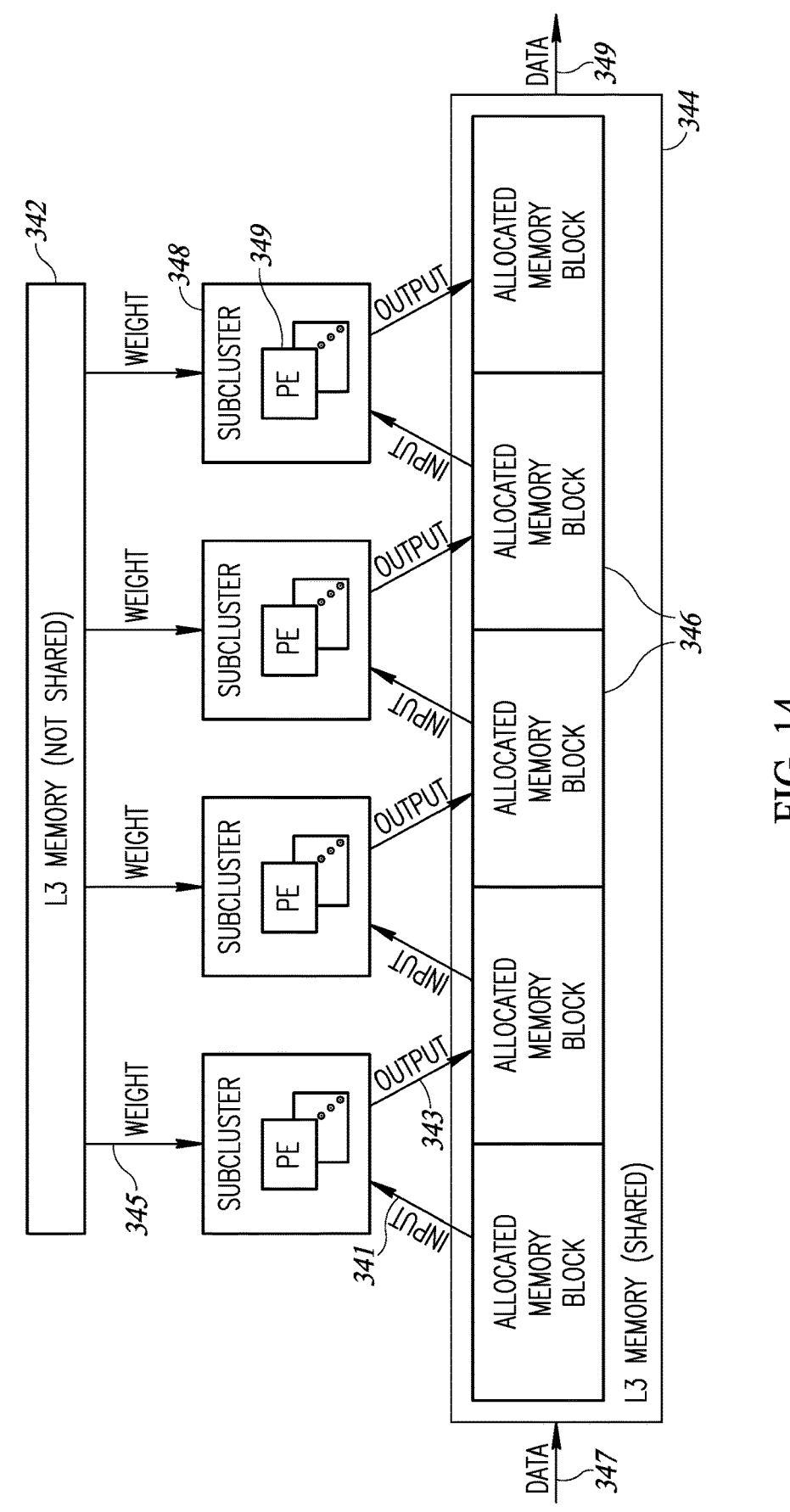
FIG. 14 is a diagram illustrating a second example memory windowing scheme.
Figure 15:
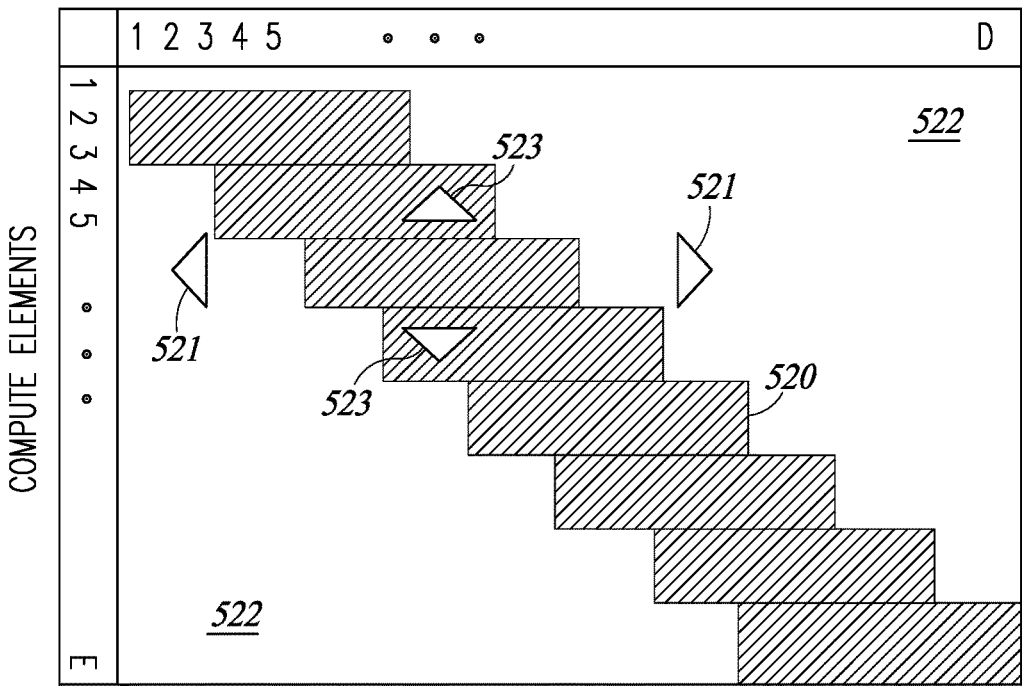
FIG. 15 is a diagram illustrating first example memory accessibility between compute and memory elements including window size and computer access configurability.
Figure 16:
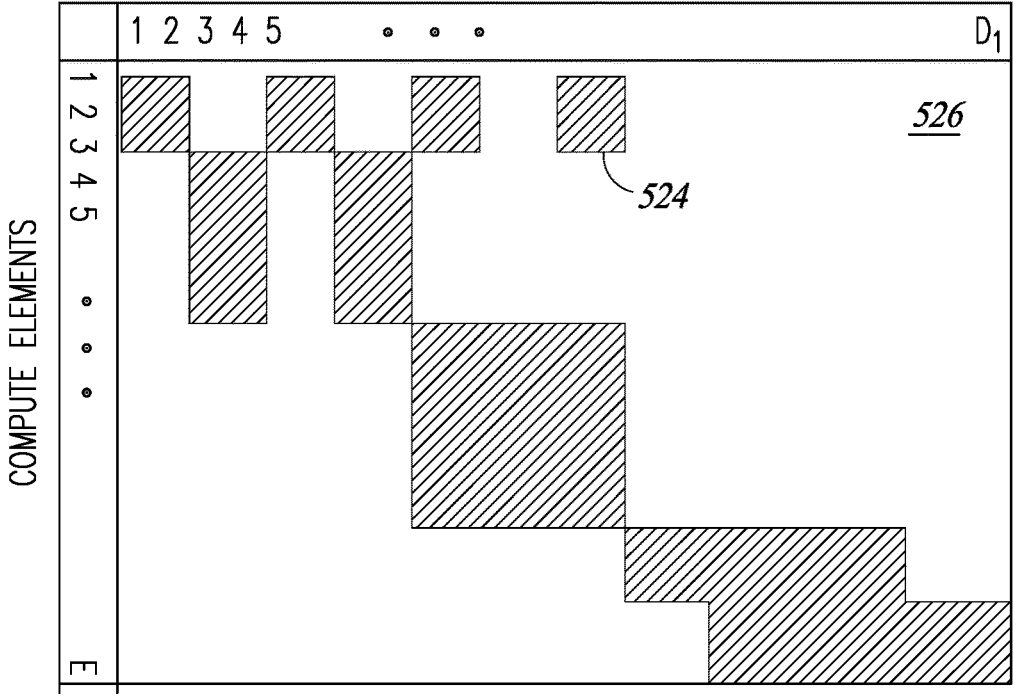
FIG. 16 is a diagram illustrating second example memory accessibility between compute and memory elements.
Figure 17:
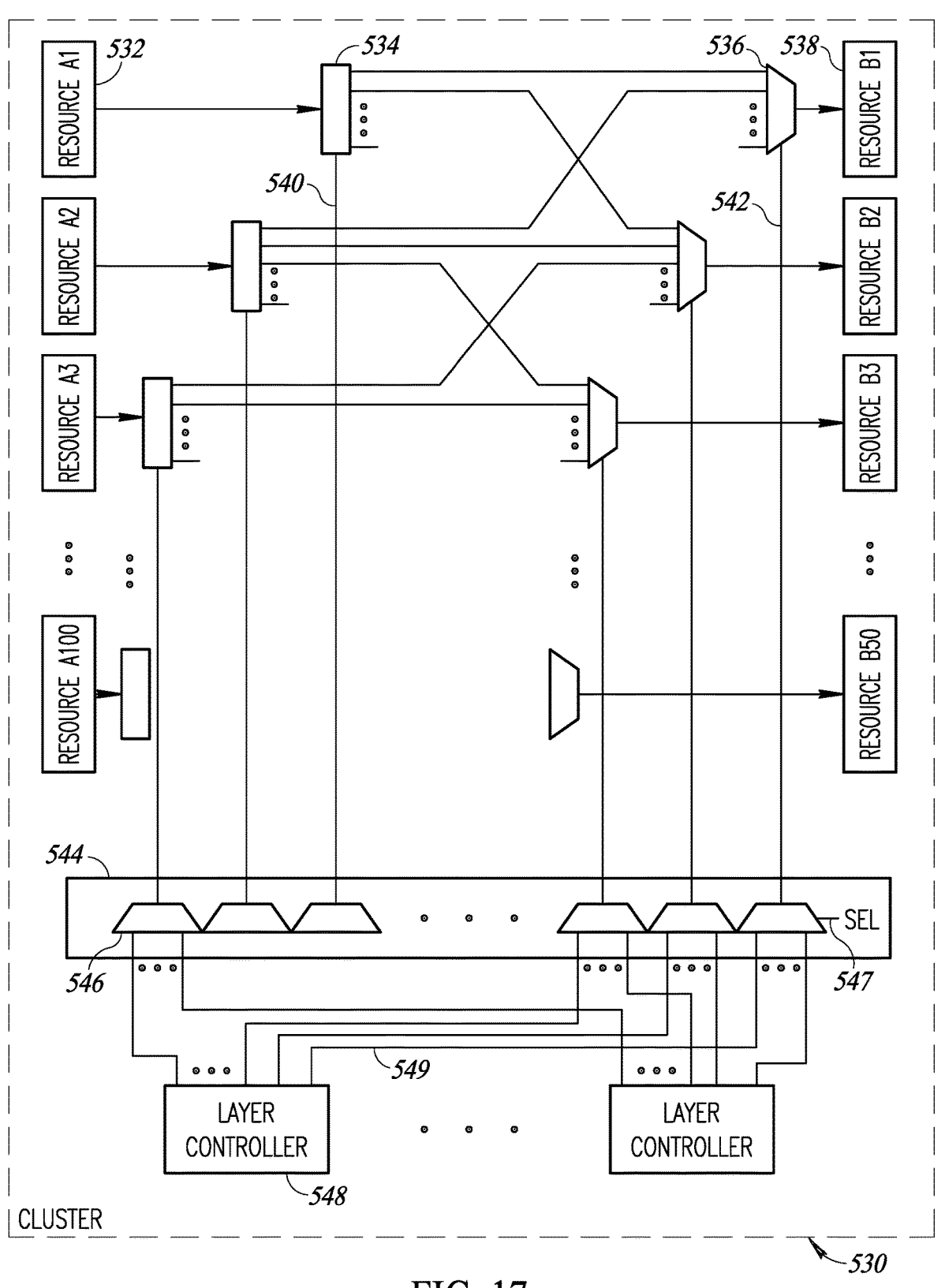
FIG. 17 is a diagram illustrating an example scatter/gather based resource windowing technique.

A diagram illustrating a second example memory windowing scheme is shown in FIG. 14. In one embodiment, the data that flows through the computing elements in the NN processor is pipelined, wherein PEs in the subclusters receive data as input and generate outputs which then serve as input for some other subcluster for subsequent computations. The memory in the various layers is localized as much as possible and leveraged to maximize accessibility and efficiency of the computing elements each layer serves. Since the computing elements only need to access a limited subset of the memory routing (i.e. address lines, control, etc.), therefore a limited number of cross connect memory blocks available to the computing elements saves silicon space and routing resources. FIGS. 15, 16, and 17 illustrate the configurability of the memory access windows through which the allocation of each resource is administered and configured and equipped with the resources that address the particular demand.

The window memory scheme, generally referenced 340, comprises a plurality of subclusters 348, each including a plurality of PEs 349, L3 memory (not shared) 342, and L3 memory (shared) 344. In operation, the subclusters receive weights information 345 from a portion of L3 memory that is not shared. Input data 341 to a subcluster is received from an allocated memory block 346 from a shared portion of L3 memory. The PEs within the subcluster process the weights and input data and generate outputs 343. The outputs, however, are written to a different (e.g., neighboring) allocated memory block (i.e. not the memory block the inputs were read from). These outputs are then read as inputs to another subcluster (e.g., neurons in a subsequent layer of the ANN). In this fashion, ANN input data 347 enters shared L3 memory, is read from allocated memory blocks, processed by the PEs in one or more subclusters, output to neighboring memory blocks, and after traversing through the various layers in the ANN is ultimately output as ANN output data 349 from shared L3 memory.

Note that the subclusters, however, do not have direct random access capability to L3 memory, but rather only to neighboring or close by allocated memory blocks. For example, subcluster H has access to subcluster H−2, H−1, H (itself), and H+1 subclusters. This greatly reduces the addressing and control routing requirements for memory access. Thus, each subcluster only 'sees' a relatively small window of memory, just enough for its PEs to perform their function.

A diagram illustrating first example memory accessibility between compute and memory elements window size and computer access configurability is shown in FIG. 15. This diagram illustrates the memory windowing scheme whereby compute elements as well as memory elements have limited access to each other. For example, consider memory elements 1 through D and compute elements 1 through E. The hatched blocked area 520 represents the resources accessible by each. Thus, the compute elements 1 through 3 can only access memory elements 1 through 12. Similarly, memory elements 1 through 12 can only connect to compute elements 1 through 3. As shown, the memory elements accessible to the compute elements form sliding access windows that overlap one another. The access windows have a size (i.e. span) and specific connectivity that can be dynamically configured and not hardwired or fixed. A key feature is that any single compute element does not have random access to the entire memory. Rather, each compute element can only access a portion of the memory elements, e.g., neighboring memory elements or those close by. The non-accessible portion of memory for the compute elements is represented by the white area 522.

Note also that the number of compute elements accessible by memory is programmable and configurable as represented by the vertical arrows 523. Similarly, the number of memory elements accessible by a compute element is programmable and configurable as represented by the horizontal arrows 521.

A diagram illustrating second example memory accessibility between compute and memory elements is shown in FIG. 16. This diagram illustrates that access between compute and memory elements is not limited to contiguous windows. Rather, access may be discontinuous which is achieved in one embodiment using virtual to physical mapping. Regardless of the means, the accessible regions have rectangular shapes of limited and predefined range indicating that access between compute and memory elements is limited and finite i.e. no such region covers the entire address space.

A diagram illustrating an example scatter/gather based resource windowing technique is shown in FIG. 17. For illustration purposes, a portion of an example cluster 530 is shown. The technique, however, is not limited for use in a cluster and can be used anywhere in the NN processor. Consider two resources A 532 and B 538, where the resource may comprise any desired circuit, e.g., compute, memory, control elements, etc. To limit access, the output of each resource A 532 is input to a splitter 534 and the input to each resource B 538 is the output of a multiplexer 536. Rather than provide full mesh connectivity, the outputs of the splitters only go to a limited number of multiplexer inputs, thus providing limited connectivity. For example, the output of resource A1 is input to resources B1 and B2 only. Similarly, the output of resource A2 is input to resources B1, B2, and B3 only and the output of resource A3 is input to resources B2 and B3 only. In this manner, each B resource only connects to a small window of A resources. Thus, access between the 100 A resources and 50 B resources (the number of resources is only an example) forms a sliding window where a finite number of A resources connect with a finite number of B resources on an overlapping sliding basis.

Control of the splitters and muxes is provided by the layer controllers (LCs) 548. The control lines 549 output of the LCs are input to a series of muxes 546 in a control fabric 544 that select one of the controls from the LC in accordance with a SEL line 547 which originates in the LCU and may be further decoded within the LC. The control of the muxes 546 is programmable and configurable, such as at compile or run time, thereby achieving flexible mapping between the A and B resources.

In accordance with the invention, a feature of the memory access fabric of the NN processor is the ability to operate in substantially high parallelism. This is a virtue of the inherent separation of mappings between compute resources and the memory attached to them. For example, weights are connected explicitly only to the relevant subcluster. One exception, however, is the case where an allocated memory block is shared and a collision occurs. Although such an event is typically rare, the NN processor provides the capability to resolve the contention resulting from the collision. In one embodiment, memory contention is resolved at the control layer, where the two compute entities that share a common memory block handle collision avoidance at the signaling level as described infra. Note that backpressure is typically temporary and short lived, and the overall total bandwidth is guaranteed by the design of the NN processor.

Figure 18:
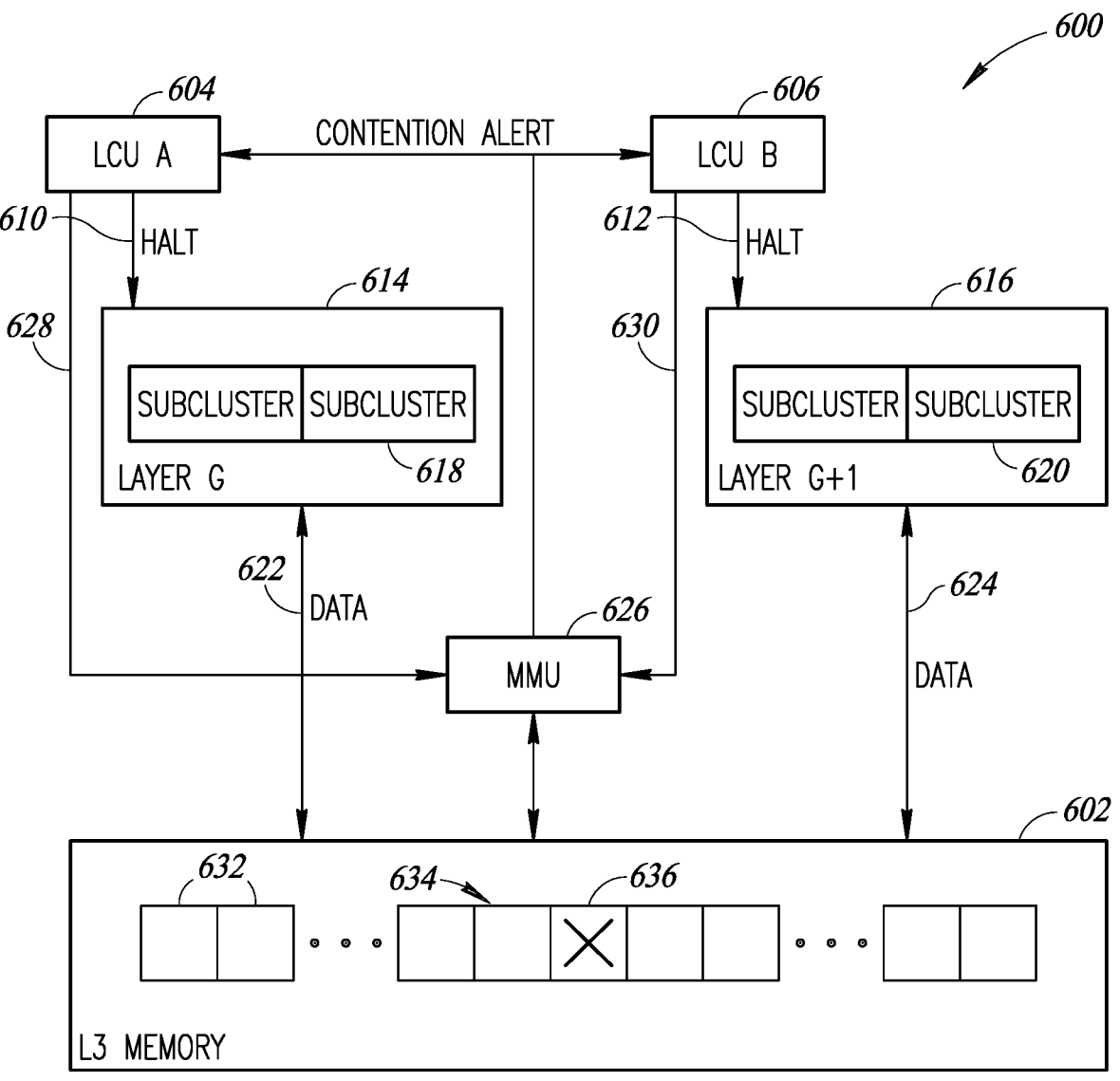
FIG. 18 is a block diagram illustrating an example memory contention resolution scheme.

A block diagram illustrating an example memory contention resolution scheme is shown in FIG. 18. Memory contention resolution circuit, generally referenced 600, comprises L3 memory 602 including a plurality of memory blocks 632, MMU 626, LCU A 604, LCU B 606, one or more subclusters 618 forming ANN layer G 614, and one or more subclusters 620 forming ANN layer G+1 616.

In this illustrative example, both layers G and G+1 of the ANN read and write data to and from memory blocks 634 in L3 memory. The output of layer G serves as the input to layer G+1. Occasionally, however, both layers may try to access the same memory block at the same time. This is indicated by the memory block 636 labeled with an 'X'. When contention for the same memory block occurs, the MMU 626 detects the event and generates a contention alert 608 to the LCUs (A and B in this example) in their respective LCs. In response to the contention alert, one of the LCUs generates a halt command 610, 612 that is input to the subclusters. The subcluster that receives the halt command inhibits access to the memory block in L3 memory until the read or write operation is complete.

Note that memory contention always occurs between ANN layers and not within a layer since within a layer, the subcluster making up the layer are configured such that contention for memory never occurs. Typically, contentions occur when one layer is writing while the other is reading. In response to the contention alert, either the write or the read operation can be inhibited. In one embodiment, the write operation is inhibited since the nature of ANNs is that write operations are far rarer events. In addition, inhibiting read operations would stall a significant portion of the data processing pipeline. Thus, write operations are inhibited rather than read operations. A halt signal (610 to layer G or 612 to layer G+1) is issued to the layer to be inhibited. Note also that the decision whether to inhibit write or read operations is programmable and configurable a priori at compile time.

Layer Controller

Figure 19:
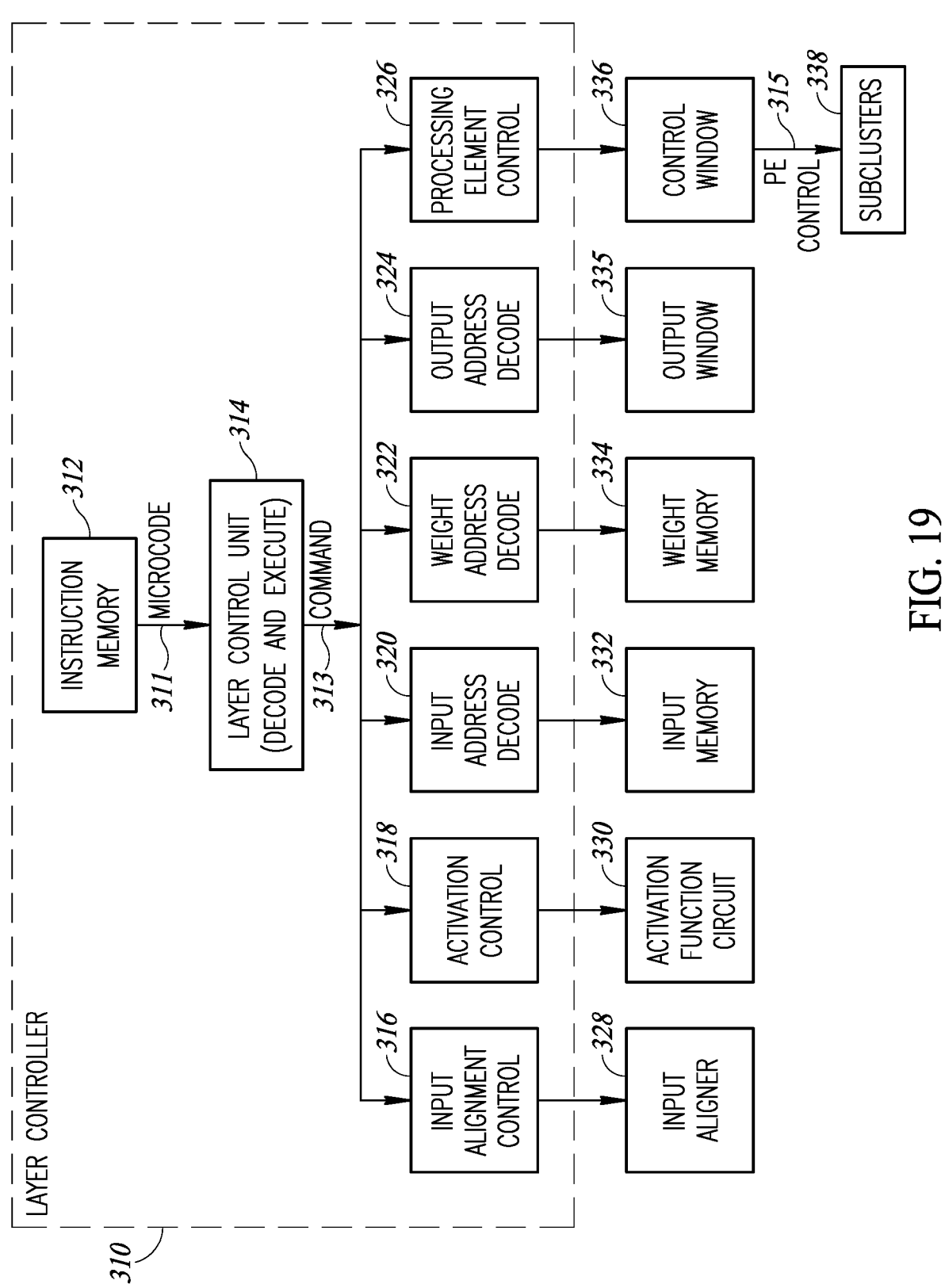
FIG. 19 is a high-level block diagram illustrating a first example layer controller in more detail.

A high-level block diagram illustrating an example layer controller in more detail is shown in FIG. 19. The layer controller (LC), generally referenced 310, comprises a layer control unit (LCU) 314 responsible for decoding and executing microcode instructions 311 read from instruction memory 312. Depending on the instruction one or more command signals 313 are output to various control and decode blocks, including input aligner control 316, activation control 318, input address decoder 320, weight address decoder 322, output address decoder 324, and PE control 326. The control and address signals from these six blocks are respectively output to input aligner 328, activation function circuit 330, input memory 332, weight memory 334, output window 335, and control window 336. PE control signals 315 are output from the control window 336 to the PE circuits in the subclusters 338.

A high-level block diagram illustrating the layer controller interface to L3 memory and subclusters in more detail is shown in FIG. 20. The example cluster, generally referenced 640, comprises L3 memory 644, LC 642, plurality of subclusters 662, post processor 666, and windowing for control, write data, read data, and weights as described supra in connection with FIG. 17. The LC 642 comprises LCU 656, one or more preprocessors 652, instruction memory 654, one or more decoder circuits 658, and MMU 660.

In particular, control windowing includes control window circuit 674 and related control lines 685; weight windowing includes circuits 646, 648, and signal lines 650; ingress data windowing includes circuits 676, 678, 672, and signal lines 690, 692; egress data windowing includes circuits 680, 682, 668, and signal lines 686, 688. Note that the ingress and egress windows accessing L3 memory overlap as indicated by the dashed lines. Control for the windowing (i.e. selects for the splitters and muxes) is provided by the memory window control (MWC) signals 670 generated by the LCU and decoders and input to the window circuits 674, 646, 648, 676, 678, 672, 680, 682, and 668.

In operation, ingress data is read from L3 memory and input to the preprocessing circuits 652. These circuits function to optionally reshape the data, performing manipulations on the input data, e.g., shifting, etc. The preprocessed data is output to the subclusters where the PEs 664 multiply the input data with weights also read from L3 memory. Intermediate results, i.e. contexts, are output from the subclusters to post processing circuitry 666 through the memory windowing. The post processing circuit is part of the data processing pipeline and is operative to apply the activation function and optionally alignment.

Note that each LC is assigned one or more subclusters that make up a layer in the ANN. Each cluster comprises a plurality of LCs (e.g., eight). Thus, the subclusters 662 shown are only a subset of the M subclusters within each cluster, where each LC controls a different set of subclusters that can be selected using the same windowing concept described above. In addition, the N PEs within a subcluster are not split, meaning all PEs in a subcluster are controlled as a single unit. This simplifies the control of the computing elements and allows for relatively lean control signaling as only a few control lines control large numbers of PEs and ultimately neurons. Similarly, each of the decoder circuits 658 is configured to control a different set of memory blocks. The control signals 698, which in one embodiment are encoded, are generated by the LCU and input to the decoders decoder circuits 658. The LCU itself is controlled by the contents of the instruction memory 654. The execution of each instruction results in the generation of encoded control signals which are then decoded by the decoders and output to the computing elements via the control window circuit 674. Note that in addition to the control signals that control the computing elements in the subclusters, the LCU also generates the control signals (i.e. MWC select controls) for controlling the control window as well (along with the weight, ingress and egress data windows). Once configured (as at compile time), the control signals, weights, ingress and egress data are routed statically. The MMU 660 generates the control signals 684 for the L3 memory windowing and functions to perform the virtual to physical mapping. It also functions to generate a contention alert 694 in response to a memory contention event between two layers in the ANN. As described supra, the LCU resolves the contention event by issuing one of the layers a halt command.

Figure 21:
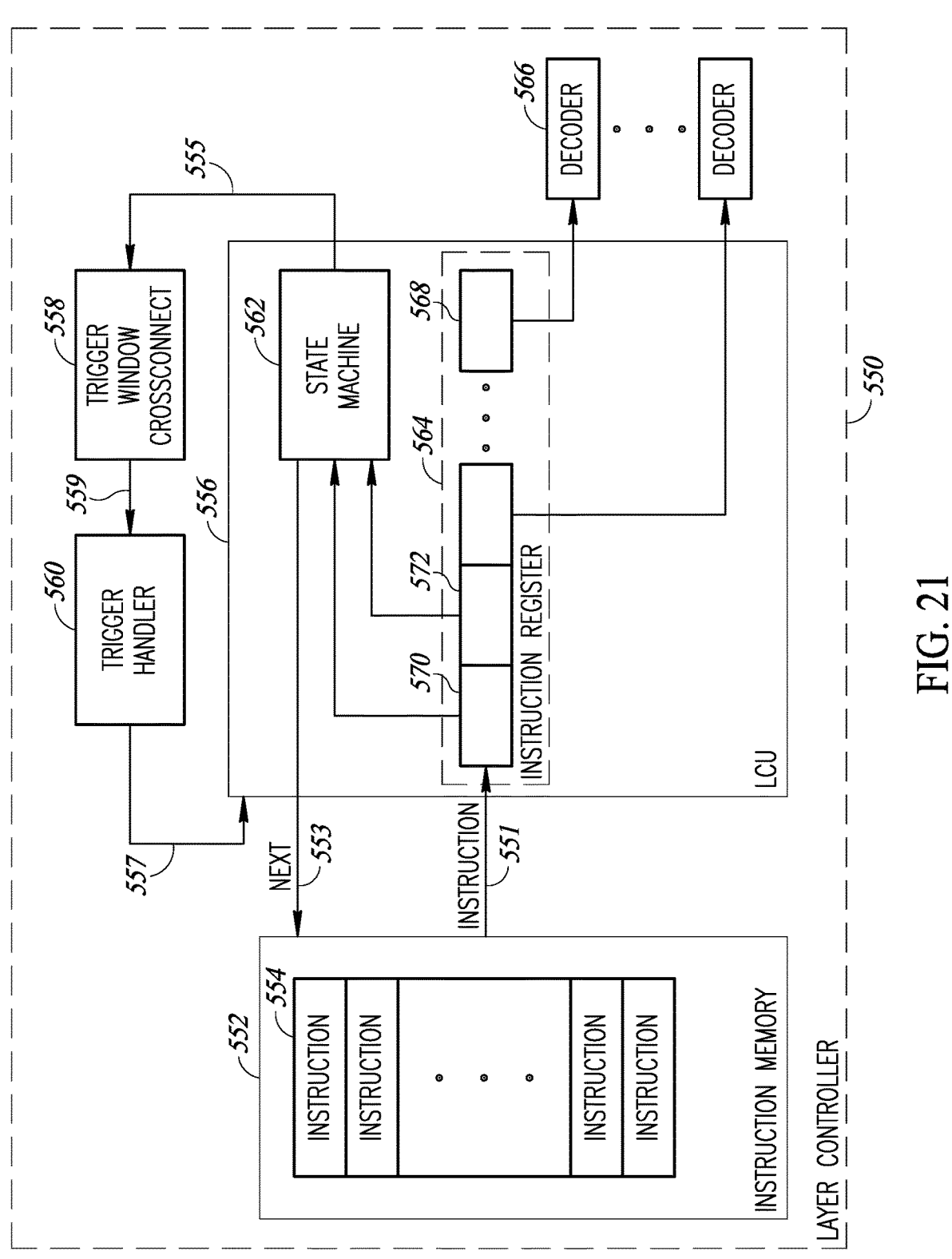
FIG. 21 is a high-level block diagram illustrating a second example layer controller in more detail.

A high-level block diagram illustrating a second example layer controller in more detail is shown in FIG. 21. The example LC, generally referenced 550, comprises instruction memory 552 including a plurality of instructions 554, LCU 556, instruction decoders 566, trigger window cross connect 558, and trigger handler 560. The LCU 556 comprises a state machine 562, and instruction register 564.

In operation, instructions 551 are read from instruction memory into the instructions register 564 in the LCU where they are decided and executed. The one or more portions 568 of the instructions that are configured to directly control hardware are sent to the one or more decoders 566 for decoding. The output of the decoders comprises direct control signaling that is sent to the subclusters to control the internal PE operation as shown and described supra in FIG. 20. The other portions 570, 572 of the instruction control the logical state of the LCU and are input to the state machine 562. These portions control looping and branching, for example. A next 553 command causes the next instruction from the instruction memory 552 to be read into the LCU for execution.

In one embodiment, one or more triggers 555 are generated by the state machine and input to the trigger cross connect 558. The trigger function is similar to an 'interrupt' where activity can be halted and delayed until the occurrence of some event. Trigger signals are used to trigger activity. Triggers can be issued to activate other triggers. They represent an asynchronous mechanism that functions to synchronize activities in the NN processor. For example, a trigger can be issued to halt processing until a buffer is written to, or until a layer completes processing (or otherwise function as an indication that some event has taken place and further processing can commence).

In addition, a trigger can be issued to trigger activity in an LCU in a different LC. This process is termed a 'handover'. The handover mechanism can trigger activity from one LC to another, e.g., a trigger can be used when one ANN layer completes and sends results to another layer in the ANN. The trigger window cross connect, functions to steer output trigger signals 559 to the trigger handler in the appropriate LC where they act to control activity in the LCU via signals 557.

Regarding the separation between data and control planes, in one embodiment, the microcode that governs the control plane executes in the LCs and does not have any access to data. An additional capability of the microcode machine in the LCs is that there are no conditional statements or conditional branching. This is advantageous for data pipelining since the need to manage branch prediction or other pipeline overhead is avoided. Execution is thus fully predictable. This is in contrast to typical prior art microcode that can branch causing execution to be dependent on the input. In the NN processor, once microcode executes, the evolution of data flow is fully predictable, i.e. the generation of each control signal can be predicted at every instance in time.

In one embodiment, each microcode instruction executed in the microcode-based controllers is operative to generate control signaling for compute resources and memory resources. In other words, the microcode does not carry any 'overhead' as there are no operations that are responsible for internal handling that do not also apply actual control signaling to the outputs. Thus, no microcode instruction operations are wasted on internal housekeeping of the microcode machine (with the sole exception of a 'NOP' operation).

Another capability of the microcode machine in the LCs is triggered operation. Although branching is not supported, execution flow can be triggered by external signals that indicate start/stop of execution to enable data pipeline handshakes, e.g., handoffs from one LCU to another.

Yet another capability of the microcode machine in the LCs is repeated operation support whereby inline repetition of operations (i.e. loops that run inline) are supported such that repeated operations can be indicated within the opcode itself thereby avoiding unnecessary cycles for setting up and managing the loop, and related fetching. Note that this feature is useful for loops that have few operations compared to the overhead of loop management. The latter is very common in neural network operations, e.g., many multiply and accumulate (MAC) operations followed by activation. In a data pipeline machine, it is very important when the ratio between control and data is such that very little control defines the behavior of a relatively large data pipe.

For example, consider a conventional processor configured to perform 1000 multiply and accumulate (MAC) operations. Example pseudo code is provided in Listing 2 below.

---

Listing 2: Example conventional processor pseudo code loop

---

```
Init: Set count = 1000
Start: Multiply A, B => C
       Add C, D
       Decrement count by 1
       If count > 0 jump to Start
```

---

In the above pseudo code, there are four opcodes in the loop (i.e. four cycles) two of which are operational, for a utilization of 50%. Assuming that this loop controls 1024 MAC circuits, this means that only 512 are effectively operating at full capacity.

In contrast, inline repetition is supported in the NN processor. In addition, there is zero overhead for internal control eliminating the requirement to have 'spare' opcodes, i.e. opcodes that are used just for internal management of the machine or housekeeping. The pseudo code of Listing 2 translates into the following pseudo code presented below in Listing 3.

---

Listing 3: Example NN processor pseudo code loop

---

```
Mul a, b => c ; start loop
Add c, d; end loop, 1000 repetitions
```

---

As shown above, all loop information is embedded in the functional opcodes and MAC utilization increases to 100%.

It is noted that having a deep separation between control and data planes also functions to provide a degree of inherent immunity from control plane security hazards. This is because a common technique for hacking a device is to feed it data that interferes with the control plane. Since the two planes are strictly separate, interfering with one does not affect the other.

Compiler

Figure 22:
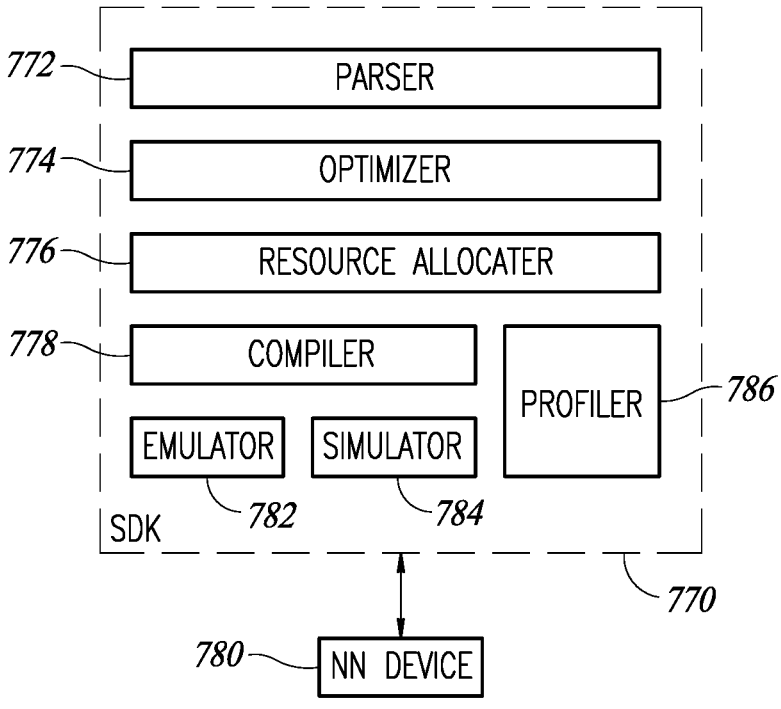
FIG. 22 is a high-level block diagram illustrating an example NN processor compiler/SDK.

A high-level block diagram illustrating an example NN processor compiler/SDK is shown in FIG. 22. The software development kit (SDK), generally referenced 770, accompanies the NN processor 780 and functions to configure the NN processor based on an input ANN model. Its components are executed in a process that executes off-chip as part of an external software tool chain used and initiated by a user. In one embodiment, the SDK comprises parser 772, optimizer 774, resource allocator 776, compiler 778, profiler 786, simulator 784, and emulator 782. Typically, the compiler has knowledge of the NN processor, NN processor SoC or multiple NN processor SoCs (780) that will be the target of the source ANN model.

In particular, the parser 772 functions to receive the user model and generate an intermediate format of the model. The optimizer 774 functions to perform model level optimizations, post-translation model adjustments for performance, and numerical adaptations to different bit widths. The resource allocator 776 allocates and assigns physical resources (e.g., compute and memory elements, etc.) in accordance with the intermediate model. The profiler 786 performs a performance evaluation, including for example, expected power consumption, throughout, latency, etc. The software emulator 782 functions to perform bit exact numerical emulation of the NN processor 780 using the intermediate model output of the parser 772.

In one embodiment, several target options are provided to the user to implement the external tool chain. The three target options include (1) the NN Device 780, (2) emulator 782, and (3) simulator 784 which comprises a software model of the hardware that simulates NN device functionality. Thus, a user has the option of executing the tool chain either using the NN device itself, a hardware emulation of the NN device or a software simulation of the NN device.

Multiple Operating Granularity of the NN Processor and Related Memory/Latency Trade-Off A capability and advantage of the present invention is that the pipeline in the NN processor is able to operate at any desired granularity of any subset of the input where memory is traded off for latency and vice versa. More specifically, when the input data has some internal structure (e.g., frames of video and each frame is composed of multiple rows (or buffers, packets, etc.)), the NN processor architecture can trigger the activity of a next layer at any aggregation from a single such row, buffer, packet, etc., and multiples of thereof.

In the case of lower aggregation, additional intermediate result (i.e. contexts) storage is required to store the intermediate results. Latency, however, is minimal since subsequent processing elements are freed up for further processing earlier in the pipeline, which allows incoming traffic to be consumed but not become blocked. Thus, higher memory storage requirements are traded-off for lower latency of contexts.

On the other hand, in the case of higher aggregation, i.e. less context memory is desired or an ANN model that requires large numbers of contexts is to be implemented, a trade-off can be made where less context memory is used in exchange for buffer memory whereby additional buffering of the input is implemented resulting in a decrease of the number of contexts needed simultaneously at any one time, but with an increase in latency. In one embodiment, this trade-off is implemented by microcode in the LCs and is thus configurable and programmable.

Figure 23:
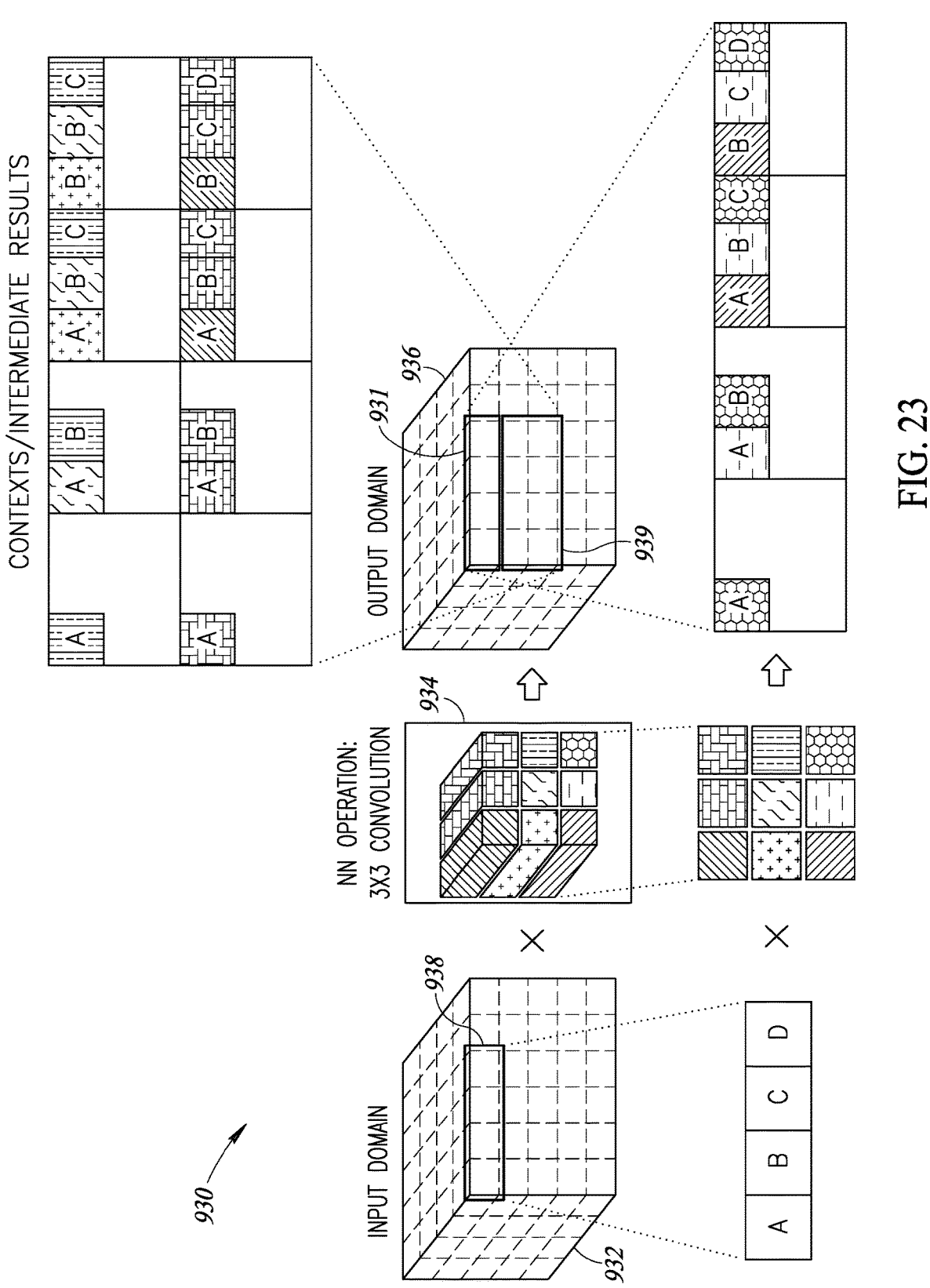
FIG. 23 is a diagram illustrating the flexible processing granularity of the NN processor and related memory versus latency trade-off.

A diagram illustrating the flexible processing granularity of the NN processor and related memory versus latency trade-off is shown in FIG. 23. The data pipeline example, generally referenced 930, highlights the option of leveraging the data pipeline to favor minimal latency and operate at low input domain granularity. Consider the example input tensor 932 including input data 938 that can be located at the beginning of or at any arbitrary point in the network. One of the network layers then applies an NN operation 934 to the input data (e.g., 3×3 convolution in this example) followed by the output domain 936 including memory blocks 931 and 939.

In this example, the input data stream is fully consumed and all needed calculations are applied while minimizing latency and without the need to retrieve the input data since all computations are committed to intermediate results stored in memory. In alternative embodiments, this function can be executed by: (1) waiting for the entire frame and applying a batch operation whereby all data is immediately committed to output to avoid intermediate results; (2) waiting for the minimal set of rows in order to avoid intermediate results (in this example case three); (3) using intermediate results stored in external memory with the increase in memory access latency; or (4) recalling inputs as needed (i.e. multiple reads of the same data) in order to avoid having to store intermediate results.

NN Processor SoC, Intra-Chip and Inter-Chip Connectivity

As described in detail supra, the NN processor can be used to implement an ANN. In the event, however, that the ANN to be implemented exceeds the capacity of the NN processor, the invention provides the capability of using several NN processors to implement the ANN model. As described supra, the NN processor comprises a plurality of bus interfaces (e.g., chip to chip interfaces) for communicating between NN processor cores. In the example disclosed herein, two chip-to-chip interfaces are provided, but any number can be implemented. Thus, large ANN models can be accommodated by combining the processing power of multiple NN processor cores.

It is noted that deployment of a network of interconnected NN processors over the chip to chip interfaces is substantially seamless. Utilizing device-to-device communications, the behavior of the network is equivalent to an ANN contained on a single NN device. In one embodiment, the chip-to-chip interface keeps with the technique of narrowing bandwidth on the boundaries of layers. The physical layer of the interface may comprise any suitable protocol that is synchronous and guarantees the required bandwidth. The next layer is a packet layer which carries a frame format that can be removed by the receiving chip. The structure of the frame format attempts to minimize overhead in transition between devices and is similar to that of Ethernet, including a plurality of fields including, for example, a stream ID, destination layer, data format, etc. For example, consider a layer having a W×H×F output tensor. The protocol identifies the structure, the stream ID, and network ID in the next device before any processing occurs. The bandwidth needed is then (W×H×F+overhead)×frames/s.

Figure 24:
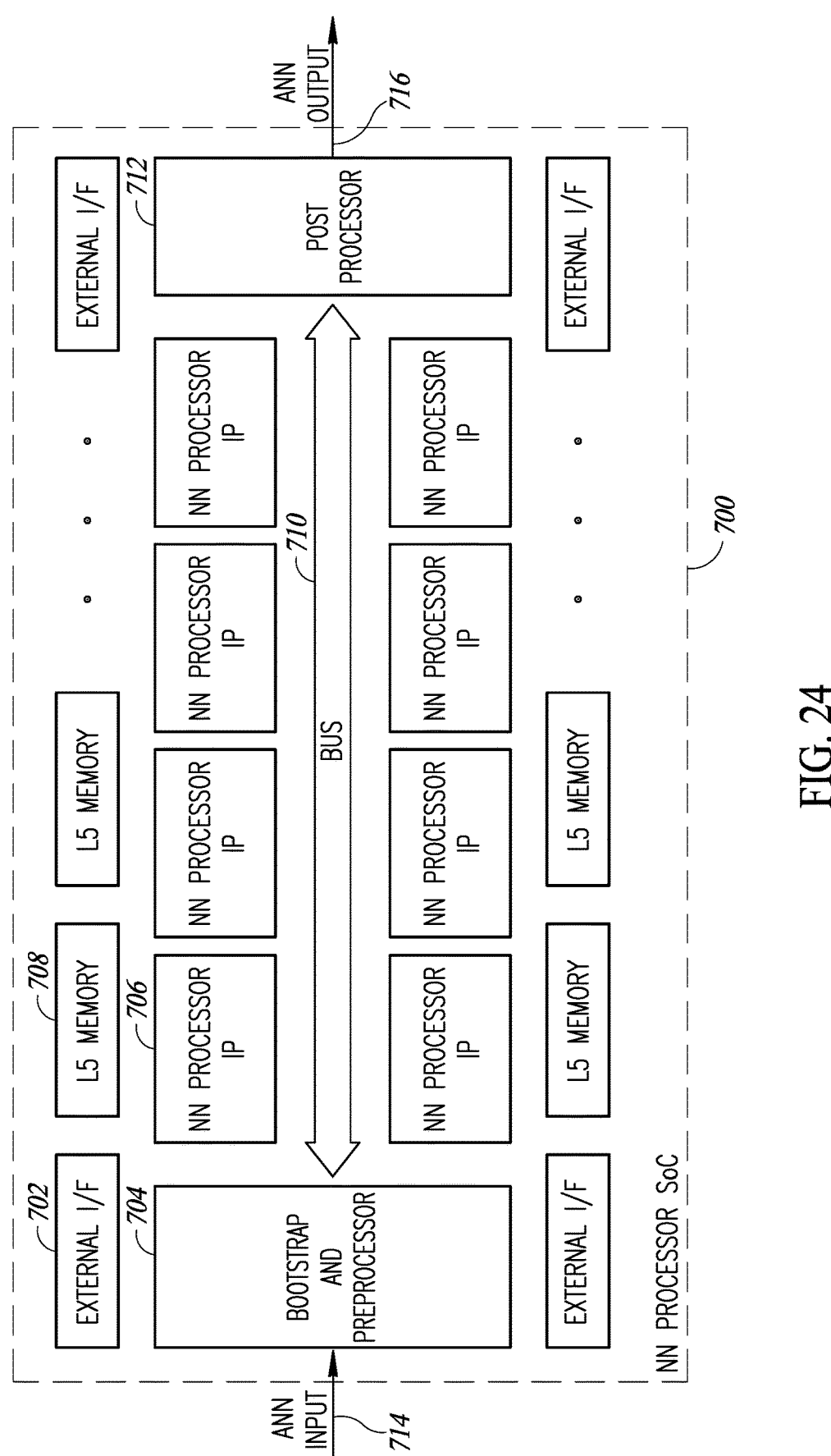
FIG. 24 is a diagram illustrating a first example multi-NN processor SoC system of the present invention.

A diagram illustrating a first example multi-NN processor SoC system of the present invention is shown in FIG. 24. In one embodiment, the NN processor core (or engine) as described supra and shown in FIGS. 4 and 5 can be replicated and implemented as a System on Chip (SoC). The intellectual property (IP) for the NN processor core can be used to implement a monolithic integrated circuit (IC). Alternatively, physical NN processor core dies can be integrated and implemented on an SoC.

Implemented as a monolithic semiconductor or an SoC, the NN processor SoC, generally referenced 700, comprises a plurality of NN processor cores 706 interconnected via an internal bus 710, one or more external interface circuits 702, one or more 'external' L5 memory circuits 708, bootstrap and preprocess circuit 704, and postprocess circuit 712. Note that the number of NN processor cores, L5 memory circuits, etc. is not limited to that shown as one skilled in the semiconductor arts can implement an IC or SoC having any number of NN processor cores and other components.

In operation, ANN input data 714 is written to the SoC 700 via an external I/F 702. The bootstrap and preprocess circuit 704 is operative to perform one or more functions depending on the implementation, including for example, buffering, clocking, power management, data throttling, etc. Data is then fed to the NN processor cores 706 for processing. The NN processor cores communicate with each other over the internal bus 710. Note that connectivity between the NN processor cores may comprise any desired routing type including such as full mesh, token ring, chained, etc. depending on implementation and is not critical to the invention. Note that the other circuit components also communicate over the bus, including the bootstrap and preprocessor 704, external I/Fs 702, L5 memories 708, and postprocessor 712.

Figure 25:
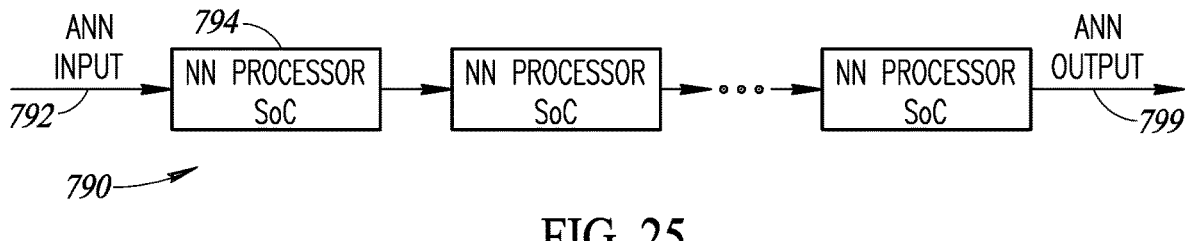
FIG. 25 is a diagram illustrating a second example multi-NN processor SoC system of the present invention.

A diagram illustrating a second example multi-NN processor SoC system of the present invention is shown in FIG. 25. In this example system, generally referenced 790, a plurality of NN processor cores or SoCs 794 are concatenated serially. ANN input data 792 enters the left most NN processor and ANN output data 799 exits the right most NN processor. The plurality of NN processors together implement the ANN model layer by layer.

Figure 26:
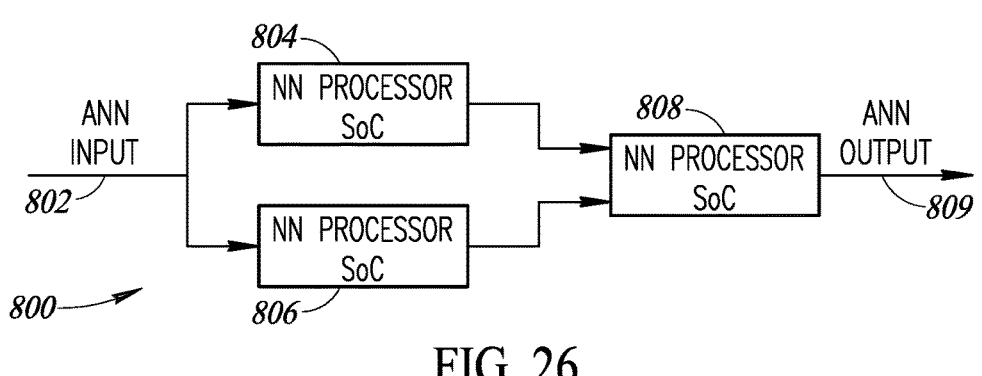
FIG. 26 is a diagram illustrating a first example multi-NN processor SoC system of the present invention.

A diagram illustrating a first example multi-NN processor SoC system of the present invention is shown in FIG. 26. In this example system, generally referenced 800, three NN processor cores or SoCs 804, 806, 808 are combined in a 2→1 gather scheme and together implement the ANN model. ANN input data 802 is input to both NN processors 804, 806 through input ports. In this example, two NN processor cores 804, 806 in parallel are needed to implement the ANN model, e.g., either (1) the model contains a very large number of neurons in one or more layers or (2) the number of neurons exceeds any of the resource constraints (e.g., control, memory or compute) of a single device. The outputs of each NN processor 804, 806 are input via chip to chip input ports to NN processor 808 which functions to generate the ANN output 809.

Figure 27:
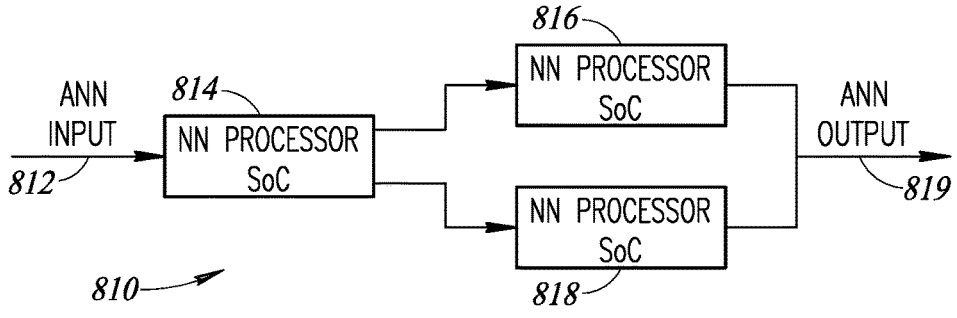
FIG. 27 is a diagram illustrating a first example multi-NN processor SoC system of the present invention.

A diagram illustrating a first example multi-NN processor SoC system of the present invention is shown in FIG. 27. In this example system, generally referenced 810, three NN processor cores or SoCs 814, 816, 818 are combined in a 1→2 scatter scheme and together implement the ANN model. ANN input data 812 is input to NN processor 814 through an input port. The output of NN processor 814 is input to both NN processors 816, 818. In this example, two NN processor cores 816, 818 in parallel are needed to implement the ANN model, e.g., either (1) the model contains a very large number of neurons in one or more layers or (2) the number of neurons exceeds any of the resource constraints (e.g., control, memory or compute) of a single device. The outputs generated by each NN processor 816, 818 are combined to form the ANN output 819.

Example ANN Mapping Strategies

As described supra, if the requirements of an ANN exceed the compute and/or memory resources of a single NN processor core, the ANN model can be split across several devices. The compiler/SDK seamlessly leverages the typically cellular nature of ANNs that allows splitting and merging between and across network layers. Within the compiler, the split is done while accounting for the bandwidth demand at the input and output of the sub-networks that are mapped to each device, in addition to relying on the fact that inter-layer bandwidth is inherently much lower than intra-layer bandwidth. Several example mapping possibilities and strategies are presented.

Generally speaking the device to device mapping, as performed by the compiler, is driven by the number of input and output ports present in the device (e.g., two in the present example). In the example case of two input and output ports on the device, the flexibility to map 1→2 (i.e. scatter), 2→1 (i.e. gather), as well as 11 (i.e. feedforward) allows constructing the system arrangements shown.

Figure 28:
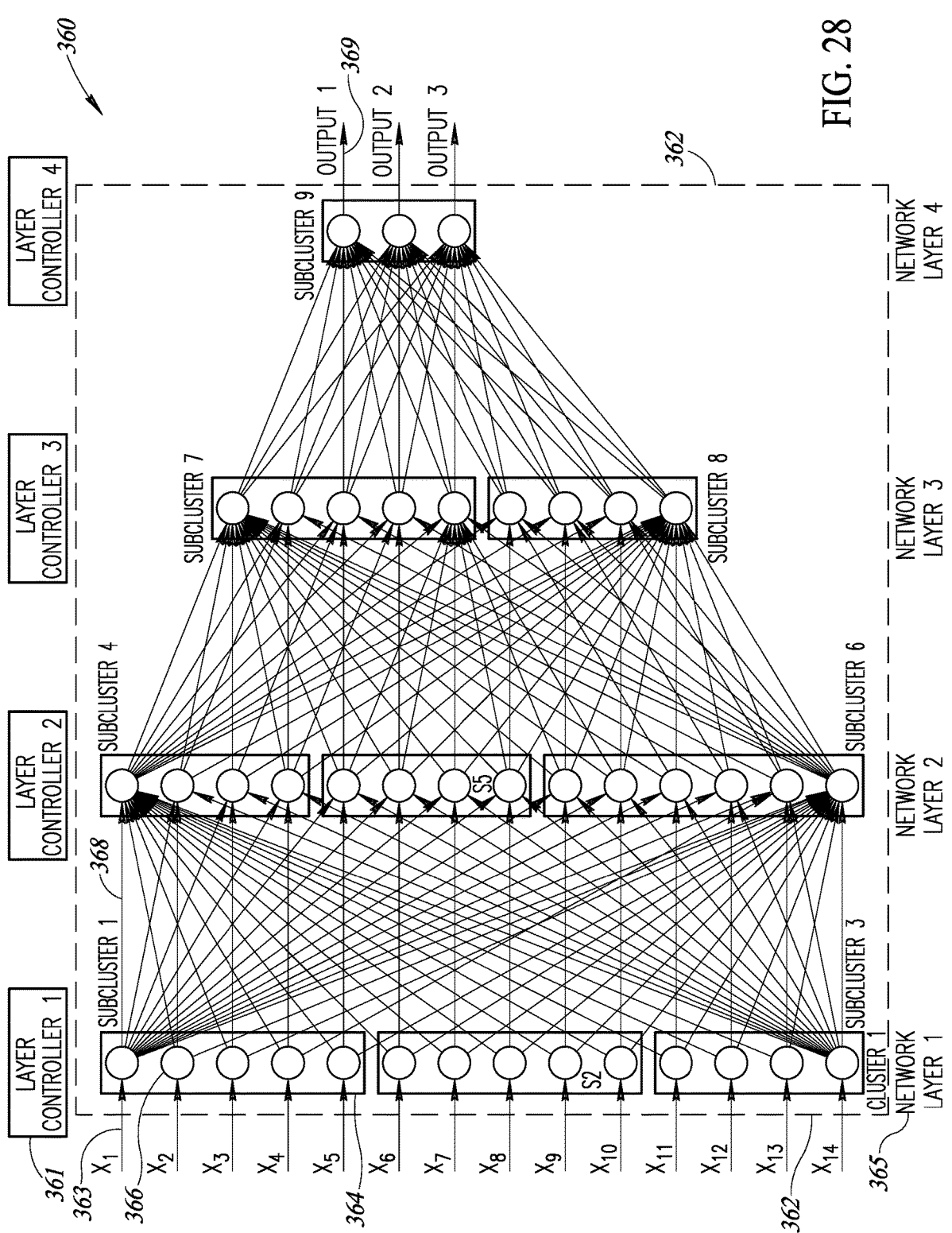
FIG. 28 is a diagram illustrating an example mapping strategy for the first example artificial neural network of FIG. 2.

A diagram illustrating an example mapping strategy for the first example ANN of FIG. 2 is shown in FIG. 28. As described supra, the compiler/SDK functions to map the logical ANN model to the physical NN processor device. As a result of its analysis, in this example, the compiler determines that the entire ANN can be implemented in a single cluster 362 in a single NN processor device. Each network layer 365 in the ANN is mapped to one or more subclusters 364 and an LC 361 is assigned as well. Thus, for example, network layer 1 is mapped to three subclusters, namely subclusters 1, 2, and 3 which also receive ANN inputs 363. These three subclusters are configured and controlled by LC 1. Similarly, the neurons in network layer 2 are mapped by the compiler to subclusters 4, 5, and 6 and assigned to LC 2. The neurons in network layer 3 are mapped to subclusters 7 and 8 and assigned to LC 3. Finally, network layer 4 is mapped to subcluster 9 and configured and controlled by LC 4. The ANN outputs 369 are generated by subcluster 9.

Figure 29:
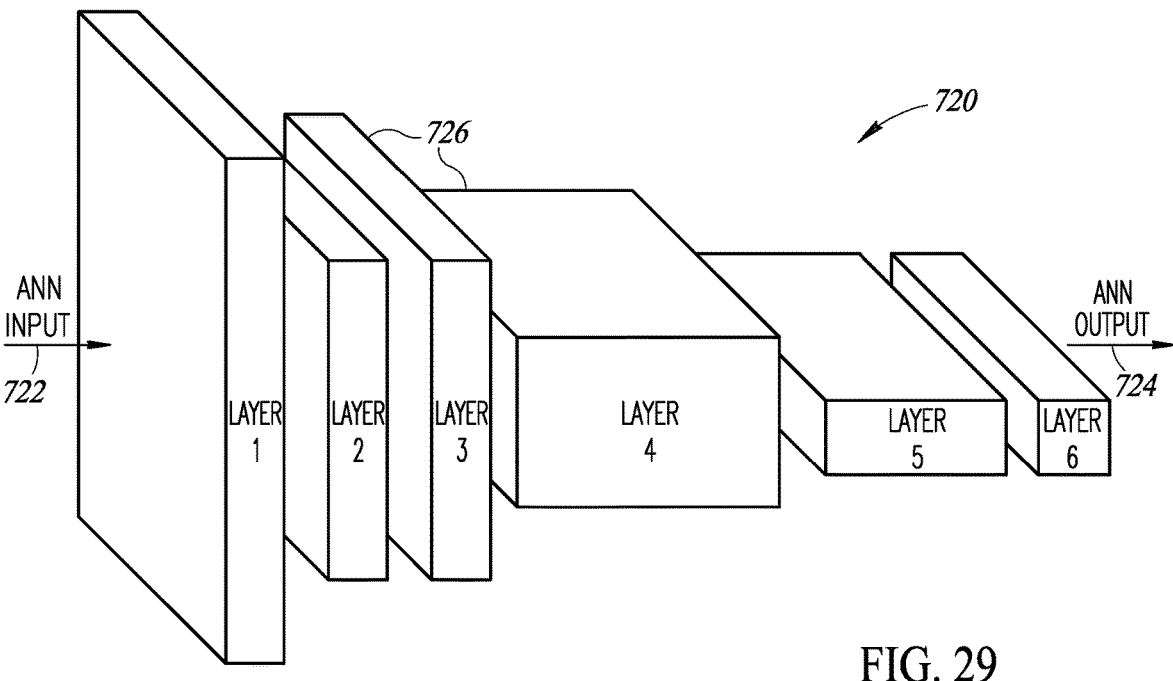
FIG. 29 is a diagram illustrating a second example artificial neural network.

A diagram illustrating a second example artificial neural network is shown in FIG. 29. This example ANN, generally referenced 720, which may be a convolutional type NN, comprises a plurality of layers 726, including Layers 1 through 6. Layer 1 receives ANN input 722 and Layer 6 generates ANN output 724.

Figure 30:
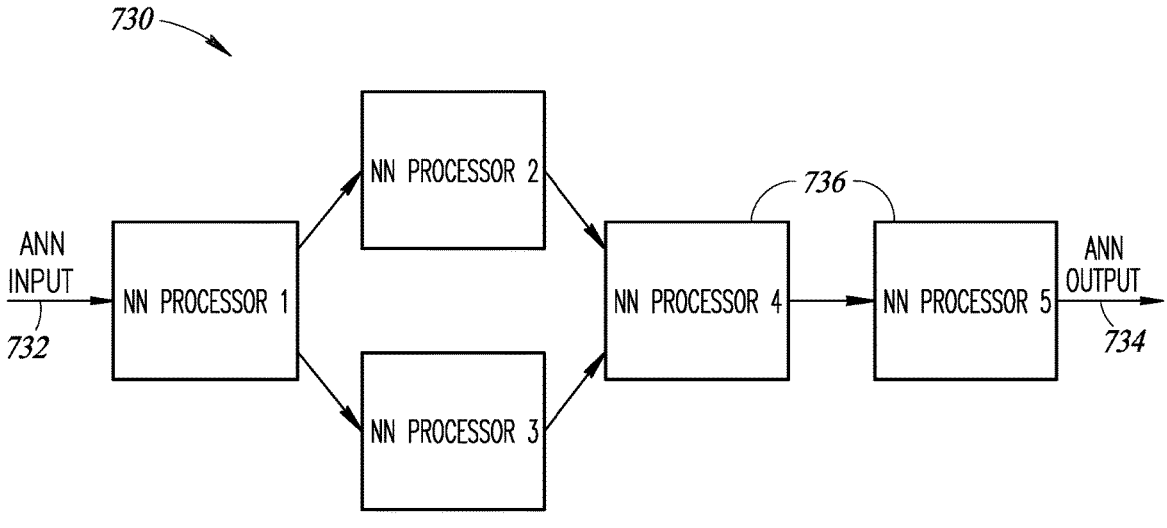
FIG. 30 is a diagram illustrating an example multi-NN processor SoC system of the ANN of FIG. 29.

A diagram illustrating an example multi-NN processor SoC system of the ANN of FIG. 29 is shown in FIG. 30. The NN system, generally referenced 730, represents the mapping of the ANN 720 to the NN processor system of the present invention. Each NN processor 736 comprises a separate IC or alternatively, a separate die in an SoC.

It is the function of the compiler and SDK to map the logical ANN model to physical NN processor configuration during the complication process. In this example, Layer 1 maps into the entire NN processor 1 since its capacity in terms of compute elements, memory fabric, etc. is only sufficient to implement Layer 1. NN processor 1 also received the ANN input 732. Layers 2 and 3 are such that they cannot be implemented in a single device, thus two devices are required, i.e. NN processors 2 and 3, in parallel and the processing is split between them. Layer 4 is large but the compiler determines that it can be implemented in a single device. Thus, the entire NN processor 4 is mapped to Layer 4. Layers 5 and 6 are analyzed and mapped to a single NN processor 5 device by the compiler. NN processor 5 generates the ANN output 734. Note that the NN processors communicate with each other in a feedforward manner via the chip to chip interfaces in each device.

Figure 31:
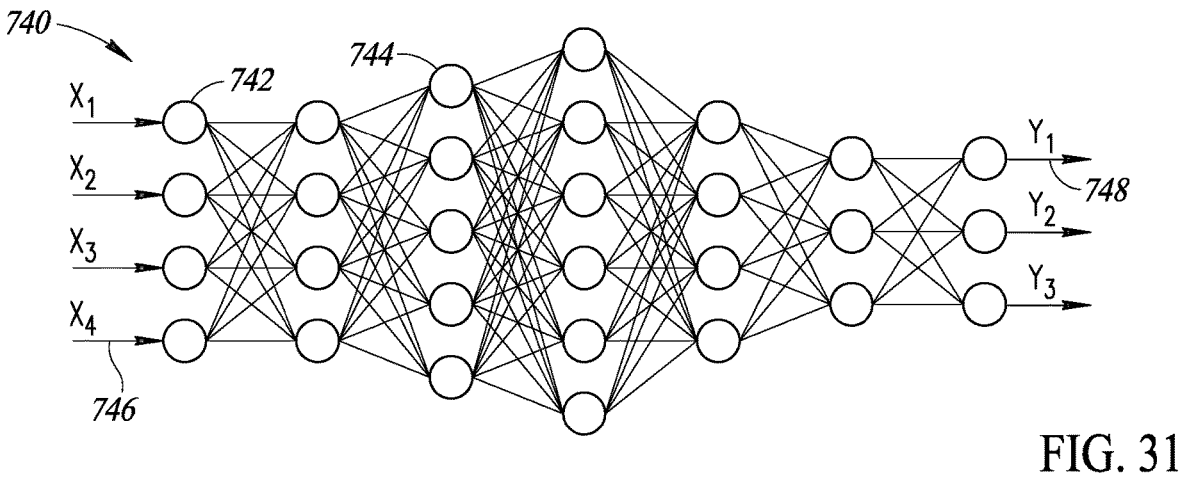
FIG. 31 is a diagram illustrating a third example artificial neural network.

A diagram illustrating a third example artificial neural network is shown in FIG. 31. The example ANN, generally referenced 740, is intended to represent any desired ANN. It comprises a plurality of neurons 744 organized into different network layers. Input data X 746 is input to the first layer and output data Y 748 is generated by the last layer.

Figure 32:
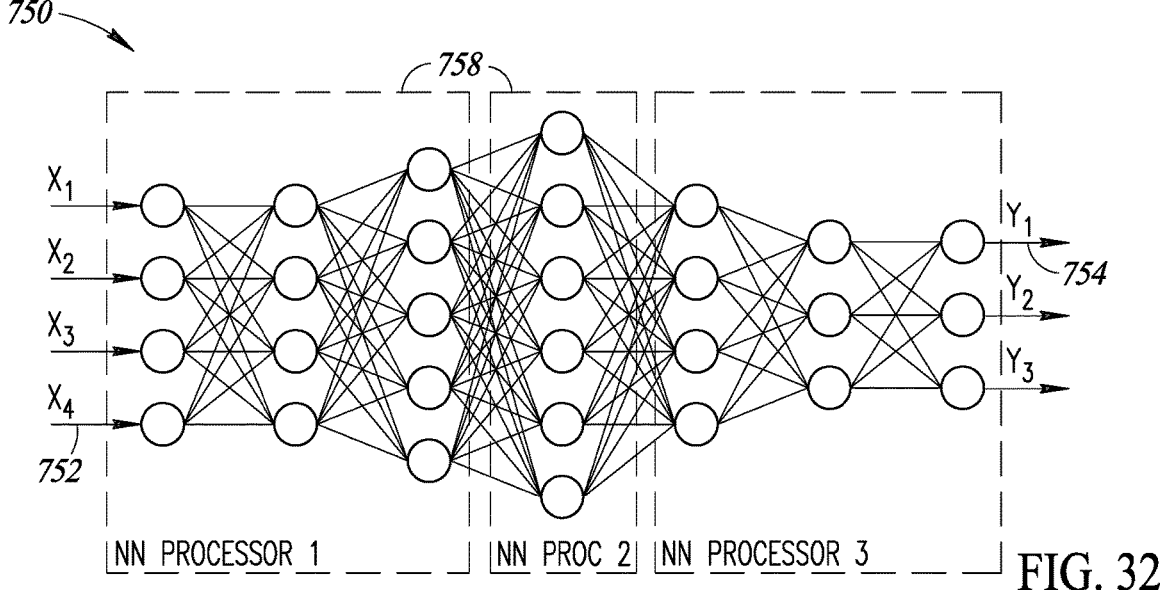
FIG. 32 is a diagram illustrating a first example multi-NN processor SoC system of the ANN of FIG. 31.

A diagram illustrating a first example multi-NN processor SoC system of the ANN of FIG. 31 is shown in FIG. 32. In this example, a first mapping, generally referenced 750, is generated by the compiler/SDK and comprises several NN processor devices. In particular, the neurons 756 in the first two network layers are mapped to NN processor 1, the third network layer is mapped to NN processor 2 and the last three network layers are mapped to NN processor 3. ANN input data 752 is input to the first layer in NN processor 1. NN processor 3 generates the ANN output data 754.

Figure 33:
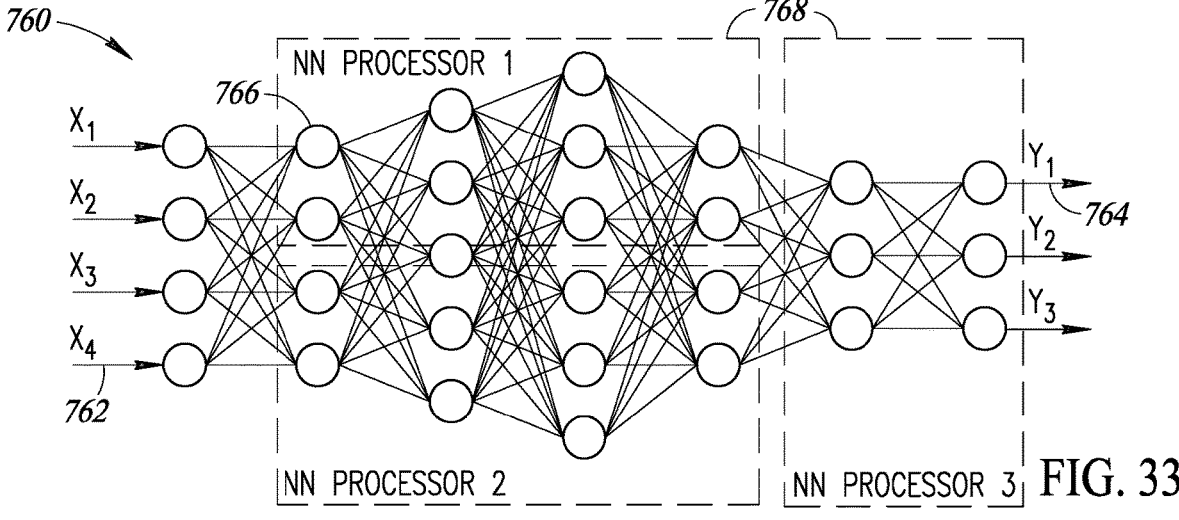
FIG. 33 is a diagram illustrating a second example multi-NN processor SoC system of the ANN of FIG. 31.

A diagram illustrating a second example multi-NN processor SoC system of the ANN of FIG. 31 is shown in FIG. 33. In this example, a different mapping, generally referenced 760, is generated by the compiler/SDK and comprises several NN processor devices. In particular, the neurons 766 in the first four network layers are split between two devices, namely NN processors 1 and 2, as they exceed the capacities of a single device. The last two network layers are mapped to NN processor 3. ANN input data 762 is input to the first layer in NN processors 1 and 2. NN processor 3 generates the ANN output data 764.

Scanning Multi-Dimensional Data Stored in Memory

In implementing ANNs, often times the data that is stored in memory is multi-dimensional in nature, i.e. the data stored in memory is ordered and structured. For example, in convolutional neural networks, data arrays of two, three or more dimensions are stored in memory. This fact can be leveraged to simplify the addressing required to scan the memory. The present invention leverages the fact that a dimension (or several dimensions) are to be scanned where memory is accessed element by element for a particular dimension. This is important since without this assumption, the 'next' trigger signal (described infra) as a lean control interface does not hold.

For example, consider the addressing required for a conventional 1 MB memory. In this case, 20-bits are required to access a memory location. Using the multi-dimension address generator of the present invention, 20-bits of address are still required to access a location in memory. The number of address lines required to interface to the memory does not change. What is different, however, is that a memory access circuit is placed in front of the memory to reduce the number of address lines required to be generated by the compute elements. The memory access circuit generates the memory address. Thus, rather than require the full 20-bits of address to be provided, the memory access circuit only requires a few signal lines and a single signal line to count up or down. In one embodiment, once configured, the memory access circuit only requires a single external control input (e.g., NEXT) provided from the compute elements to access a location in memory.

The invention thus provides a memory access circuit for efficiently accessing a memory entity, which is by nature linear and organized sequentially as a multi-dimensional tensor of given shape and form. Using this circuit, a window of Z-dimensions with each dimension of size $S_1$ through $S_Z$, can be accessed on a dimension-level basis (i.e. location advancement within a given dimension) using a single control bit per dimension.

The memory access circuit is preferably placed in close proximity to the memory circuit. This minimizes the routing and space required in the NN device for the complete set of address line signals for the memory. In one embodiment, in place of the full set of address lines, the memory access circuit takes as input a signal that indicates the particular dimension to access. Within a dimension, memory access is sequential. Any number of dimensions may be configured with the only limitation the size of the memory.

In one embodiment, the memory access circuit can be used in combination with the memory windowing technique described in detail supra to further reduce the number of signals required to be provided by the compute elements to access memory, thus further narrowing the control bandwidth required. This is because the neural network data stored in the memory represents a tensor, i.e. a Z-dimensional matrix of size.

Figure 34:
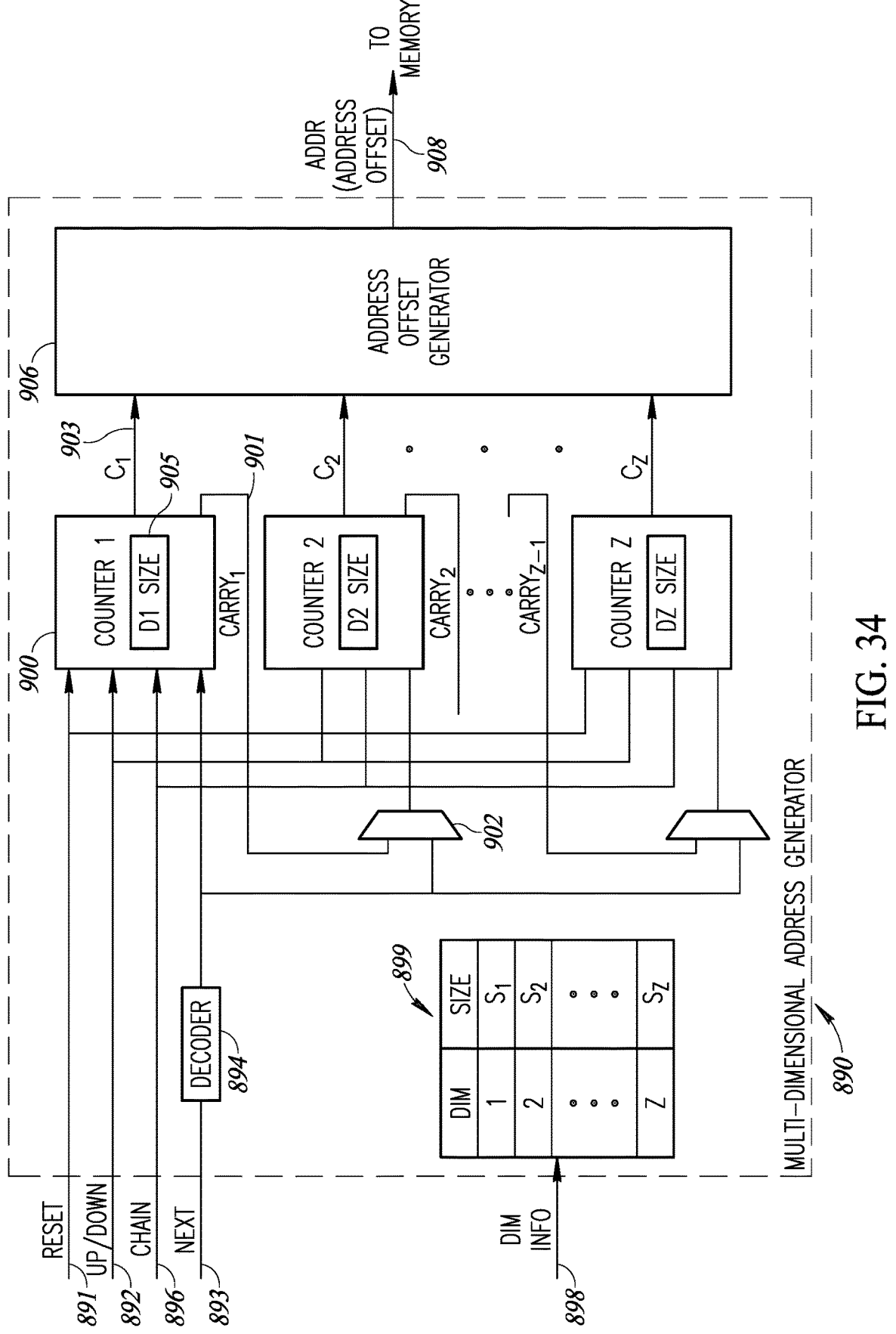
FIG. 34 is a block diagram illustrating an example multi-dimensional memory access circuit in more detail.

A block diagram illustrating an example multi-dimensional memory access circuit in more detail is shown in FIG. 34. The memory access circuit, generally referenced 890, comprises a plurality of counters 900, labeled counter 1 through counter Z, with each counter associated with a different dimension, multiplexer circuits 902, decoder 894, dimension information register bank 899 and address generator circuit 906. A RESET signal 891 functions to reset and clear all the counters 900. An UP/DOWN signal 892 functions to configure the counters to count either up or down causing the memory address (ADDR) 908 output to either increase or decrease.

A CHAIN input signal 896 functions to configure whether the counters are chained together or function independently. If the counters are independent, then each counter counts without regard to arriving at the end of a dimension. The counter for that dimension wraps around to the beginning of the dimension and continues counting.

If the counters are chained, then when a counter reaches the end of its dimension, a carry signal 901 is generated that is input to a neighboring counter (i.e. the next dimension) causing it to trigger (i.e. increment or decrement). In this manner, counting in one dimension can have a ripple effect on the count in other dimensions. This enables a repeating single count command (NEXT) in one dimension to scan (i.e. access) multiple dimensions in memory.

In addition, dimension information is provided to the circuit 890. This includes the number of dimensions Z of the data as well as the size S of each dimension. The dimension size information stored in register 905 is used by each respective counter to configure a 'modulo' function or maximum value whereby when the counter reaches the maximum size (i.e. the dimension size), generates the carry signal 905, and then wraps back to zero and continues counting.

The function of the multi-dimensional memory access circuit (also referred to as a multi-dimensional counter) is to address (or scan) memory that is virtually organized in Z multiple dimensions each having a given size. The circuit is operative to generate an address offset of a given coordinate in the Z-space. In one embodiment, the order of the dimensions in multi-dimensional space matters. The inner most dimension is defined as dimension 1 and the outermost dimension as dimension Z. Thus, as the index increases, the dimensions go from inner to outer.

The inner most dimension is 'inner' in the sense that it is the only dimension whose elements are stored in consecutive locations in memory. Thus, the first element in the tensor is stored in address $addr_0$, the next at $addr_1$, etc. through to $addr_{S1}$. Given the dimension size $S_1$, it can be said that $S_1$ elements belong to this dimension and once $addr_{S1-1}$ is reached the counter wraps back to 0.

The counters 900 are statically configured a priori to count in a pre-defined direction either up (i.e. increment) or down (i.e. decrement) in accordance with the UP/DOWN input signal 892. The counter for each dimension is capable of independently counting (up or down) where each counter can be configured differently, i.e. not all counters count in the same direction. When a counter increments, it is along a single dimension each cycle. The NEXT signal 893 comprises a number 1 through Z indicating which dimension the circuit 890 is to generate a memory address for. Decoder 894 functions to translate the input dimension number to a signal output on one of 'trigger' or 'count' instruction lines, each trigger command line input to one of the counters. Thus, the NEXT signal functions to (1) indicate which of the dimensions to generate a memory address for; and (2) serve as a 'clock' indicating when to trigger the address generation.

As described supra, the counters can count independently or in chain mode. When in independent mode, the counters are not chained and each counter has a maximum value set by the corresponding dimension size S. This value may be stored in a register 905 in each counter, e.g. counter 1 stores the size of dimension 1, counter 2 stores the size of dimension 2, etc. through dimension Z. The counter, in accordance with the UP/DOWN signal, counts either up or down (i.e. forward or backward) to the maximum value and returns (or wraps) to zero once reached. The NEXT input signal and the output of decoder 894 indicates which dimension to trigger (i.e. to clock). Once triggered, the selected counter corresponding to this dimension updates its value (i.e. counts either up or down). Note that in this mode, each counter counts up or down independently from the action occurring on all the other counters.

In chain mode, however, one or more counters can be chained to neighboring counters. In this mode, counters that are chained are triggered by a carry signal 901 generated by the preceding neighboring counter instead of the NEXT signal (as selected by the respective multiplexer 902). Counters that are configured in chain mode cannot be controlled by the external NEXT signal. Counters that are chained, have the ability to trigger another counter once the inner counter's maximum count has been reached. When a counter reaches its maximum value, a carry signal 901 is generated and input to the next outer dimension counter it is chained to trigger it to count (i.e. either up or down).

Note that in one embodiment, the order of chaining is from the inner dimension to outer dimensions. Note also that the inner most dimension counter 1 is never chained since there cannot be a dimension more inner than it and thus it always increments or decrements explicitly via the NEXT signal. The multiplexers 902 in front of counters (other than counter 1), function to select either the decoded NEXT signal or the carry signal from a counter it is chained to.

The output values 903 of all the counters as well as the size of each dimension are used to calculate the memory address addr 908 output of the circuit 890. In one embodiment, the address is a summation of the current count status 903 of all counters where each count value is multiplied by the dimensions of all previous dimensions, i.e. dimensions that are 'inner' to it. The following expression is used to generate the memory address where addr denotes the generated address output, SCALE represents a scale factor, Z represents the number of dimensions, $S_1$ represents the size of dimension j, and $C_i$ is the value of counter i. Note that the address generated by the circuit typically functions as an offset or index to the memory that is added to a base value to yield the final physical memory address.

$$addr = SCALE\left[\sum_{i=2}^{Z}\left(\prod_{j=1}^{i-1}S_j\right)(C_i - 1) + C_1\right] - 1 \qquad (6)$$

The SCALE factor is used to represent the size in bytes (i.e. the granularity) of each element in memory. For example, if SCALE=1 the memory address offset steps by one at a minimum. If the content stored in memory is double-word (i.e. 32-bit), then each address offset generated comprises four bytes and thus the address is generated in 4-byte granularity or SCALE=4.

Figure 35:
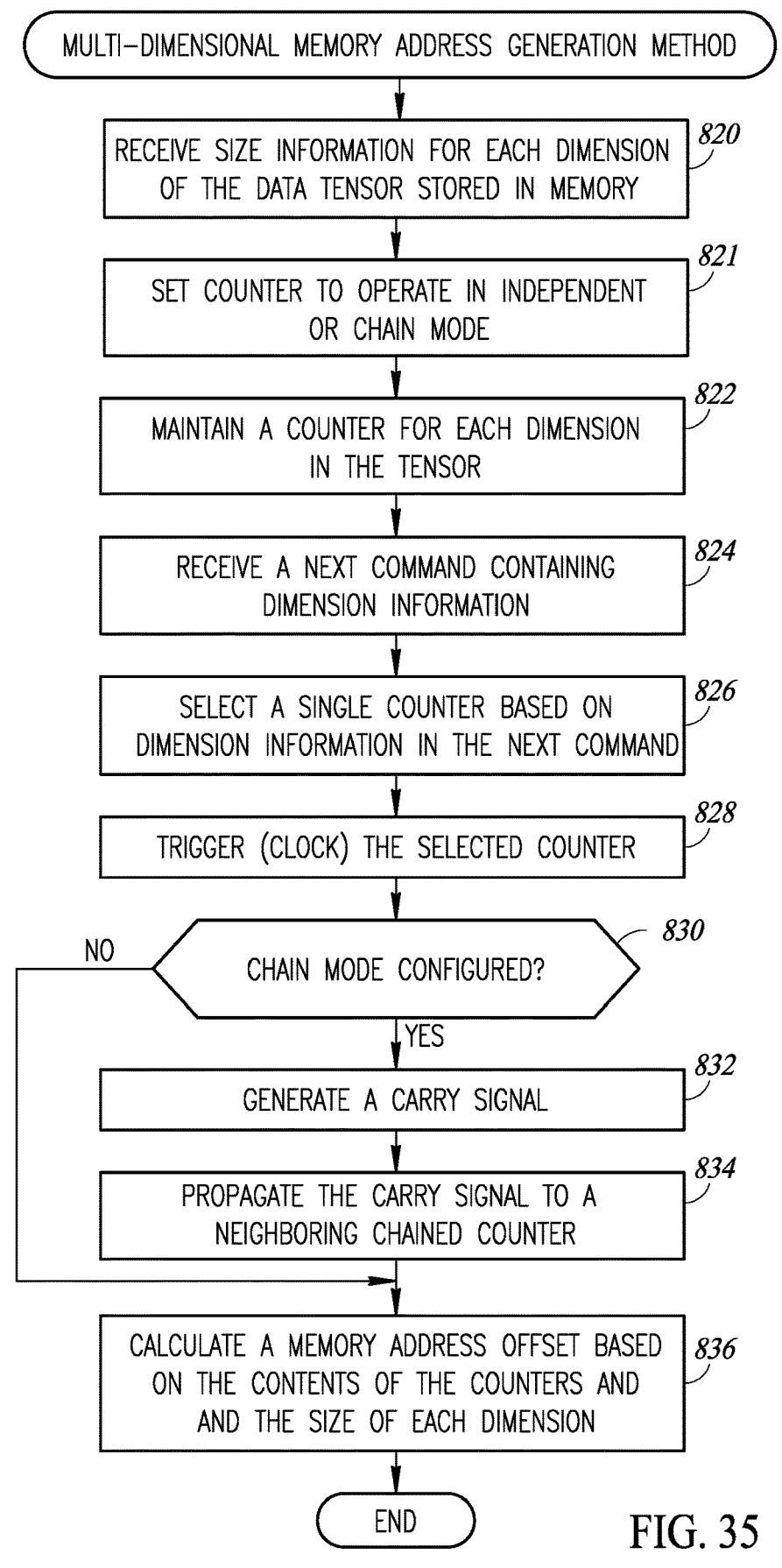
FIG. 35 is a flow diagram illustrating an example multi-dimensional memory access circuit generator method of the present invention.

A flow diagram illustrating an example multi-dimensional memory access circuit generator method of the present invention is shown in FIG. 35. Initially, the circuit receives the size of each dimension $S_j$ of data stored in memory as well as an up/down configuration setting (step 820). The counters are also set to operate in either independent or chain mode (step 821). A counter is assigned and a count maintained for each dimension (step 822). An external NEXT trigger (command or count) signal is received containing dimension information (step 824). Based on the NEXT signal, a single counter is selected (step 826). The selected counter is clocked (step 828).

If the counters are configured to independent mode (step 830), the method continues with step 836. If the counters are configured to chain mode, the clocked counter generates a 'carry' signal if it has reached its maximum value (step 832). In one embodiment, the carry signal is conditionally generated (i.e. active) if the count has elapsed. The majority of the time the carry signal is inactive and only becomes active when the count value has reached the dimension size. The carry signal is propagated to the chained neighboring counter causing it to either increment or decrement (step 834). The memory address is calculated based on the value or all the counters in the tensor and the sizes of each dimension (step 836).

Several access schemes are illustrated herein including for one, two and three dimensions. It is noted, however, that the memory access circuit can be used for any number of dimensions and is not limited to the example disclosed herewith.

Figures 36, 39:
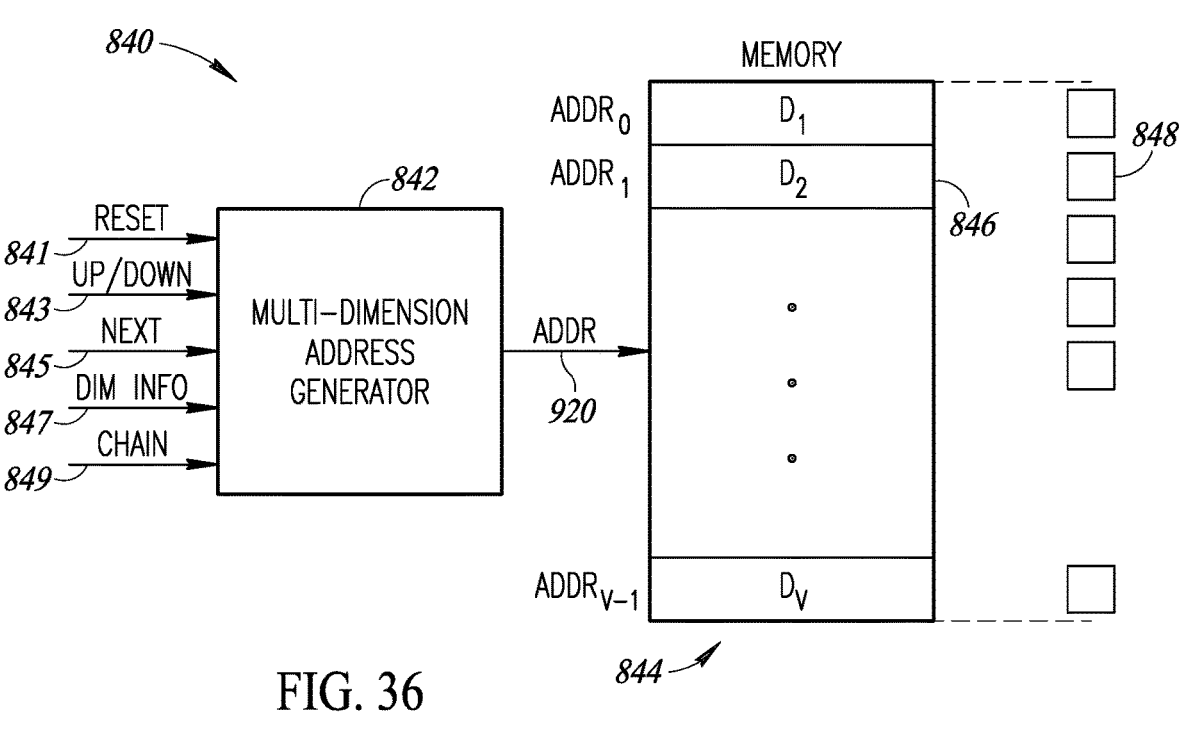
FIG. 36 is a diagram illustrating an example multi-dimension memory access circuit for accessing data stored in one dimension.
FIG. 39 is a diagram illustrating an example two-dimensional memory array.

A diagram illustrating an example multi-dimension memory access circuit for accessing data stored in one dimension is shown in FIG. 36. The memory access scheme, generally referenced 840, comprises a multi-dimension memory access circuit 842 and a memory 844. In one embodiment, the memory access circuit receives a RESET signal 841, UP/DOWN signal 843, NEXT signal 845, dimension information 847, and chain signal 849. The memory 844 comprises a plurality of V (i.e. $S_1$) individual memory locations 846, denoted $D_1$ through $D_V$, that are accessed via address lines $ADDR_0$ through $ADDR_{V-1}$. In this example, the data array stored in memory is linear with only a single dimension wherein consecutive addresses reflect the original vector arrangement. This is represented by the linear column of squares 848, with each square representing a single memory location.

In operation, the memory access circuit 842 is configured a priori via several of the input signals. The UP/DOWN signal indicates whether sequential access to the memory increases or decreases after each access, i.e. whether the preceding or subsequent location is accessed in the memory. The dimension information is used to configure the memory access circuit with the number of dimensions Z of the data that is stored in the memory as well as the size S of each particular dimension. The address offset 920 output of the circuit 842 is used to generate the physical addressing to the memory 844.

Figure 37:
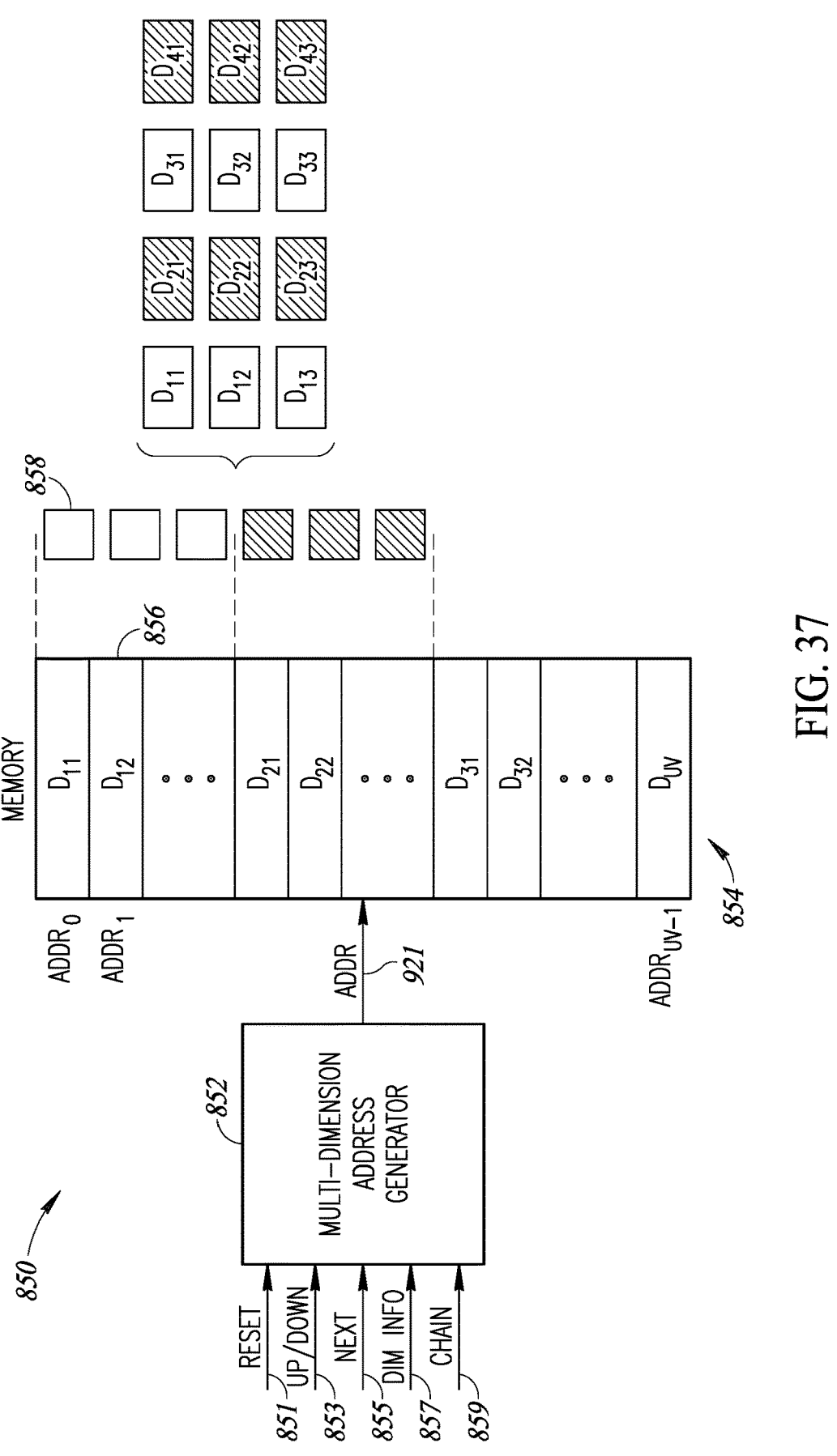
FIG. 37 is a diagram illustrating an example multi-dimension memory access circuit for accessing 2-dimensional data.

A diagram illustrating an example multi-dimension memory access circuit for accessing 2-dimensional data is shown in FIG. 37. The memory access scheme, generally referenced 850, comprises a multi-dimension memory access circuit 852 and a memory 854. In one embodiment, the memory access circuit receives a RESET signal 851, UP/DOWN signal 853, NEXT signal 855, dimension information 857, and chain signal 859. The memory 854 comprises a plurality of U·V (i.e. $S_1·S_2$) individual memory locations 856, denoted $D_{11}$ through $D_{UV}$ that are accessed via address lines $ADDR_0$ through $ADDR_{UV-1}$, where the first digit of the D subscript represents the column and the second digit represents the row. In this example, the data stored in memory has two dimensions but is laid out in a consecutive manner in memory. This is represented by the column of squares 858, with each square representing a single memory location, whereby squares of one dimension are blank while squares of the second dimension are cross hatched.

In operation, the memory access circuit 852 is configured a priori via several of the input signals. The UP/DOWN signal indicates whether sequential access to the memory increases or decreases after each access, i.e. whether the preceding or subsequent location is accessed in the memory. The dimension information is used to configure the memory access circuit with the number of dimensions Z of the data that is stored in the memory as well as the size S of each particular dimension. The address offset 921 output of the circuit 852 is used to generate the physical addressing to the memory 854.

Figure 38:
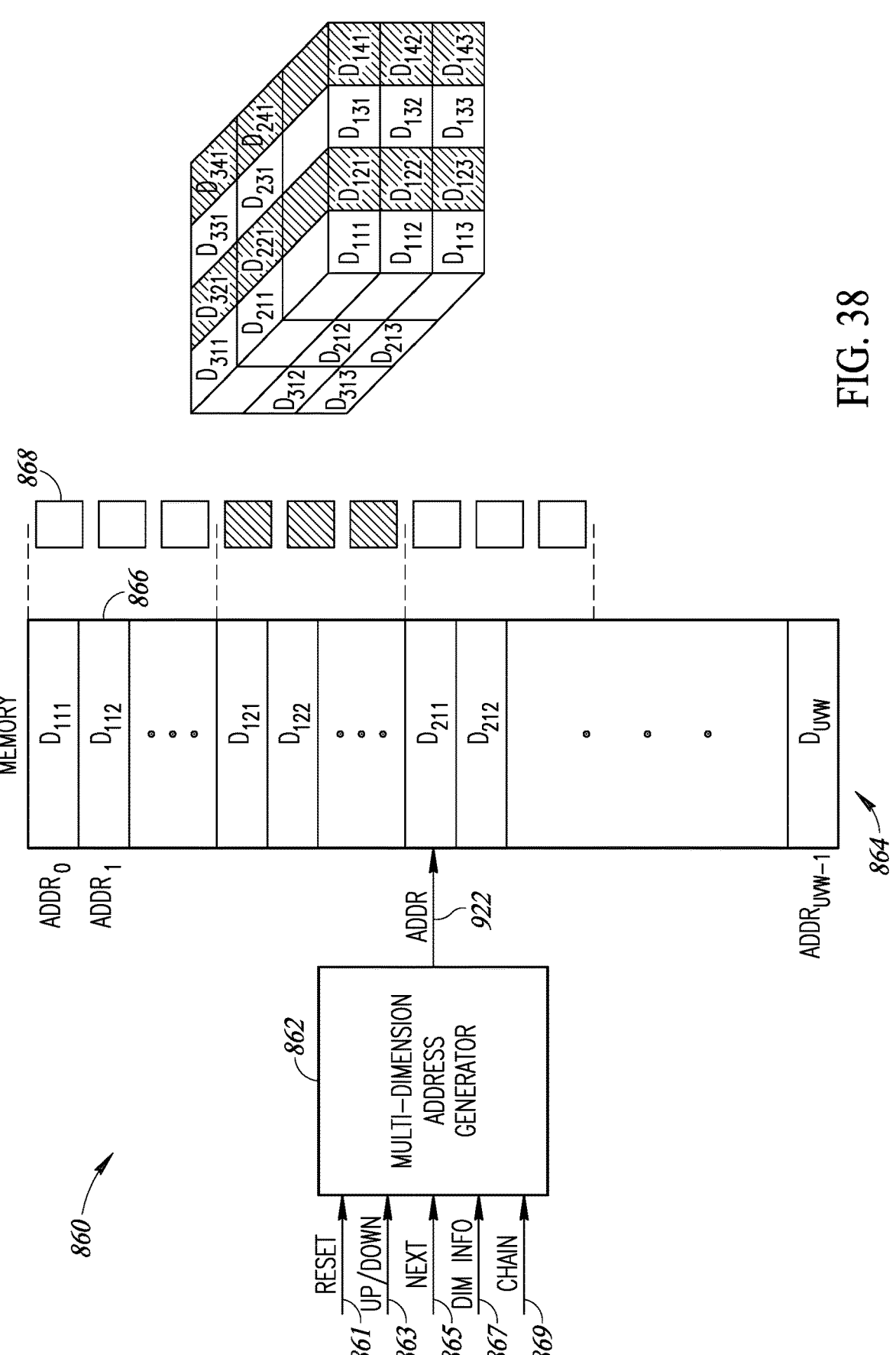
FIG. 38 is a diagram illustrating an example multi-dimension memory access circuit for accessing 3-dimensional data.

A diagram illustrating an example multi-dimension memory access circuit for accessing 2-dimensional data is shown in FIG. 38. The memory access scheme, generally referenced 860, comprises a multi-dimension memory access circuit 862 and a memory 864. In one embodiment, the memory access circuit receives a RESET signal 861, UP/DOWN signal 863, NEXT signal 865, dimension information 867, and chain signal 869. The memory 864 comprises a plurality of U·V·W (i.e. $S_1·S_2·S_3$) individual memory locations 866, denoted $D_{111}$ through $D_{UVW-1}$, that are accessed via address lines $ADDR_0$ through $ADDR_{UVW-1}$. In this example, the data stored in memory has two dimensions but is laid out in a consecutive manner in memory. This is represented by the column of squares 868, with each square representing a single memory location, whereby squares of one dimension are blank while squares of the second dimension are cross hatched.

In operation, the memory access circuit 862 is configured a priori via several of the input signals. The UP/DOWN signal indicates whether sequential access to the memory increases or decreases after each access, i.e. whether the preceding or subsequent location is accessed in the memory. The dimension information is used to configure the memory access circuit with the number of dimensions Z of the data that is stored in the memory as well as the size S of each particular dimension. The address offset 922 output of the circuit 862 is used to generate the physical addressing to the memory 864.

A diagram illustrating an example 2-dimensional memory array is shown in FIG. 39. As an example, consider a 2-dimensional tensor arrangement (e.g., three rows by four columns). In memory 910 the data is laid out in a consecutive manner at address 0 through 11 storing data elements 912, namely $D_{11}$ through $D_{43}$. The multi-dimension memory access circuit functions to generate addressing for the entire array using only the NEXT input command to advance through memory. To be capable of addressing a desired location in the 3×4 matrix, the counters are configured to have two dimensions (i.e. $Z=2$, $S_1=3$, $S_2=4$).

In one example, the entire array is to be accessed. Assuming the counters are configured to be in chain mode, the first NEXT command is provided to select the first data Doo element in the array. Memory addresses starting from 0 and extending to 11 are generated by receiving successive NEXT commands. When the value of counter 1 goes from 2 to 3, a carry from counter 1 to counter 2 is generated. This causes counter 2 to increment even though the NEXT input command is directed to counter 1.

In another example, consider access to $D_{32}$ of the matrix, where the first digit of the subscript represents the column and the second digit represents the row. Assuming the counters are at position $D_{32}$ in the matrix, the address generator will compute an output address using the following expression (assuming SCALE=1).

$$addr = \left( \sum_{i=2}^{Z} \left( \prod_{j=1}^{i-1} S_j \right) (C_i - 1) + C_1 - 1 \right) = \qquad (7)$$

$$\left( \sum_{i=2}^{2} \left( \prod_{j=1}^{1} S_j \right) (C_i - 1) + 2 - 1 \right) = (3*(3-1)+2) - 1 = 7$$

The address offset of 7 is added to a base address to generate the appropriate physical address to the memory. Note that tensors having different dimensions are handled in a similar fashion as described supra. Thus, the present invention provides an efficient mechanism for accessing multi-dimensional data stored in a memory.

Neural Network Processor Safety Mechanisms

In one embodiment, the NN processor incorporates several functional safety concepts which reduce its risk of failure that occurs during operation from going unnoticed. The safety mechanisms disclosed herein function to detect and promptly flag (i.e. report) the occurrence of an error and with some of the safety mechanisms correction of the error is also possible. These features are highly desired or even mandatory in certain applications such as use in autonomous vehicles as dictated by the ISO 26262 standard.

The NN processor is realized as a programmable SoC and as described herein is suitable for use in implementing deep neural networks. The processor includes hardware elements, software elements, and hardware/software interfaces, in addition to one or more software tools (e.g., SDK) which are provided to the costumer.

The following describes the scope of the safety concept related to the NN processor. Note that the SDK can be excluded from the safety context except for functions that are directly involved in content deployed to the device. Note further that this does not exclude the embedded firmware that runs on the on chip MCU subsystem.

The NN processor and SDK are elements that are developed separately from the end application in which it deployed by the user. Therefore, the NN processor can be considered to be a Safety Element out of Context (SEooC). As other elements and systems including the NN processor may interact with sensors, additional controllers, and actuators, etc., assumptions are made on the system level environment in which the NN processor is typically used. Several intended functional concepts and accompanying assumptions are described hereinbelow.

Figure 40:
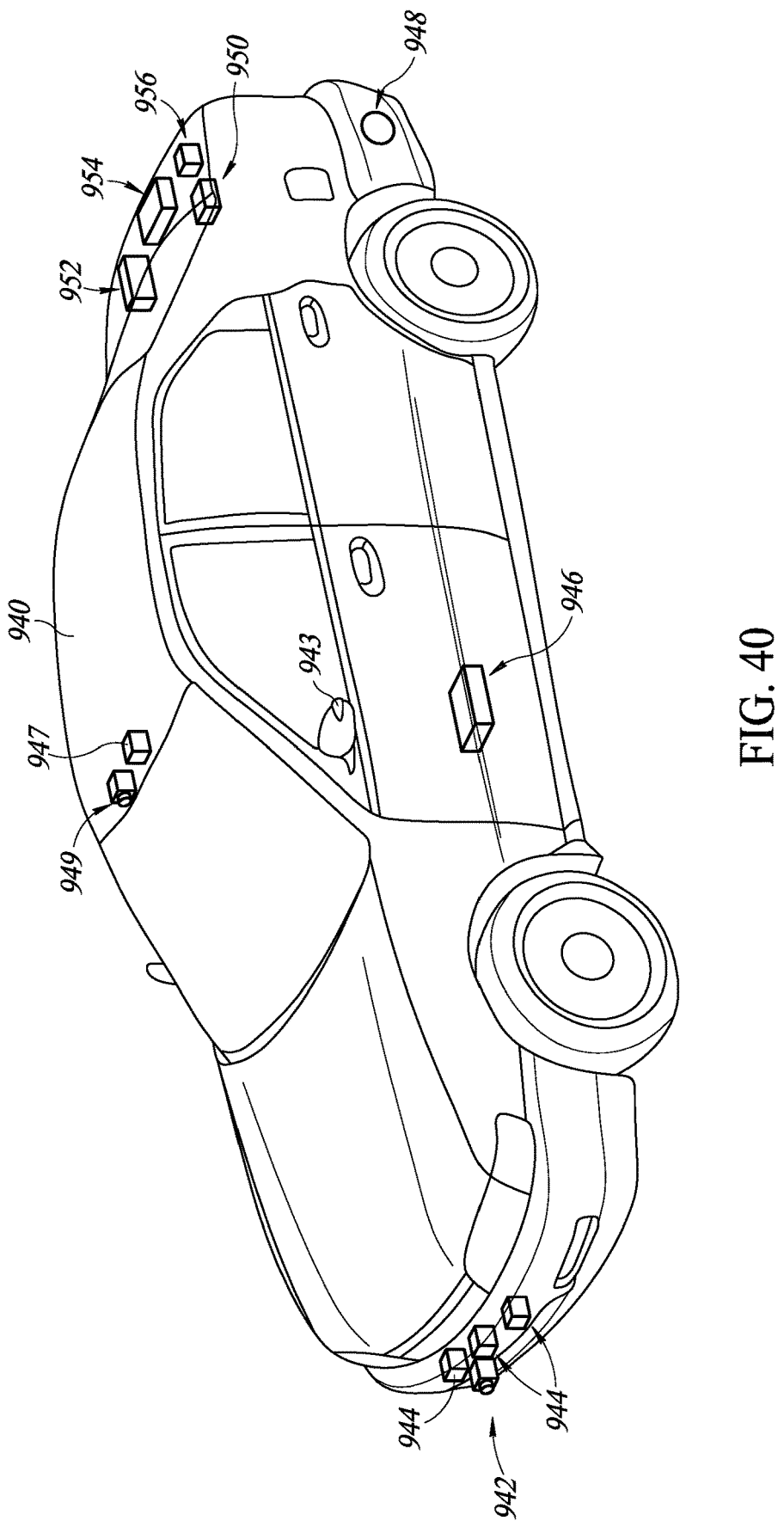
FIG. 40 is a diagram illustrating an example vehicle with sensors and related multiple neural network processors.

A diagram illustrating an example vehicle with sensors and related multiple neural network processors is shown in FIG. 40. The vehicle 940 comprises a plurality of sensors and processors including forward looking camera 942, forward looking radar 944, dashboard camera 949, dashboard lidar 947, mirror camera 943, advanced driver assistant system (ADAS) electronic control unit (ECU) 946, side camera and/or radar 948, display controller 950, vision computer 954, vehicle control computer 952, and drive by wire controller 956.

The NN processor can be embedded in any number of the elements and systems in the vehicle, playing varying active roles, having various interfaces, and therefore different functional safety requirements. The specific system or item which embeds the NN processor is typically defined by the system integrator and application provider, but some guidelines and examples are provided by this section. A few possible elements and systems are described within the context of the NN processor.

Figure 41:
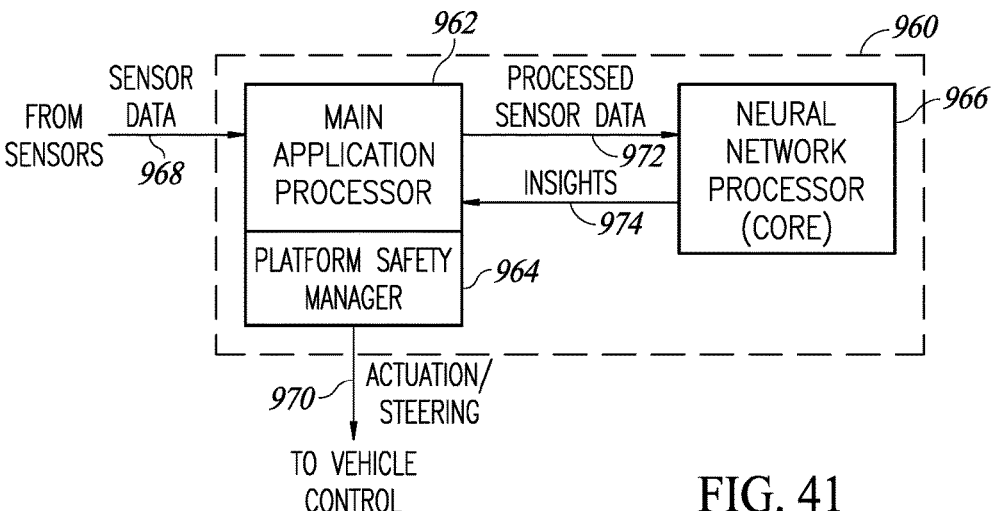
FIG. 41 is a diagram illustrating an example centralized sensor data processing system.

In one embodiment, a centralized processing platform incorporates the NN processor which serves as a companion processor offloading the neural network and perception tasks. A diagram illustrating an example centralized sensor data processing system is shown in FIG. 41. The system 960 comprises a main application processor (e.g., host) 962, platform safety manager 964 and NN processor 966. Note that in this system it is assumed that there is a main application processor orchestrating the compute platform including the NN processor. In operation, sensor data 968 from one or more sensors are input to the main application processor which functions to generate processed sensor data 972 which is output to the NN processor 966. The NN processor, configured with the application neural network, generates insights 974 about the input data which are output to the main application processor 962, which in response outputs actuation/steering commands 970 to the vehicle control system.

In this embodiment, the NN processor serves as a dedicated NN accelerator. It receives processed sensor data or other processed data from other sources. The NN processor device outputs insights back to the main application processor, which may be used for decisions on actuation or steering in connected systems. In the context of a centralized processing system, the NN processor may be part of an automotive safety integrity level (ASIL) D design and will thus have system level redundancy.

The major hazards in this configuration, however, are (1) availability failure where the NN processor is unable to perform its designated functionality owing to some system level issue (e.g., cannot power up), meaning that the insights are not received back at the perception subsystem; and (2) false indications where the NN processor is providing wrong output for a given input as either false positives or false negatives. The correctness of the output is derived from comparing the outputs to a bit exact emulation of a neural network's output golden model.

Figure 42:
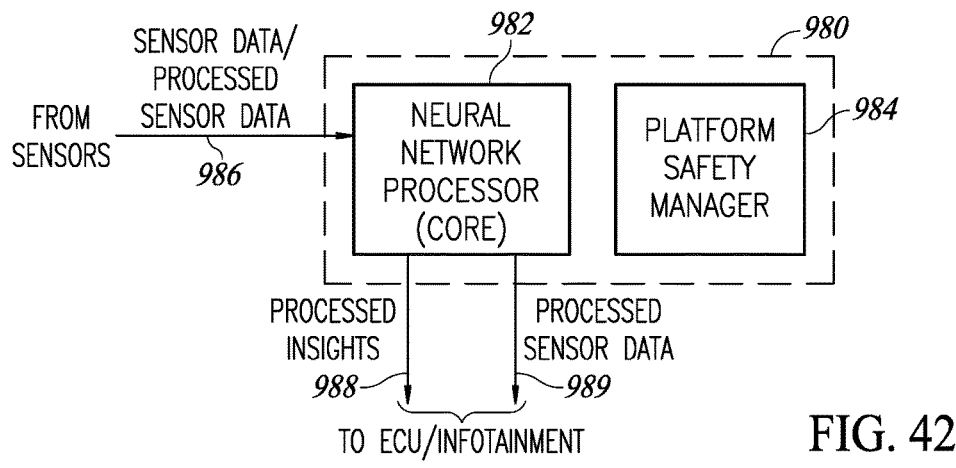
FIG. 42 is a diagram illustrating an example of a stand-alone sensor data processing system.

A diagram illustrating an example of a standalone sensor data processing system is shown in FIG. 42. The system 980 comprises an NN processor 982 and platform safety manager 984. In this standalone sensing system, the NN processor serves as the main processor in the system's data path, carrying safety related sensor information over a physical medium. In operation, sensor data 986 from one or more sensors are input to the NN processor 982 which functions to generate processed sensor data 989 and processed insights 988 which is output to the ECU or infotainment system of the vehicle.

In this embodiment, in the context of a sensing system, the NN processor is part of a system controlled by a main processor (not shown). The major hazards in this configuration are similar to those stated in connection with FIG. 41. The implications, however, are limited at the platform level since the impact is limited to the subsystem that suffers the impact. In this context, the NN processor acts as a standalone system and thus determines the ASIL level for this subsystem rendering it ASIL-B.

The major hazards in this configuration include (1) sensor subsystem failure because the NN processor is unable to perform its designed functionality; and (2) the NN processor is providing wrong output for a given input either as false positives or false negatives.

Figure 43:
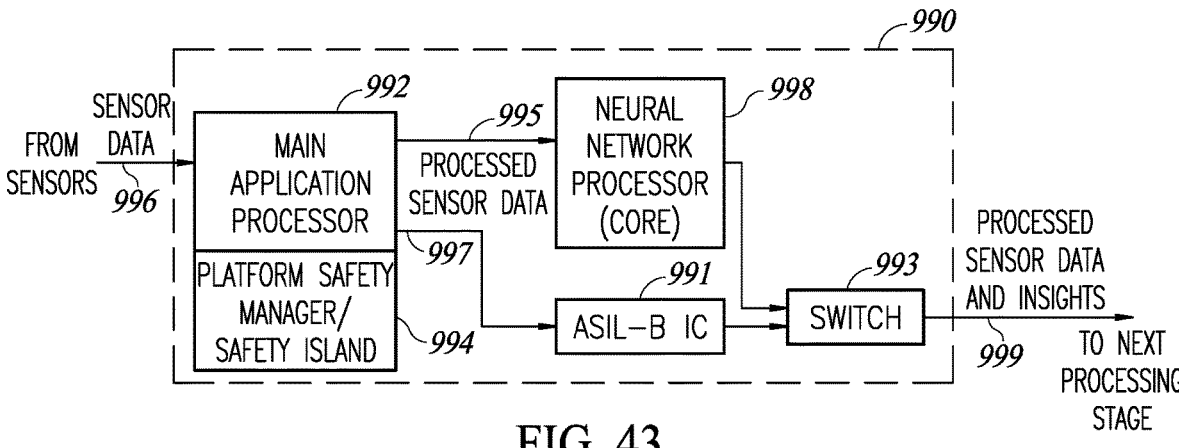
FIG. 43 is a diagram illustrating an example of a companion sensor data processing system.

A diagram illustrating an example of a companion sensor data processing system is shown in FIG. 43. The system 990 comprises a main application processor 992, platform safety manager 994, NN processor 998, additional ASIL-B chips and switch 993. This embodiment comprises a companion sensing system/sensing hub with the NN processor serving as a companion processor, running a neural network application. In this system, it is also assumed that there is a main application processor orchestrating the NN processor. Note that in this configuration the NN processor may be a part of the main data path, carrying safety related sensor information over a physical medium.

In this context, the NN processor functions as a neural network accelerator. It may also be part of the data path of the system, serving as the logical or physical output of the system. Therefore, the NN processor may output the original data and/or the insights 999 to a centralized ECU. In the context of a centralized processing system, the NN processor is part of an ASIL-D design and can thus contributes to system level redundancy. It is noted that the level of system level redundancy is determined by the integrator with the NN processor providing several features that the integrator may or may not choose to take advantage of.

The major hazards in this configuration include (1) sensor subsystem malfunction where the NN processor is unable to serve its designated functionality owing to some system level issue (e.g. cannot power up), meaning that both insights and original processed data are not received back at the perception subsystem; (2) data corruption where the NN processor corrupts the processed sensor data enroute to the ECU subsystem; and (3) false indications where the NN processor provides wrong output for a given input either as false positives or false negatives.

Since the intended functionality and application of the NN processor cannot be known in advance, a detailed hazard analysis cannot be conducted. Therefore, the system level safety goals are typically defined by the safety system level designer. Several example safety goals of the system include (1) the NN processor should serve its intended designated functionality and in case it fails due to a system level fault, this should be detected and reported to the platform safety manager; (2) the NN processor should provide the correct output for a given input where correctness is defined with regard to the output of a bit exact golden model computing the same input and the NN processor should not output either false positives or false negatives insights; (3) the NN processor should route the original sensing data to the next processing stage without corrupting it and if the NN processor corrupts the original, this state should be detected and reported to the platform safety manager; and (4) the NN processor should permit to be transited to one of three safe states including (a) a shutdown state; (b) a reset state where all the internal states and configurations are reset to a reset value, all I/O are transited to their reset value, and memory values are retained; and (c) a halt state there all the internal states and configurations and memories are retained.

The NN processor is suitable for use in safety relevant applications. As the exact end application of the device is unknown, however, it is considered Safety Element Out of Context (SEooC) development as defined in the ISO 26262 standard. In one embodiment, the NN processor is capable of achieving ASIL-B Ready (and ASIL-D by decomposition) by implementing both internal safety mechanisms and external diagnostic mechanisms.

Since the NN processor will be embedded in an application and system of unknown nature, the fault detection and recovery time may depend on multiple system factors. Several of the factors include (1) sensor input data rate; (2) the interface speed of the NN processor, e.g., Ethernet MAC in 1000 Mbps mode; and (3) platform safety manager processor speed.

Given a particular configuration, the NN processor ensures detection and reporting of any faults leading to violations of the safety goals enumerated supra in a deterministic time period. The safety system designer can determine this time based on suitable software tool. In addition, the NN processor can enter one of the defined safe states upon request.

In addition, the system safety architect should ensure that the resulting fault detection time resulting from the specific system setting meets the desired system fault tolerant time interval (FTTI) requirement.

Figure 44:
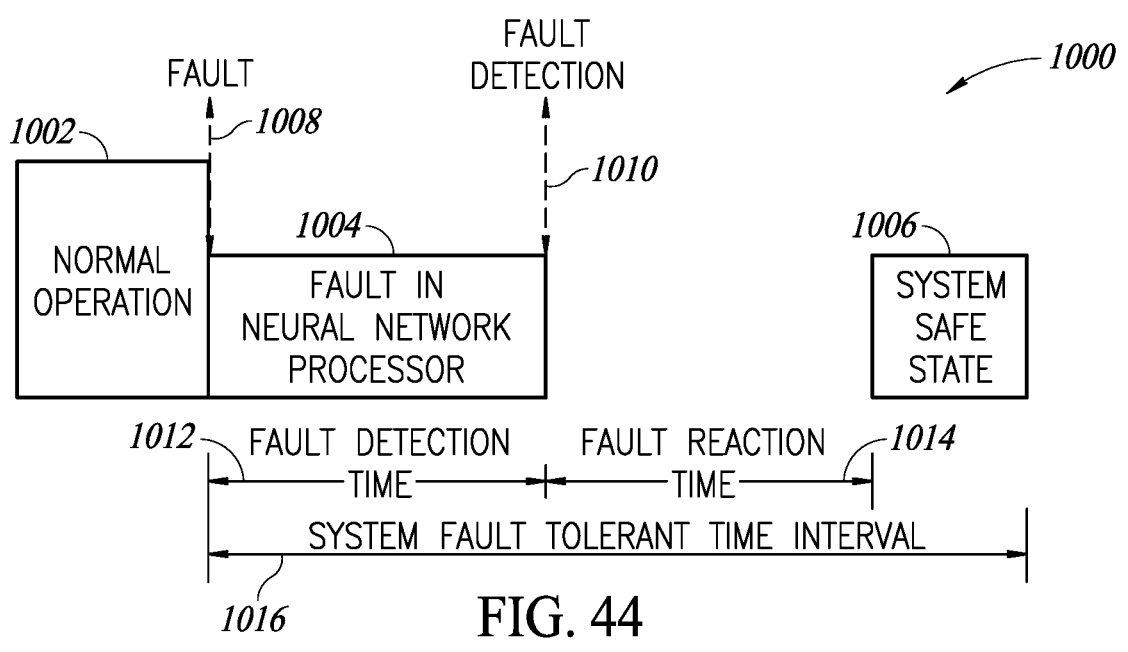
FIG. 44 is a diagram illustrating example fault tolerance, detection, and reaction timing.

A diagram illustrating example fault tolerance, detection, and reaction timing is shown in FIG. 44. In the scheme shown, generally referenced 1000, at some point during normal operation 1002 a fault 1008 occurs in the NN processor 1004. The fault is detected 1010 within a fault detection time 1012. Within a fault reaction time 1014, the system enters a safe state 1006. The combined fault detection time 1012, fault reaction time 1014 and time in the system safe state 1006 is the system fault tolerant time interval 1016.

As a rule of thumb, the NN processor is operative to detect and report faults at a latency within the timing of an incoming frame or less as typically NN processor outputs are determined at the end of each frame. For example, for input data at 30 FPS, the NN processor detects and reports faults violating safety goals within a time frame of 30 ms.

Nevertheless, appropriate software tools allow the system safety architect to decrease this time at the possible cost of reduced functionality.

The safety mechanisms described infra can generally be divided into the following four groups: training time, compilation time, deployment, and runtime. Redundant modeling is performed during training time (and compile time involving model analysis and allocation both being part of the compilation flow) where one or more redundant paths in the neural network model are populated. This covers multiple independent logic failure paths and improves model robustness margins. Note that none of the safety mechanisms disclosed herein involve training time.

Redundant allocation is employed during compilation time where multiple instances of one or more layers is allocated to allow error detection and/or majority voting. This is intended to cover multiple independent physical failure paths.

During deployment final testing and production line testing are deployed. These are used to detect faulty memory cells and faulty interconnects. This serves to minimize or eliminate static, undetected production, storage or handling failures.

Several built in self-test (BIST) techniques are employed during runtime operation of the NN processor including powerup BIST, transition BIST, periodic/background BIST, and online/runtime fault detection. The BIST tests provide input and transient data protection (in transit)m memory protection for weights, and memory protection for intermediate results. Thus, quasi-static and transient fault protection is provided.

Figure 45:
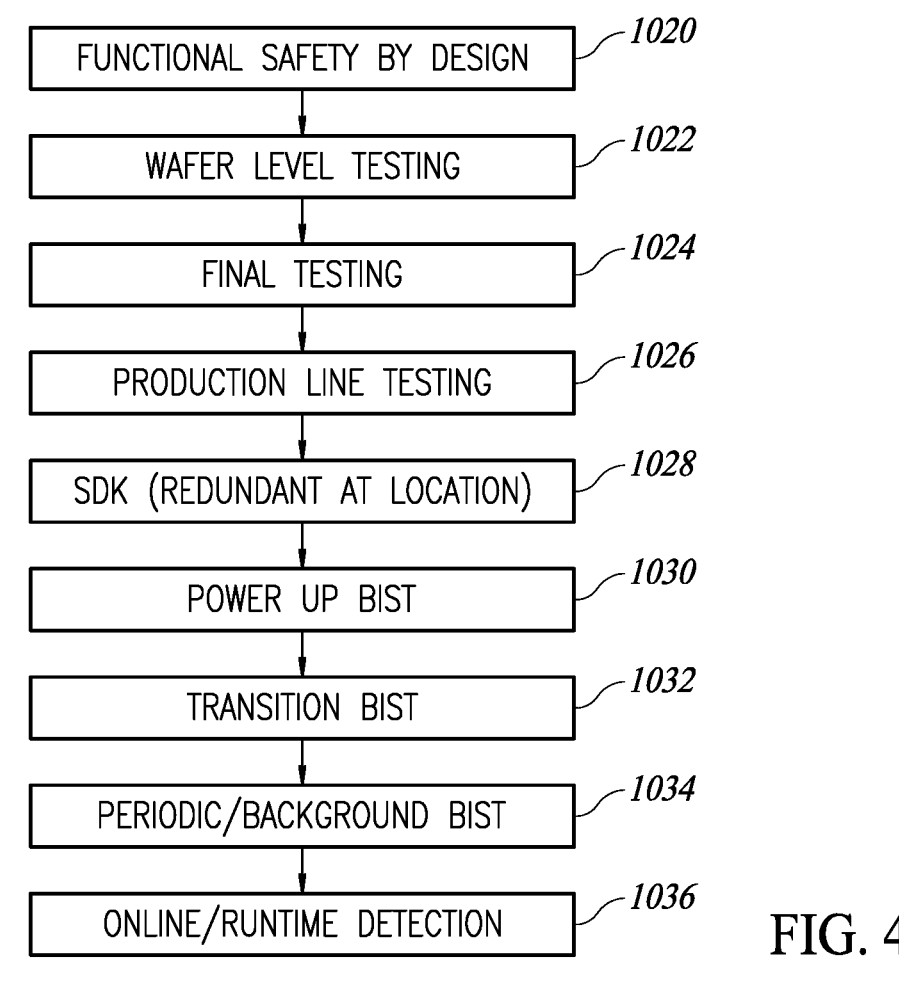
FIG. 45 is a diagram illustrating an example hierarchical approach to safety features in a neural network processor.

In one embodiment, the invention includes a hierarchical approach to safety that reflects an end-to-end philosophy towards safety-aware design, implementation, and provisioning. The various approaches reflect a high degree of intervention to address residual risks and to detect both systemic and random faults. A diagram illustrating an example hierarchical approach to safety features in a neural network processor is shown in FIG. 45.

Functional safety by design 1020 refers to mechanisms that lower the error/failure probability based on inherent properties of the design of the NN processor circuit. These safety features are built in and guaranteed at design time. Examples include design redundancy (especially redundancy of sensitive logic) to avoid single points of failure, determining which memory elements require protection (e.g., memory error correction code (ECC), cyclic redundancy check (CRC)), connectivity, logic protection, lock step, and shared bus error detection.

In conventional systems, most circuits are by default nonredundant and thus need special consideration. Examples include clock and power delivery circuitry and to some extent sensitive control signaling circuitry. In terms of design redundancy, a major difference over typical prior art redundancy methods is that the redundancy mechanisms disclosed herein are not predetermined, hardwired, or fixed but rather flexible and applied according to the actual workload.

Wafer level testing 1022 refers to tests performed on the die while still at the wafer stage but before slicing the die and packaging and wire bonding steps. Sometimes it is desirable to weed out bad chips at this stage rather than spend time and money on bonding and packaging.

Final testing 1024 refers to mechanisms that are applied during production of the NN processor after slicing, wire bonding, and packaging. Based on the results of the test, the NN processor is configured based on observed faults. Primarily, this refers to mechanisms such as memory repair which allows leveraging design induced redundancy in a way that is transparent to the rest of the system. Note that binning, yield, and defective parts per million (DPPM) issues come into play with testing at this stage and are relevant for the purpose of guaranteeing failure likelihood for the NN processor.

Production line testing 1026 refers to mechanisms carried out by the original equipment manufacturer (OEM)/customer during production. It allows detection of issues not observed in final testing as these tests are typically longer and more thorough. In addition, they are typically performed on the customer's end product system and provide more real world testing. The provisions available for the customer in this case are limited to information defined in nonvolatile memory (NVM), providing fault indication during boot time. A suitable software tool may be provided to the customer to facilitate testing of the chip.

The SDK 1028, provided to the customer, is a capability that enables safety-aware compilation through redundancy. One example of the SDK based safety feature is redundant allocation where one or more circuit elements are repeated. This safety feature is controlled and determined by the customer as they decide on any redundancy to provide in their NN application. This translates into duplication of layers that are guaranteed to run on different resources. It imposes, however, utilization inefficiency from the circuit replication and the constraints imposed on the allocation process. Note that allocation constraints are applied based on actual distribution of fault likelihood.

Power up built in self-test (BIST) 1030 performed checks of the hardware at the time of power up. Upon power up a list of self-tests are performed. In one embodiment, tests are focused on the circuit portions with a higher likelihood to fail (e.g., memory cells). This can be realized through either dedicated hardware, external Flash or boot ROM.

Transition BIST 1032 refers to circuit checks made during mode changes. These comprise tests that are applied when going out of lower power/standby mode. They are intended to be limited in order to avoid crippling the low-power mode performance at the system level. The primary goal for these tests is to detect issues that may have evolved over time and triggered by the power up effect while avoiding the need to test the chip periodically and thus minimize tests periodically performed.

Idle or periodic detection mechanisms 1034 includes testing activity and checks that take place once during a predefined period. In one embodiment, this is limited to the absolute minimum required content that was undetected by the safety other mechanisms.

Online/runtime detection mechanisms 1036 function to extend the original network with dummy checkers that guarantee mathematical equivalence and thus does not impact performance while enabling continuous evaluation of the proper operation of internal circuit modules.

In one embodiment, to enhance safety in the design of the NN processor, several guidelines can be applied. Circuit modules comprise a single HALT/INHIBIT input to enable strict control for aborting existing operations. In addition, two FAULT outputs are provided, to indicate two types of faults, namely (1) errors that can be interrogated over time; and (2) fatal issues that trigger immediate action.

Circuit modules comprise a placeholder for a fault aggregator that merges all faults to assist in providing a common interface for external diagnostics. Circuit modules with multiple instantiation are driven separately in terms of all unique signaling such as reset, clock, and power. Circuit analysis can ensure that there are a minimum number of single point aggregators (e.g., one single reset signal distributed from a single source). Further each circuit module may include dedicated fault analysis to identify design specific faults. Further, numeric fault probabilities can be provided.

Figure 46:
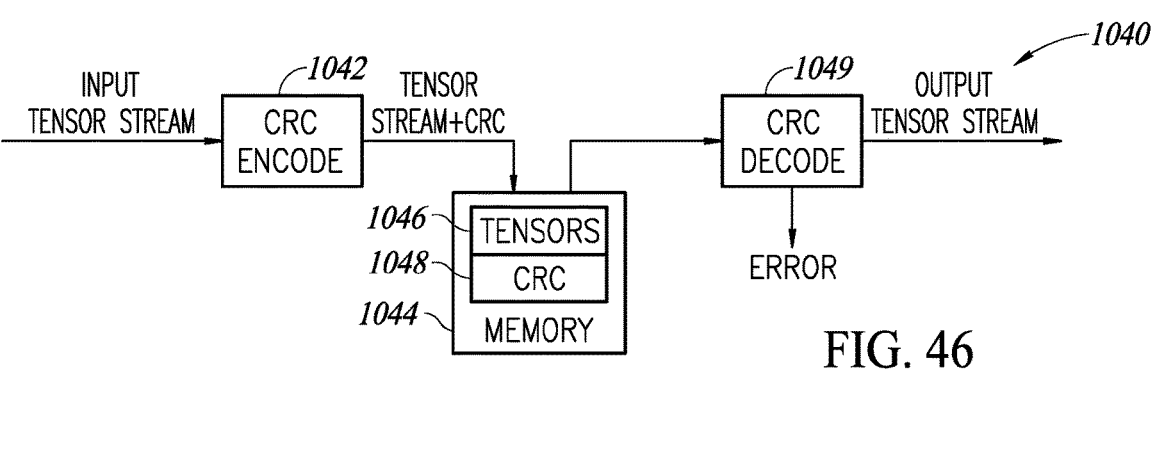
FIG. 46 is a diagram illustrating an example circuit for detecting faults while tensor flow data resides in memory.

A diagram illustrating an example circuit for detecting faults while data resides in memory is shown in FIG. 46. The circuit, generally referenced 1040, comprises a CRC encoder 1042 that is operative to generate a CRC checksum on data input thereto. The data 1046 and CRC checksum 1048 are stored in memory 1044. Eventually, the data and checksum are read out and decoded by CRC decoder 1049 which functions to calculate a CRC checksum and compare it to the checksum read from memory. If they do not match an error flag is raised and/or an interrupt is generated. Note that the validity of the stored checksum can be verified by performing the CRC calculation on the data read from memory along with the checksum value added. The resulting checksum should equal zero if there were no detectable errors.

Figure 47:
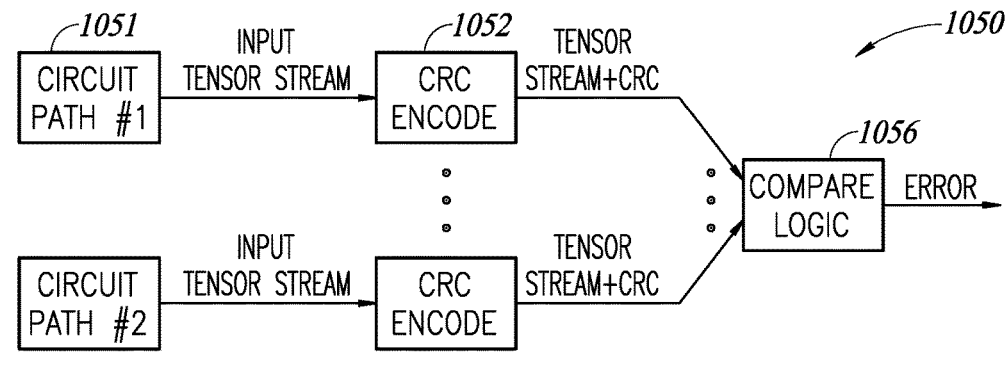
FIG. 47 is a diagram illustrating an example circuit for detecting faults generated by multiple hardware circuits.

A diagram illustrating an example circuit for detecting faults generated by multiple hardware circuits is shown in FIG. 47. The circuit, generally referenced 1050, comprises a plurality of circuits 1051 each representing a different circuit path that generates tensor data flow which is then CRC encoded by circuit 1052. Tensor flow data and associated CRC checksum are generated for each circuit path or mechanism. Compare logic 1056 compares the checksums generated by each circuit path and raises an error flag if they do not match. Note that this scheme also supports majority voting among the circuit paths.

Figure 48:
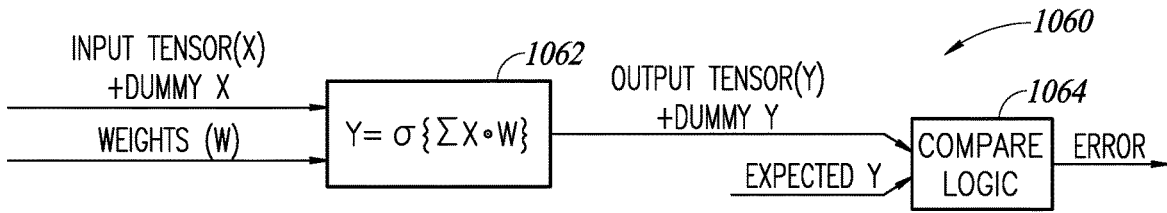
FIG. 48 is a diagram illustrating an example circuit for detecting faults during calculation and intermediate storage.

A diagram illustrating an example circuit for detecting faults during calculation and intermediate storage is shown in FIG. 48. The circuit, generally referenced 1060, comprises an example calculation circuit 1062 that receives input tensor stream data X as well as dummy data that is configured a priori. The calculation circuit generates output tensor stream data Y as well as dummy output data and may comprise intermediate storage as well. The expected value of the dummy output data, however, is predefined. The calculated dummy data as well as the expected results of the dummy data are compared via compare logic 1064 and an error flag is raised if they do not match.

Figure 49:
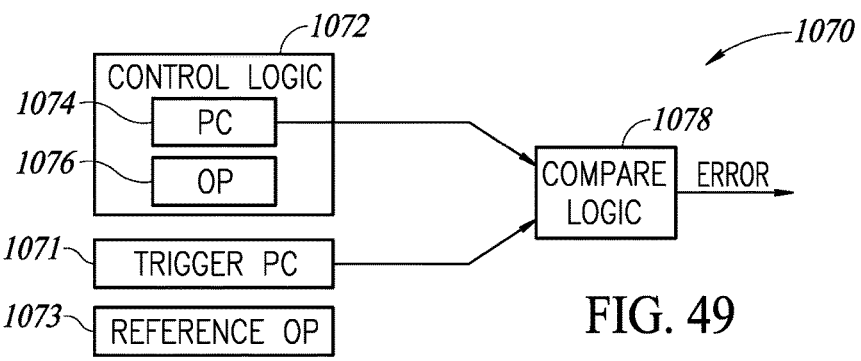
FIG. 49 is a diagram illustrating an example circuit for detecting control flow faults.

A diagram illustrating an example circuit for detecting control flow faults is shown in FIG. 49. The circuit, generally referenced 1070, comprises control logic 1072 with program counter (PC) 1074 and operation OP register 1076. An independent trigger PC 1071 and OP 1073 operate in parallel. At any point in time, the two PCs and OPs should match. Compare logic 1078 checks for a match and raises an error flag if a mismatch is detected. Note that this circuit functions to compare impendent mechanisms that are supposed to agree in terms of the expected number of cycles to reach a predefined execution point.

In one embodiment, the core top refers to the level in which the IP core representing the NN processor is integrated to the entire SoC. The core top incorporates several independent safety mechanisms, each configured to detect different types of failures and provides different spatial coverage.

NN Processor End to End Tensor Data Flow

To aid in understanding the various safety mechanisms described infra, a general overview of the end to end tensor data flow in the device is presented below. A diagram

Figure 50A:
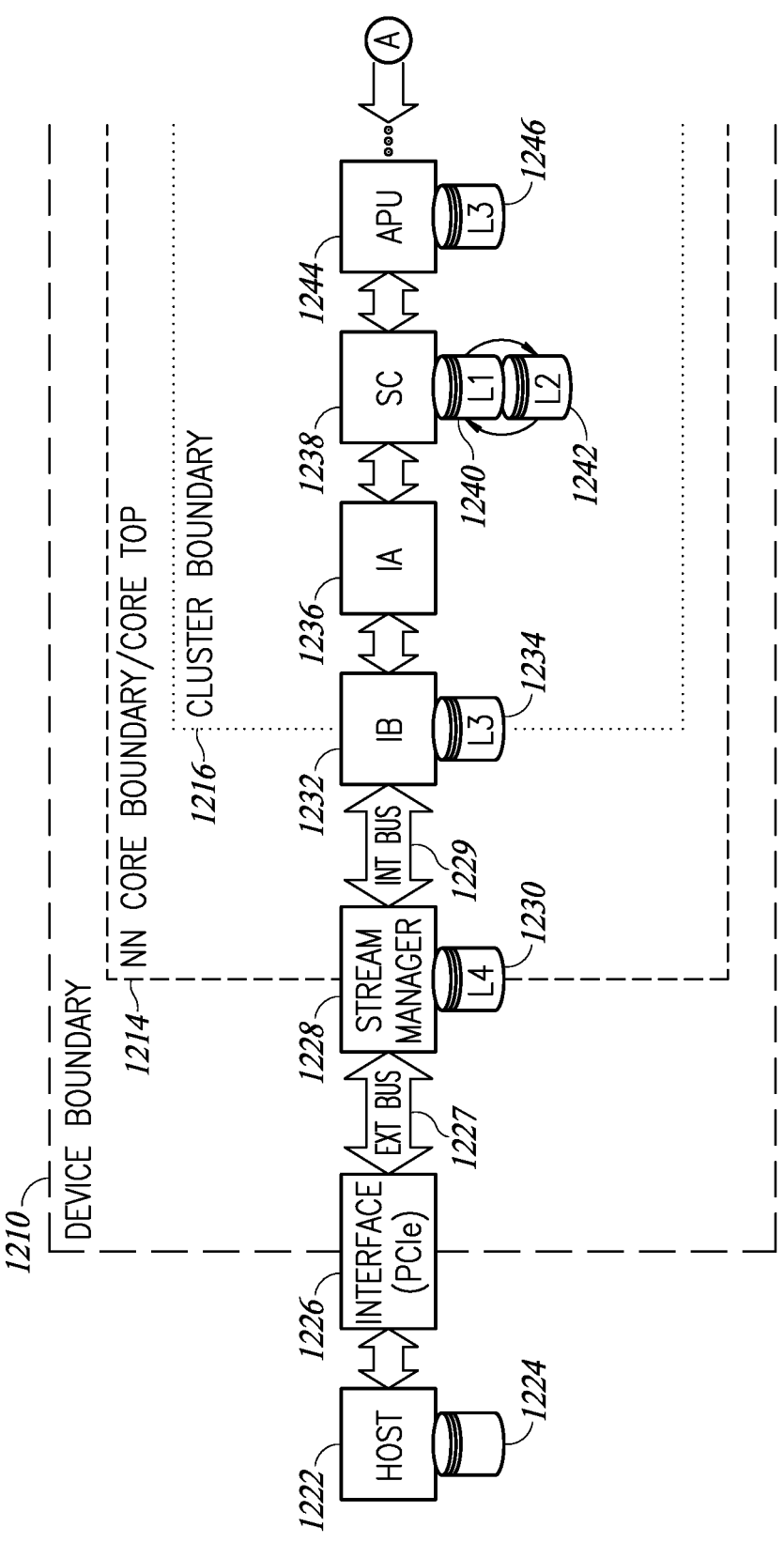
FIGS. 50A and 50B are diagrams illustrating end to end data flow in an example NN processor device.
Figure 50B:
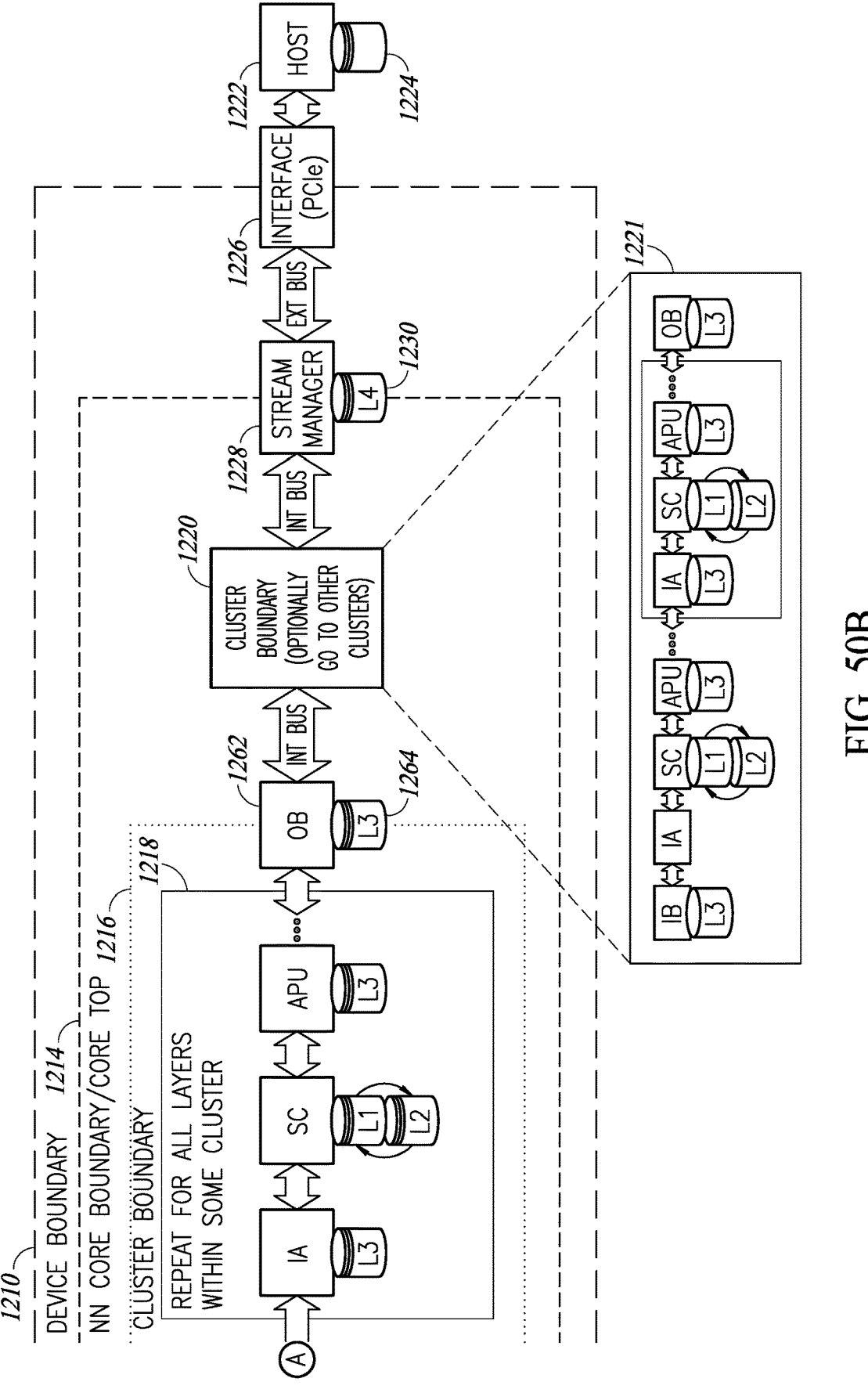

52 illustrating end to end tensor data flow in an example NN processor device is shown in FIGS. 50A and 50B. It is noted that although the connections between blocks are mostly two-way, for clarity, some blocks are repeated to show how tensor data flows through the device as well as the pipelined nature of the circuit. For example, there is only a single interface 1226 but to highlight the tensor data flow, it is shown twice.

The NN processor or device 1210 comprises an interface 1226, such as PCIe, etc., that sits at the boundary of the device 1210 and functions to interface the device to an external host 1222 and related tensor stream data store 1224. Tensor stream data received over the interface 1226 is passed to the tensor stream manager 1228 with associated L4 memory 1230 via an external bus 1227. Note that the external bus is actually within the device but is responsible for external periphery interaction between the device and the external host. The tensor stream manager, described in more detail infra, resides at the boundary of the NN core 1214 referred to as the 'core top'. Typically, the device comprises a plurality of tensor stream managers with each being allocated to different clusters. Tensor stream data output of the tensor stream manager is fed to the input buffer 1232 and associated L3 memory which sits at the boundary of a cluster 1216. The tensor data is transferred over an internal bus 1229 that functions as the internal 'highway' of the NN core.

As described supra, the cluster 1216 comprises input aligner (IA) circuit 1236, subclusters (SC) 1238 with associated L1 and L2 memory, 1240, 1242, respectively, and activation processing unit (APU) 1244 and related L3 memory 1246. Each separate layer in the neural network is made up of additional instances of input aligner, subclusters and APUs as represented by block 1218. Once processing in all layers within the cluster is complete, the tensor stream is sent to zero or more additional clusters represented by block 1220 over the internal bus. Block 1221 illustrates additional tensor data flow of additional layers in the network that are realized using other clusters. The tensor data flow is written to output buffers 1262 with associated L3 memory 1264 which resides on the boundary of the cluster 1216.

When all layers in all clusters have completed processing, the tensor stream is sent over the internal bus to the tensor stream manager 1228 and related L4 memory 1230 and is output from the device to the external host 1222 via the external bus and interface 1226.

Data Stream Fault Detection

Figure 51:
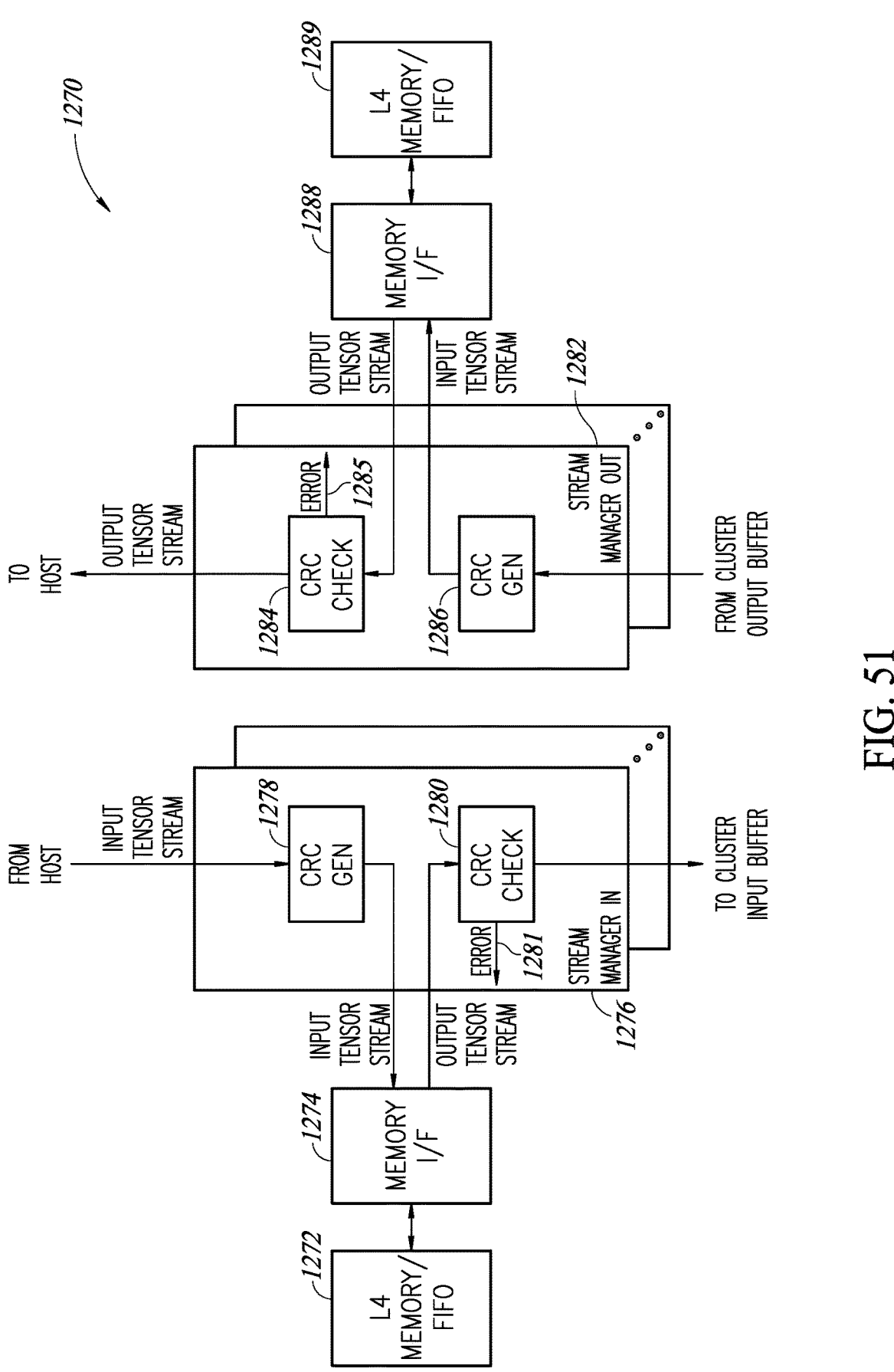
FIG. 51 is a diagram illustrating an example FIFO memory tensor stream protection scheme.

A diagram illustrating an example FIFO memory tensor stream (or tensor data flow) protection scheme is shown in FIG. 51. The circuit, generally referenced 1270, shows one tensor stream manager 1276 for handling an input tensor stream received from an external host and destined to the clusters, and another tensor stream manager 1282 for handling an output tensor stream output from the clusters and destined to the external host. In both directions, the tensor stream data is streamed through the L4 memory 1272, 1288 which is configured as a FIFO. The stream managers 1276, 1282 read and write data to the L4 memory 1272, 1289 via memory interface 1274, 1288, respectively. It is appreciated that in one embodiment there exist only one L4 memory and related interface which are shared by all the stream managers. Separate L4 memory and related interface are shown to aid in the description of the tensor data flow between the various blocks. To protect the tensor streams while stored in the L4 memory, the stream managers comprise CRC generator/check circuits which function to generate CRC before the tensor data is written to the memory and to verify the checksum after the tensor data is read from the memory. In the event a CRC error is detected, an error flag is raised. Note that the error signal may be a non-fatal error or a fatal error depending on the implementation.

In operation, CRC checksums are generated (circuit 1278) for blocks of input tensor data streamed from the host. The input tensor stream and corresponding checksums are written to the L4 memory 1272. The input tensor stream is typically stored for milliseconds but may be stored for any amount of time, e.g., seconds, minutes, hours, etc. At some point in the future, the input tensor stream is read out of the L4 memory and a CRC check (circuit 1280) is performed. If an error is detected, an error signal 1281 is generated. The input tensor stream data retrieved is then sent to an input buffer in one of the clusters.

In the opposite direction, CRC checksums are generated (circuit 1286) for output tensor data received from the clusters. At some point in the future, the output tensor stream is read out of the L4 memory 1289 and a CRC check (circuit 1284) is performed. If an error is detected, an error signal 1285 is generated. The output tensor stream data retrieved from the L4 memory is then sent to the external host.

The tensor stream fault detection mechanism comprises not only protection for the tensor stream while it is stored in memory but also for the tensor stream transitioning over data buses. Like in the previous embodiment, CRC is used to protect the tensor stream during transition over buses.

Figure 52:
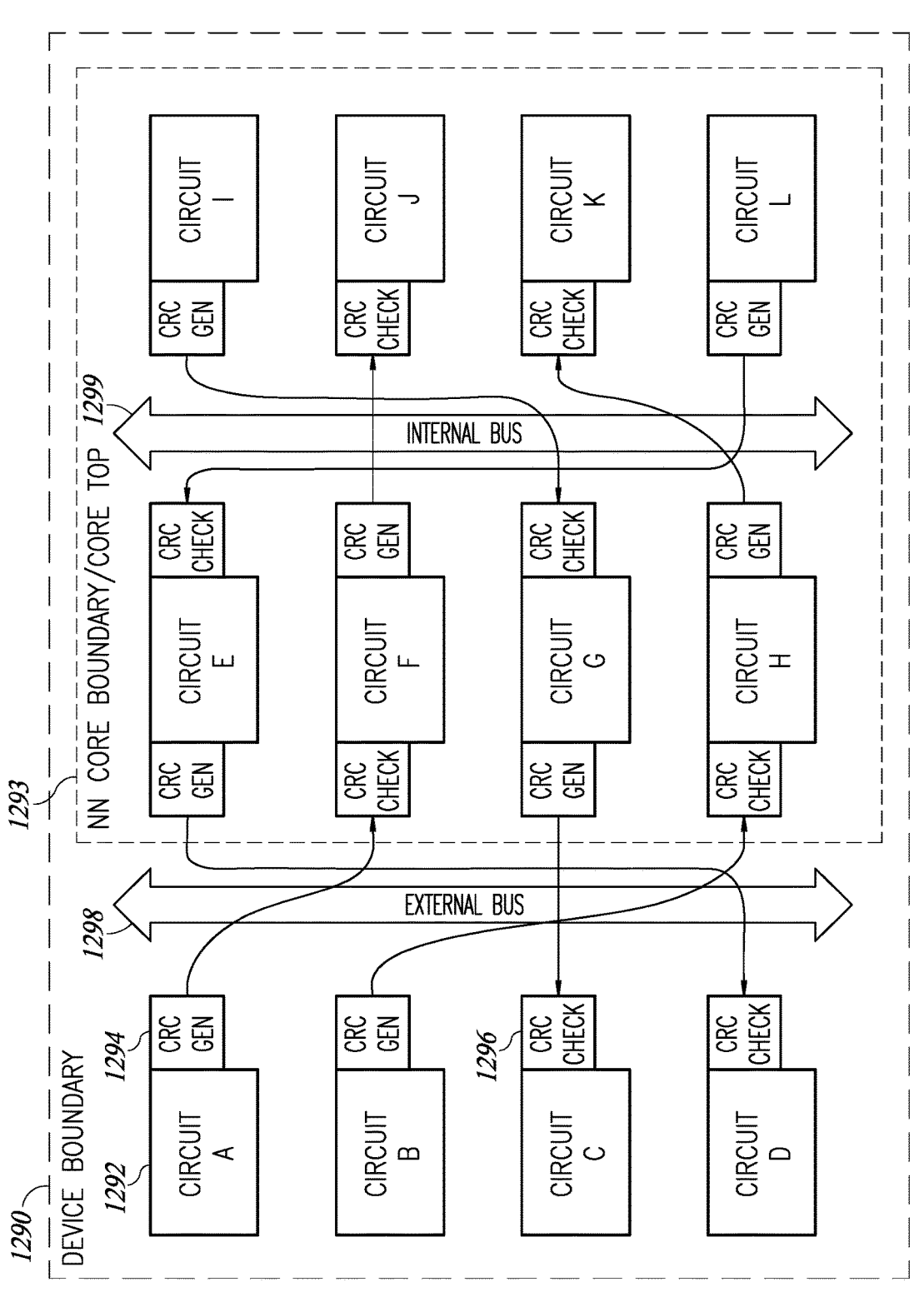
FIG. 52 is a diagram illustrating an example bus transition tensor stream protection mechanism.

A diagram illustrating an example bus transition tensor stream protection mechanism is shown in FIG. 52. The NN processor device 1290 is shown comprising a plurality of tensor data flow source and sink circuits 1292, labeled circuit A through circuit L. The source and sink circuits may have any function and are shown for illustration purposes. Each source circuit has a CRC generator circuit 1294 corresponding therewith. Similarly, each sink circuit has a CRC check circuit 1296 corresponding therewith. Tensor data flows from a source circuit to a sink circuit over a data bus such as external bus 1298 and internal bus 1299. Arrows 1291 indicate connections between source and sink circuits. In this example, the internal bus 1299 resides in the NN processor core (core top) and the external bus resides in the NN processor but outside the core top. In operation, tensor streams are protected during transition over the buses by the generation of a CRC checksum before input to the bus and the verification of the CRC checksum following transition over the bus.

Figure 53A:
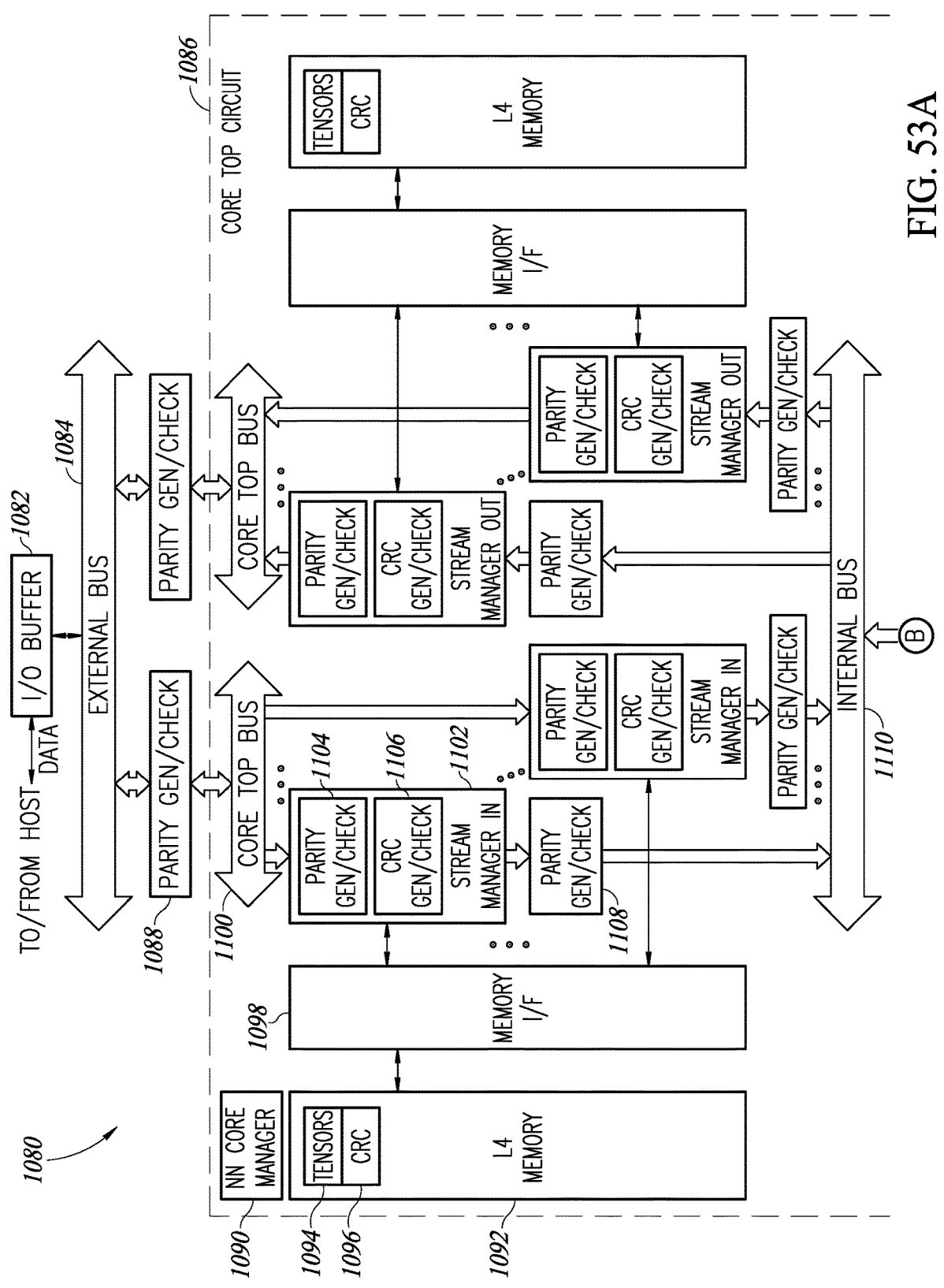
FIGS. 53A and 53B are diagrams illustrating an example neural network core top tensor stream circuit.
Figure 53B:
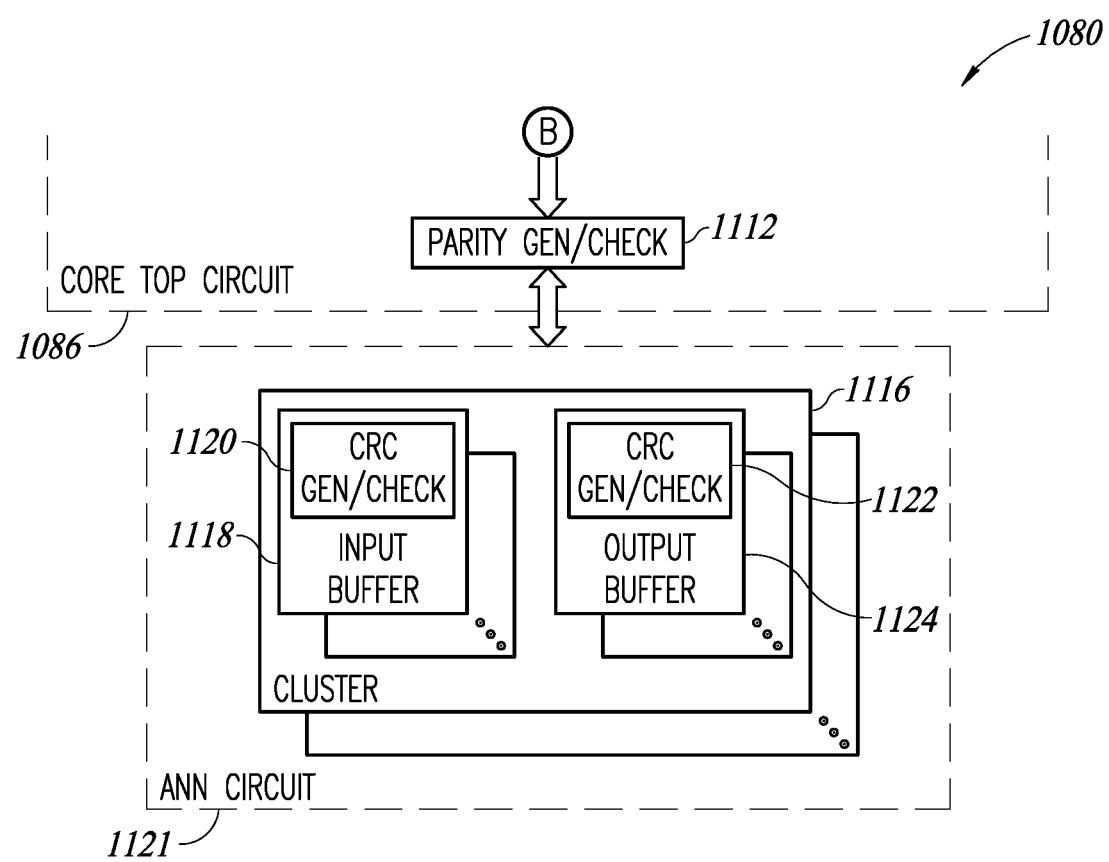

A diagram illustrating an example neural network core top tensor stream circuit is shown in FIGS. 53A and 53B. The circuit, generally referenced 1080, comprises an input/output (I/O) buffer 1082, external bus 1084, parity generator/check circuits 1088, core top circuit 1086, and ANN circuit 1121. The core top circuit 1086 comprises a plurality of core top buses 1100, a plurality of stream manager circuits 1102, parity generator/check circuits 1108, internal bus 1110, parity generator/check circuit 1112, memory interface (I/F) circuits 1098, L4 FIFO memory circuits 1092, and NN core manager 1090. The ANN circuit 1121 comprises a plurality of cluster circuits 1116, each comprising a plurality of input buffers 1118 including CRC generator/check circuits 1120 and output buffers 1124 including CRC generator/check circuits 1122. The stream manager circuits 1102 comprise parity generator/check circuit 1104 and CRC generator/check circuit 1106. In one embodiment, a portion of the stream managers are configured as input, passing tensor stream data from an external host to the clusters. In addition, a portion of the stream managers are configured as output, passing tensor stream data from the clusters to the external host.

In operation, the tensor stream safety mechanism is intended to protect the entire tensor data flow path in both directions between the fast bus 1084 and the I/O buffers in the clusters 1116. This tensor data flow path includes transition through one or more data buses and input and output stream managers. In both input and output directions, during transition within the stream manager circuits, the tensor stream data flows through the L4 memory, being written to and read from it.

In the input tensor data flow path direction, a tensor stream is received from an external host and stored in the I/O buffer 1082 before being sent over the fast bus 1084 to a parity generator circuit 1088. The parity generation protects the tensor stream during transition over the core top buses 1100 to the stream managers. Upon reception of the tensor stream from the core top bus, the stream manager checks the parity via circuit 1104. A CRC generator 1106 calculates a CRC checksum on blocks of the input tensor stream. The input tensor stream 1094 and corresponding CRC checksums 1096 are stored in a FIFO memory (i.e. L4 memory) 1092 via memory I/F 1098. The CRC is operative to protect the input tensor stream while it is stored within the L4 memory. The tensor stream data may be stored in the FIFO memory for any length of time, e.g., milliseconds, seconds, etc. The longer the tensor stream data is stored, the more beneficial the CRC generation and checking.

Upon reading of the tensor stream and CRC from the L4 memory, the CRC checksum is verified by the CRC checker circuit 1106. If verification fails, an error flag is raised. Note that in one embodiment, either a non-fatal error or fatal error may be raised depending on the particular implementation. The two types of errors are typically handled differently whereby a non-fatal error does not cause the device the NN processor SoC is installed in to immediately cease operation as a fatal error does, but rather continues with warning signals to the user.

Following CRC checking, optional padding is applied to the input tensor stream data. A new CRC checksum is then calculated and a parity generator also calculated calculates parity. The input tensor stream and related CRC checksums are routed over the internal bus 1110 where a parity check is performed via parity circuit 1112. Thus, transition of the tensor stream data over the internal bus 1110 is protected by the parity circuits 1108 and 1112. The tensor data flow then transitions over another data bus 114 to the input buffer of one of the clusters 1116 in the ANN circuit 1121. The CRC checksum is verified by the CRC checker in the input buffer and an error flag is raised if verification fails.

In the output tensor stream path direction, CRC checksums are generated by the CRC generator circuits 1122 on blocks of output tensor stream data written to the output buffers 1124 in the clusters 1116. The output tensor stream data and related CRC checksums undergo parity check 1112 and transition over the internal bus 1110 to a parity checker circuit 1108. Thus, transition of the output tensor stream data over the internal bus 1110 is protected from bit errors. From the parity check circuit, the output tensor stream data is input to one of the stream manager circuits where a CRC check is performed via the CRC engine in the stream manager. An error flag is raised if the CRC checksum verification fails. The CRC thus protects the tensor data flow path from the output buffers in the clusters to the stream managers including transitions over internal bus 1110.

Optionally, padding then removed and a second CRC checksum is then generated. The output tensor stream and related checksums are stored in the FIFO memory (i.e. L4 memory). This second CRC functions to protect the tensor stream data while it resides in the L4 memory. After being read out of the memory, the CRC is verified and an error flag is raised if verification fails.

Parity checksum is then generated before the output tensor stream transitions over the core top bus. The parity is checked after transition over the bus and is then transferred to the I/O buffer 1082 via the fast bus 1084 where it is forwarded to the external host.

Figure 54:
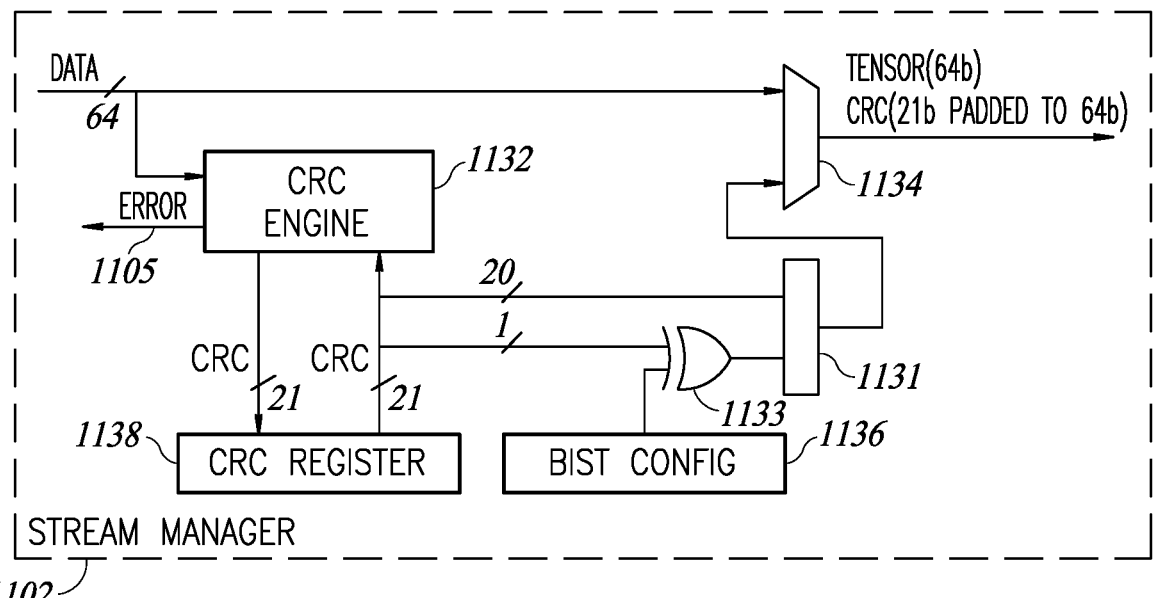
FIG. 54 is a diagram illustrating the CRC engine portion of the tensor stream manager in more detail.

A diagram illustrating the CRC engine portion of the stream manger in more detail is shown in FIG. 54. In this example, the CRC engine for the input path direction is shown. Note that the direction is reversed for the output path direction. The stream manager 1102 comprises CRC engine 1132, CRC register 1138, BIST configuration register 1136, XOR gate 1133, combiner 1131 and multiplexer 1134. In this example embodiment, a 21-bit CRC checksum is generated for each block of data. Input data and output data is 64 bits wide with the 21-bit CRC padded to 64 bits. The CRC checksum is written to and read from the CRC register 1138. The CRC engine can be used to both generate the CRC checksum and to verify the checksum. The checksum read from memory or received over the bus is fed to the CRC engine. If the checksum is correct, a zero value CRC result is generated, otherwise a non-zero result is produced which indicates an error occurred.

To support BIST operation, one of the CRC bits is flipped by placing an XOR gate 1133 on the bit where '1' indicates BIST mode and '0' indicates functional mode. The output of the XOR gate is the flipped 'CRC bit' (i.e. one of the 21 CRC bits) such that:

$$\text{output} \equiv CRC \text{ bit} = \begin{cases} \text{original } CRC \text{ bit, functional mode} \\ \text{flipped } CRC \text{ bit, } BIST \text{ mode} \end{cases} \quad (8)$$

The downstream CRC checker is operative to detect failures and trigger an error (i.e. failure interrupt). Note that the CRC engine is the same in structure and operation for both the L4 CRC protection as well as the interconnect bus CRC protection. In the latter case, the CRC checker resides in the input buffer of the cluster. The CRC check functions to verify the CRC checksums of the tensor stream data transitioning over the data bus and triggers a failure interrupt if verification fails.

Figure 55:
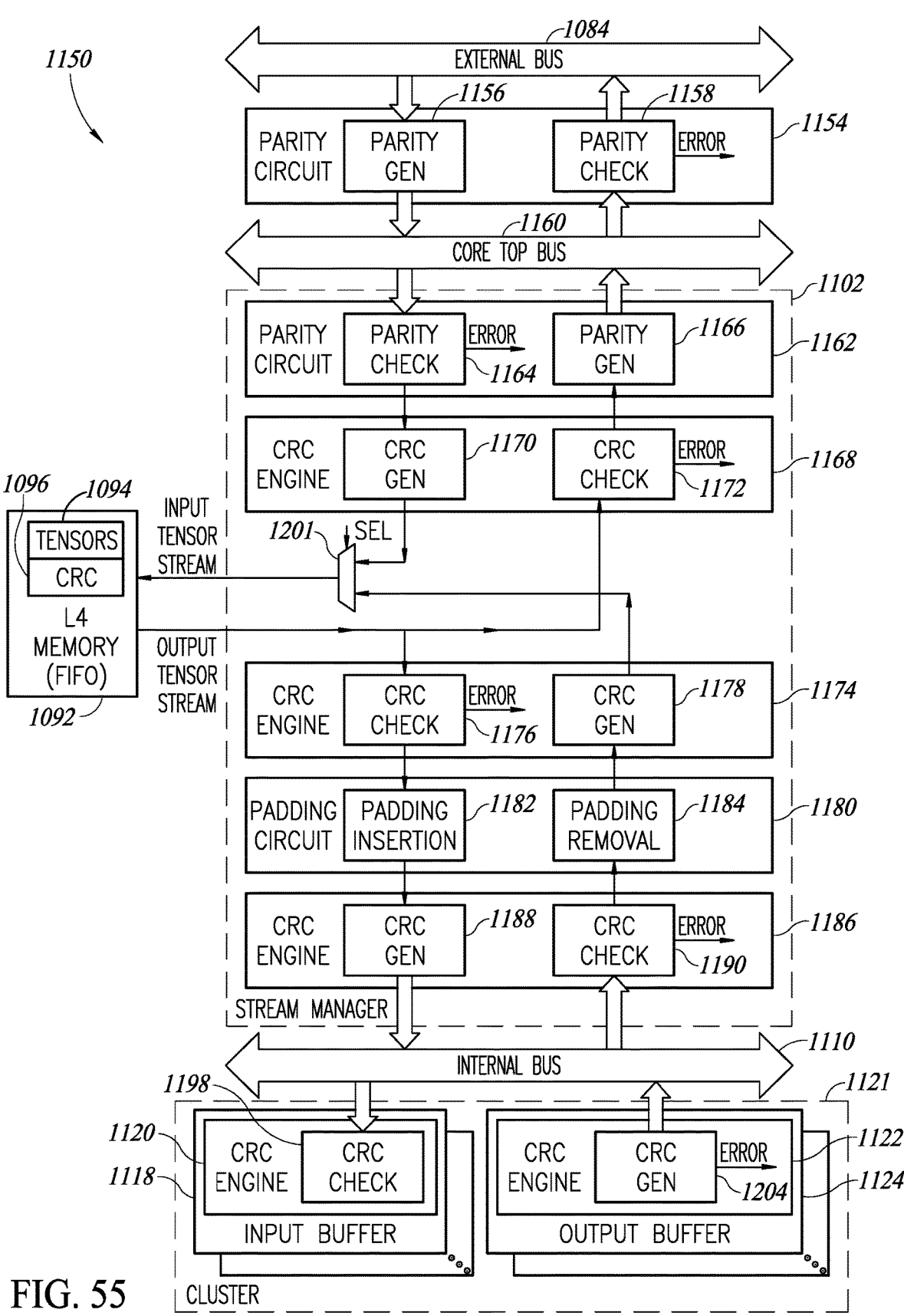
FIG. 55 is a diagram illustrating the tensor stream manager circuit in more detail.

A diagram illustrating the stream manager circuit in more detail is shown in FIG. 55. The circuit, generally referenced 1150, comprises stream manager 1102 in communication with core top bus 1160, and L4 memory 1092. The circuit also comprises external bus 1152, parity checker circuit 1154 including parity generator 1156 and parity checker 1158, and cluster 1121 which is part of the ANN circuit 1121 (not shown). The cluster comprises input buffer 1118 which includes CRC engine 1120 and CRC check circuit 1198, and output buffer 1124 which includes CRC engine 1122 and CRC generator 1204. The stream manager 1102 comprises parity checker circuit 1162 including parity generator 1166 and parity checker 1164, CRC engine 1168 including CRC generator 1170 and CRC checker 1172, multiplexer 1201, CRC engine 1174 including CRC generator 1178 and CRC checker 1176, padding circuit 1180 including padding insertion 1182 and padding removal 1184, and CRC engine 1186 including CRC generator 1188 and CRC checker 1190. Note that memory interface 1098 and parity generator and check to protect tensor data flow transition over the internal bus 1110 are not shown for clarity sake.

In operation, as described in connection with FIGS. 53A and 53B, tensor stream data is protected using several schemes while it is being handled by the stream manager 1102. Data transition over the core top bus 1160 in both directions is protected by parity circuits 1154 and 1162. In addition, tensor stream data is protected while stored in the L4 memory 1092 in both input and output directions by CRC engine circuits 1168 and 1174. Tensor stream data is also protected during transition over internal bus 1110, i.e. after optional padding circuit 1180, up to the input buffers 1118 and output buffers 1124 in the cluster 1121 by CRC engine circuits 1186 and 1120/1122. It is noted that parity and CRC circuits are similar in that parity is effectively a 1-bit CRC calculation. It is appreciated by one skilled in the art that the use of parity check versus CRC check circuits may be a matter of design choice based on particular constraints, e.g., preference to not load the width of one or more data buses.

Thus, as described supra, the neural network tensor stream protection scheme is operative to protect from (1) data and address corruption during transition through the core top busses; (2) data and address corruption during transition through the interface between the stream manager and the data buses; (3) corruption of tensor data in the L4 memories while it is streamed through it; (4) data corruption in the stream manager logic circuits; and (5) data corruption during transition through the external data bus 1184, internal data bus 1110, and core top bus.

Software Defined Redundant Allocation Safety Mechanism

The software defined redundant allocation safety mechanism provides a high level of protection of the tensor data flow in the NN processor but at a 'cost' of allocating redundant hardware resources to perform the required calculations for the particular target neural network to be implemented. In one embodiment, the allocation of hardware resources is performed in software by the compiler/SDK. The complier is operative to break down the tensor data flow into specific hardware resources that are allocated to create the overall required tensor data flow tailored to the particular neural network.

Note that unlike typical prior art computer architectures, allocating redundant hardware resources is not an option since in prior art systems, the parallelism is achieved by multiplexing the same hardware in the time domain. Thus, the same physical resource is used twice rather than once. Thus, although there is a cost to applying redundancy, it is still a choice to be made in contrast to not providing any redundancy at all.

In one embodiment, this safety mechanism comprises both a hardware component and a software component. Consider for example a main tensor data path and a redundant tensor data path. The compiler is operative to allocate the tensor data path twice. If all hardware resources, however, are already allocated, then there is not sufficient resources to perform double allocation. It may be possible, however, to allocate a portion of the tensor data flow. Consider for example a network with two layers to be allocated redundantly. Due to insufficient hardware resources available, only a portion of the tensor data flow can be doubly allocated. In this case, the first layer is allocated without redundancy but the second layer is doubly allocated. Thus, from a certain point in the neural network (e.g., input buffer) all the way to the end (i.e. output FIFO), the tensor data flows twice in space (i.e. not twice in time) for the second layer. The redundant allocated resources include the IA, SC, APU, OB, etc. The compiler ensures that the main and redundant paths for the second layer go through different resources with no overlap and that preferably reside in different clusters. Further, to detect failures, a check is performed whereby CRCs generated in each doubly allocated independent tensor data path are checked for a match. If the CRCs do not match, an error flag is raised, e.g., a fatal or non-fatal error interrupt is generated.

Note that the redundant allocation mechanism is intended to be as high level (i.e. end to end) as possible in order to detect failures which may not be detected by other mechanisms. Thus, the redundancy is in the NN core level. Note also that the above is only one example allocation whereby the granularity of the allocation is relatively very fine, e.g., a portion of a layer can be allocated. In addition, the determination of the allocation is made by the compiler by evaluating one or more error properties that are available thereto.

Further, in order to achieve near or complete independency of the main and redundant protected resources, different computation paths are allocated as the redundant resources. For the tensor data flow path itself, different stream managers (SMs) at the NN core level, different L4 cuts allocated to the stream managers at the NN core level, different input buffers (IBs) at the cluster level, different L3 memory cuts at the cluster level, different input aligners (IAs) at the cluster level, different subclusters (SCs) at the cluster level, different activation processing units (APUs) at the cluster level, and different output buffers (OBs) at the cluster level, are allocated. For the control path, different layer controller units (LCUs) at the cluster level, and different memory management units (MMUs) at the cluster level, are allocated. In order to decrease resource dependency further, it is preferable to allocate the redundant resources in different clusters.

Figure 56:
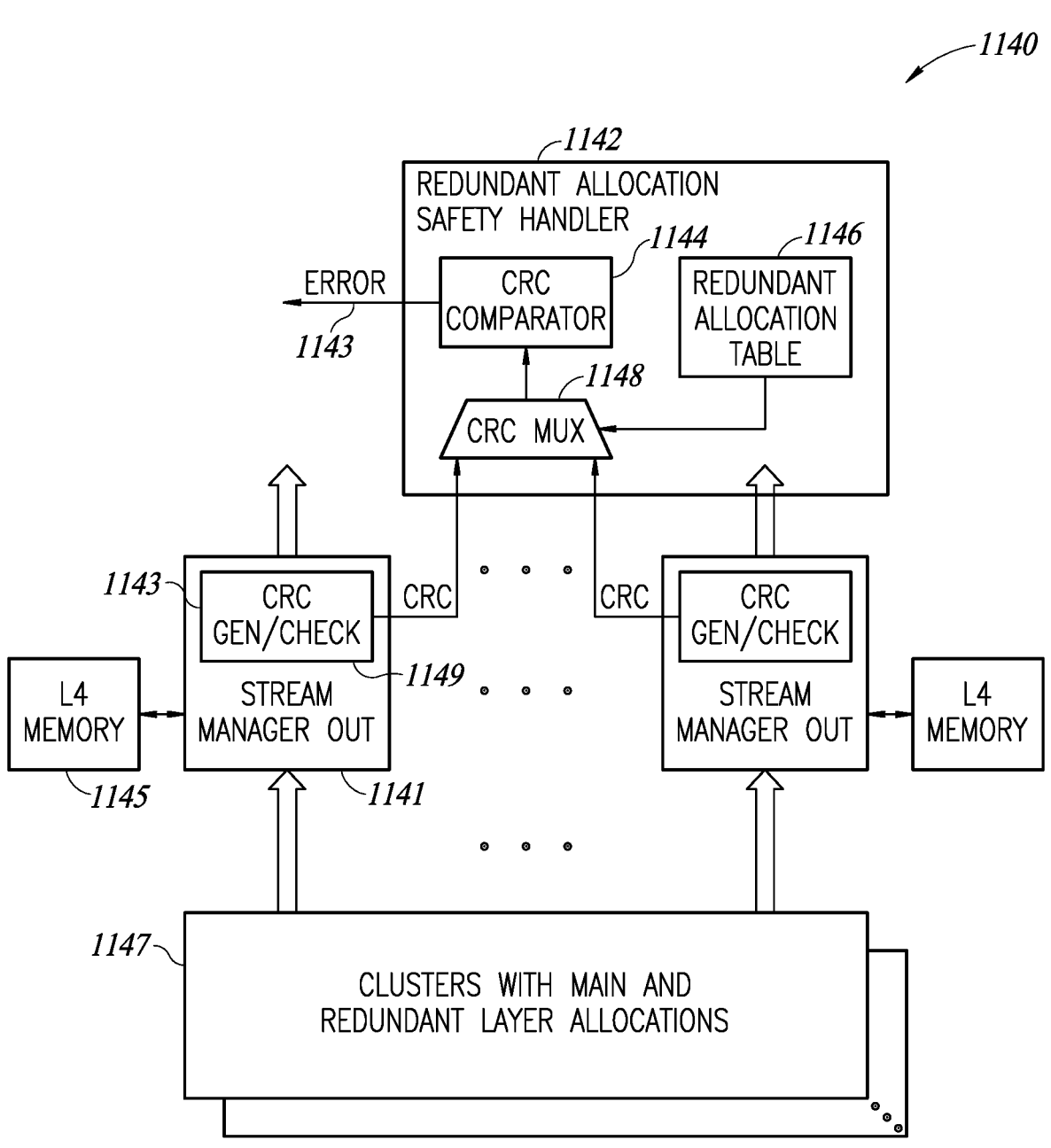
FIG. 56 is a diagram illustrating an example redundant allocation scheme and handler circuit.

A diagram illustrating an example redundant allocation scheme and handler circuit is shown in FIG. 56. The circuit, generally referenced 1140, comprises a plurality of clusters with main and redundant layer allocations 1147, output stream managers 1141 each including CRC generator/check circuits 1143, L4 memory FIFO 1145, redundant allocation safety handler logic 1142 that includes a CRC multiplexer 1148, CRC comparator 1144, and redundant allocation table 1146. Note that only a portion of the core top circuit is shown for clarity. The core top circuit 1086 (FIGS. 53A and 53B) is described in more detail supra.

In operation, depending on the target neural network and desired redundancy, the compiler determines a main computation path and one or more redundant computation paths for one or more layers from the available hardware resources. The available hardware resources in the NN processor are configured to create the main and redundant tensor data flow paths in the clusters 1147. The two different paths go to two different output stream managers. The CRC generator in each stream manager of a protected path calculates a CRC for every block (i.e. row) of tensor data that is output. The CRCs enter the mux and are compared in accordance with the table that indicates whether which stream managers are redundantly allocated. The CRC compare must pass and if not, an error flag (i.e. fatal-interrupt) is raised.

To detect failures in the protected tensor data path, CRCs on the output tensor data are generated in both stream managers 1141 before being transferred to the host. The CRCs are fed to a CRC multiplexer 1148 which is controlled by the redundant allocation table 1146 which stores a list of output stream managers whose results are protected by redundant hardware allocations and a list of output stream managers whose results are the redundant hardware allocation results. The table is configured by the compiler/SDK. The CRCs generated by the stream managers protecting a particular tensor data path are compared in the CRC comparator 1144 and if a mismatch is detected an error signal 1143 is generated. Note that there can be any number of tensor data paths (e.g., layers or portions or layers) simultaneously protected. The redundant allocation table is operative to track which stream managers are part of which protected tensor data flow. In addition, a main computation path can have more than one redundant computation path and majority voting can be implemented as described infra.

Figure 57:
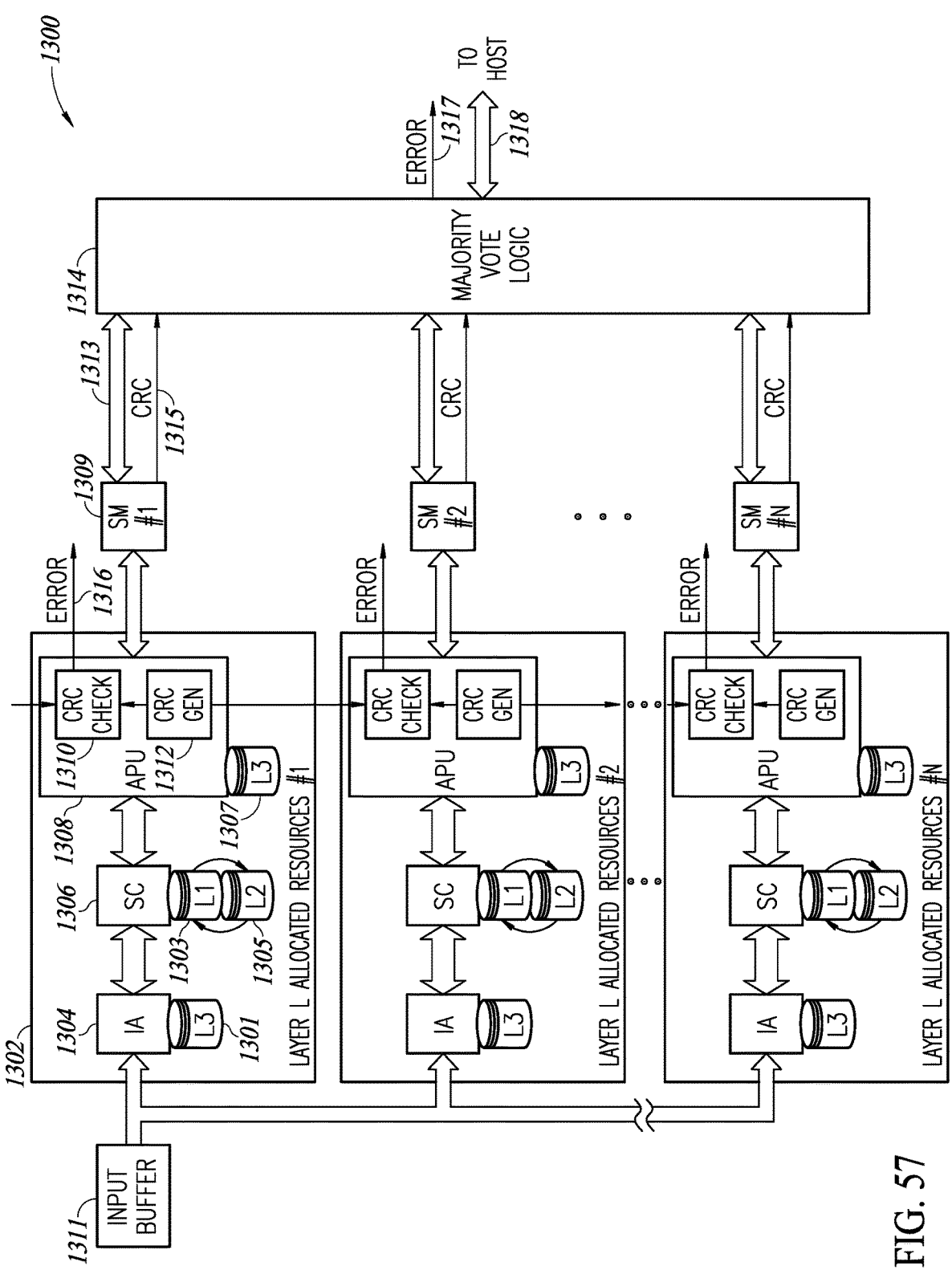
FIG. 57 is a diagram illustrating an example in-cluster redundant allocation scheme with majority voting.

A diagram illustrating an example in-cluster redundant allocation scheme with majority voting is shown in FIG. 57. The circuit, generally referenced 1300, comprises a set of N allocated resource groups 1302 for an arbitrary layer L. In one embodiment, data is split at the input buffer 1311 (may be more than one) and passed to all the redundant groups 1302 (i.e. circuit replicas). In alternative embodiments, tensor data flow may be split and multiple paths began in other places as well, e.g., L3 memory, etc. The compiler/ SDK is responsible for determining the resource allocation. The resources allocated are preferably in different clusters but are not required to be. In this example embodiment, the main computation path #1 comprises IA 1304 and related L3 memory 1301, SC 1306 and related L1 1303 and L2 1305 memories, APU 1308 including CRC generator 1312 and CRC check 1310, and related L3 memory 1307. There are N−1 redundant computation path circuits labeled #2 through #N. The output of each layer L circuit is input to a dedicated stream manager 1309 which generates a CRC 1315. The output tensor stream data 1313 and CRC 1315 from each main and redundant layer are input to majority voting logic 1314 which functions to determine output tensor stream data 1318 that is sent to the external host. The logic circuit 1314 also functions to perform majority voting. Assuming N is an odd integer three or greater, a majority vote can be generated by comparing the CRCs calculated by each layer 1302. An error signal 1317 is generated if a non-unanimous and/or non-majority vote is detected.

It is noted that redundancy is commonly used to provide circuit protection. Most implementations, however, employ time duplication where the layer hardware circuits are used to generate multiple calculation results. In the NN processor of the present invention, duplication of circuits is not in time but rather in space. The problem with this protection technique is the high cost in terms of chip area and power. Advantages of the invention, however, is the ability to leverage the NN processor by (1) having a high level of hardware redundancy to make use of on chip whereby neural network calculations can be performed in multiple places in hardware; and (2) having relatively fine granularity in the sense that tensor data flow path replication can occur on a layer or sub-layer basis. Thus, at compile time, the large amount of redundant hardware circuit elements can be taken advantage of when determining what hardware resources to allocate to which layers. Hardware allocation in prior art processors typically require pre-commitment at the design stage of development whereas allocation is determined at compile time in the NN processor of the present invention. In addition, a user can choose when to apply and when not to apply redundancy in addition to the desired granularity all at compile time.

Figure 58:
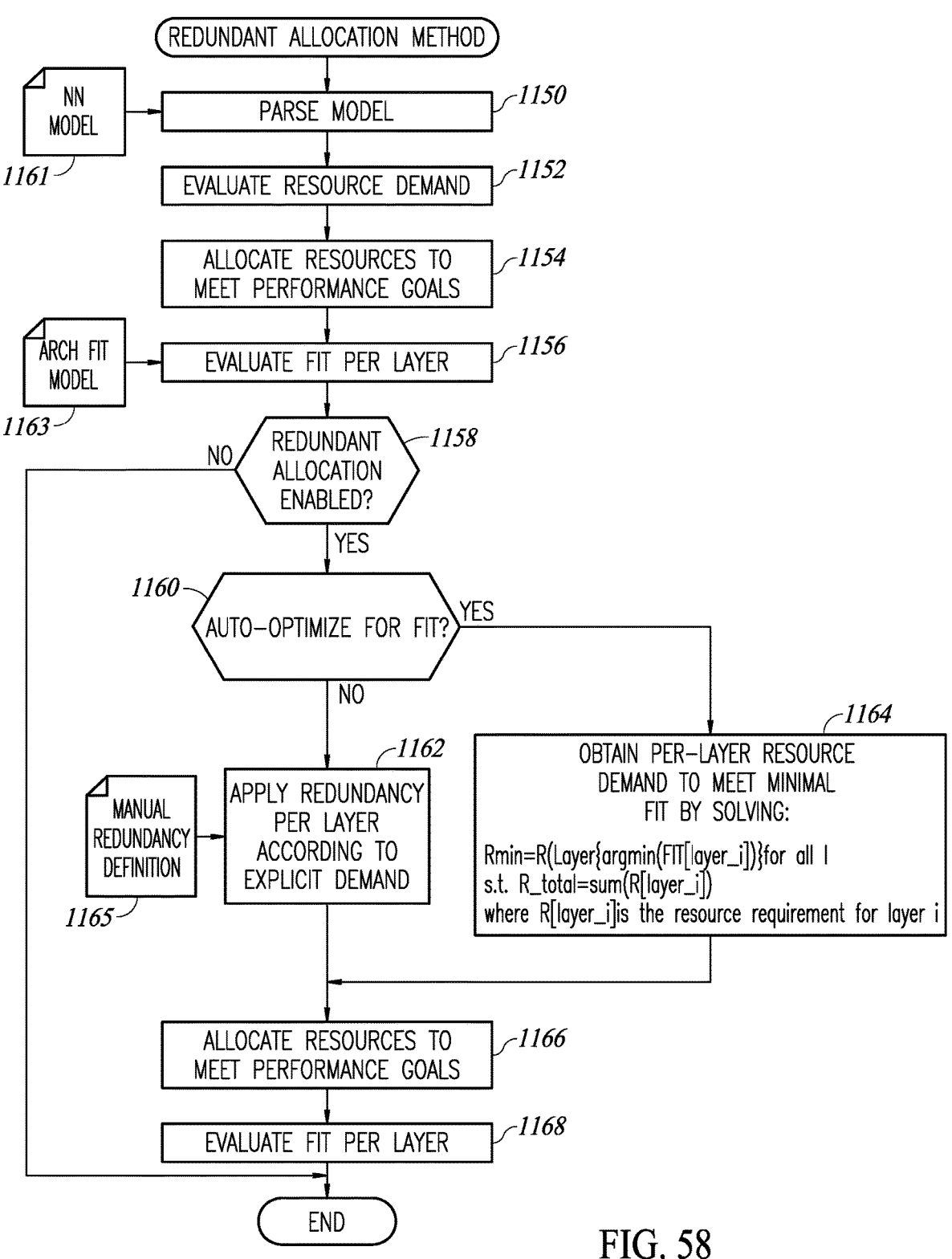
FIG. 58 is a diagram illustrating an example redundant allocation method performed by the compiler/SDK.

A diagram illustrating an example redundant allocation method performed by the compiler/SDK is shown in FIG. 58. This method is performed using the user provided network model before resources are allocated. The result of the method is a resource allocation that the NN processor is configured with to implement one or more redundant tensor data flow paths. The neural network model 1161 received from the user is first parsed (step 1150). After parsing, the hardware resources required to implement the neural network are evaluated (step 1152). The resources required to the meet the performance goals of the network are then allocated (step 1154). The failure rate in failures in time (FIT) are evaluated on a per layer basis utilizing an architecture FIT model 1163. If redundant allocation (step 1158) and auto-optimization for FIT (step 1160) are enabled, then the per-layer resource demand to meet the minimal FIT is determined by solving:

$$Rmin = R(\text{Layer}\{\text{argmin}(\text{FIT}[\text{layer\_i}])\}) \text{ for all } I \qquad (9)$$

$$\text{s.t. } R\_total = \text{sum}(R[\text{layer\_i}])$$

where R [layer_i] is the resource requirement for layer i (step 1164).

If redundant allocation (step 1158) is not enabled, the method ends. If auto-optimize (step 1160) is not enabled, then redundancy is applied on a per layer or partial layer basis according to explicit demand using a manual redundancy definition 1165 (step 1162). Whether automatic or manual, once redundancy is applied, resources are allocated to meet the desired performance goals (step 1166). The FIT is then evaluated again per layer (step 1168).

A benefit of the redundant allocation scheme is the ability to allocate portions of the neural network and not the entire network and moreover the ability to allocate portions of hardware such as partial layers and not necessarily hardware for an entire layer. This reduces the hardware requirements and makes providing redundancy less of a burden. Thus, a user has the option of choosing the layers and parts of layers to make redundant. A diagnostic coverage score (i.e. FIT evaluation) is computed to aid in determining how much redundancy to allocate. Thus, only those portions of the neural network required to achieve a certain diagnostic coverage score need be made redundant.

In operation, the complier determines the tensor data flow of the NN in the chip. It is operative to allocate IBs, IAs, SCs, APUs, OBs, L3 memories, etc. It allocates certain parts of the NN to make redundant depending on the requirements and performance goals. Consider, for example, a network consisting of SC1, APU1 and SC2, APU2. The compiler can be instructed to make the second part of the neural network (i.e. SC2, APU2) redundant allocation, thereby allocating additional resources for SC3, APU3. In addition, the compiler ensures that the main tensor data flow path that goes through SC2, APU2 is functionally identical to the redundant tensor data flow path through SC3, APU3. The path through resources SC3, APU3, however, go through a different stream manager. The tensor data flow from the main and redundant paths is output to different stream managers. When the tensor data flow through the clusters is complete, it transits the internal bus to a dedicated output stream manager. Note that the system may comprise more than one redundant tensor data flow path. With N-way redundant paths, where N is an odd number, majority voting can be implemented as described in connection with FIG. 57 supra.

Cluster Interlayer Safety Mechanism

The cluster interlayer safety mechanism functions to protect cluster hierarchy resources including interlayer tensor data flow paths. It is the goal of this and other safety mechanisms described herein to address the fact that random faults in the memories are more likely the longer data is not refreshed. Thus, the safety mechanism attempts to address this problem by providing protection for the tensor stream while it is stored in memory. Note that throughout this document, references to 'data' are intended to include 'neural network input,' 'tensor data flow,' 'streams of tensors,' 'tensor stream,' and 'tensor stream data.'

In general, tensor data flow to and from a layer occurs as follows. In one embodiment, data is written by an input buffer (IB) to one or more L3 memory cuts allocated to the particular layer. The data is then read from L3 memory to the layer's corresponding input aligner (IA). Data is then consumed from the one or more IAs by the subsclusters (SCs). The SCs output data to the APU upon completion of their calculations. Results of intermediate calculations are stored in L2 memory. The data output from a layer is then written by the APU to one or more L3 memory cuts allocated to the layer. The following then occurs depending on the allocation: (1) the layer output data is read from the L3 memory by another IA within the same cluster (i.e. a different layer within the same cluster); or (2) the layer output data is read by the layer's output buffers (OBs) from one or more L3 memory cuts, where data is then propagated either to the IB in another cluster, or an output stream manager (SM). These various schemes are highlighted by the following FIGS. 60, 61, 62, 63, 64, 65.

Figure 59A:
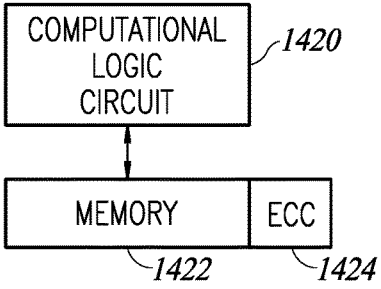
FIG. 59A is a diagram illustrating a memory ECC based cluster interlayer failure detection scheme.

A diagram illustrating a memory ECC based cluster interlayer failure detection scheme is shown in FIG. 59A. In this embodiment, the output of the computational logic circuit 1420 is written to memory fabric 1422. The data is protected in memory by the use of error correction code (ECC) circuits 1424. ECC codes are calculated immediately upon the data being written to the memory. In the case where the entire computation graph is not known, data is stored in the main memory fabric each cycle and the ECC is implicitly computed each cycle. The disadvantage of this technique is that the addition of ECC circuitry to the memory fabric is costly in terms of chip area and power consumption.

Figure 59B:
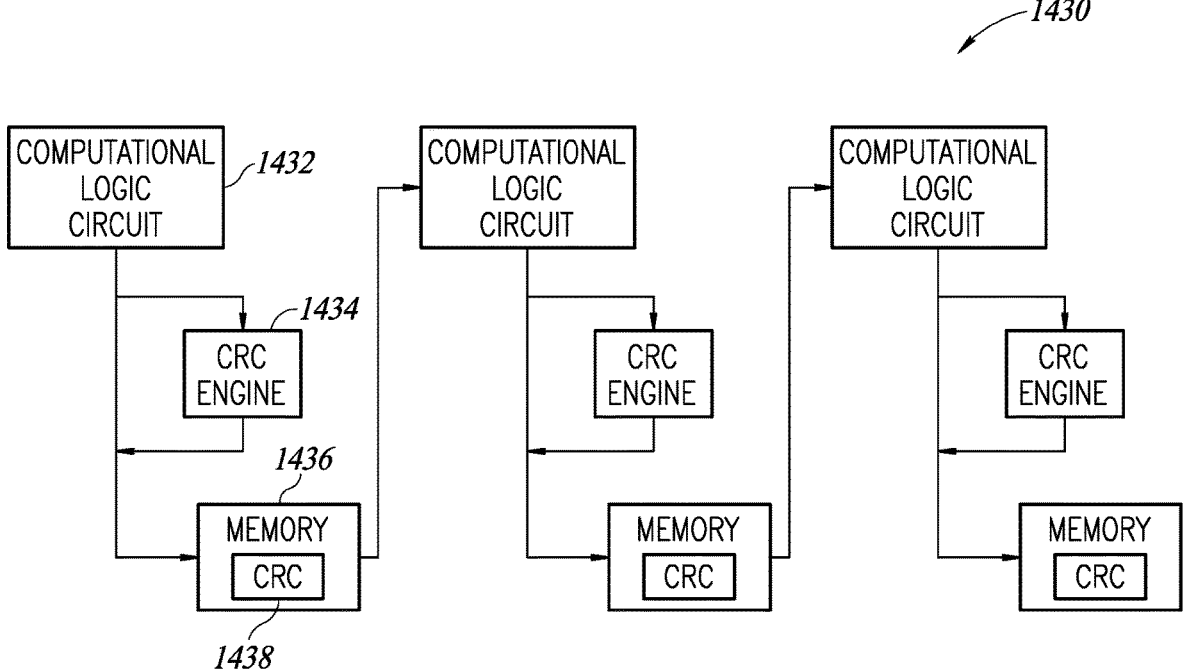
FIG. 59B is a diagram illustrating a CRC based cluster interlayer failure detection scheme.

A diagram illustrating a CRC based cluster interlayer failure detection scheme is shown in FIG. 59B. In this embodiment, the circuit, generally referenced 1430, comprises several layers (three are shown for example purposes only) with each layer including computation logic circuit 1432, CRC engine 1434, and memory fabric 1436. In operation, output of the computational logic circuit is stored in the main memory fabric. Along with the output data, CRC engine calculates a CRC checksum 1438 which is also stored with the data in memory.

This embodiment has the advantage in that the calculated output from the computational logic circuit is protected by calculating the CRC checksum over all the output data. Assuming N cycles for the output tensor, the CRC checksum needs to be 'committed' or stored to memory only once every N cycles.

Figures 60, 61:
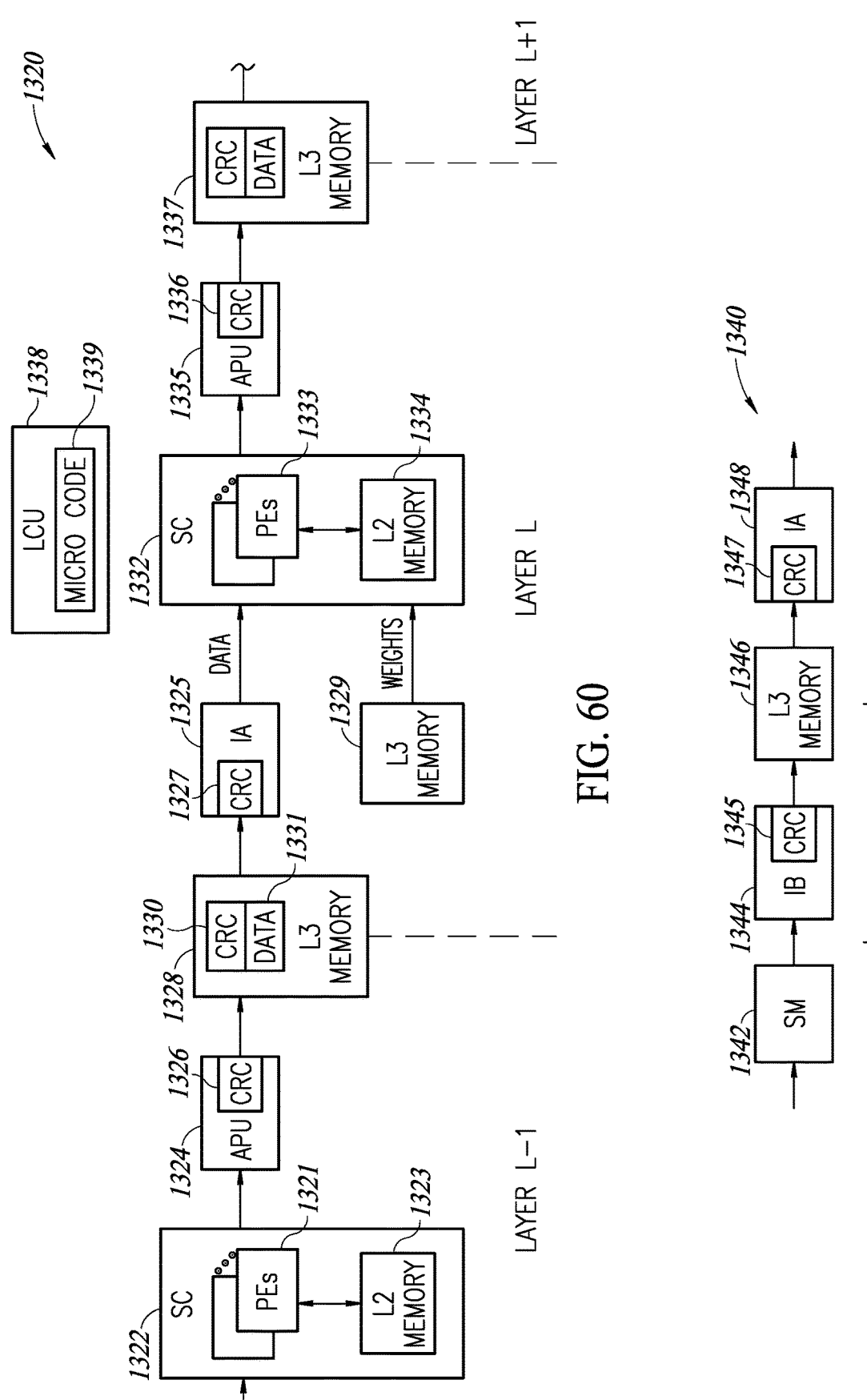
FIG. 60 is a diagram illustrating a first example cluster interlayer failure detection scheme.
FIG. 61 is a diagram illustrating a second example cluster interlayer failure detection scheme.

A diagram illustrating a first example cluster interlayer failure detection scheme is shown in FIG. 60. The circuit, generally referenced 1320, shows the data flow within a cluster over several layers. Data in layer L−1 is processed by the processing elements (PEs) 1321 and L2 memory 1323 in the subclusters (SCs) 1322. The data is fed to the APUs 1324 which is operative to generate output data from the layer L−1 that is to be input to the subsequent layer L. In operation, the output data from one layer is stored in L3 memory 1328 which is then streamed to the next layer. To protect the data while stored in L3 memory, a CRC checksum is generated over each data tensor via CRC engine 1326 in the APU. A CRC checksum 1330 is generated and stored along with its data tensor 1331 in L3 memory 1328.

In layer L, the data tensor and corresponding CRC are read from L3 memory and input to the input aligner (IA) circuit 1325. A CRC engine 1327 in the IA calculates the CRC on the data tensor and verifies it matches the CRC 1330 read from the L3 memory. If it does not match, an error flag is raised (i.e. interrupt generated) which may be fatal or non-fatal. Weights read from L3 memory 1329 and data from the IA are fed to the PEs 1333/L2 memory 1334 within the SCs 1332. The output of the SCs are fed to the APUs 1335 where again a CRC engine 1336 is operative to generate a CRC checksum over the data tensors. The data tensor and corresponding CRC are stored in the L3 memory 1337 for input to the next layer L+1.

Thus, in this fashion, the data stream flows from layer to layer within a cluster. The output data from one layer is protected by CRC while stored in the L3 memory that serves as the interface between layers. Examples of inter-cluster data flow, as well as input from and output to stream managers and related failure detection will now be described.

A diagram illustrating a second example cluster interlayer failure detection scheme is shown in FIG. 61. In this example circuit, generally referenced 1340, data from an external host (not shown) is written to an input stream manager (SM) 1342 at the NN core top 1341. The data is then fed to the input buffer (IB) 1344 at the top of a cluster C 1343. The data is stored in L3 memory 1346 enroute to the first layer 1349. The data is protected while stored in the L3 memory via CRC checksum generated by the CRC engine 1345 in the IB circuit 1344. The data is read out of the L3 memory and input to the input aligner (IA) 1348 which feeds the data to the SCs where it is processed. Upon reading the data output of the L3 memory, the CRC checksum is verified via CRC engine 1347 in the IA 1348.

Figure 62:
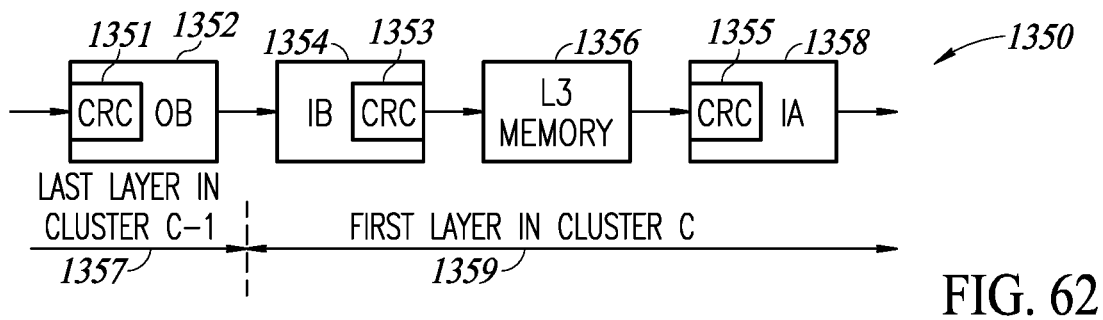
FIG. 62 is a diagram illustrating a third example cluster interlayer failure detection scheme.

A diagram illustrating a third example cluster interlayer failure detection scheme is shown in FIG. 62. In this example circuit, generally referenced 1350, data from the last layer in cluster C−1 1357 is fed to the first layer in cluster C 1359. Output data from the output buffer (OB) 1352 in cluster C−1 is written to the input buffer (IB) 1354 in cluster C. CRC engine 1351 in the OB 1352 functions to verify the CRC read from the L3 memory (not shown) in cluster C−1. The data from the IB written to the L3 memory 1356 is protected by CRC generated by CRC engine 1353 in the IB. The data in the L3 memory is read out and fed to the IA 1358. Once read out, the CRC checksum is checked by CRC engine 1355 in the IA in layer L.

Figure 63:
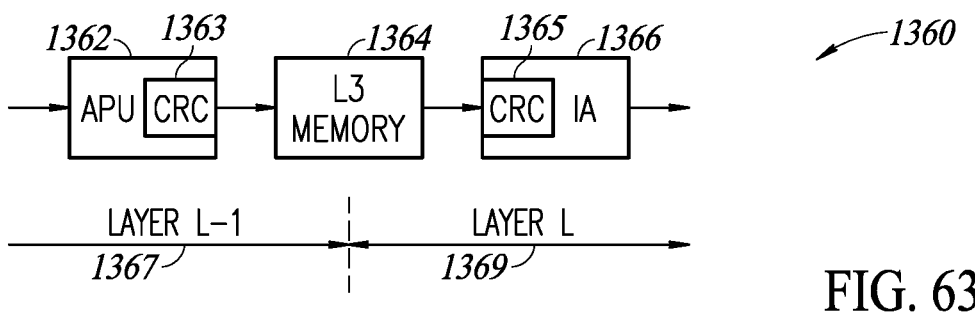
FIG. 63 is a diagram illustrating a fourth example cluster interlayer failure detection scheme.

A diagram illustrating a fourth example cluster interlayer failure detection scheme is shown in FIG. 63. In this example circuit, generally referenced 1360, data from one layer L−1 1367 is fed to the subsequent layer L 1369 within the same cluster, in similar fashion to the example scheme shown in FIG. 60 described supra. Data processed by the APU 1362 to be forwarded to the next layer is stored in L3 memory 1364. The data is protected by CRC checksum generated by CRC engine 1363 in the APU while stored in the L3 memory. Upon reading the data from the L3 memory, CRC engine 1365 in the IA verifies the checksum and generated an error if verification fails.

Figure 64:
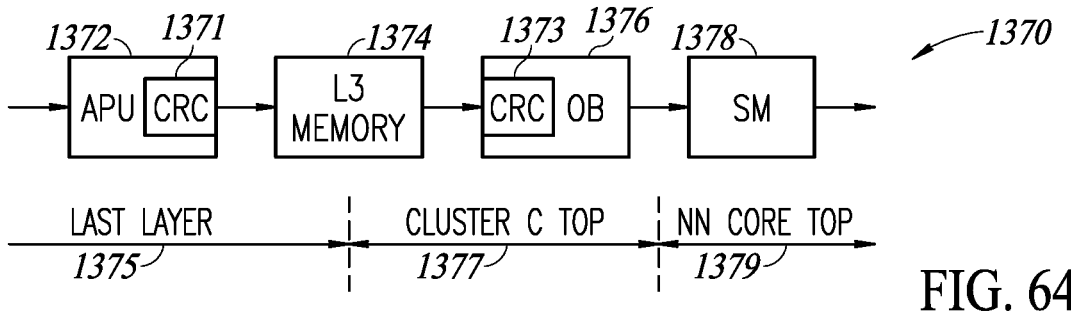
FIG. 64 is a diagram illustrating a fifth example cluster interlayer failure detection scheme.

A diagram illustrating a fifth example cluster interlayer failure detection scheme is shown in FIG. 64. In this example circuit, generally referenced 1370, data from the last layer 1375 in a cluster C is output of the cluster C top 1377 and written to the stream manager (SM) 1378 at the NN core top 1379. The output data processed by the APU 1372 is written to the L3 memory 1374. While stored in memory, the data is protected by CRC checksum generated by CRC engine 1371 in the APU. Data and corresponding CRC checksums are read out of the memory and written to the output buffer (OB) 1376. The CRC checksum are verified by the CRC engine 1373 in the OB circuit. Data from the OB is input to the SM 1378 where it is forwarded to the external host (not shown).

Figure 65:
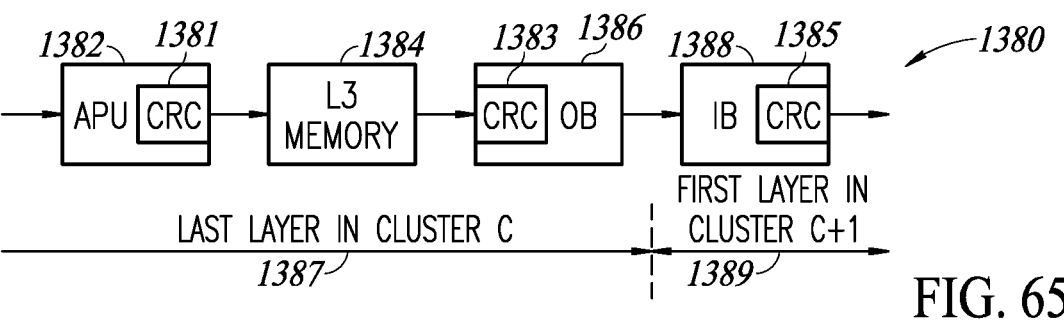
FIG. 65 is a diagram illustrating a sixth example cluster interlayer failure detection scheme.

A diagram illustrating a sixth example cluster interlayer failure detection scheme is shown in FIG. 65. In this example circuit, generally referenced 1380, data in the last layer in cluster C 1387 is input to the first layer in cluster C+1 1389. The output data processed by the APU 1382 is written to the L3 memory 1384. While stored in memory, the data is protected by CRC checksum generated by CRC engine 1381 in the APU. Data and corresponding CRC checksums are read out of the memory and written to output buffer (OB) 1386. The CRC checksum are verified by the CRC engine 1383 in the OB circuit. Data from the OB is input to the input buffer (IB) 1388 in the next cluster C+1. The CRC engine 1385 in the IB generates CRC checksums for protecting the data while it is stored in L3 memory (not shown) in the first layer of the next cluster.

Thus, there are four data paths that make up the interlayer data paths. Two are layer input paths, namely IB→L3 memory→IA and APU→L3 memory→IA and two are layer output paths, namely APU→L3 memory→IA and APU→L3 memory→OB. The data during transitions over these paths are protected while the data is stored in L3 memory. Thus, the following three data paths are protected: IB→IA, APU→IA, and APU→OB. Thus, in one embodiment, the IB and APU comprise CRC generators and the IA and OB comprise CRC checkers.

In one embodiment, utilizing CRC checksum mechanism, the checksum codeword is sent along with the transmitted data, since the data does not return to the transmitter as in weight and contexts CRC mechanisms described infra. Thus, the CRC checksum cannot be stored at the CRC generator and verify correctness when the data returns to the circuit within which the CRC generator is located.

To overcome this problem, the following mechanism is provided. Definitions of input and output frames are provided first. An input frame is defined as a certain number of input pixels (e.g., eight pixels, one byte each for a total of 64 bits) of the same input row and of the same input feature set. An output frame is a defined as a certain number of output pixels (e.g., eight pixels, one byte each for a total of 64 bits) of the same output row having the same output feature set.

Figure 66:
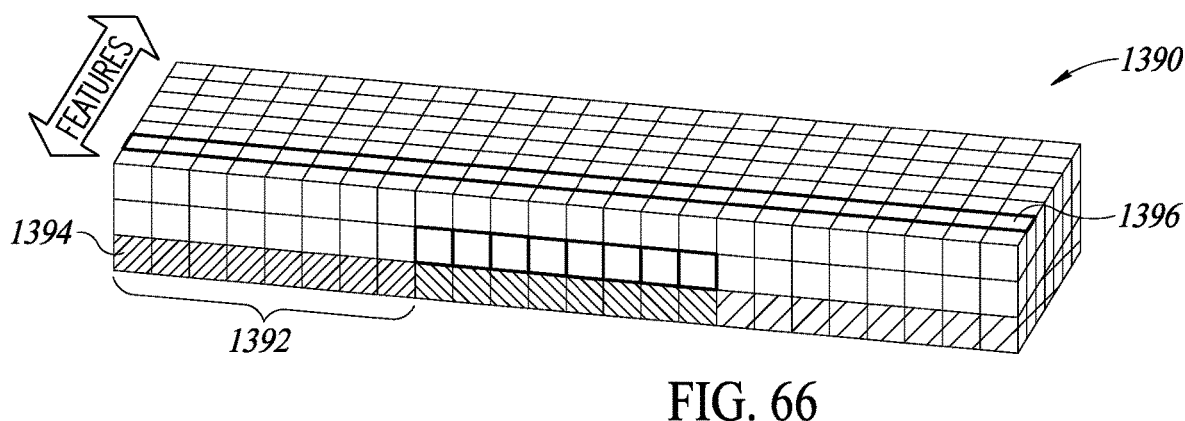
FIG. 66 is a diagram illustrating an input/output frame of an example tensor data.

A diagram illustrating an input/output frame of an example data tensor is shown in FIG. 66. The block of pixels 1390 comprises a plurality of data tensors 1392. Each data tensor is eight pixels wide and each individual pixel 1394 comprises one byte. Three data tensors are shown where each tensor comprises multiple features. Each feature comprises a row 1396, where the features make up the depth of the block.

When calculating a CRC checksum that is meant to protect a fixed amount of data, it is desirable that the CRC, generated by the previous layer (or the input buffer), to be independent of the next layer as much as possible. The next layer kernel can read its input data in many ways (e.g., different read order, different number of times each input frame (eight pixels) are being read, etc.). Thus, when calculating CRC checksums for large data blocks (e.g., complete input buffer), the CRC check value must match the way in which the following layer consumes the data. Thus, calculating a CRC checksum for an entire input buffer (i.e. an entire input row with all its input features) is problematic.

Therefore, in one embodiment, as a solution a smaller CRC calculation granularity is used that is more controllable, i.e. the kernels can be forced to align their manner of reading inputs and writing outputs to this granularity such that every kernel is able to generate CRC checksums for the next layer and to check CRC checksums of the previous layer without depending on the previous or next layer kernel.

In one embodiment, an additional feature referred to as a CRC feature is added to each data tensor that contains a CRC checksum of the data tensor over all of the "real" features. Each eight pixels (i.e. 8-byte input/output frame) of the CRC feature is a CRC of the 8-bytes over all the real features. In addition, in one embodiment, the width of the CRC feature is as wide as the row width of all the features (e.g., 8-bytes).

Figure 67A:
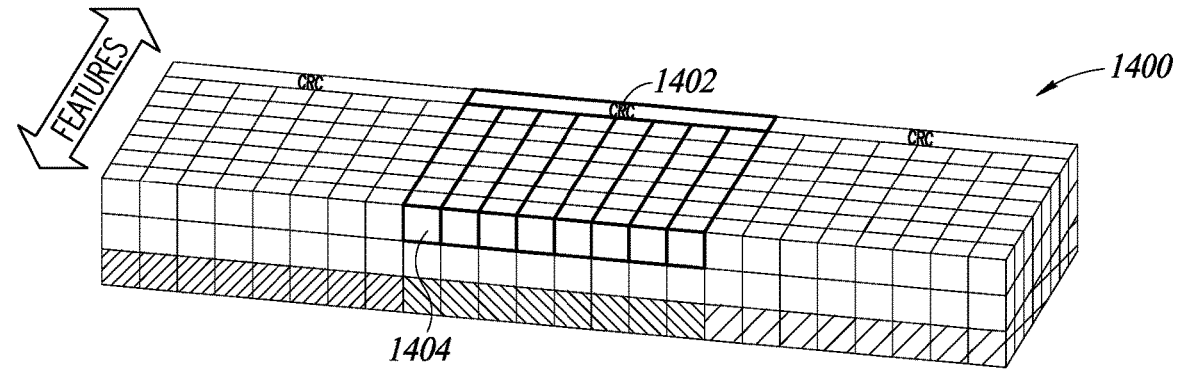
FIG. 67A is a diagram illustrating an input/output frame of an example tensor data with CRC checksum generated across all features.

A diagram illustrating an input/output frame of an example data tensor with CRC checksum generated across all features is shown in FIG. 67A. Consider in this example data tensors 1404 that are eight pixels wide and having a number F features that span the depth of the data block 1400. As described supra, the granularity of the CRC calculation is reduced from the entire input buffer (i.e. the entire input row) to each eight pixel wide data tensor but across all F features of the data tensor. The resulting 8-byte CRC 1402 is added to the data tensor as an additional feature (i.e. feature F+1).

Figure 67B:
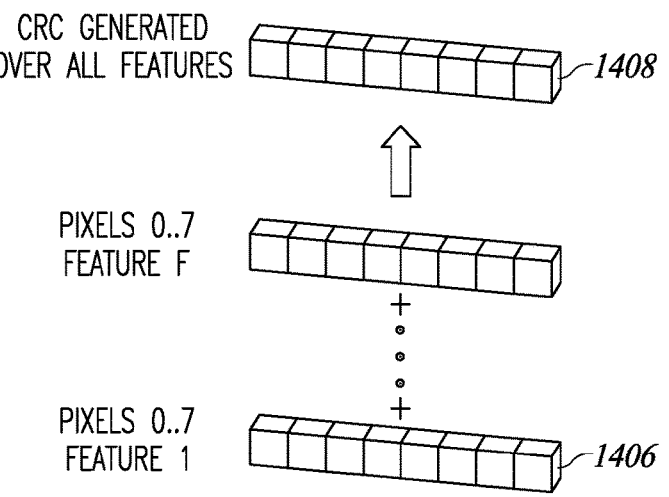
FIG. 67B is a diagram illustrating the calculation of the CRC checksum of the pixels in the tensor data across all features.

A diagram illustrating the calculation of the CRC checksum of the pixels in the data tensor across all features is shown in FIG. 67B. In this example, the CRC calculation is performed over the eight pixels 1406 wide data tensor including all features 1 through F resulting in the eight byte wide CRC checksum 1408 that is added as an additional CRC feature (i.e. feature F+1) to the data tensor. The entire data tensor along with the CRC feature is stored in L3 memory.

Figure 68:
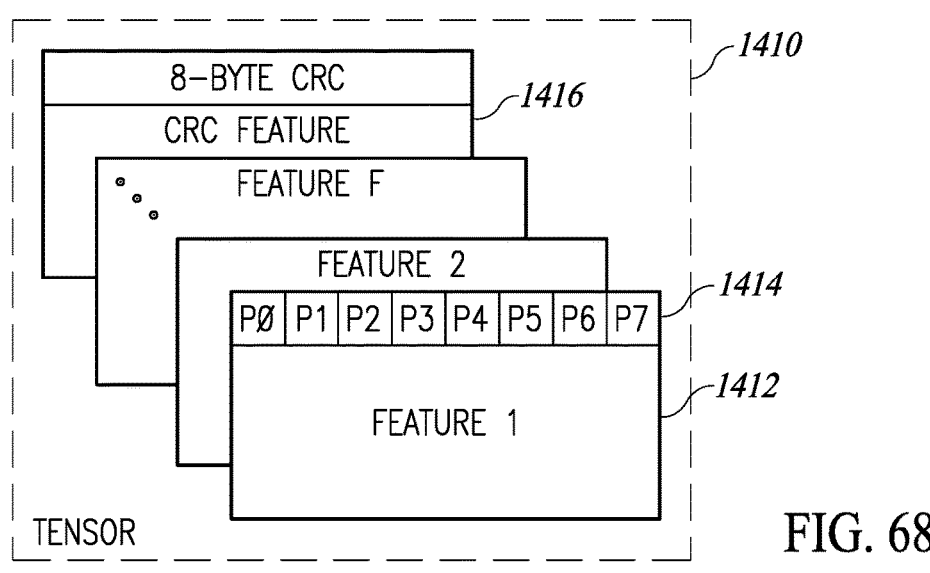
FIG. 68 is a diagram illustrating the addition of an extra feature for the CRC checksum generated across all features.

A diagram illustrating the addition of an extra feature for the CRC checksum generated across all features is shown in FIG. 68. In this example the data tensor 1410 comprises features 1 through F 1412, where each feature comprises eight pixels 1414. The CRC checksum is calculated across all features and stored in L3 memory along with the data tensor as an additional CRC feature 1416.

Figure 69:
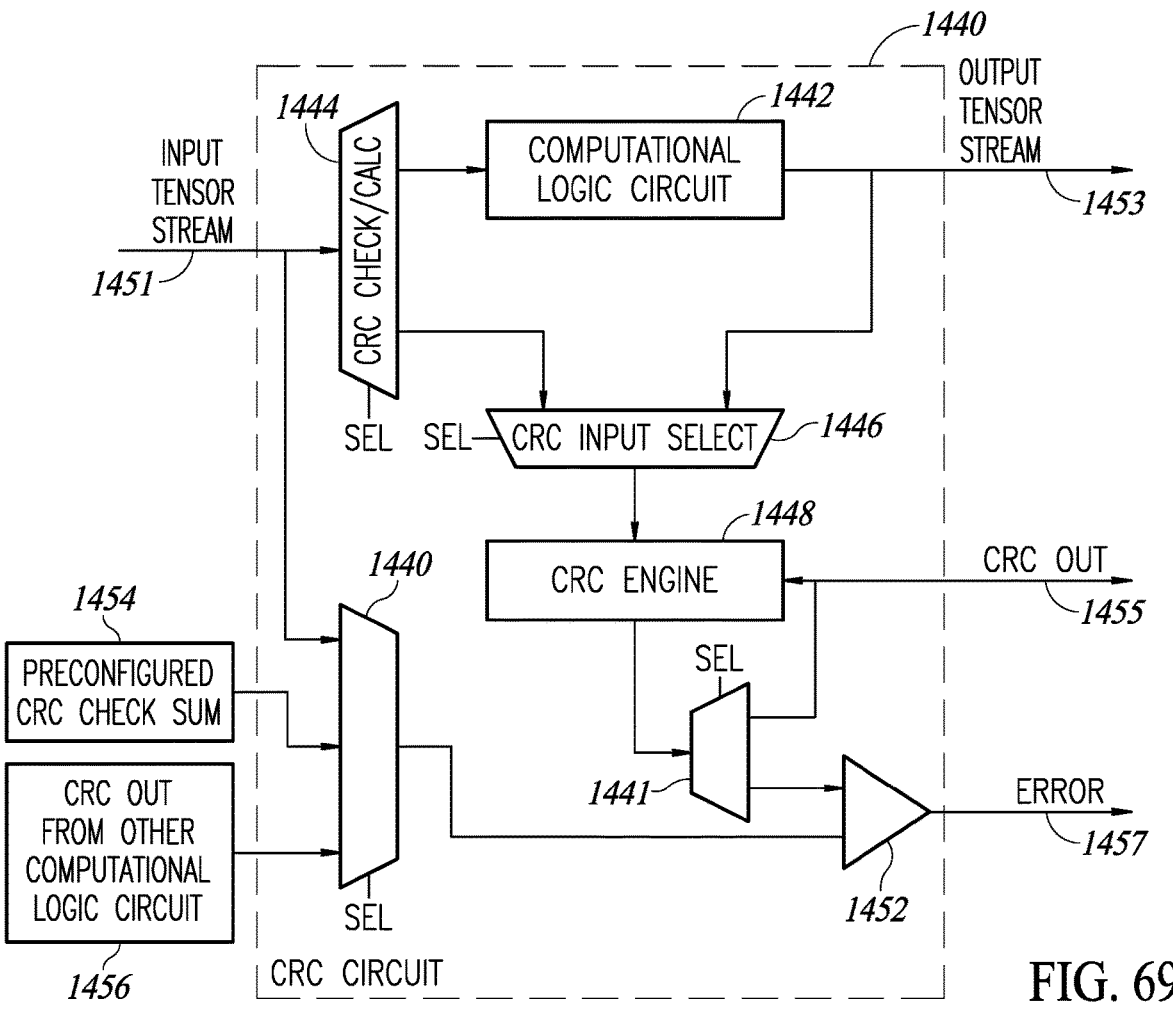
FIG. 69 is a diagram illustrating an example CRC circuit for use in the IB, APU, IA and OB circuits.

A diagram illustrating an example CRC circuit for use in the IB, APU, IA and OB circuits is shown in FIG. 69. The CRC circuit 1440 comprises CRC check/calc multiplexer 1444, computational logic circuit 1442, CRC input select multiplexer 1446, CRC engine 1448, target comparison multiplexer 1450, CRC engine feedback multiplexer 1441, and comparator 1452. In operation, input data 1451 from a previous layer or circuit element in the same layer is fed to either the computational logic circuit 1442 or the CRC input select multiplexer 1446 via CRC check/calc multiplexer 1444. In CRC calculate mode, multiplexer 1444 is configured to steer input data to the computational logic circuit (e.g., APU, etc.). The output data 1453 generated by the circuit 1442 is input to the CRC engine 1448 via the CRC input select multiplexer 1446. The CRC engine functions to calculate the CRC checksum over the output data.

In CRC check mode, multiplexer 1444 is configured to pass the input data (which is now the previously calculated and stored CRC checksum to be verified) through the CRC input select multiplexer 1446 to the CRC engine. A zero at the output of the CRC engine indicates matching checksums. A non-zero result indicates a mismatch and an error is triggered.

By suitable configuration of the target comparison multiplexer 1450, the checksum calculated by the CRC engine 1448 can be compared to a preconfigured expected CRC checksum 1454 via comparator 1452. An error signal 1457 is raised if a mismatch is detected. Alternatively, the CRC checksum 1456 calculated from another computational logic circuit may be compared to the CRC calculated by the CRC engine. In a third option, the input data 1451 may be selected for comparison with the CRC calculated by the CRC engine. The output of the CRC engine 1448 can either be input to the comparator 1452 for comparison with the output of multiplexer 1440 or can be fed back to and output (CRC OUT 1455) from the CRC engine in accordance with CRC feedback multiplexer 1441.

Thus, the CRC circuit 1440 is flexible and able to provide CRC functionality

Cluster Intralayer Safety Mechanism

The cluster intralayer safety mechanism functions to protect internal cluster resources including intralayer data paths. In one embodiment, intralayer data path comprises the input aligner (IA), subcluster (SC), and activation processing unit (APU).

Figures 70, 71:
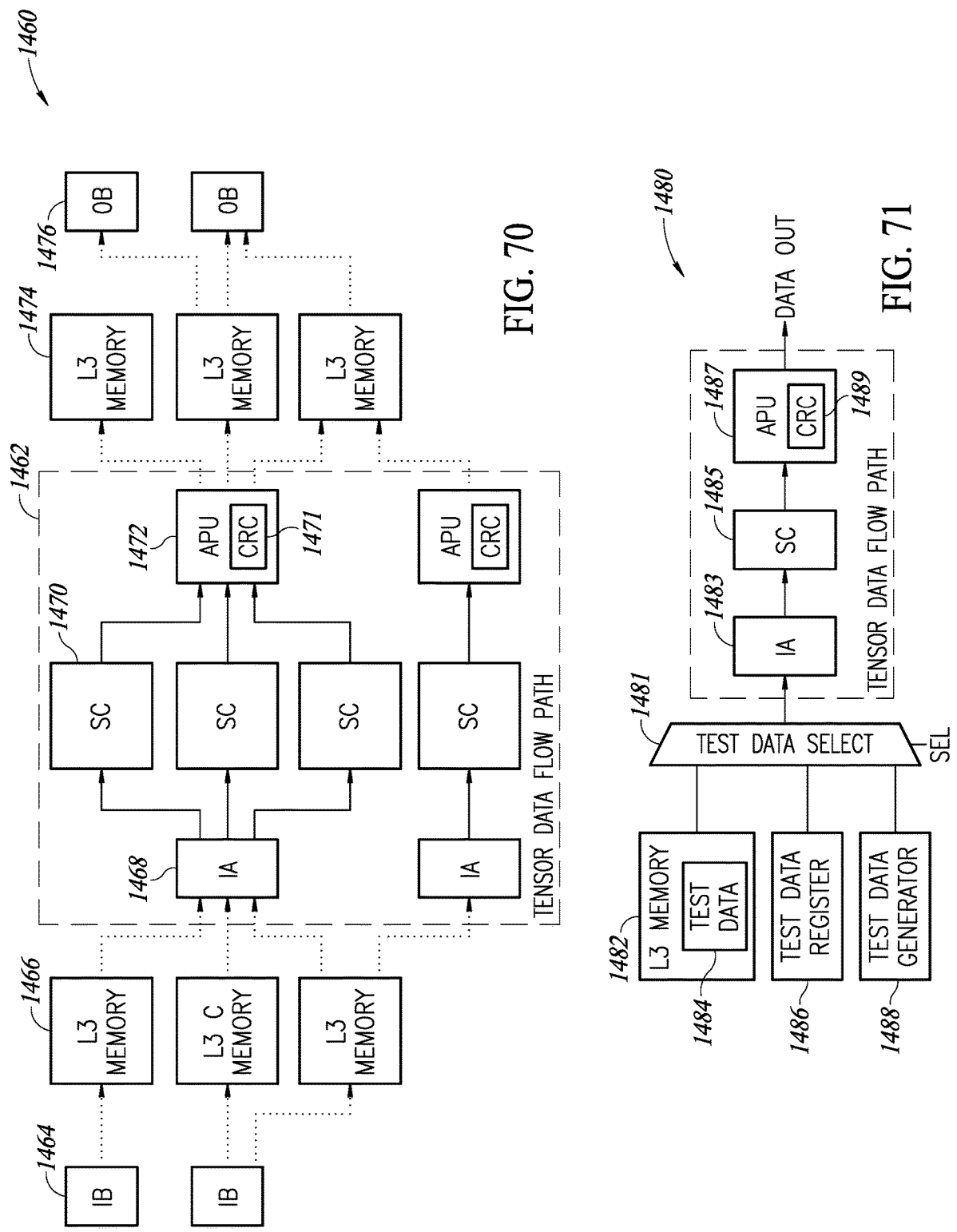
FIG. 70 is a diagram illustrating an example layer allocation in a cluster.
FIG. 71 is a diagram illustrating several alternative test data input options.

A diagram illustrating an example layer allocation in a cluster is shown in FIG. 70. In this example allocation, generally referenced 1460, a plurality of circuit elements that make up the tensor data flow path 1462 within a layer are shown. In general, the tensor data flow path comprises a computation logic circuit which in this example comprises the IAs 1468, SCs 1470, and APUs 1472. Note that this allocation shows only the data paths for clarity sake. Control and triggering signals from the LCU that control the layer as well as weight reading data paths are omitted. Data from a previous layer or input stream manager circuit (not shown) is input to the input buffer (TB) 1464 and then stored in L3 memory 1466. When retrieved, the data is fed to the input aligner which functions to feed the input data stream to the subclusters for calculations with the weights. The calculations output of the subclusters are input to activation circuits in the APU. Data destined for the next layer is written to L3 memory 1474 and then to the output buffer (OB) 1476 if the next layer is in a different cluster. If it is the last layer, the data is then input to an output stream manager (not shown). Note that if the layer's output is the next layer's input within the same cluster than the IB and OB are not needed.

The safety mechanism for protecting data while stored in L3 memory was described in detail supra in connection with the cluster interlayer safety mechanism. The dotted lines indicate the tensor data flow path that is protected by the interlayer safety mechanism.

In this intralayer safety mechanism, failures in the circuitry along the tensor data flow path (shown in solid lines) within the layer are detected. This is achieved by injecting known tensor test data into the tensor data flow path, calculating an output and comparing that output with a preconfigured expected output. If a mismatch is found, an error signal is raised. Alternatively, a CRC checksum over the calculated output data is generated via CRC circuit 1471 in the APU which at an appropriate point in time is compared to a preconfigured expected CRC checksum. A mismatch indicates a fault and an error flag is raised.

The intralayer safety mechanism functions to provide (1) end to end protection of the tensor data within the IA; (2) end to end protection of the tensor data within the SC including computational circuitry and input samples within the SC; and (3) end to end protection of the APU including both configuration and tensor data. Note that it is desirable to provide protection of the control and configuration plane as well. Thus, the end-to-end protection mechanism is implemented by comparing a final calculated result with a preconfigured value computed for the operations executed by the LCU controls. Whenever a control failure occurs in the process (e.g., in the control interconnect), the final comparison will not be valid (i.e. a mismatch) and a failure is detected.

In one embodiment, the intralayer safety mechanism is operative to generate and/or store tensor test data along with test weights at the cluster level. Occasionally (i.e. periodically or aperiodic) the NN processor ceases normal operations and runs calculations on the test data and weights. This is achieved partly via the compiler/SDK which is aware of the test feature whereby the relevant LCUs are programmed accordingly via appropriate microcode to ensure test information is handled properly and does not interfere with real calculation results.

In one embodiment, the tensor test data is run through the tensor data flow path within the layer including the input aligner where the tensor test data is shifted out to the subclusters which in turn multiply the tensor test data with the test weights possibly multiple times in order to verify the accumulation logic in the processing elements (PEs). The test output tensor data is input to the APU which activates the tensor data and utilizes one or more other APU computational resources to generate activation output. This output is compared to expected test output that is calculated and configured in the cluster a priori. In an alternative embodiment, rather than check each and every sample in the output tensor, an ongoing CRC checksum is calculated over the entire test output tensor. Once complete, the CRC checksum is compared to a preconfigured checksum calculated a priori by numeric emulation of the NN processor. Matching CRC checksums are verified and an error flag is raised if a mismatch is found.

A diagram illustrating several alternative test data input options is shown in FIG. 71. The example circuit, generally referenced 1480, comprises tensor data flow path 1489 that is protected by the intralayer safety mechanism. In this example the tensor data flow path comprises IA 1483, SC 1485, and APU 1487 but may contain different circuit elements depending on the implementation. As described supra, tensor test data is occasionally injected into the tensor data flow path for detecting circuit faults. The test data may be provided by one of several sources: (1) test data 1484 stored in L3 memory 1482; (2) test data 1486 stored in a register in the cluster or elsewhere; and (3) test data (and optionally weights) generated dynamically on the fly via a test data generator 1488. In one embodiment, the test data comprises a pseudorandom binary sequence. Selection of the test data source is made by data source select multiplexer 1481. Note that the weights that the test data are multiplied with may comprise actual weights used for non-test data and read from L2 or L3 weight memory.

Figure 72:
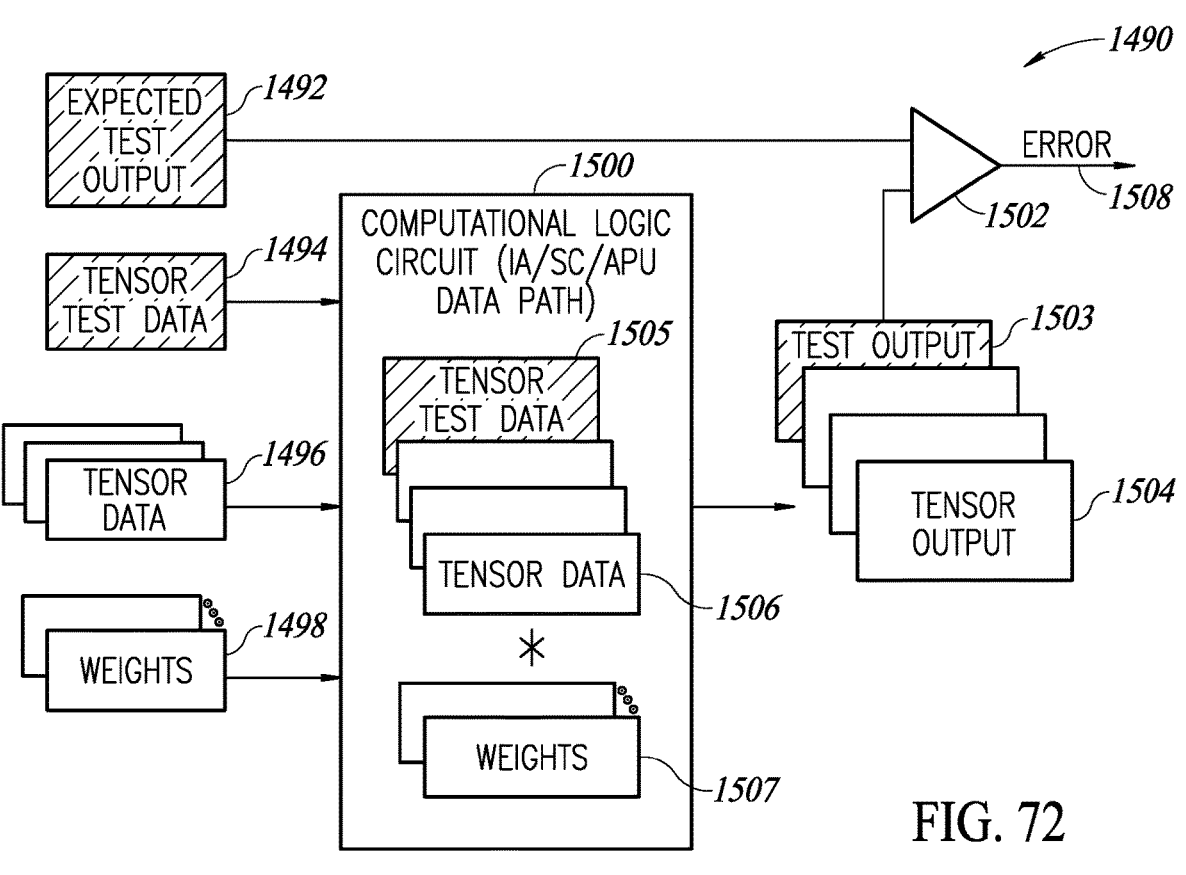
FIG. 72 is a block diagram illustrating a first example test data injection mechanism for detecting failures in intralayer circuitry.

A block diagram illustrating a first example test data injection mechanism for detecting failures in intralayer circuitry is shown in FIG. 72. The example circuit, generally referenced 1490, comprises a computational logic circuit or tensor data flow path 1500 (which in this example consists of the IA, SC, and APU), one or more test data tensors 1494, a stream of regular data tensors 1496, weights 1498, expected test output 1492, calculated output tensor data 1504 generated by the computational logic circuit, test output 1503, and comparator 1502.

In operation, a stream of input tensors 1496 and corresponding weights 1498 are input to the computational logic circuit tensor data flow path 1500. Convolution is performed whereby the tensors 1506 are multiplied with weights 1507. Output tensors 1504 generated by the tensor data flow path is output to subsequent layers in the same or different cluster or output to the stream manager after the last layer is processed. At some point, normal processing of the tensors ceases and tensor test data 1494 is injected into the tensor data flow path 1500. The one or more test tensors 1505 are processed by the computational logic circuit in the same fashion as regular input tensors. Test output 1503 is generated by the circuit 1500 and compared to the previously configured expected test output 1492 by the comparator 1502. A match/mismatch is determined and an error signal 1508 is triggered if a mismatch is detected.

Note that the expected test output 1492 comprises the convolution of the test data with test weights and is performed a priori by the compiler. The test data and expected test output are preconfigured in the NN processor and test data is injected into the data path under control of the LCU allocated to that particular layer.

Note also that the injection of the test data 1494 to the data path may be performed in periodic or aperiodic fashion. For example, the test data may be injected after every three input data tensors for a 3:1 ratio. Considering video frame input, test data may be injected in between rows of each frame or between frames depending on the desired ratio of test data to regular data (i.e. the desired throughput or "duty cycle"). More frequent injection of test data provides a higher degree of safety but at the expense of lowered throughput.

Figure 73:
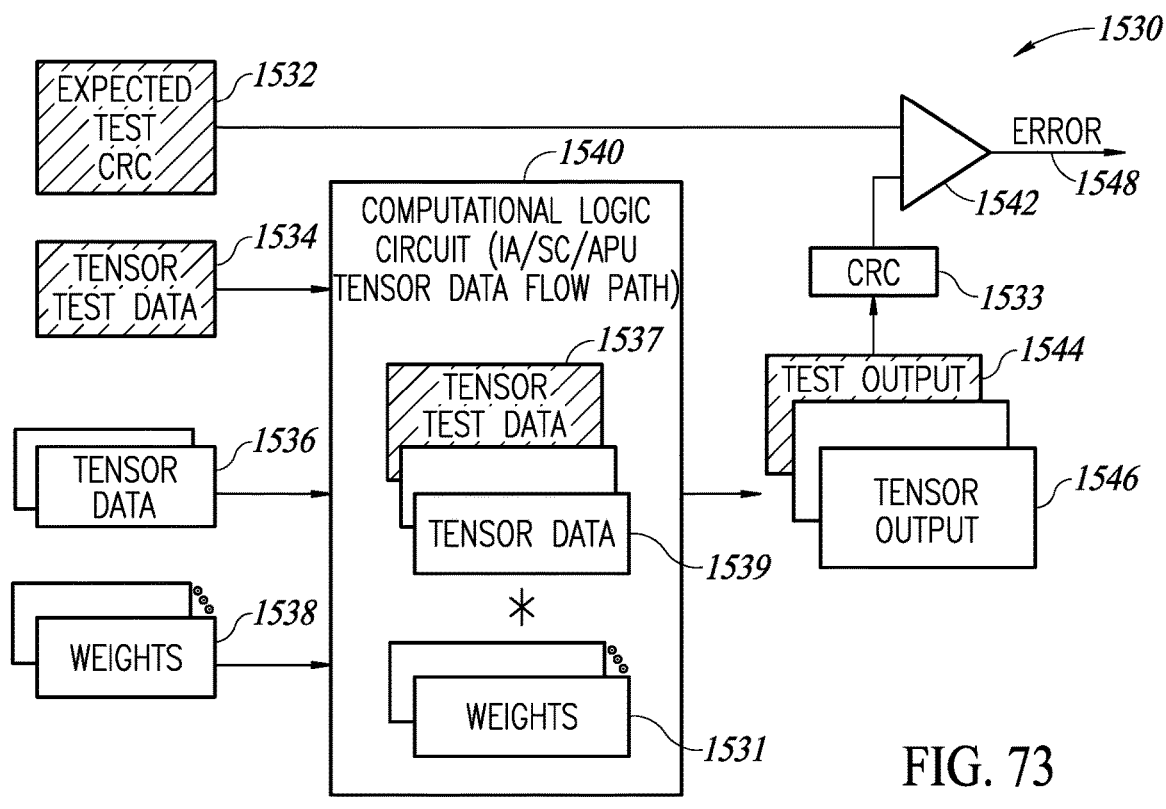
FIG. 73 is a block diagram illustrating a second example test data injection mechanism for detecting failures in intralayer circuitry using CRC.

A block diagram illustrating a second example test data injection mechanism for detecting failures in intralayer circuitry using CRC is shown in FIG. 73. The example circuit, generally referenced 1530, comprises a computational logic circuit or tensor data flow path 1540 (which in this example consists of the IA, SC, and APU), one or more test data tensors 1534, a stream of regular tensors 1536, weights 1538, expected test output CRC 1532, calculated output data 1546 generated by the computational logic circuit, test output 1544, CRC circuit 1533, and comparator 1542.

In operation, a stream of input tensors 1536 and corresponding weights 1538 are input to the computational logic circuit data path 1540. Convolution is performed whereby the tensors 1539 are multiplied with weights 1531. Output tensors 1546 generated by the computational logic circuit is output to subsequent layers in the same or different cluster or output to the stream manager after the last layer is processed. At some point, normal processing of the tensors ceases and test tensors 1534 are injected into the computational logic circuit 1540. The one or more test tensors 1537 are processed by the computational logic circuit in the same fashion as regular input data tensors. Test output 1544 is generated by the computational logic circuit 1540 and a running CRC checksum (i.e. test CRC) is calculated over the test output using the CRC circuit 1533. Once processing of the test data is complete, the calculated test CRC is compared to the previously configured expected test CRC output

1532 by the comparator 1542. A match/mismatch is determined and an error signal 1548 is triggered if a mismatch is detected.

Note that the expected test CRC 1532 is calculated by taking a CRC over the expected test data output as generated by the complier. The expected test output is generated by the complier a priori by taking the convolution of the tensor test data with test weights. Test data and the expected test CRC are then preconfigured in the NN processor and tensor test data is injected into the tensor data flow path under control of the LCU allocated to that particular layer.

Figure 74:
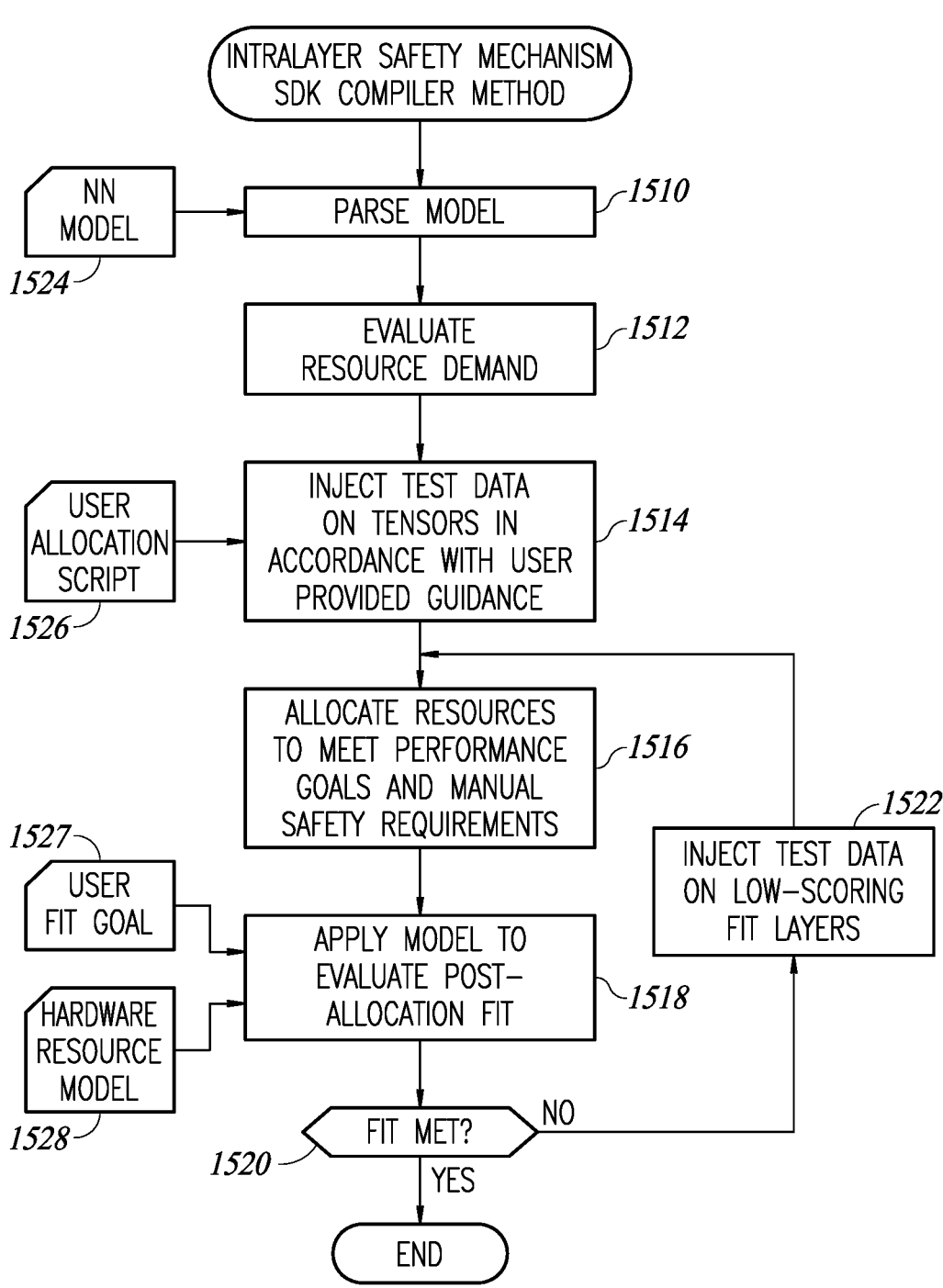
FIG. 74 is a flow diagram illustrating an example intralayer safety mechanism SDK compiler method.

A flow diagram illustrating an example intralayer safety mechanism SDK compiler method is shown in FIG. 74. This method is performed off-line from the NN processor but with knowledge of the NN model. Initially, the user provides the desired NN model 1524 to be implemented by the NN processor to the compiler which first parses the model (step 1510). The compiler then evaluates the model and determines the resources required to implement the model including layers and corresponding circuit elements (step 1512). In accordance with an allocation script 1526 provided by the user, the compiler injects (emulated) test data on input tensors (step 1514). NN processor circuit resources (i.e. clusters, subclusters, IA, APU, OB, IB, SM, etc.) are allocated to meet performance goals and manually set safety requirements (step 1516). The NN model is then applied to evaluate post-allocation failure in time (FIT) using the user set FIT goal 1527 and the hardware resource model 1528 as inputs (step 1518). If the FIT goal is met (step 1520), the method ends, otherwise test data is injected (emulated) on layers that had low FIT scores (step 1522) and the method returns to step 1516 and resources are re-allocated. This cycle continues until the FIT is met.

LCU Instruction Addressing Safety Mechanism

The LCU instruction addressing safety mechanism provides protection for internal LCU microcode operations. During normal operation of the NN processor, instructions are being read from LCU microcode (i.e.) instruction memory according to an address generated by the LCU module internal logic. There are typically two types of faults that may occur in the process of addressing the instruction memory. The first is when the instruction address generating logic is faulty which causes one or more generated addresses to be faulty for one or more valid address cycles. A transient fault may occur for one or more address cycles which may affect the entire addressing flow since address generation sometimes relies on previously generated addresses. Alternatively, a permanent fault may occur where one or more address bits are stuck at a certain logic value or may change but remain faulty. The second is when the address bus itself becomes stuck, whereby the address towards the memory is faulty for one or more address cycles. Note that an address fault for more than a single clock cycle is also possible for transient faults.

Thus, regardless of the type of fault that occurs, the implication is similar in that an instruction address is faulty for one or more address cycles, and where in extreme situations one or more address bits can become stuck at a certain logical value.

In one embodiment, an error for a finite number of valid address cycles, meaning a non-permanent fault, should be detected by a subcluster or a cluster level safety mechanism which would trigger an interrupt. This is because this type of fault would result in a finite number of clock cycles with nonregular behavior of the kernel (i.e. microcode program), whether in the data plane or in the control plane. When the fault condition is finally removed, however, the cluster/subcluster safety mechanisms would check the kernel data and control behavior and would detect the error.

Note that the consecutive manner of address generation dictates that single address cycle errors are not highly probable. Thus, a single error is likely to turn into multiple errors. In addition, a permanent addressing error, may result in a situation where no safety mechanism check is triggered, and hence goes undetected by cluster/subcluster level safety mechanisms.

When a permanent error does occur, some addresses (one or more) are likely not accessible at all. If the kernel program does not use these addresses, then there is no real problem (i.e. it is a latent fault). If the kernel uses these addresses, however, then this fault should be detected. The LCU instruction addressing safety mechanism of the present invention addresses this problem.

If a fault occurs in the actual logic that generates addresses to the instruction memory, then the operation of the current layer becomes unpredictable. A bad instruction read from LCU microcode memory causes faulty commands to be given to the rest of the cluster. Synchronization between LCU instructions collapses and the cluster logic circuitry may become stuck. Worst case is that bad things occur without being able to detect them as the behavior of the system becomes unpredictable.

In one embodiment, the LCU instruction addressing safety mechanism incorporates three different but related safety sub-mechanisms as described in more detail infra. Each LCU incorporates these safety sub-mechanism and each layer is mapped to an LCU.

Figure 75:
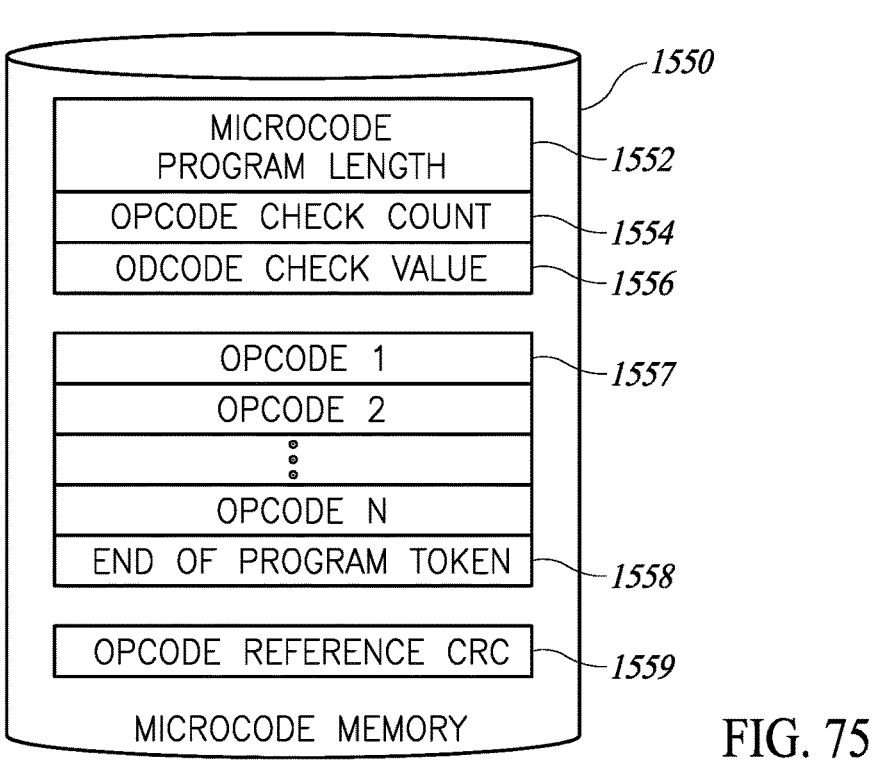
FIG. 75 is a diagram illustrating example contents of microcode memory in an LCU.

A diagram illustrating example contents of microcode memory in an LCU is shown in FIG. 75. The LCU microcode memory 1550 comprises the microcode program made up of a plurality of opcodes 1557, i.e. opcode 1 through opcode N, an end of program token 1558 also stored in memory, a microcode program length 1552, opcode check count 1554, opcode check value 1556, and an opcode reference CRC checksum 1559.

In a first safety sub-mechanism, knowledge of the expected microcode flow is taken advantage of Since the LCU logic has no branching, this can be leveraged by protecting control flow since program flow is known a priori. In particular, the length of the microcode is known with an end of program token indicating the end of program. The length value determined by the compiler is loaded into a register in the LCU circuit. Once the end of program is reached, the counter value is compared to the length register. This ensures that the microcode ran properly and at the correct pace and did not experience a fault. If a mismatch is found, an error is flagged.

Figure 76:
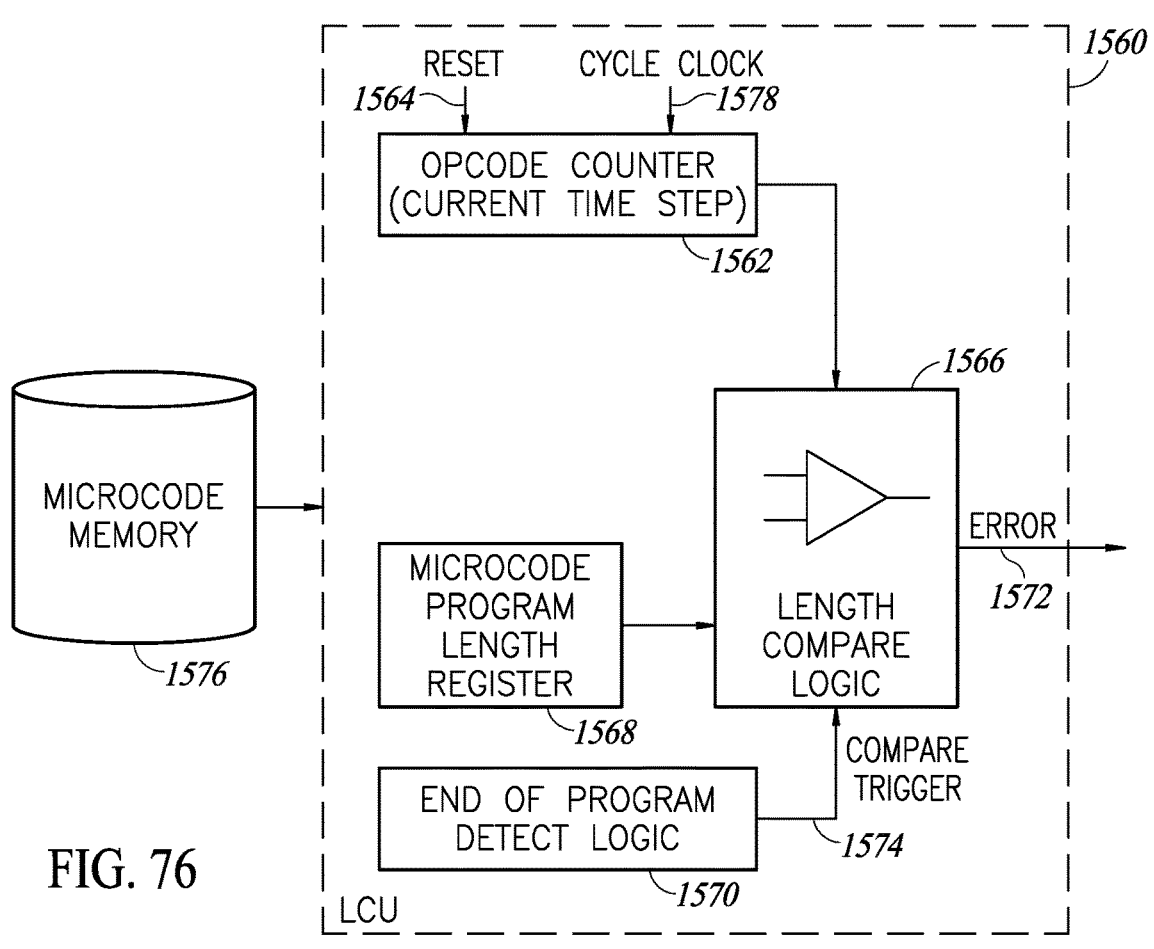
FIG. 76 is a diagram illustrating an example LCU circuit incorporating a microcode program length check safety mechanism.

A diagram illustrating an example LCU circuit incorporating a microcode program length check safety mechanism is shown in FIG. 76. The LCU circuit 1560 comprises opcode counter 1562 that maintains the current time step having a reset input 1564 and cycle clock 1578, microcode program length register 1568 for storing the microcode program length value retrieved from coupled microcode memory 1576, end of program detect logic 1570, and length compare logic 1566.

The opcode counter 1562 functions to count the number of reads performed by the LCU (i.e. number of opcodes). Every time an instruction is read from memory, the counter is incremented (i.e. once per cycle). The compiler that is part of the SDK knows a priori how many reads should be performed for the particular microcode program running in the LCU. This value referred to as the microcode program length is calculated and stored in microcode memory (i.e. MCU instruction memory) along with the program. This value is loaded into the LCU and stored in a register 1568. Since the LCU circuitry does not have branching, operation of the LCU operation is predictable. The value of the opcode counter at the end of the program should match that of the value in the register 1568. The end of program detect logic 1570 functions to detect the end of the microcode program using the end of program token 1558 (FIG. 75) retrieved from instruction memory.

Note that the microcode typically contains loops that repeat over and over a certain number of instructions per line. Each LCU has one opcode counter that gets reset at the beginning of the program with the first instruction code. Each LCU has instruction memory with a set of instructions to be executed per layer known a priori. In operation, the layer always performs the same actions.

When an end of program is detected, a compare trigger 1574 is input to the length compare logic 1566. The current value of the opcode counter 1562 is compared to the contents of the microcode program length register 1568. If a mismatch is detected, an error flag 1572 is raised.

Note that the LCU knows when it is at zero instruction address (i.e. the beginning of time for each layer). Reads are made to the LCU instruction memory which in one embodiment the contents of which are protected by ECC. The LCU instruction addressing safety mechanism described herein, however, is not designed to protect the contents of the instruction memory but rather the LCU addressing logic. Well-known ECC techniques can be used to protect the contents of memories.

A problem with data flow machines such as the NN processor is that there is no branching and thus no opportunity to trap problems. In a conventional machine, if a fault occurs where instructions are skipped and wrong results generated there will ultimately be a trap that captures the error. An exception will be triggered to indicate that something went wrong. But in a data flow machine there is no point in time where some logic will detect that something went wrong. The circuit will simply start outputting garbage and continue executing instructions. To detect such faults, this safety sub-mechanism provides a layer of protection to indicate that something possibly went wrong.

Each cycle, when reading an opcode from instruction memory, if a fault occurs on the address bus, the wrong instruction will be retrieved from memory. The opcode counter 1562 counts checks that in aggregate (i.e. on the boundaries of a trigger) there is an expectation of a certain number of cycles 'N' and a check is performed that indeed only 'N' cycles occurred.

The opcode counter begins at address zero. The compare is performed on the last instruction, e.g., the last instruction in a loop for a layer (i.e. end of layer processing). The length compare logic 1566 performs the compare and determines whether the opcode count matches the reference count. At the end of the kernel (i.e. program) the opcode counter is reset for each iteration of the loop.

In a second sub-mechanism, once the program finishes executing, it means all opcodes were consumed. During execution, however, a CRC is computed over all the opcodes. The resultant CRC is checked against a reference CRC computed by the compiler a priori and an error is raised if a mismatch is found. In one embodiment, the CRC engine is run for an additional cycle which takes the reference CRC checksum as an 'opcode' and if the CRC checksums match, the result is zero. An error interrupt is triggered in the event of a non-zero result.

Figures 77, 78:
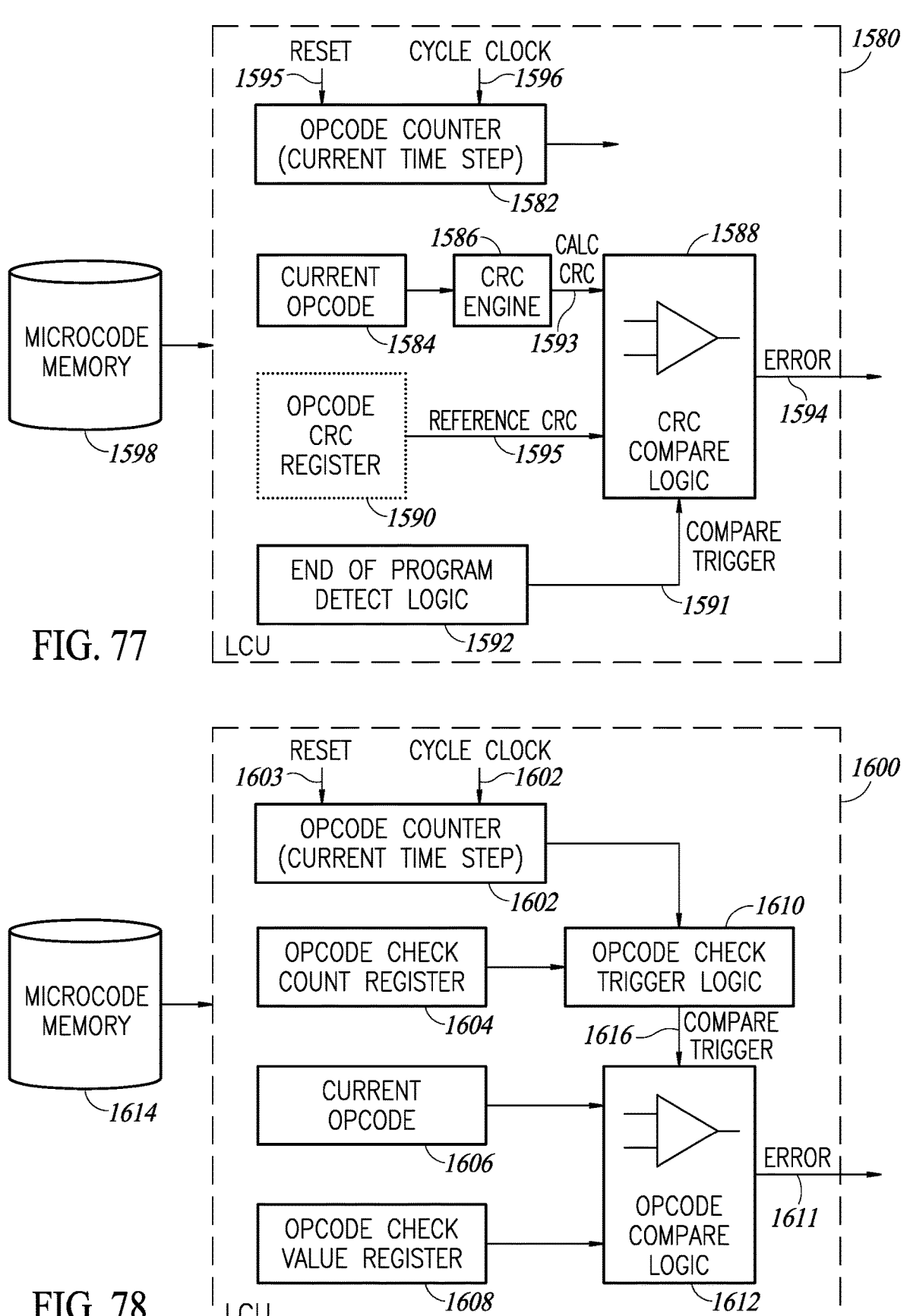
FIG. 77 is a diagram illustrating an example LCU circuit incorporating a microcode program contents check safety mechanism.
FIG. 78 is a diagram illustrating an example LCU circuit incorporating a mid-microcode program opcode check safety mechanism.

A diagram illustrating an example LCU circuit incorporating a microcode program contents check safety mechanism is shown in FIG. 77. The LCU circuit 1580 comprises opcode counter 1582 that maintains the current time step having a reset input 1595 and cycle clock 1596, current opcode register 1584, CRC engine 1586 that generates a calculated CRC checksum 1593, optional opcode CRC register 1590 that provides a reference CRC checksum 1595 loaded from microcode memory 1598, end of program detect logic 1592, and CRC compare logic 1588.

In operation, as the microcode program executes in the LCU logic, CRC engine 1586 is operative to calculate a CRC checksum over each opcode 1584. Once the end of program detect logic 1592 detects the end of program (via end of program token 1558 (FIG. 75)), a compare trigger signal 1591 is generated which instructs the CRC compare logic 1588 to verify the calculated CRC with the reference CRC value. In one embodiment, the reference CRC value is loaded from microcode memory 1598 into optional opcode CRC register 1590 and at the appropriate time the reference CRC 1595 is input to the CRC compare logic which functions to compare the reference CRC to the calculated CRC 1593. If a mismatch is found, an error flag 1594 is raised. Alternatively, the reference CRC is read from microcode memory and input to the CRC engine as a final opcode. The error flag is raised if the resultant CRC checksum is non-zero. Note that the opcode reference CRC checksum 1559 (FIG. 75) is calculated a priori by the compiler and stored in the microcode memory. It is loaded into the LCU along with the microcode program.

In a third sub-mechanism a running program in the LCU is checked midstream to ensure it is executing correctly. In some programs the number of opcodes is relatively small but they execute over and over for long periods of time. Note that opcodes can indicate to execute for a certain number of cycles, e.g., 1000s or more. For example, consider a program length of two opcodes but the cycle duration is many thousands of cycles. For long duration programs, a check at the end of the program is not sufficient. In this case, a check count (i.e. opcode count or check index) and corresponding check value is provided which provides an intermediate check to determine whether the pace of execution is correct. For example, consider a microcode program where at time step 1000, opcode #2 is loaded. A check can be performed with check count of 1000 and check value of #2. Internally, the LCU counts cycles and when the opcode counter reaches the correct count in a check count register the value of the current opcode is compared with the contents of check value register. If they do not match, an error interrupt is triggered.

A diagram illustrating an example LCU circuit incorporating a mid-microcode program opcode check safety mechanism is shown in FIG. 78. The LCU circuit 1600 comprises opcode counter 1602 that maintains the current time step having a reset input 1603 and cycle clock 1601, current opcode register 1606, opcode check count register 1604, opcode check value register 1608, opcode check trigger logic 1610, and opcode compare logic 1612.

In operation, the opcode check count and opcode check value are generated by the software compiler and stored in microcode memory 1614 along with the associated program contents. The opcode check count and opcode check value are loaded from microcode memory into the opcode check count register 1604 and opcode check value register 1608, respectively. The opcode counter 1602 output is input to the opcode check trigger logic 1610 which compares the current opcode count to the contents of the opcode check count register. When they match, the trigger logic 1610 generates a compare trigger 1616 to the opcode trigger logic 1612. In response to the trigger, the current opcode 1606 is compared to the contents of the opcode check value register 1608. If a mismatch is found, an error interrupt 1611 is triggered.

Although the compiler may set a check count and check value to any place in the execution of the program, it is preferable to provide protection for opcodes that execute for many cycles. Opcodes are not necessarily balanced as some may run for a few cycles and others for many cycles. In one embodiment, for example, for an opcode that runs for 100,000 cycles, the compiler will place a check value for that opcode at approximately the half way point. In addition, a program can have a plurality of check indices and values. In setting the check count and check value, the compiler may take into account the fault tolerant time interval (FTTI), i.e. the time that a fault can be present in a system before a hazard occurs representing a total target time the system needs to meet in order to transition to a safe state. Setting check count to a point at half way through the execution of the opcode cuts the FTTI time to respond in half.

Figure 79:
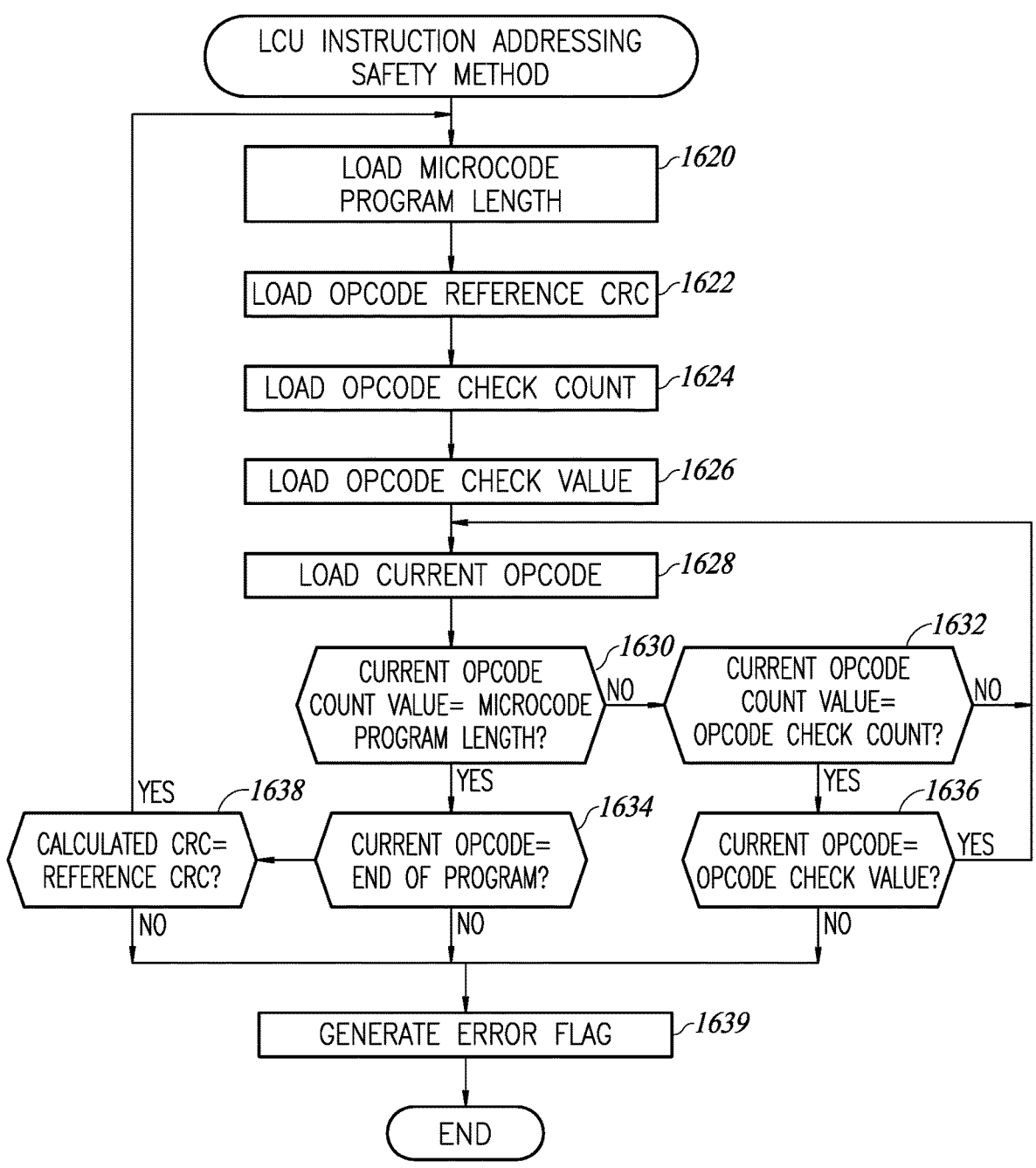
FIG. 79 is a flow diagram illustrating an example LCU instruction addressing safety method.

A flow diagram illustrating an example LCU instruction addressing safety method that embodies all three sub-mechanisms described supra is shown in FIG. 79. With reference to FIG. 75, initially, the microcode program length 1552 is loaded into the LCU circuit from the microcode memory (step 1620). The opcode reference CRC checksum 1559 is also located into the LCU circuit from microcode memory (step 1622). The opcode check count 1554 is then loaded (step 1624) as well the opcode check value 1556 (step 1626), both loaded from microcode memory.

The current opcode from the microcode program 1557 is then loaded into LCU memory (step 1628). If the value of the current opcode count is equal to the length of the microcode program (step 1630) meaning the program has completed execution, then it is checked whether the current opcode is equal to the end of program token (step 1634). If not, then a fault occurred and an error flag is raised (step 1639). If it is, it is then checked whether the calculated CRC checksum is equal to the reference CRC checksum (step 1638). If they match, the method returns to step 1620 load a new microcode program. If they do not match, a fault occurred and an error flag is raised (step 1639).

If the current opcode count value is not equal to the microcode program length (step 1630), then it is checked whether the current opcode count value is equal to the opcode check count stored in the LCU register (step 1632). If not, it means the execution of the program has not reached the check point and the method continues with step 1628. If it does, then it is checked whether the current opcode is equal to the opcode check value stored in the LCU register (step 1636). If they match, the method continues with step 1628. If they do not match, a fault occurred and an error flag is raised (step 1639).

Weights Safety Mechanism

The weights safety mechanism of the present invention is intended to protect data that is generated and/or used by the subclusters, namely the weights being stored in L2 memory internal to the subcluster or in L3 memory external to the subcluster, which are read by the subcluster as part of the calculations performed by normal neural network process-ing, i.e. weights×inputs. The dedicated weights safety mechanism is operative to detect failures of weights stored in L2 or L3 memory.

It is noted that while conventional ECC circuits used in memories can provide memory protection, a disadvantage is that it has a relatively high cost in terms of the size, power, etc. in that the entire memory, i.e. every location, is protected while the weights themselves may occupy a small portion of the memory depending on the network. Even in extreme cases, only two thirds of the memory is occupied by weights and in most cases far less than that. In addition, conventional ECC mechanisms are not capable of providing detectability of an error as ECC circuits do not provide an indication that an error occurred, they only protect the memory fabric.

In contrast, the weights safety mechanism described herein comes at a relatively low cost in terms of size and power requirements and in addition satisfies the detectability requirement whereby an error can be detected and reported to higher layers.

Figure 80:
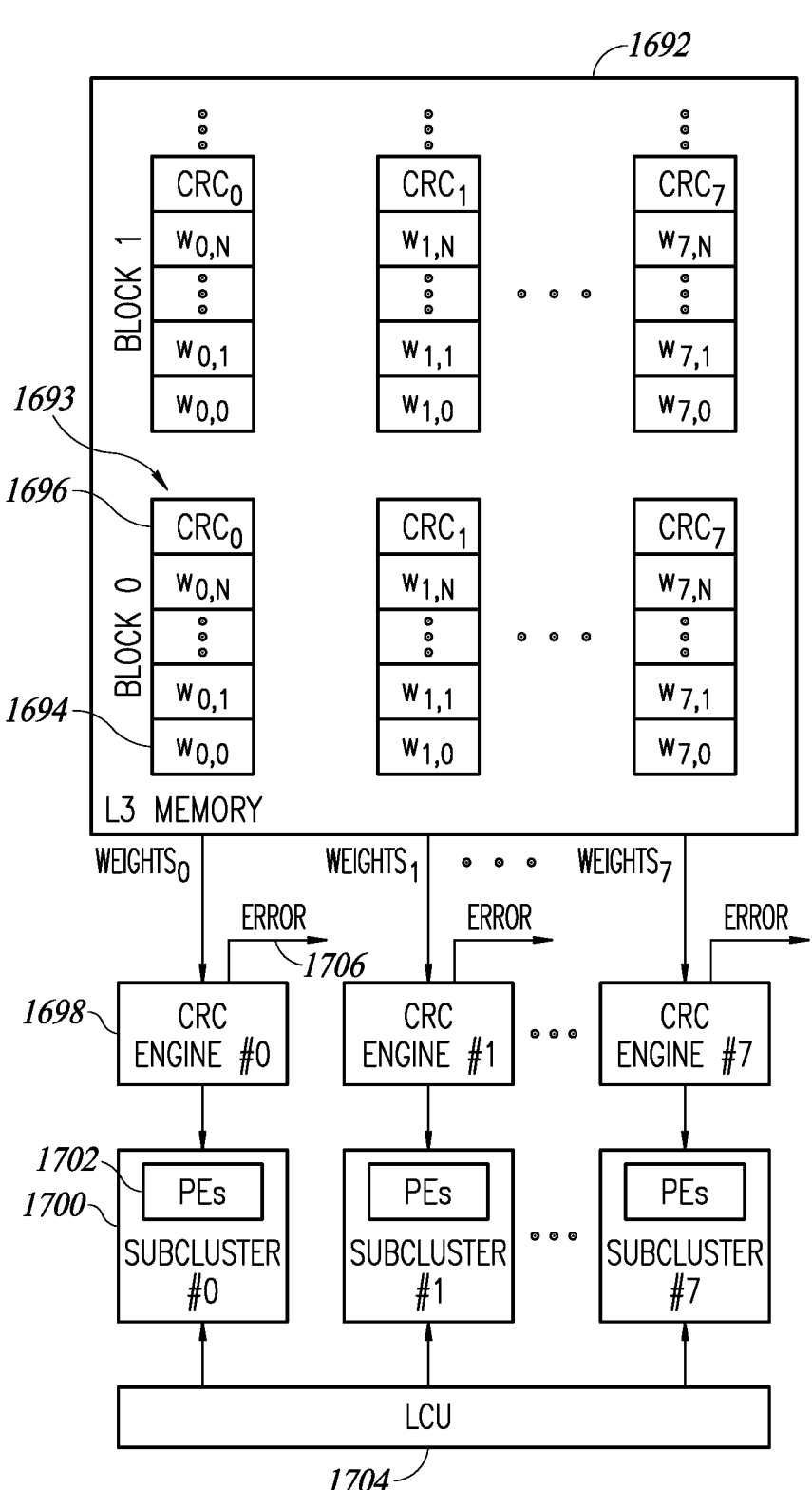
FIG. 80 is a diagram illustrating a first example weights safety mechanism incorporating L3 memory.

A diagram illustrating a first example weights safety mechanism incorporating L3 memory is shown in FIG. 80. The circuit, generally referenced 1690, comprises L3 memory 1692 external from the subclusters, a plurality of CRC engines 1698, a plurality of subclusters 1700, and LCU 1704.

In operation, the weights are stored in L3 memory as blocks 1693 of n weights in each block. The blocks of weights are grouped by subcluster with a set of blocks associated with each subcluster. Each block 1693 includes n weights 1694, i.e. $w_{0,0}$ to $w_{0,n}$, for subcluster #0 for example. Weights $w_{1,0}$ to $w_{1,n}$ correspond to the weights in blocks corresponding to subcluster 1, and so on. The last entry in each block is a precalculated CRC checksum 1696. It is calculated by the compiler a priori (before runtime) and written to the L3 memory along with the weights as the last entry in the block. Each block has its own CRC checksum calculated over the weights making up that particular block. Note that each subcluster may be any number of blocks of weights. The number n of weights in each block, however, is typically the same for each layer.

The weights are read out of L3 memory when needed by the subclusters and fed to one of the CRC engines 1698, namely CRC engine #0 through #7. In one example embodiment, eight CRC engines are used corresponding to sub-clusters #0 through #7 respectively. Each CRC engine is operative to calculate a CRC checksum over the weights retrieved from the L3 memory. A CRC checksum is calculated for each block of weights. Once the CRC checksum calculation is complete, it is compared to the precalculated checksum read from memory. If a mismatch is detected, the CRC engine generates an error flag 1706. Note that the weights are passed to the CRC engines as well as the subclusters where they are used in the calculations per-formed by the processing elements (PEs) 1702. The LCU 1704 functions to control the operation of the weights safety mechanism including reading and writing the L3 memory and inputting weights to the CRC engines and subclusters.

Figure 81:
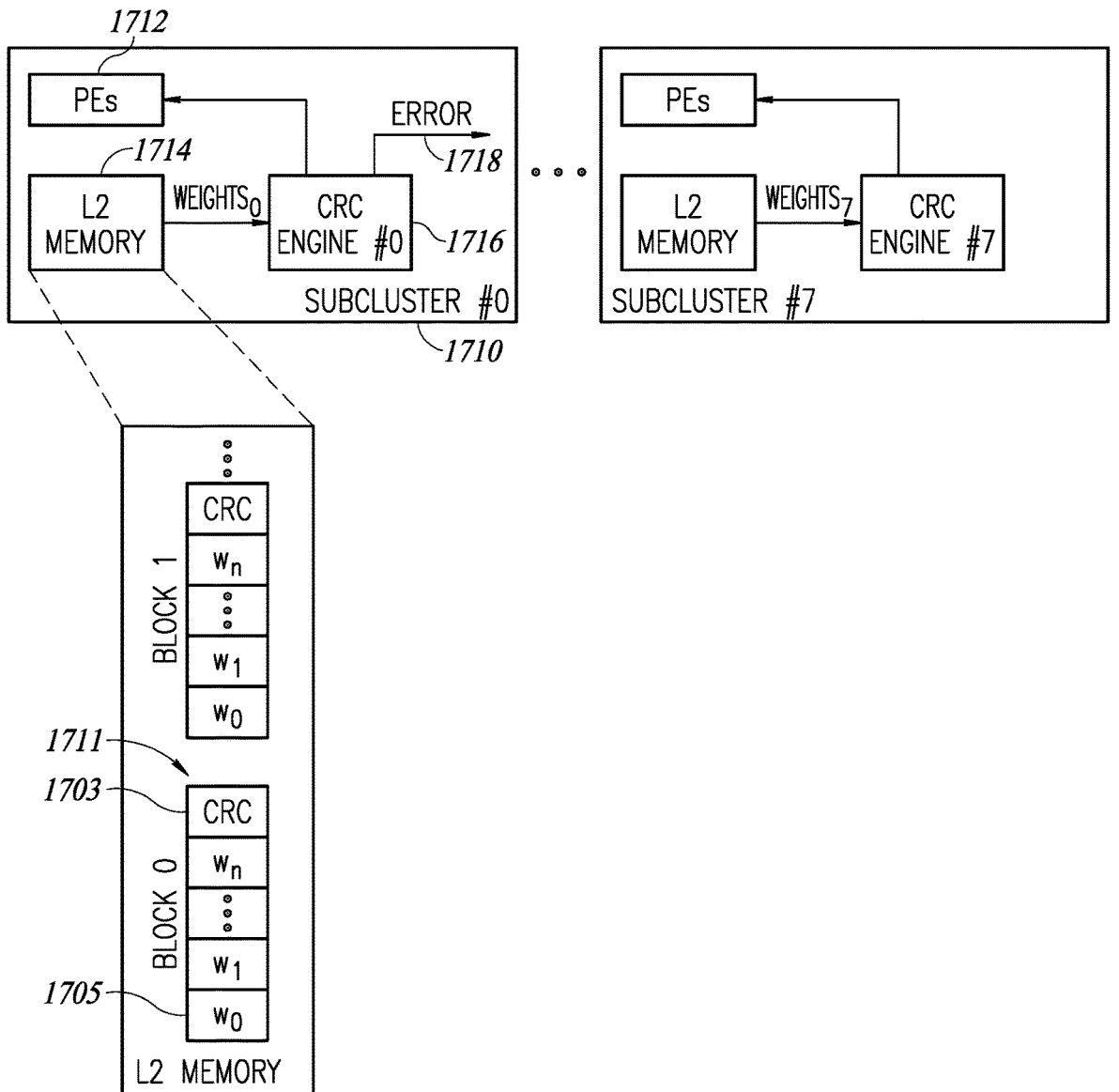
FIG. 81 is a diagram illustrating a second example weights safety mechanism incorporating L2 memory.

In an alternative embodiment, rather than protect the weights stored in L3 memory, the weights stored in L2 memory are protected. A diagram illustrating a second example weights safety mechanism incorporating L2 memory is shown in FIG. 81. For clarity, only a single subcluster, subcluster #0, is shown. The mechanism, how-ever, can be applied to any number of subclusters depending on the particular implementation. The subcluster 1710 comprises PEs 1712, L2 memory internal to the subclusters, and CRC engine 1716 with output error signal 1718.

The weights are stored in L2 memory in similar fashion to the weights stored in L3 memory shown in FIG. 80. In operation, the weights are stored in L2 memory as blocks 1711 of n weights in each block. The blocks of weights stored in L2 memory are associated with only one subcluster, subcluster #0 in this example. Each block 1711 includes n weights 1705, i.e. $w_0$ to $w_n$. The last entry in each block is a precalculated CRC checksum 1703. It is calculated by the compiler a priori (before runtime) and written to the L2 memory along with the weights as the last entry in the block. Each block has its own CRC checksum calculated over the weights making up that particular block. Note that the L2 memory in each subcluster may be any number of blocks of weights. The number n of weights in each block, however, is typically the same for each layer.

The weights are read out of L2 memory when needed by the PEs in the subcluster and fed to the CRC engine #0 1716. In this embodiment, each subcluster has its own corresponding CRC engine. The CRC engine is operative to calculate a CRC checksum over the weights retrieved from the L2 memory. A CRC checksum is calculated for each block of weights. Once the CRC checksum calculation is complete, it is compared to the precalculated checksum read from memory. If a mismatch is detected, the CRC engine generates an error flag 1718. Note that the weights are passed to the CRC engines as well as the PEs where they are used in the calculations performed thereby. The LCU (not shown) functions to control the operation of the weights safety mechanism including reading and writing the L2 memory and inputting weights to the CRC engines and PEs.

Figures 82, 83:
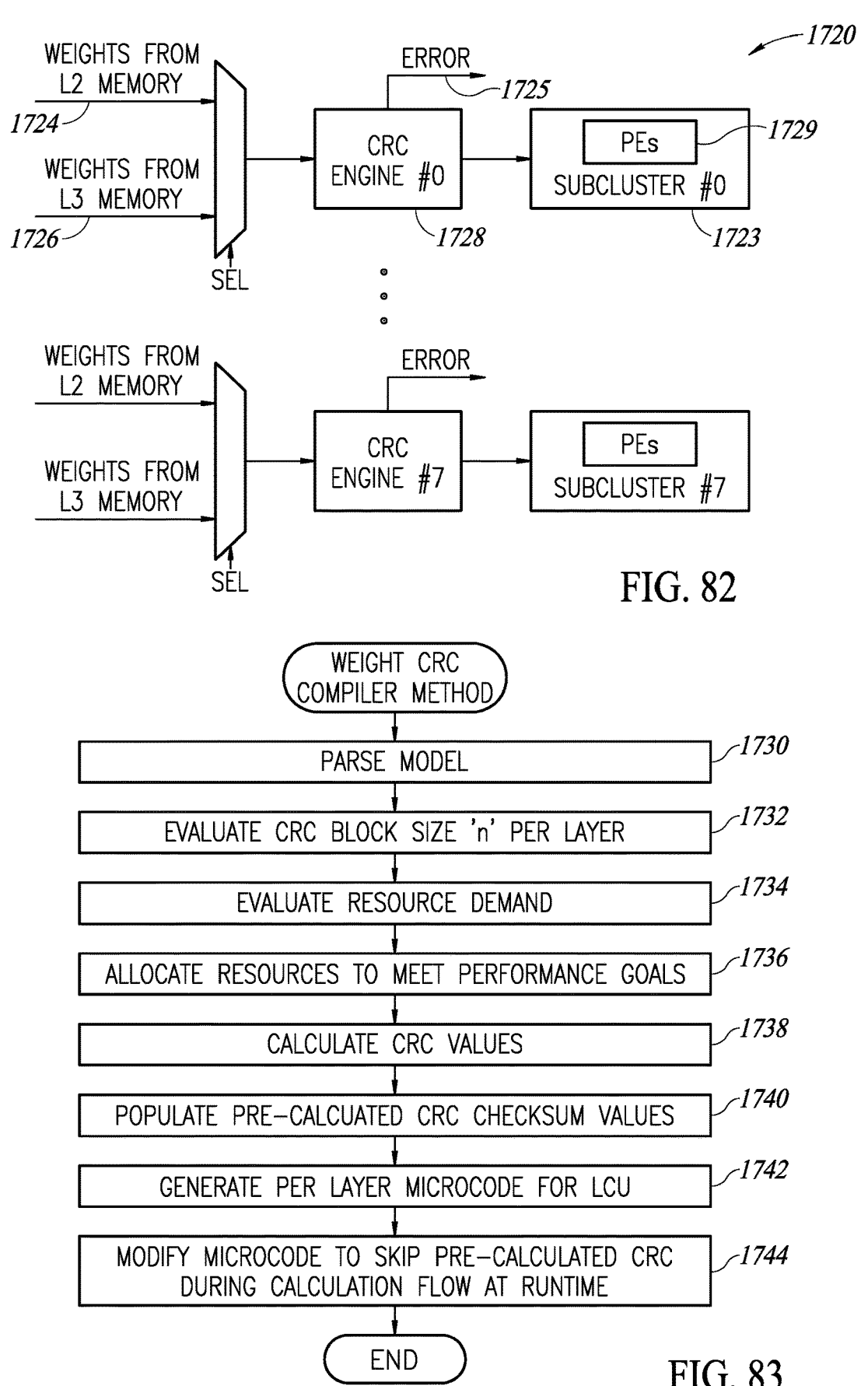
FIG. 82 is a diagram illustrating an example circuit for multiplexing weights from L2 and L3 memories.
FIG. 83 is a flow diagram illustrating an example weights CRC complier method.

A diagram illustrating an example circuit for multiplexing weights from L2 and L3 memories is shown in FIG. 82. To conserve chip real estate and reduce power consumption, the CRC engines used in the circuits of FIGS. 80 and 81 can be shared. Thus, in the circuit 1720 only a single CRC engine 1728 is needed for each subcluster 1723. The weights from L2 memory 1724 and the weights from L3 memory 1726 are multiplexed via multiplexer 1722 whose output is fed to the input of the CRC engine 1728. The precalculated CRC is compared with the CRC calculated from the weights retrieved from either memory and an error signal 1725 is raised if a mismatch is detected. The weights, output from the CRC engine are input to the subcluster where they are multiplied by the input in the processing element circuits 1729.

A flow diagram illustrating an example weights CRC complier method is shown in FIG. 83. This method is performed off-line from the NN processor but with knowledge of the NN model. Initially, the user provides the desired NN model to be implemented by the NN processor to the complier which first parses the model (step 1730). The complier then evaluates and determines the CRC block size n to use for each layer (step 1732). In this step, the weights density is calculated and accordingly the memory block size for which a CRC is needed. The compiler then evaluates the model and determines the resources required to implement the model including layers and corresponding circuit elements (step 1734). NN processor circuit resources (i.e. clusters, subclusters, IA, APU, OB, IB, SM, etc.) are allocated to meet performance goals and manually any set safety requirements (step 1736). The CRC checksum values are calculated for each of the blocks of n weights (step 1738). The memory is populated with the blocks of weights and the precalculated CRC value per block (step 1740). Microcode for the LCU circuits are then generated accordingly (step

1742). The microcode generated is modified so as to skip the precalculated CRC checksums in each block during the calculation flow at runtime (step 1744). Normally, without the weight safety mechanism, the weights in each block are read from memory and fed to the processing elements where they are used in the calculation flow. The last entry in each block, however, is now the precalculated CRC checksum for that block and should not be used as a weight in the neural network calculations and thus must be skipped over.

NN Intermediate Results Safety Mechanism

The NN intermediate results safety mechanism of the present invention is intended to protect NN intermediate results (i.e. also referred to as contexts or context values) generated within the subclusters, namely the NN intermediate results stored in L2 memory internal to the subcluster. During calculations performed by normal neural network processing, i.e. weights×inputs, the L1 memories associated with the processing elements may overflow. In this case, NN intermediate results are shuffled (i.e. transferred) from L1 memory to L2 memory and vice versa. The dedicated NN intermediate results safety mechanism is operative to ensure that no failure has occurred during the shuffling process or during the time the NN intermediate results are stored in L2 memory.

The NN intermediate results safety mechanism described herein is useful to address the fact that random faults in the memories are more likely the longer data is not refreshed. In particular, the longer L2 memory is not refreshed with new data, the more likely the chances of an error occurring. In fact, in some cases, the contents of the L2 memory may remain unrefreshed (i.e. stale) for relatively long periods of time in cases of calculation of a very heavy compute intensive layer. In such cases, the L2 memory is refreshed at a rate of L2/L1 and since L1 is relatively small, L2/L1 is fairly large. Thus, the safety mechanism attempts to address this problem by providing protection for the intermediate results while they are stored in memory.

Figure 84:
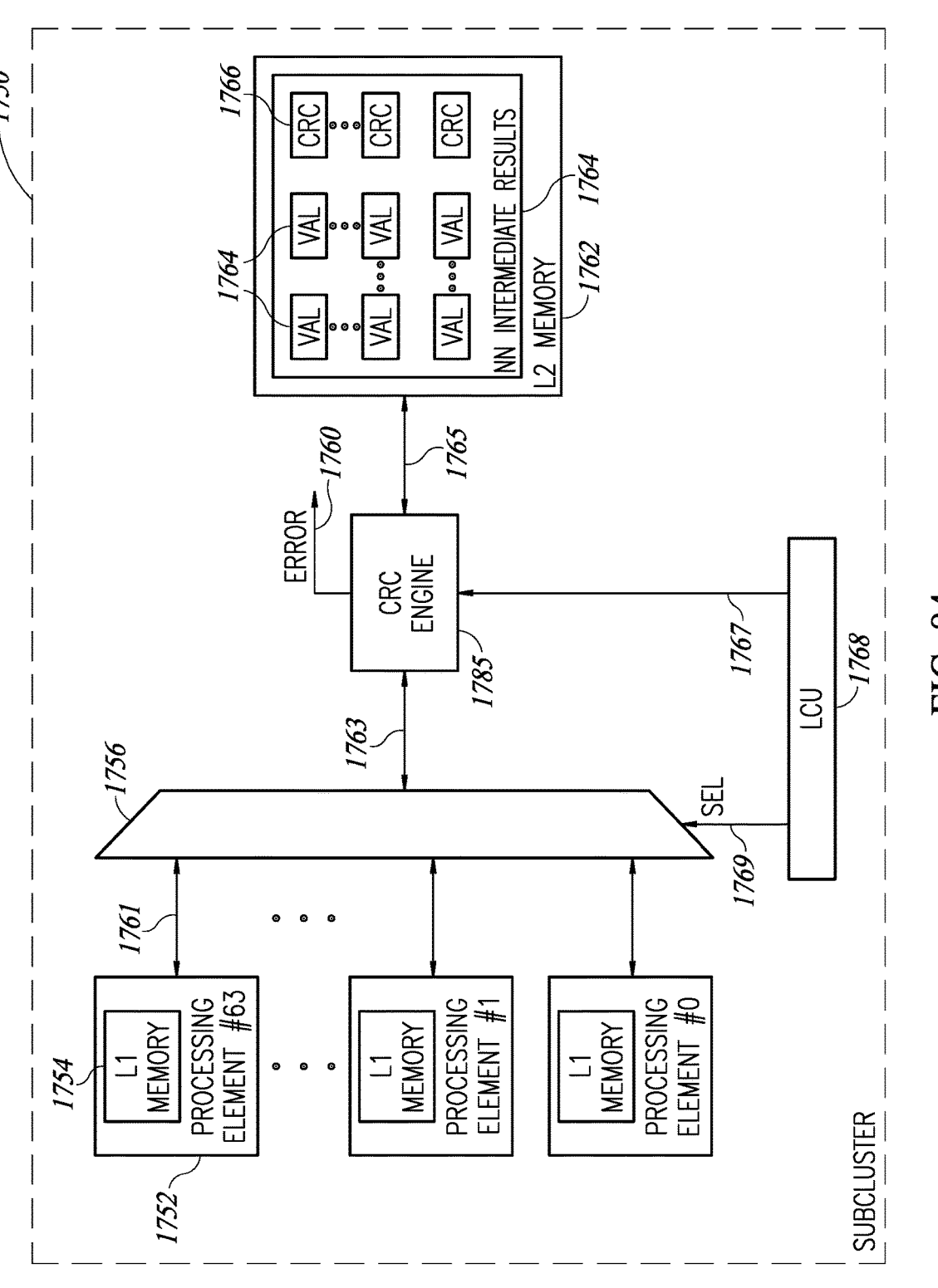
FIG. 84 is a high level block diagram illustrating an example NN intermediate results safety mechanism.

A high level block diagram illustrating an example NN intermediate results safety mechanism is shown in FIG. 84. The example subcluster 1750 comprises a plurality of processing elements (PEs) 1752, PE #0 to PE #63, each PE having associated L1 memory 1754, multiplexer 1756, CRC engine 1785, L2 memory 1762 incorporating blocks of stored NN intermediate results 1765, and LCU 1768.

In one embodiment, a running first CRC checksum is calculated over all the NN intermediate results generated by a single subcluster from calculations conducted on a single output row with all its input features and to store the CRC checksum in L2 memory with the NN intermediate results. When reading the NN intermediate results from L2 memory, a second running CRC checksum is calculated over the NN intermediate results read from memory and compared to the first CRC checksum. If a mismatch is detected, an error flag 1760 is raised.

The NN intermediate results or context values represent the intermediate results generated by the MAC circuits in the processing elements 1752. They are normally stored in L1 memory 1754 within the PE. Since the L1 memories are of limited size, they may overflow in which case the NN intermediate results are transferred to L2 memory which is much bigger in size. In one example embodiment, the NN intermediate results 1761 output from each PE are multiplexed via multiplexer 1756 whose select input is controlled by the LCU 1768 via select line 1769. The multiplexed NN intermediate results 1763 output of the multiplexer are input to the CRC engine 1758.

The CRC engine functions to calculate the first CRC checksum over blocks of context where a CRC checksum is generated over the NN intermediate results in each block. The CRC checksum 1766 is attached to its corresponding block of context values 1764 and stored in the L2 memory 1762. Note that for clarity signals 1765 represent both the blocks of context value as well as the CRC checksums while signals 1763 represents the NN intermediate results transferred between the PEs and the CRC engine.

The CRC checksums 1766 generated for each block of context values 1764 are stored with their respective blocks of NN intermediate results. In order to minimize memory utilization, the CRC is calculated over multiple NN intermediate results, e.g., 5, 10, 20, with the actual block size configured by the LCU via configuration/control signal 1767. Any number of NN intermediate results may be protected by a single CRC.

In addition, the NN intermediate results may be transferred from L1 memory to L2 memory via means other than multiplexer 1756. For example, a dedicated CRC engine may be provided for each processing element which feeds NN intermediate results and associated CRC checksums to and from L2 memory.

In operation, the NN intermediate results are read out of L2 memory when they are needed for calculations in the processing elements. They are fed to the CRC engine 1758 which calculates a second CRC checksum over the NN intermediate results in a block retrieved from the L2 memory. A CRC checksum is calculated for each block of NN intermediate results. Once the second CRC checksum calculation is complete, it is compared to the first CRC checksum originally stored in L2 memory. If a mismatch is detected, the CRC engine generates an error flag 1760. The LCU 1768 functions to control the operation of the NN intermediate results safety mechanism including the transfer of NN intermediate results to and from L2 memory.

It is noted that the width of the NN intermediate results and CRC checksums may be 8 or 16 bits wide. The width of the NN intermediate results and CRC checksums do not have to be the same and may differ from each other. The block size of the NN intermediate results and widths of the context values and checksums are typically static and determined by the compiler through the LCU. Alternatively, the block size for the context values may vary depending on one or more factors.

Error Interrupt Aggregation

In one embodiment, the error interrupts (i.e. error flags) from the various safety mechanisms throughout the NN processor are aggregated in a particular hierarchy from the subclusters to the clusters to the NN core top. The NN core top is the highest level in which failures from all the NN core hierarchies (e.g., core top, subclusters, clusters, etc.) can be aggregated in order to expose a relatively simpler and more robust safety handling interface to the ARM/safety manager entity which can act as a safety island depending on the particular implementation. It is impractical for the ARM to have multiple interrupt inputs from each and every safety mechanism. This is because the repetitive nature of the NN core architecture would require an overwhelming number of interrupt signals from many different hierarchies to the ARM. It is thus desirable to have some form of aggregation and safety feature handling in the NN core level.

Figure 85:
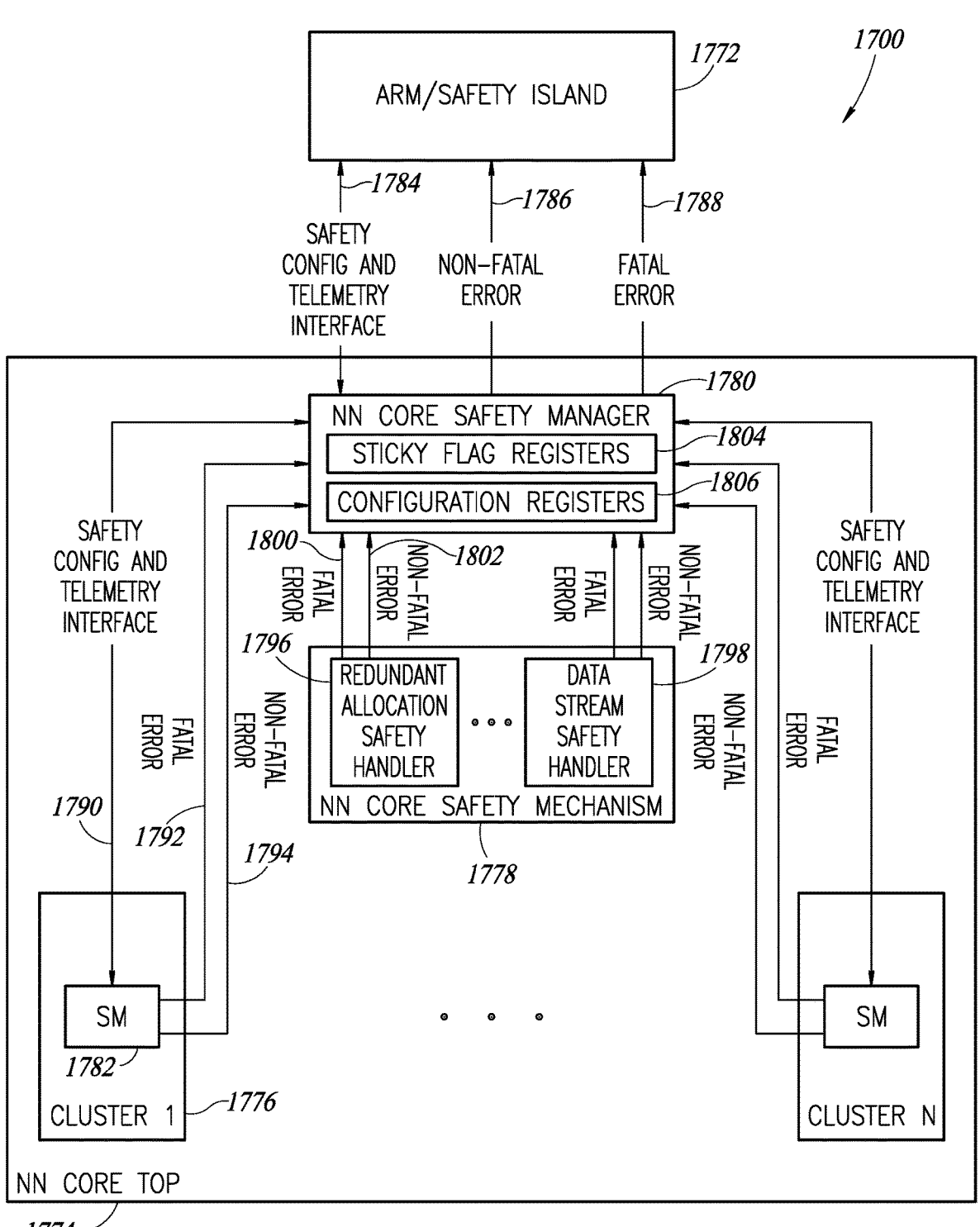
FIG. 85 is a high level block diagram illustrating an example error interrupt aggregation scheme for the safety mechanisms of the neural network processor of the present invention.

A high level block diagram illustrating an example error interrupt aggregation scheme for the safety mechanisms of the neural network processor of the present invention is shown in FIG. 85. The aggregation scheme, generally referenced 1770, comprises ARM/safety island 1772 and NN core top 1774. A safety configuration and telemetry interface 1784 connects the ARM/safety island and the NN core top which is operative to output non-fatal error signal 1786 and fatal error signal 1788. The non-fatal error indicates an error occurred somewhere in the NN processor covered by one of the safety mechanisms described supra. The error, however, is deemed non-fatal and is passed to the higher level processing but operation of the NN processor continues. On the other hand, the fatal error indicates that the error that occurred in the NN processor covered by one of the safety mechanisms is sever enough that operation of the NN processor is now not reliable and upper layers should take appropriate action, e.g., immediately stop an autonomous vehicle, shut down a machine that was functioning, etc.

The NN core top 1774 comprises a plurality of clusters 1776, namely cluster 1 through cluster M, NN core safety mechanism 1778, and NN core safety manager 1780. The clusters 1776 each include stream manager (SM) 1782, safety configuration and telemetry interface 1790 between the NN core safety manager 1780, and generate fatal error signal 1792 and non-fatal error signal 1794 which are input to the NN core safety manager 1780. The NN core safety mechanism 1778 comprises a plurality of safety handlers including for example redundant allocation safety handler 1796 and data stream safety handler 1798, where each safety handler functions to generate fatal error signal 1800 and non-fatal error signal 1802 which are input to the NN core safety manager 1780. The NN core safety manager 1780 comprises sticky flag registers (i.e. interrupt signaling registers) 1804 and configuration registers 1806 and functions to generate non-fatal error signal 1786 and fatal error signal 1788.

It is noted that the features of the NN core safety manager is 'guaranteed by design,' ensuring that generated errors can only be cleared upon reading by the safety management entity. In addition, the safety manager itself is protected by a mechanism that prevents any other entity from accessing the interrupt signaling registers and either accidentally or maliciously clearing safety faults.

Figure 86:
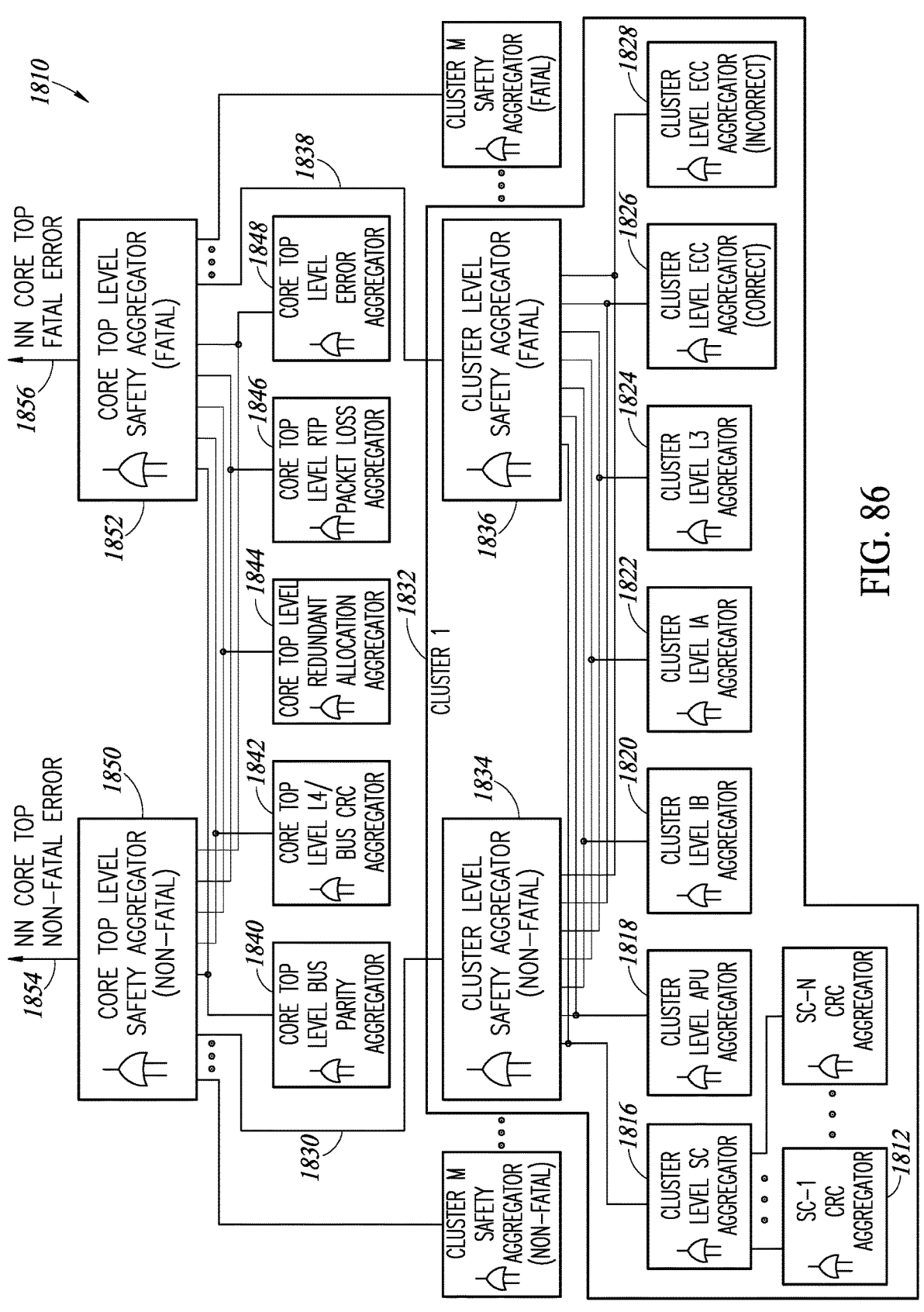
FIG. 86 is a high level block diagram illustrating the example error interrupt aggregation scheme of FIG. 85 in more detail.

A high level block diagram illustrating the example error interrupt aggregation scheme of FIG. 85 in more detail is shown in FIG. 86. The aggregation scheme, generally referenced 1810, comprises a plurality of aggregators at the subcluster, cluster and core top levels. The aggregation is divided between non-fatal and fatal errors. Aggregators for both non-fatal and fatal errors are provided in each cluster for clusters 1 though M. Although detail is shown for cluster 1 only for clarity sake, it is appreciated that all M clusters, including non-fatal as well as fatal, as constructed similarly. Each cluster comprises subcluster CRC aggregators 1812, namely SC-1 CRC aggregator to SCN CRC aggregator. CRC error flags from the various safety mechanisms in the subclusters are generally ORed together and the output passed up to the cluster level subcluster aggregator block 1816. Other cluster level aggregators include cluster level APU aggregator 1818, cluster level IB aggregator 1820, cluster level IA aggregator 1822, cluster level L3 aggregator 1824, cluster level ECC aggregator (correct) 1826, and cluster level ECC aggregator (incorrect) 1828.

The non-fatal outputs of all cluster level aggregators are input to the cluster level safety aggregator (non-fatal) 1834 while the fatal outputs of all cluster level aggregators are input to the cluster level safety aggregator (fatal) 1836. The aggregated non-fatal error signal 1830 from clusters 1 through M are input to the core top level safety aggregator (non-fatal) 1850 while the aggregated fatal error signal 1838 from clusters 1 through M are input to the core top level safety aggregator (fatal) 1852.

In addition, non-fatal and fatal error signals from other aggregators are input to the core top safety aggregator (non-fatal) 1850 and core top level safety aggregator (fatal) 1852, respectively, including core top level bus parity aggregator 1840, core top level L4/Bus CRC aggregator 1842, core top level redundant allocation aggregator 1844, core top level RTP packet loss aggregator 1846, and core top level error aggregator 1848.

The core top level safety aggregator (non-fatal) 1850 functions to aggregate the plurality of non-fatal error signals to generate a single NN core top non-fatal error signal 1854. Similarly, the core top level safety aggregator (fatal) 1852 functions to aggregate the plurality of fatal error signals to generate a single NN core top fatal error signal 1856. Both these NN core top error signals 1854, 1856 are input to upper layers for further processing whereby one or more safety actions may be undertaken.

Figure 87:
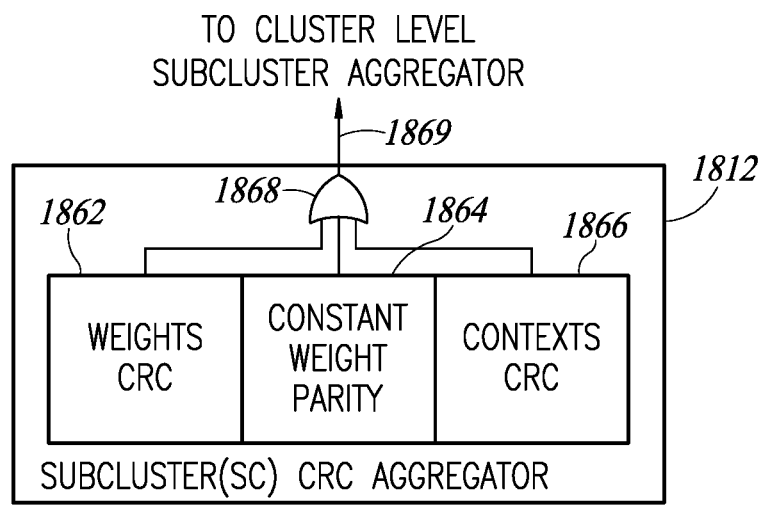
FIG. 87 is a block diagram illustrating the subcluster CRC aggregator in more detail.

A block diagram illustrating the subcluster CRC aggregator in more detail is shown in FIG. 87. The subcluster CRC aggregator 1812 is operative to aggregate CRC error flags from several subcluster level safety mechanisms including the weights CRC 1862, constant weight parity 1864, and contexts CRC 1866 via OR gate 1868 to generate aggregated error signal 1869 which is input to the cluster level subcluster aggregator 1816.

Figure 88:
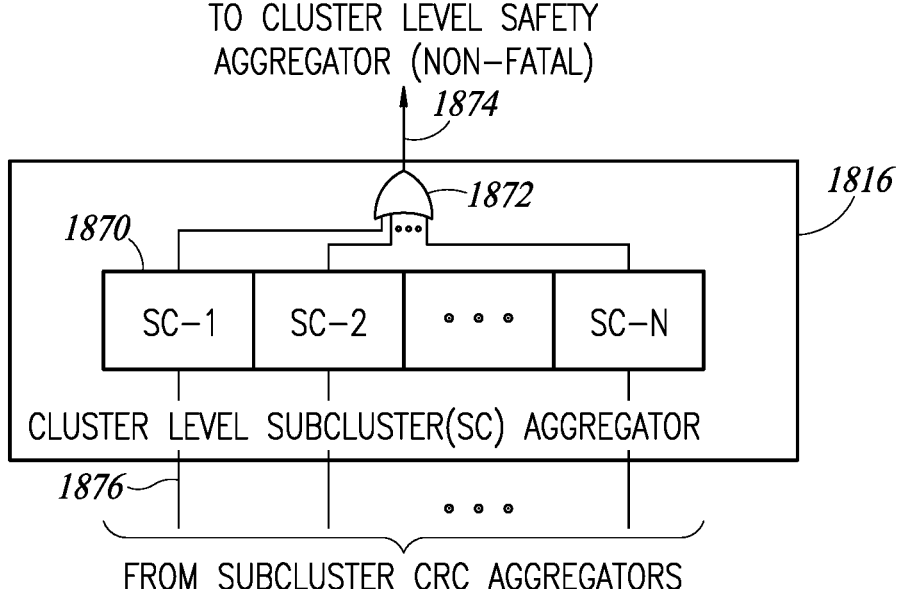
FIG. 88 is a block diagram illustrating the cluster level subcluster aggregator in more detail.

A block diagram illustrating the cluster level subcluster aggregator in more detail is shown in FIG. 88. The cluster level subcluster aggregator 1816 is operative to aggregate error flags 1876 from several subcluster CRC aggregators 1870, SC–1 through SC-N, via OR gate 1872 to generate aggregated error signal 1874 which is input to the cluster level safety aggregator (non-fatal) 1834. Note that similar aggregation is provided for corresponding fatal error signals as well.

Figure 89:
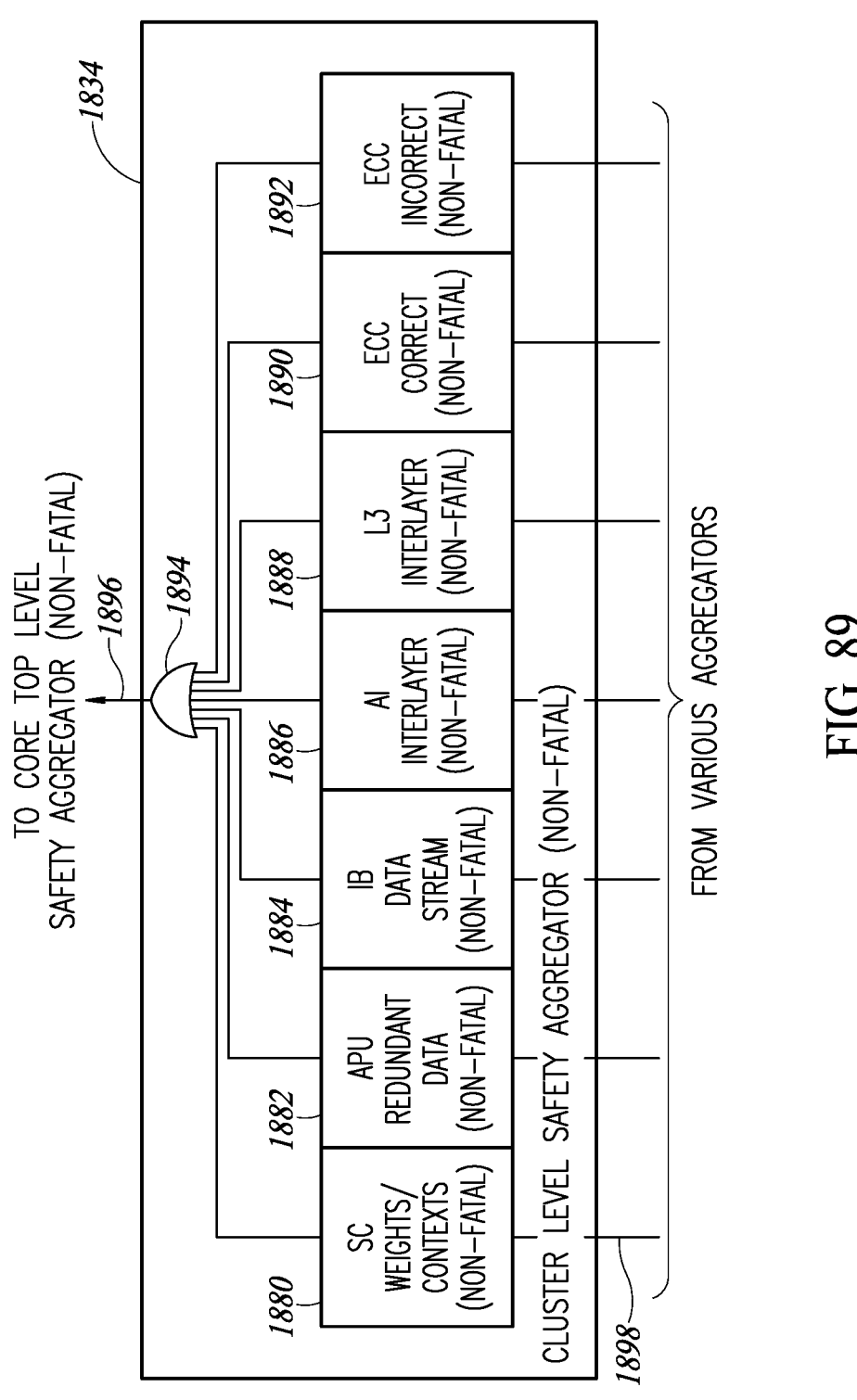
FIG. 89 is a block diagram illustrating the cluster level safety aggregator (non-fatal) in more detail.

A block diagram illustrating the cluster level safety aggregator (non-fatal) in more detail is shown in FIG. 89. The cluster level safety aggregator (non-fatal) 1898 is operative to aggregate error flags 1898 from several cluster aggregators via OR gate 1894 to generate aggregated error signal 1896 which is input to the core top level safety aggregator (non-fatal) 1850. In one embodiment, error flags from the following cluster aggregators are aggregated, including subcluster weights/contexts 1880, APU redundant data 1882, IB data stream 1884, AI interlayer 1886, L3 interlayer 1888, ECC correct 1890, and ECC incorrect 1892. Note that similar aggregation is provided for corresponding fatal error signals as well.

Figure 90:
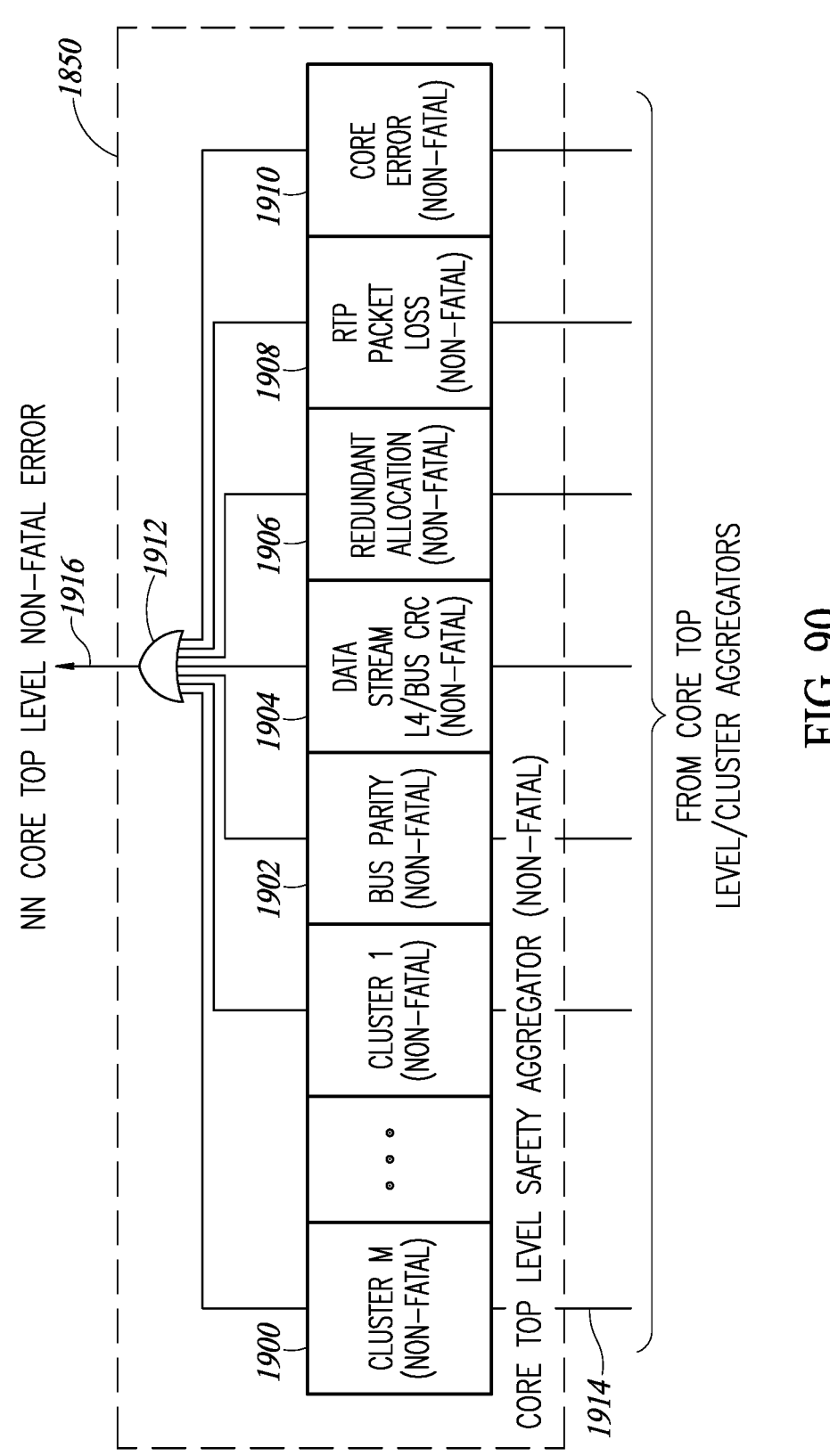
FIG. 90 is a block diagram illustrating the core top level safety aggregator (non-fatal) in more detail.

A block diagram illustrating the core top level safety aggregator (non-fatal) in more detail is shown in FIG. 90. The core top level safety aggregator (non-fatal) 1850 is operative to aggregate error flags 1914 from several core top level/cluster level safety aggregators via OR gate 1912 to generate the NN core top level non-fatal error signal 1916. In one embodiment, error flags from the following core top level/cluster level safety aggregators are aggregated, including clusters 1 through M 1900, core error 1902, RTP packet loss 1904, redundant allocation 1906, data stream 1908, and bus parity 1910. Note that similar aggregation is provided for corresponding fatal error signals as well.

Those skilled in the art will recognize that the boundaries between logic and circuit blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediary components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the claims, any reference signs placed between parentheses shall not be construed as limiting the claim. The use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first," "second," etc. are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method of cluster intralayer tensor data flow path failure detection for use in a neural network processor, the method comprising:

providing a physical neural network intralayer tensor data flow hardware circuit path for performing regular artificial neural network (ANN) computation processing on a stream of regular input data tensors and weights that are part of the ANN to be implemented;

compiler generation of tensor test data and weights as well as expected test output based thereon a priori via numeric emulation of said physical neural network intralayer tensor data flow hardware circuit path and used solely for safety and protection of the neural network processor;

temporal multiplexing of said physical neural network intralayer tensor data flow hardware circuit path for both regular inference of the regular input data tensors as well as fault detection utilizing said tensor test data and weights;

injecting said tensor test data and weights into said physical neural network intralayer tensor data flow hardware circuit path during a fault detection window after regular ANN inference processing of the regular input data tensors has paused thereby providing end-to-end intralayer fault coverage without interfering with normal ANN processing throughput;

calculating a test output based on said test sensors and test weights during the fault detection window; and comparing said test output with the expected test output and generating an error if a mismatch is detected.

2. The method according to claim 1, further comprising:

calculating a test cyclic redundancy code (CRC) checksum on said test output; and comparing said test CRC checksum with a precalculated test CRC checksum and generating an error if a mismatch is detected.

3. The method according to claim 1, wherein said physical neural network intralayer tensor data flow hardware circuit path consisting of an input aligner (IA), subcluster (SC), and activation processing unit (APU) circuits.

4. The method according to claim 1, wherein said tensor test data is injected into said physical neural network intralayer tensor data flow hardware circuit path periodically or a periodically.

5. The method according to claim 1, wherein said tensor test data comprises a pseudorandom binary sequence generated dynamically.

6. The method according to claim 1, wherein said tensor test data is determined a priori and stored in a memory.

7. An apparatus for cluster intralayer tensor data flow path failure detection for use in a neural network processor, comprising:

a physical neural network intralayer tensor data flow hardware circuit path for performing regular artificial neural network (ANN) computation processing on a stream of regular input data tensors and weights that are part of the ANN to be implemented;

a first hardware circuit to receive and store tensor test data and weights as well as expected test output based thereon a priori generated by a compiler via numeric emulation of said physical neural network intralayer tensor data flow hardware circuit path and used solely for safety and protection of the neural network processor;

a second hardware circuit operative to temporally multiplex said physical neural network intralayer tensor data flow hardware circuit path for both regular inference of the regular input data tensors as well as fault detection utilizing said tensor test data and weights;

a third hardware circuit operative to inject said tensor test data and weights into said physical neural network intralayer tensor data flow hardware circuit path during a fault detection window after regular ANN inference processing of the regular input data tensors has paused thereby providing end-to-end intralayer fault coverage without interfering with normal ANN processing throughput;

a fourth hardware circuit operative to calculate a test output based on said test sensors and test weights during the fault detection window; and a fifth hardware circuit operative to compare said test output with the expected test output and generating an error if a mismatch is detected.

8. The apparatus according to claim 7, further comprising:

a sixth hardware circuit incorporating a cyclic redundancy code (CRC) engine and operative to calculate a test CRC checksum on said test output; and a comparator circuit operative to compare said test CRC checksum with a test CRC checksum calculated a priori and to generate an error if a mismatch is detected.

9. The apparatus according to claim 7, wherein said physical neural network intralayer tensor data flow hardware circuit path comprises a tensor data flow path consisting of an input aligner (IA), subcluster (SC), and activation processing unit (APU) circuits.

10. The apparatus according to claim 7, wherein said third hardware circuit is operative to inject said tensor test data into said physical neural network intralayer tensor data flow hardware circuit path periodically or a periodically.

11. The apparatus according to claim 7, wherein said tensor test data are generated and configured by a software compiler.

12. The apparatus according to claim 7, wherein said tensor test data comprises a pseudorandom binary sequence generated dynamically.

13. The apparatus according to claim 7, wherein said tensor test data are determined a priori and stored in a memory.

* * * * *